United States Patent
Kimura et al.

(10) Patent No.: US 12,426,474 B2
(45) Date of Patent: Sep. 23, 2025

(54) DISPLAY APPARATUS, METHOD FOR MANUFACTURING DISPLAY APPARATUS, DISPLAY MODULE, AND ELECTRONIC DEVICE

(71) Applicant: Semiconductor Energy Laboratory Co., Ltd., Atsugi (JP)

(72) Inventors: Hajime Kimura, Atsugi (JP); Kentaro Hayashi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 578 days.

(21) Appl. No.: 17/742,689

(22) Filed: May 12, 2022

(65) Prior Publication Data
US 2022/0384536 A1   Dec. 1, 2022

(30) Foreign Application Priority Data
May 27, 2021 (JP) .................. 2021-089159

(51) Int. Cl.
*H10K 59/60* (2023.01)
*H10K 30/82* (2023.01)
(Continued)

(52) U.S. Cl.
CPC ............. *H10K 59/60* (2023.02); *H10K 39/34* (2023.02); *H10K 50/85* (2023.02); *H10K 59/65* (2023.02);
(Continued)

(58) Field of Classification Search
CPC ......... H10K 59/8052; H10K 59/80523; H10K 59/80524; H10K 59/60; H10K 50/85; H10K 59/65; H10K 71/00
See application file for complete search history.

(56) References Cited

U.S. PATENT DOCUMENTS 5,953,985 A    9/1999 Kobayashi
6,120,338 A    9/2000 Hirano et al.
(Continued)

FOREIGN PATENT DOCUMENTS

JP    2000-036385 A    2/2000
JP    2003-059663 A    2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Eduardo A Rodela
(74) *Attorney, Agent, or Firm* — Eric J. Robinson; Robinson Intellectual Property Law Office, P.C.

(57) ABSTRACT

A display apparatus capable of performing image capturing with high sensitivity is provided. The display apparatus includes a light-emitting element including a light-emitting layer, and a light-receiving element including a photoelectric conversion layer. A transflective electrode is provided over the light-emitting layer, and a transparent electrode is provided over the photoelectric conversion layer. With a structure where the transflective electrode does not overlap the photoelectric conversion layer, a reduction in light-receiving sensitivity of the light-receiving element can be prevented while a microcavity structure is used for the light-emitting element. Thus, the display apparatus can emit light with high color purity and perform image capturing with high sensitivity.

13 Claims, 53 Drawing Sheets

(51) Int. Cl.
  *H10K 39/34* (2023.01)
  *H10K 50/85* (2023.01)
  *H10K 59/131* (2023.01)
  *H10K 59/65* (2023.01)
  *H10K 59/80* (2023.01)
  *H10K 71/00* (2023.01)

(52) U.S. Cl.
  CPC ..... *H10K 59/80524* (2023.02); *H10K 59/873* (2023.02); *H10K 71/00* (2023.02); *H10K 59/876* (2023.02); *H10K 59/878* (2023.02)

(56) References Cited

U.S. PATENT DOCUMENTS

| | | | | |
|---|---|---|---|---|
| 10,032,941 | B2* | 7/2018 | Kudo | H01L 31/103 |
| 10,804,346 | B2* | 10/2020 | Wang | H10K 50/82 |
| 11,081,535 | B2* | 8/2021 | Li | H10K 59/122 |
| 11,462,587 | B2* | 10/2022 | Tang | H10K 59/60 |
| 2002/0072139 | A1 | 6/2002 | Kashiwabara | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0075761 | A1* | 3/2013 | Akiyama | H10K 65/00 257/E31.095 |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2013/0299789 | A1 | 11/2013 | Yamazaki et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2021/0111364 | A1* | 4/2021 | Sakamoto | H10K 59/8731 |
| 2022/0209162 | A1 | 6/2022 | Seo et al. | |
| 2022/0407030 | A1* | 12/2022 | Kim | H10K 50/824 |
| 2023/0083099 | A1* | 3/2023 | Xu | H10K 59/352 257/79 |
| 2024/0164175 | A1 | 5/2024 | Yamazaki et al. | |

FOREIGN PATENT DOCUMENTS

| | | |
|---|---|---|
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-197522 A | 10/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 45A
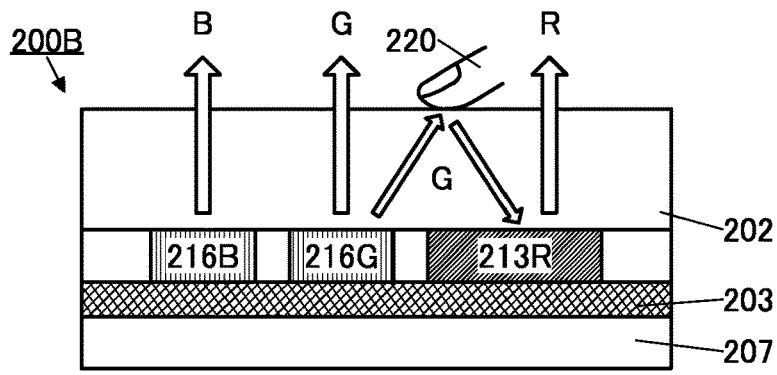
FIG. 45B  FIG. 45C  FIG. 45D  FIG. 45E
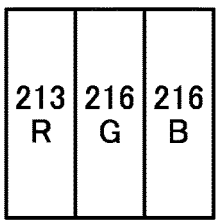 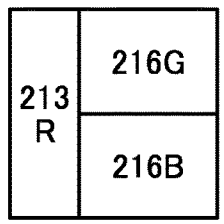 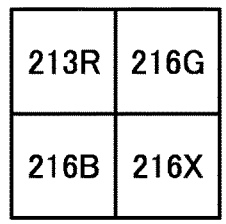 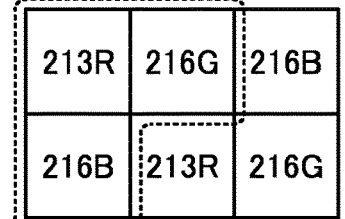
FIG. 45F  FIG. 45H
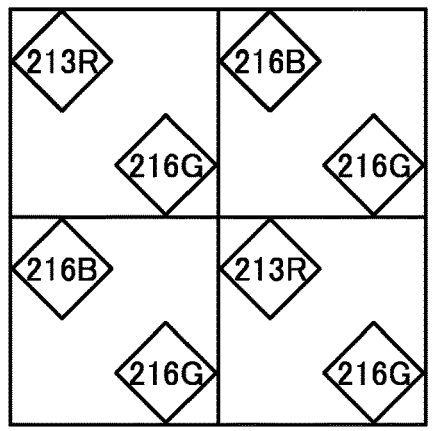 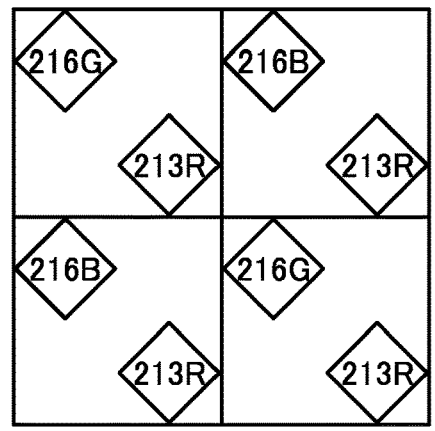
FIG. 45G  FIG. 45I
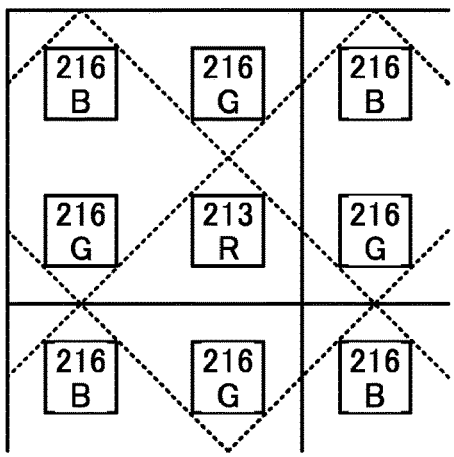 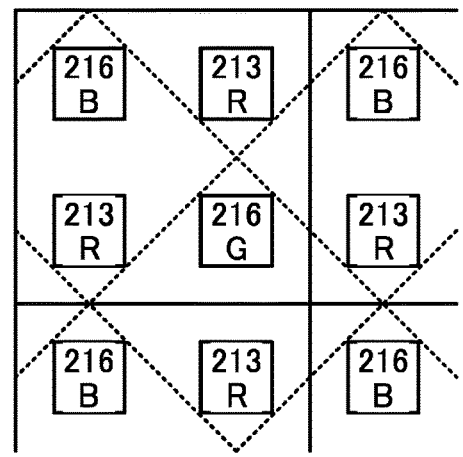

FIG. 47A
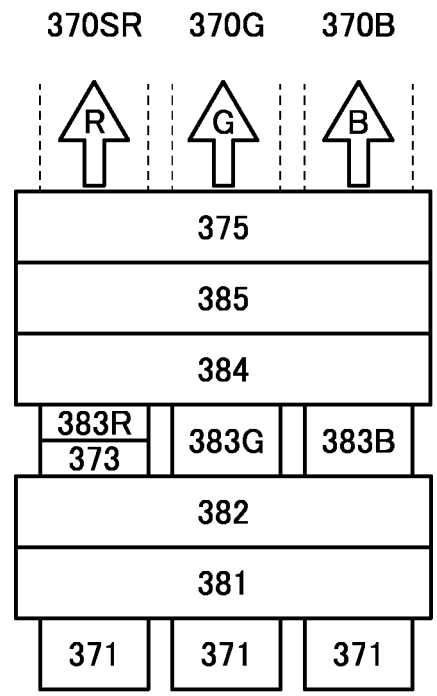
FIG. 47B
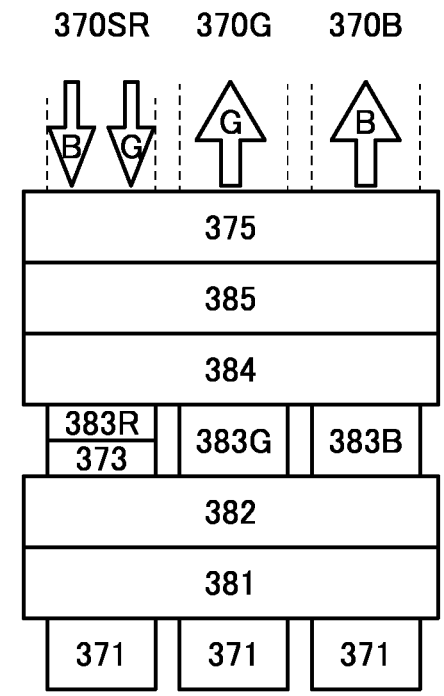
FIG. 47C  FIG. 47D  FIG. 47E  FIG. 47F  FIG. 47G
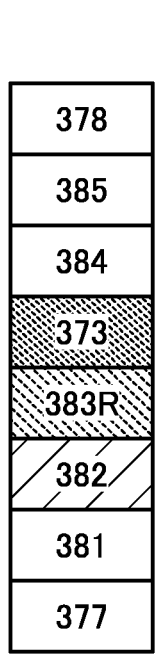 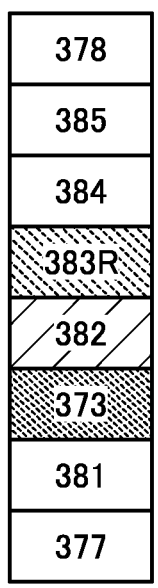 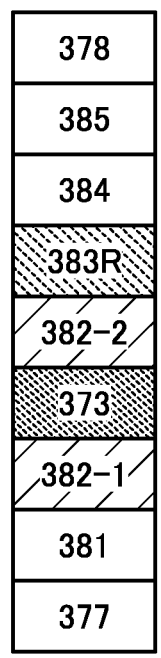 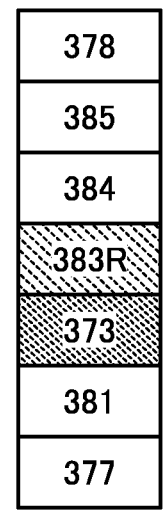 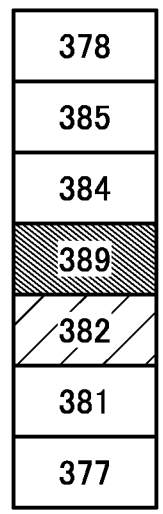

9101

9102

9200

9201

9201

9201

DISPLAY APPARATUS, METHOD FOR MANUFACTURING DISPLAY APPARATUS, DISPLAY MODULE, AND ELECTRONIC DEVICE

BACKGROUND OF THE INVENTION

1. Field of the Invention

One embodiment of the present invention relates to a display apparatus. One embodiment of the present invention relates to an imaging apparatus. One embodiment of the present invention relates to a display apparatus having an image capturing function. One embodiment of the present invention relates to a display module. One embodiment of the present invention relates to an electronic device.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to a device that can function by utilizing semiconductor characteristics in general.

2. Description of the Related Art

In recent years, display apparatuses have been required to have higher definition in order to display high-resolution images. Display apparatuses used in information terminals such as smartphones, tablet terminals, and laptop personal computers (PCs) have been required to have lower power consumption as well as higher definition. Furthermore, display apparatuses have been required to have a variety of functions such as a touch panel function and a function of capturing images of fingerprints for authentication in addition to a function of displaying images.

Light-emitting apparatuses including light-emitting elements, for example, have been developed as display apparatuses. Light-emitting elements utilizing electroluminescence (hereinafter referred to as EL elements) have features such as ease of reduction in thickness and weight, high-speed response to input signals, and capability of DC constant voltage driving, and have been used in display apparatuses. Patent Document 1, for example, discloses a flexible light-emitting apparatus using organic EL elements.

REFERENCE

Patent Document 1: Japanese Published Patent Application No. 2014-197522

SUMMARY OF THE INVENTION

An object of one embodiment of the present invention is to provide a display apparatus or an imaging apparatus capable of performing image capturing with high sensitivity. Another object of one embodiment of the present invention is to provide a high-definition display apparatus or imaging apparatus. Another object of one embodiment of the present invention is to provide a display apparatus or an imaging apparatus having a high aperture ratio. Another object of one embodiment of the present invention is to provide a display apparatus capable of performing display with high color purity. Another object of one embodiment of the present invention is to provide a display apparatus with high display quality. Another object of one embodiment of the present invention is to provide a display apparatus capable of obtaining biological information such as fingerprints. Another object of one embodiment of the present invention is to provide a display apparatus that functions as a touch panel. Another object of one embodiment of the present invention is to provide a highly reliable display apparatus or imaging apparatus. Another object of one embodiment of the present invention is to provide a display apparatus or an imaging apparatus having a novel structure. Another object of one embodiment of the present invention is to provide an electronic device including the above-described display apparatus or imaging apparatus. Another object of one embodiment of the present invention is to provide a method for manufacturing the above-described display apparatus, imaging apparatus, or electronic device.

Note that the description of these objects does not preclude the existence of other objects. One embodiment of the present invention does not necessarily achieve all the objects listed above. Note that other objects can be derived from the description of the specification, the drawings, the claims, and the like.

One embodiment of the present invention is a display apparatus including a first light-emitting layer, a photoelectric conversion layer, a first electrode, and a second electrode. The first electrode is positioned over the first light-emitting layer. The second electrode is positioned over the photoelectric conversion layer. Visible light transmittance of the second electrode is higher than visible light transmittance of the first electrode.

In the above embodiment, the first electrode may be a transflective electrode, and the second electrode may be a transparent electrode.

In the above embodiment, an optical adjustment layer may be provided under the first light-emitting layer.

In the above embodiment, the photoelectric conversion layer may include a region not overlapped by the first electrode.

In the above embodiment, the photoelectric conversion layer may include no region overlapped by the first electrode.

In the above embodiment, the second electrode may include a region overlapping the first light-emitting layer, and the second electrode may include a region in contact with the first electrode.

The above embodiment may include a resin layer. The resin layer may be positioned between the first light-emitting layer and the photoelectric conversion layer.

The above embodiment may include an insulating layer. The insulating layer may be positioned between the first light-emitting layer and the resin layer and between the photoelectric conversion layer and the resin layer.

The above embodiment may include a second light-emitting layer. The first electrode may be positioned over the second light-emitting layer.

The above embodiment may include an organic layer. The organic layer may be positioned between the first light-emitting layer and the first electrode and between the second light-emitting layer and the first electrode. The organic layer may include at least one of a hole-injection layer, a hole-transport layer, a hole-blocking layer, an electron-blocking layer, an electron-transport layer, and an electron-injection layer.

In the above embodiment, the organic layer may be positioned between the photoelectric conversion layer and the second electrode.

The above embodiment may include a protective layer. The protective layer may be positioned over the first electrode and the second electrode.

A display module including the display of one embodiment of the present invention and at least one of a connector and an integrated circuit is also one embodiment of the present invention.

An electronic device including the display module of one embodiment of the present invention and at least one of a battery, a camera, a speaker, and a microphone is also one embodiment of the present invention.

Another embodiment of the present invention is a method for manufacturing a display apparatus, including the steps of: forming a light-emitting layer and a photoelectric conversion layer; and forming a first electrode over the light-emitting layer and forming, over the photoelectric conversion layer, a second electrode having higher visible light transmittance than the first electrode.

Another embodiment of the present invention is a method for manufacturing a display apparatus, including the steps of: forming a light-emitting film and a first sacrificial film in this order over an insulating surface; processing the first sacrificial film and the light-emitting film, thereby forming a first sacrificial layer and a light-emitting layer under the first sacrificial layer; forming a photoelectric conversion film and a second sacrificial film over the first sacrificial layer and the insulating surface; processing the second sacrificial film and the photoelectric conversion film, thereby forming a second sacrificial layer and a photoelectric conversion layer under the second sacrificial layer; removing the first sacrificial layer and the second sacrificial layer; and forming a first electrode over the light-emitting layer and forming, over the photoelectric conversion layer, a second electrode having higher visible light transmittance than the first electrode.

In the above embodiment, an insulating film may be formed over the first sacrificial layer, the second sacrificial layer, and the insulating surface before the first sacrificial layer and the second sacrificial layer are removed; and the insulating film may be processed, thereby forming an insulating layer between the light-emitting layer and the photoelectric conversion layer.

In the above embodiment, the insulating film may be formed by a spin coating method, a spraying method, a screen printing method, or a painting method.

In the above embodiment, the first electrode may be formed by forming a transflective film over the light-emitting layer, and the second electrode may be formed by forming a transparent film over the photoelectric conversion layer.

In the above embodiment, an optical adjustment layer may be formed over the insulating surface before the light-emitting layer is formed; and the light-emitting layer may be formed over the optical adjustment layer.

In the above embodiment, the first electrode may be formed to include a region not overlapping the photoelectric conversion layer.

In the above embodiment, the first electrode may be formed not to include a region overlapping the photoelectric conversion layer.

In the above embodiment, the second electrode may be formed to include a region overlapping the light-emitting layer and a region in contact with the first electrode.

One embodiment of the present invention can provide a display apparatus or an imaging apparatus capable of performing image capturing with high sensitivity. One embodiment of the present invention can provide a high-definition display apparatus or imaging apparatus. One embodiment of the present invention can provide a display apparatus or an imaging apparatus having a high aperture ratio. One embodiment of the present invention can provide a display apparatus capable of performing display with high color purity. One embodiment of the present invention can provide a display apparatus with high display quality. One embodiment of the present invention can provide a display apparatus capable of obtaining biological information such as fingerprints. One embodiment of the present invention can provide a display apparatus that functions as a touch panel. One embodiment of the present invention can provide a highly reliable display apparatus or imaging apparatus. One embodiment of the present invention can provide a display apparatus or an imaging apparatus having a novel structure. One embodiment of the present invention can provide an electronic device including the above-described display apparatus or imaging apparatus. One embodiment of the present invention can provide a method for manufacturing the above-described display apparatus, imaging apparatus, or electronic device.

Note that the description of these effects does not preclude the existence of other effects. One embodiment of the present invention does not necessarily have all the effects listed above. Other effects can be derived from the description of the specification, the drawings, the claims, and the like.

BRIEF DESCRIPTION OF THE DRAWINGS

In the accompanying drawings:

FIGS. 23A, 23B1, and 23B2 are cross-sectional views illustrating examples of a method for manufacturing a display apparatus;

FIGS. 32A and 32B1 to 32B4 are cross-sectional views each illustrating a structure example of a display apparatus;

FIG. 45A is a cross-sectional view illustrating a structure example of a display apparatus, and FIGS. 45B to 45I are top views illustrating examples of pixels;

FIGS. 47A to 47G each illustrate a structure example of a display apparatus;

DETAILED DESCRIPTION OF THE INVENTION

Figure 1:
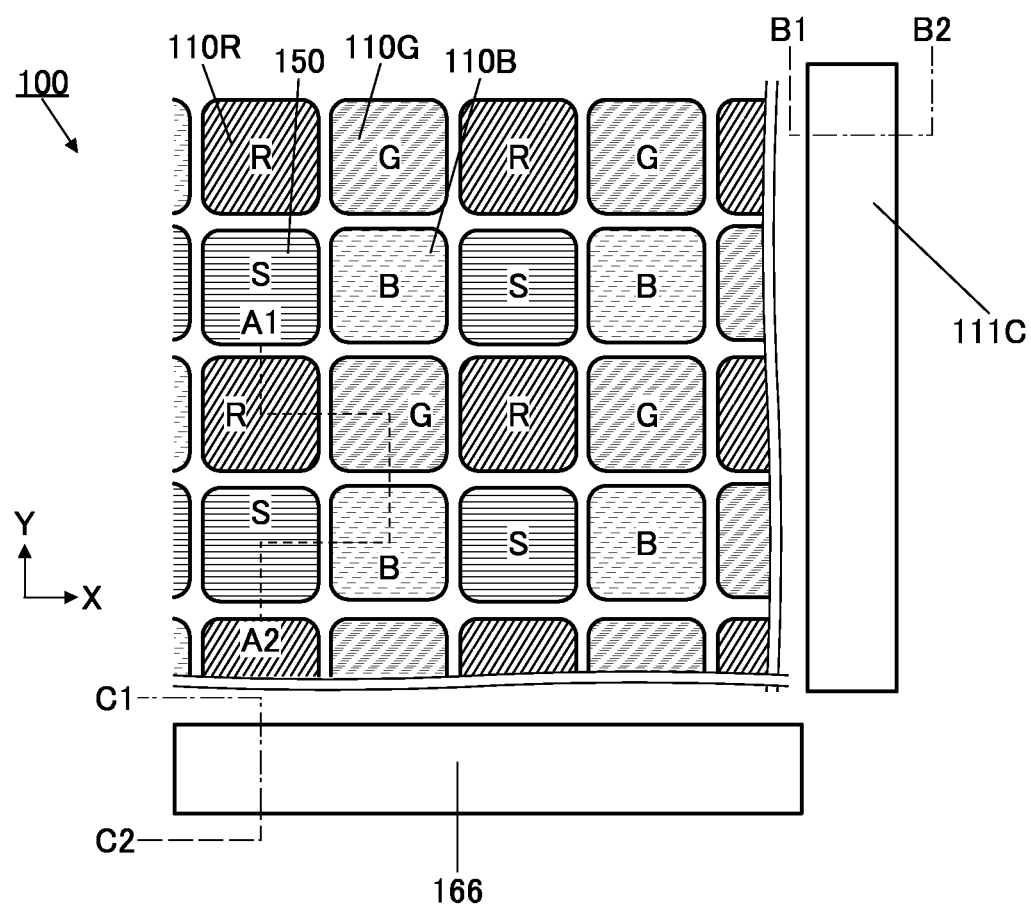
FIG. 1 is a top view illustrating a structure example of a display apparatus.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of the embodiments below.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

Note that in each drawing described in this specification, the size, the layer thickness, or the region of each component is exaggerated for clarity in some case. Therefore, the size, the layer thickness, or the region is not limited to the illustrated scale.

Note that in this specification and the like, ordinal numbers such as "first" and "second" are used in order to avoid confusion among components and do not limit the number of components.

Note that the expressions indicating directions, such as "over" and "under", are basically used to correspond to the directions in the drawings. However, in some cases, the term "over" or "under" in the specification indicates a direction that does not correspond to the apparent direction in the drawings, for the purpose of easy description or the like. For example, when the stacked order (or formation order) of a stack is described, even in the case where a surface on which the stack is provided (e.g., a formation surface, a support surface, a bonding surface, or a flat surface) is positioned above the stack in the drawings, the direction and the opposite direction are referred to as "under" and "over", respectively, in some cases.

In this specification and the like, the terms "film" and "layer" can be interchanged with each other depending on the case or circumstances. For example, in some cases, the terms "conductive layer" and "insulating layer" can be changed into "conductive film" and "insulating film", respectively.

Note that in this specification and the like, an EL layer refers to a layer that is provided between a pair of electrodes of a light-emitting element and contains at least a light-emitting substance (such a layer is also referred to as a light-emitting layer), or a stack including a light-emitting layer. A PD layer refers to a layer that is provided between a pair of electrodes of a light-receiving element and contains at least a photoelectric conversion material (such a layer is also referred to as an active layer or a photoelectric conversion layer), or a stack including an active layer.

In this specification and the like, a display panel that is one embodiment of a display apparatus has a function of displaying (outputting) images, for example, on (to) a display surface. Thus, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

Embodiment 1

In this embodiment, a structure example of a display apparatus of one embodiment of the present invention and a method for manufacturing the display apparatus will be described.

One embodiment of the present invention is a display apparatus including a light-emitting element (also referred to as a light-emitting device) and a light-receiving element (also referred to as a light-receiving device). The light-emitting element includes a pair of electrodes, and an EL layer including at least a light-emitting layer between the electrodes. The light-receiving element includes a pair of electrodes, and a PD layer including at least an active layer (also referred to as a photoelectric conversion layer) between the electrodes. The light-emitting element is preferably an organic electroluminescent element (organic EL element). The light-receiving element is preferably an organic photodiode (organic photoelectric conversion element).

The display apparatus preferably includes two or more light-emitting elements that emit light of different colors. The light-emitting elements that emit light of different colors include respective EL layers containing different materials. For example, a display apparatus including three types of light-emitting elements that emit red (R) light, green (G) light, and blue (B) light achieves full-color display.

One embodiment of the present invention is capable of image capturing by a plurality of light-receiving elements and thus functions as an imaging apparatus. In this case, light-emitting elements can be used as a light source for image capturing. Moreover, one embodiment of the present invention is capable of displaying images by a plurality of light-emitting elements and thus functions as a display apparatus. Accordingly, one embodiment of the present invention can be regarded as a display apparatus having an image capturing function or an imaging apparatus having a display function.

For example, in the display apparatus of one embodiment of the present invention, light-emitting elements are arranged in a matrix in a display portion, and light-receiving elements are also arranged in a matrix in the display portion. Hence, the display portion has a function of displaying images and a function of a light-receiving portion. An image can be captured by the plurality of light-receiving elements provided in the display portion, so that the display apparatus can function as an image sensor or a touch panel. That is, in the display apparatus of one embodiment of the present invention, an image can be captured in the display portion, for example. Alternatively, the display apparatus of one embodiment of the present invention can sense an object approaching or touching the display portion. Furthermore, since the light-emitting elements provided in the display portion can be used as a light source at the time of receiving light, a light source does not need to be provided separately from the display apparatus; thus, a highly functional display apparatus can be provided without increasing the number of electronic components.

In one embodiment of the present invention, when an object reflects light emitted from the light-emitting element included in the display portion, the light-receiving element can sense the reflected light; thus, it is possible to perform image capturing even in a dark environment and to sense a touch (including a hover touch) of the object.

When a finger, a palm, or the like touches the display portion in the display apparatus of one embodiment of the present invention, an image of the fingerprint or the palm print can be captured. Thus, an electronic device including the display apparatus of one embodiment of the present invention can perform personal authentication by using the captured image of the fingerprint or the palm print. Accordingly, an imaging apparatus for the fingerprint authentication or palm-print authentication does not need to be additionally provided, and the number of components of the electronic device can be reduced. Since the light-receiving elements are arranged in a matrix in the display portion, an image of a fingerprint or a palm print can be captured in any portion in the display portion, which can provide a highly convenient electronic device.

Here, when the light-emitting element has a micro-optical resonator (microcavity) structure, light emitted from the light-emitting layer can be resonated between a pair of electrodes (one electrode and the other electrode) of the light-emitting element. This makes it possible to increase the intensity of light emitted from the light-emitting element. Specifically, the light-emitting element can employ a microcavity structure, for example, by using an electrode having a property of reflecting visible light (a reflective electrode) as one electrode of the light-emitting element and an electrode having properties of transmitting and reflecting visible light (a transflective electrode) as the other electrode of the light-emitting element. For example, in a top-emission display apparatus, the light-emitting element can employ a microcavity structure by using a reflective electrode as a lower electrode (also referred to as a pixel electrode) of the light-emitting element and a transflective electrode as an upper electrode.

Meanwhile, when a transflective electrode is used as an upper electrode of the light-receiving element, for example, part of light emitted toward the active layer of the light-receiving element is reflected by the upper electrode of the light-receiving element and does not enter the active layer of the light-receiving element in some cases. Thus, the light-receiving sensitivity of the light-receiving element may decrease and the imaging sensitivity of the display apparatus may decrease, for example, as compared to the case where all the light emitted toward the active layer of the light-receiving element enters the active layer. Specifically, the imaging sensitivity of the imaging apparatus included in the display apparatus may decrease.

In view of the above, in the display apparatus of one embodiment of the present invention, a transflective electrode is used as the upper electrode of the light-emitting element, and an electrode having a property of transmitting visible light (a transparent electrode) is used as the upper electrode of the light-receiving element, for example. Thus, the light-receiving element can have high light-receiving sensitivity while a microcavity structure is used for the light-emitting element. Consequently, the display apparatus of one embodiment of the present invention can emit light with high color purity and perform image capturing with high sensitivity.

Structure Example 1

FIG. 1 is a schematic top view of a display apparatus 100. The display apparatus 100 includes a plurality of light-emitting elements 110R that emit red light, a plurality of light-emitting elements 110G that emit green light, a plurality of light-emitting elements 110B that emit blue light, and a plurality of light-receiving elements 150. In FIG. 1, light-emitting regions of the light-emitting elements are denoted by R, G, or B to easily differentiate the light-emitting elements. In FIG. 1, light-receiving regions of the light-receiving elements are denoted by S.

In this specification and the like, for example, a description common to the light-emitting elements 110R, 110G, and 110B is sometimes made using the collective term "light-emitting element 110". As for other components that are distinguished from each other using letters of the alphabet, matters common to the components are sometimes described using reference numerals excluding the letters of the alphabet.

The light-emitting elements 110R, the light-emitting elements 110G, the light-emitting elements 110B, and the light-receiving elements 150 are arranged in a matrix. FIG. 1 illustrates a structure in which two types of elements are alternately arranged in one line. Note that the arrangement method of the light-emitting elements is not limited thereto; another method such as a stripe, S-stripe, delta, Bayer, zigzag, pentile, or diamond arrangement can also be employed.

As each of the light-emitting elements 110R, 110G, and 110B, an EL element such as an organic light-emitting diode (OLED) or a quantum-dot light-emitting diode (QLED) is preferably used. Examples of a light-emitting substance included in the EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material).

As the light-receiving element 150, a PN or PIN photodiode (also referred to as PD) can be used, for example. The light-receiving element 150 functions as a photoelectric conversion element that senses light incident on the light-receiving element 150 and generates charge. The amount of generated charge in the photoelectric conversion element is determined depending on the amount of incident light. It is particularly preferable to use an organic photodiode including a layer containing an organic compound as the light-receiving element 150. An organic photodiode, which is easily made thin, lightweight, and large in area and has a high degree of freedom for shape and design, can be used in a variety of apparatuses.

By including the light-receiving elements 150, the display apparatus 100 can capture images. Thus, the display apparatus 100 can function as an image sensor or a touch panel. That is, the display apparatus 100 can take an image in a display portion, for example. Alternatively, the display apparatus 100 can sense an object approaching or touching the display portion. Moreover, the light-emitting elements 110 can be utilized as a light source at the time of receiving light; hence, it is not necessary to provide a light source separately from the display apparatus 100. Consequently, the display apparatus 100 can have high functionality without increasing the number of electronic components.

In the display apparatus 100, when an object reflects light emitted from the light-emitting element 110, the light-receiving element 150 can sense the reflected light. Thus, the display apparatus 100 can capture images even in a dark environment and sense a touch (including a hover touch) of an object.

When a finger, a palm, or the like touches the display portion in the display apparatus 100, an image of the fingerprint or the palm print can be captured. Thus, an electronic device including the display apparatus 100 can perform personal authentication by using the captured image of the fingerprint or the palm print. Accordingly, an imaging apparatus for the fingerprint authentication or palm-print authentication does not need to be additionally provided, and the number of components of the electronic device can be reduced. Since the light-receiving elements 150 are arranged in a matrix in the display portion, an image of a fingerprint or a palm print can be captured in any portion in the display portion. Hence, an electronic device including the display apparatus 100 can be highly convenient.

FIG. 1 illustrates an electrode 111C that is electrically connected to electrodes (anodes or cathodes) of the light-emitting elements 110R, 110G, and 110B and the light-receiving elements 150. FIG. 1 also illustrates an electrode 166. The electrode 166 is electrically connected to an FPC (not illustrated), for example. The electrode 111C and the electrode 166 are also referred to as connection electrodes.

The electrode 111C is supplied with a potential to be supplied to the anodes or the cathodes. The electrode 111C is provided outside the display region where the light-emitting elements 110 and the light-receiving elements 150 are arranged.

The electrode 111C can be provided along the outer periphery of the display region. For example, the electrode 111C may be provided along one side or two or more sides of the outer periphery of the display region. That is, when the display region has a rectangular top surface, the top surface of the electrode 111C can have a band shape, an L shape, a square bracket shape, a frame-like shape, or the like. When the electrode 166 is provided parallel to the electrode 111C, the electrode 166 can be provided beyond the electrode 111C on the outer side of the display region. In other words, the electrode 111C can be provided between the display region and the electrode 166.

Figure 2A:
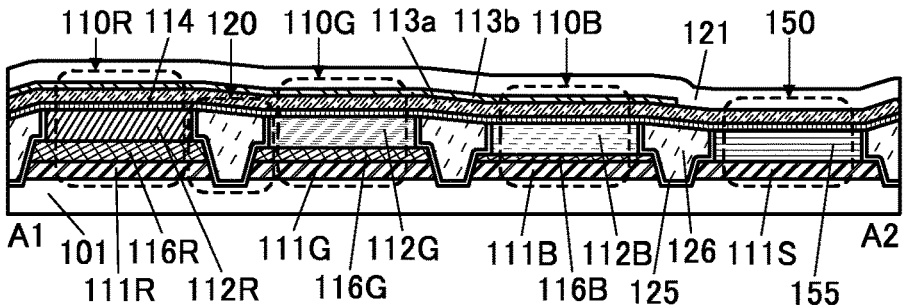
FIGS. 2A to 2D are cross-sectional views each illustrating a structure example of a display apparatus.

FIG. 2A is a schematic cross-sectional view along the dashed-dotted line A1-A2 in FIG. 1. FIG. 2A is a schematic cross-sectional view of the light-emitting element 110R, the light-emitting element 110G, the light-emitting element 110B, and the light-receiving element 150. The light-emitting elements 110 and the light-receiving element 150 are provided over a layer 101 including transistors. The layer 101 including transistors is provided over a substrate (not illustrated).

The layer 101 including transistors can have a stacked-layer structure in which an insulating layer is provided to cover the transistors, for example. Here, as illustrated in FIG. 2A, the layer 101 including transistors may have a recessed portion between the adjacent light-emitting elements 110. The layer 101 including transistors may also have a recessed portion between the light-emitting element 110 and the light-receiving element 150 that are adjacent to each other. For example, an insulating layer positioned on the outermost surface of the layer 101 including transistors may have a recessed portion. Note that in some cases, the layer 101 including transistors does not have a recessed portion between the adjacent light-emitting elements 110 or between the light-emitting element 110 and the light-receiving element 150 that are adjacent to each other.

In the layer 101 including transistors, a pixel circuit, a scan line driver circuit (gate driver), and a signal line driver circuit (source driver), for example, are preferably formed. In addition to the above, an arithmetic circuit, a memory circuit, or the like may be formed.

The light-emitting element 110R includes an electrode 111R, an optical adjustment layer 116R over the electrode 111R, an EL layer 112R over the optical adjustment layer 116R, an organic layer 114 over the EL layer 112R, a transparent electrode 113a over the organic layer 114, and a transflective electrode 113b over the transparent electrode 113a. The light-emitting element 110G includes an electrode 111G, an optical adjustment layer 116G over the electrode 111G, an EL layer 112G over the optical adjustment layer 116G, the organic layer 114 over the EL layer 112G, the transparent electrode 113a over the organic layer 114, and the transflective electrode 113b over the transparent electrode 113a. The light-emitting element 110B includes an electrode 111B, an optical adjustment layer 116B over the electrode 111B, an EL layer 112B over the optical adjustment layer 116B, the organic layer 114 over the EL layer 112B, the transparent electrode 113a over the organic layer 114, and the transflective electrode 113b over the transparent electrode 113a. The light-receiving element 150 includes an electrode 111S, a PD layer 155 over the electrode 111S, the organic layer 114 over the PD layer 155, and the transparent electrode 113a over the organic layer 114.

The visible light transmittance of the transparent electrode 113a is higher than that of the transflective electrode 113b. The visible light reflectivity of the transparent electrode 113a is lower than that of the transflective electrode 113b. Specifically, the visible light transmittance of the transparent electrode 113a is higher than or equal to 40%. The visible light reflectivity of the transflective electrode 113b is higher than or equal to 10% and less than or equal to 95%, preferably higher than or equal to 30% and lower than or equal to 80%. Note that in the case where the light-emitting elements 110 emit near-infrared light (light with a wavelength greater than or equal to 750 nm and less than or equal to 1300 nm), the near-infrared light transmittance and reflectivity of these electrodes preferably satisfy the above-described numerical ranges of the visible light transmittance and reflectivity.

The visible light or near-infrared light transmittance of the optical adjustment layer 116 can be a visible light or near-infrared light transmittance that the transparent electrode 113a can have. The visible light or near-infrared light transmittance of the optical adjustment layer 116 can be higher than that of the electrode 111. The visible light or near-infrared light reflectivity of the optical adjustment layer 116 can be a visible light or near-infrared light reflectivity that the transparent electrode 113a can have. The visible light or near-infrared light reflectivity of the optical adjustment layer 116 can be lower than that of the electrode 111.

Here, the electrode 111 can be referred to as a lower electrode or a pixel electrode. Alternatively, the electrode 111 and the optical adjustment layer 116 may be collectively referred to as a lower electrode or a pixel electrode. The transparent electrode 113a and the transflective electrode 113b can be referred to as an upper electrode or an opposite electrode. In some cases, the electrode 111 is an upper electrode, and the transparent electrode 113a and the transflective electrode 113b are a lower electrode. Note that the optical adjustment layer 116 can also be referred to as an electrode.

Since the transparent electrode 113a and the organic layer 114 are shared by the light-emitting elements 110 and the light-receiving element 150 in the example illustrated in FIG. 2A, the transparent electrode 113a and the organic layer 114 can be referred to as a common electrode and a common layer, respectively.

Note that the name "organic layer" implies a layer included in an organic EL element or an organic photoelectric conversion element, and an organic layer does not always need to contain an organic compound.

The EL layer 112R included in the light-emitting element 110R contains a light-emitting organic compound that emits light with intensity at least in a red wavelength range. The EL layer 112G included in the light-emitting element 110G contains a light-emitting organic compound that emits light with intensity at least in a green wavelength range. The EL layer 112B included in the light-emitting element 110B contains a light-emitting organic compound that emits light with intensity at least in a blue wavelength range. A layer that is included in the EL layer 112 and contains a light-emitting organic compound can be referred to as a light-emitting layer. Note that the display apparatus 100 may include an EL layer 112 that emits light with intensity in an infrared wavelength range.

The PD layer 155 included in the light-receiving element 150 contains a photoelectric conversion material having sensitivity to visible light or infrared light. A wavelength range to which the photoelectric conversion material contained in the PD layer 155 is sensitive preferably includes one or more of the wavelength range of light emitted from the light-emitting element 110R, the wavelength range of light emitted from the light-emitting element 110G, and the wavelength range of light emitted from the light-emitting element 110B. Alternatively, a photoelectric conversion material having sensitivity to infrared light, which has a longer wavelength than light emitted from the light-emitting element 110R, may be used. A layer that is included in the PD layer 155 and contains a photoelectric conversion material can be referred to as an active layer or a photoelectric conversion layer.

In this specification and the like, visible light refers to light with a wavelength greater than or equal to 400 nm and less than 750 nm, for example, and infrared light refers to light with a wavelength greater than or equal to 750 nm, for example.

The EL layer 112 includes at least a light-emitting layer. In addition to a light-emitting layer, the EL layer 112 can include one or more of a hole-injection layer, a hole-transport layer, a hole-blocking layer, an electron-blocking layer, an electron-transport layer, and an electron-injection layer. For example, the EL layer 112 can have a structure in which a hole-injection layer, a hole-transport layer, a light-emitting layer, and an electron-transport layer are stacked in this order from the electrode 111 side. Alternatively, the EL layer 112 can have a structure in which an electron-injection layer, an electron-transport layer, a light-emitting layer, and a hole-transport layer are stacked in this order from the electrode 111 side.

The PD layer 155 includes at least an active layer. In addition to an active layer, the PD layer 155 can include one or more of a hole-transport layer, a hole-blocking layer, an electron-blocking layer, and an electron-transport layer. For example, the PD layer 155 can have a structure in which a hole-transport layer, an active layer, and an electron-transport layer are stacked in this order from the electrode 111 side. Alternatively, the PD layer 155 can have a structure in which an electron-transport layer, an active layer, and a hole-transport layer are stacked in this order from the electrode 111 side. That is, the PD layer 155 can have a structure without an electron-injection layer and a hole-injection layer.

The organic layer 114 can be an electron-injection layer or a hole-injection layer. In the case where the organic layer 114 includes an electron-injection layer, the EL layer 112 does not need to include an electron-injection layer; in the case where the organic layer 114 includes a hole-injection layer, the EL layer 112 does not need to include a hole-injection layer. Here, for the organic layer 114, a material with as low electric resistance as possible is preferably used. Alternatively, it is preferable to form the organic layer 114 as thin as possible, in which case the electric resistance of the organic layer 114 in the thickness direction can be reduced. For example, the thickness of the organic layer 114 is preferably greater than or equal to 1 nm and less than or equal to 5 nm, further preferably greater than or equal to 1 nm and less than or equal to 3 nm.

Note that the organic layer 114 may include a hole-transport layer, a hole-blocking layer, an electron-blocking layer, or an electron-transport layer. In other words, the organic layer 114 can include at least one of a hole-injection layer, a hole-transport layer, a hole-blocking layer, an electron-blocking layer, an electron-transport layer, and an electron-injection layer. A structure is obtained in which the layer included in the organic layer 114 is not included in the EL layer 112 and the PD layer 155.

Here, the function of the organic layer 114 in the light-emitting element 110 may be different from the function of the organic layer 114 in the light-receiving element 150. For example, the organic layer 114 can have a function of an electron-injection layer or a hole-injection layer in the light-emitting element 110, and can have a function of an electron-transport layer or a hole-transport layer in the light-receiving element 150.

The optical adjustment layer 116 is a conductive layer having a property of transmitting visible light and has a function of adjusting the optical path length of light emitted from the EL layer 112. For example, when the display apparatus 100 is a top-emission display apparatus, the electrode 111, which can serve as the lower electrode of the light-emitting element 110, includes an electrode having a property of reflecting visible light, and the upper electrode of the light-emitting element 110 includes an electrode having properties of transmitting and reflecting visible light (a transflective electrode). When the light-emitting element 110 has such a structure, the optical adjustment layer 116R has a function of adjusting the optical path length of light emitted from the EL layer 112R. The optical adjustment layer 116G has a function of adjusting the optical path length of the light emitted from the EL layer 112G. The optical adjustment layer 116B has a function of adjusting the optical path length of light emitted from the EL layer 112B. Accordingly, varying the thicknesses of the optical adjustment layers 116R, 116G, and 116B makes the optical path lengths of light emitted from the EL layers 112R, 112G, and 112B different from each other. For example, the optical adjustment layer 116R is made thicker than the optical adjustment layer 116G, and the optical adjustment layer 116G is made thicker than the optical adjustment layer 116B.

The light-emitting element 110 having the above structure can have a micro-optical resonator (microcavity) structure in which light emitted from the EL layer 112 is resonated between the lower electrode and the upper electrode. Thus, light with a specific wavelength can be intensified, so that the display apparatus 100 can have high color purity. For example, the light-emitting element 110R can emit light whose red range of a spectrum is enhanced; the light-emitting element 110G can emit light whose green range of a spectrum is enhanced; and the light-emitting element 110B can emit light whose blue range of a spectrum is enhanced.

Note that the light-emitting element 110 may include no optical adjustment layer 116. In that case, for example, varying the thicknesses of the EL layers 112R, 112G, and 112B enables the light-emitting elements 110 to have a microcavity structure. For example, by varying the thickness of the layer other than the light-emitting layer included in the layer 112 between the EL layers 112R, 112G, and 112B, the thicknesses of the EL layers 112R, 112G, and 112B can be different from each other. Specifically, for example, the thickness of at least one of a hole-injection layer, a hole-transport layer, a hole-blocking layer, an electron-blocking layer, an electron-transport layer, and an electron-injection layer can vary between the EL layers 112R, 112G, and 112B.

Meanwhile, when a transflective electrode is used as the upper electrode of the light-receiving element 150, for example, part of light emitted toward the PD layer 155 of the light-receiving element 150 is reflected by the upper electrode of the light-receiving element 150 and does not enter the active layer of the light-receiving element 150 in some cases. Thus, the light-receiving sensitivity of the light-receiving element 150 may decrease and the imaging sensitivity of the display apparatus 100 may decrease, for example, as compared to the case where all the light emitted toward the PD layer 155 enters the PD layer 155. Specifically, the imaging sensitivity of the imaging apparatus included in the display apparatus 100 may decrease.

In view of the above, in the example illustrated in FIG. 2A, the upper electrode of the light-emitting element 110 has a stacked-layer structure of the transparent electrode 113a, which is a visible light-transmitting electrode, and the transflective electrode 113b. That is, the transparent electrode 113a and the transflective electrode 113b have a region overlapping the EL layer 112. Meanwhile, the upper electrode of the light-receiving element 150 is the transparent electrode 113a. Specifically, the PD layer 155 has a region that is not overlapped by the transflective electrode 113b, preferably has no region overlapped by the transflective electrode 113b. Accordingly, the imaging sensitivity of the display apparatus 100, specifically, the imaging sensitivity of the imaging apparatus included in the display apparatus 100 can be increased, as compared to the case where the PD layer 155 is overlapped by the transflective electrode 113b. Thus, in the display apparatus 100, the light-receiving element 150 can have high light-receiving sensitivity while a microcavity structure is used for the light-emitting element 110. Consequently, the display apparatus 100 can emit light with high color purity and perform image capturing with high sensitivity.

A metal material can be used for the electrode 111, for example. For instance, for the electrode 111, it is possible to use a metal material such as gold, silver, platinum, magnesium, nickel, tungsten, chromium, molybdenum, iron, cobalt, copper, palladium, or titanium or an alloy material containing any of these metal materials (e.g., an alloy of silver and magnesium). Alternatively, a nitride of the metal material (e.g., titanium nitride) or the like may be used for the electrode 111.

For the optical adjustment layer 116 and the transparent electrode 113a, a conductive oxide such as indium oxide, indium tin oxide, indium zinc oxide, zinc oxide, zinc oxide containing gallium, indium tin oxide containing silicon, or indium zinc oxide containing silicon can be used, for example. Graphene may also be used for the optical adjustment layer 116.

As the transflective electrode 113b, a layer of a metal material that is made thin enough to have a light-transmitting property can be used, for example. For instance, a metal material such as gold, silver, platinum, magnesium, nickel, tungsten, chromium, molybdenum, iron, cobalt, copper, palladium, or titanium or an alloy material containing any of the above metal materials (e.g., an alloy of silver and magnesium) can be used for the transflective electrode 113b. A nitride of the metal material (e.g., titanium nitride) or the like may also be used for the transflective electrode 113b.

In the example illustrated in FIG. 2A, the transparent electrode 113a is shared by the light-emitting elements 110 and the light-receiving element 150, and the transflective electrode 113b is shared by the light-emitting elements 110. For example, in the case where the transparent electrode 113a is shared by the light-emitting elements 110, the transflective electrode 113b can have a region in contact with the transparent electrode 113a.

A protective layer 121 is provided over the transparent electrode 113a and the transflective electrode 113b to cover the light-emitting elements 110 and the light-receiving element 150. The protective layer 121 has a function of preventing diffusion of impurities such as water into the light-emitting elements 110 and the light-receiving element 150 from the above.

An insulating layer 125 and an insulating layer 126 are provided in regions 120 between the light-emitting element 110 and the light-receiving element 150 that are adjacent to each other and between the two adjacent light-emitting elements 110. For example, the insulating layer 125 and the insulating layer 126 are provided between the EL layer 112 and the PD layer 155 that are adjacent to each other, between the adjacent EL layers 112, between the adjacent optical adjustment layers 116, and between the adjacent electrodes 111. The insulating layer 125 is provided along the side surfaces of the electrode 111, the optical adjustment layer 116, the EL layer 112, and the PD layer 155, for example, and along the top surface of the layer 101 including transistors. The insulating layer 126 is provided over the insulating layer 125 and has a function of filling a recessed portion in the region 120 and planarizing the top surface. Filling the recessed portion in the region 120 with the insulating layer 126 can improve coverage with the transparent electrode 113a and the transflective electrode 113b.

The insulating layer 125 and the insulating layer 126 have an effect of preventing a short circuit between the electrode 111 and each of the transparent electrode 113a and the transflective electrode 113b. The insulating layer 126 has an effect of improving adhesion of the organic layer 114. That is, providing the insulating layer 126 improves adhesion of the organic layer 114, so that separation of the organic layer 114 can be suppressed.

The insulating layer 125 is provided in contact with the side surface of the EL layer 112, thereby preventing the EL layer 112 and the insulating layer 126 from being in contact with each other. If the EL layer 112 and the insulating layer 126 are in contact with each other, the EL layer 112 might be dissolved by an organic solvent contained in the insulating layer 126, for example, particularly when the EL layer 112 contains an organic compound. Thus, providing the insulating layer 125 between the EL layer 112 and the insulating layer 126 as illustrated in FIG. 2A can protect the side surface of the EL layer 112. In addition, the insulating layer 125 is provided in contact with the side surface of the PD layer 155. Accordingly, the side surface of the PD layer 155 can be protected as well as the side surface of the EL layer 112. Note that the region 120 can have any structure that allows division of one or more of a hole-injection layer, a hole-transport layer, an electron-blocking layer, a light-emitting layer, an active layer, a hole-blocking layer, an electron-transport layer, and an electron-injection layer.

The insulating layer 125 can contain an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. An inorganic insulating film such as an aluminum oxide film, a hafnium oxide film, or a silicon oxide film is formed by an atomic layer deposition (ALD) method as the insulating layer 125, whereby the insulating layer 125 can have few pinholes and an excellent function of protecting the EL layer 112 and the PD layer 155.

Note that in this specification and the like, oxynitride refers to a material that contains more oxygen than nitrogen, and nitride oxide refers to a material that contains more nitrogen than oxygen. For example, silicon oxynitride refers to a material that contains oxygen at a higher proportion than nitrogen, and silicon nitride oxide refers to a material that contains nitrogen at a higher proportion than oxygen.

The insulating layer 125 can be formed by a sputtering method, a chemical vapor deposition (CVD) method, a pulsed laser deposition (PLD) method, an ALD method, or the like. The insulating layer 125 is preferably formed by an ALD method achieving good coverage.

The insulating layer 126 can contain an organic material. For example, the insulating layer 126 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. In the case of containing a resin, the insulating layer 126 can be referred to as a resin layer.

The insulating layer 126 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

For the insulating layer 126, a photosensitive resin can be used. A photoresist may be used as the photosensitive resin. The photosensitive resin can be of positive or negative type.

The insulating layer 126 may be formed using a colored material (e.g., a material containing a black pigment) to have a function of blocking stray light from adjacent pixels and preventing color mixing.

A reflective film (e.g., a metal film containing one or more of silver, palladium, copper, titanium, aluminum, and the like) may be provided between the insulating layer 125 and the insulating layer 126 so that light emitted from the light-emitting layer is reflected by the reflective film; hence, the display apparatus 100 may be provided with a function of increasing the light extraction efficiency.

The protective layer 121 can have, for example, a single-layer structure or a stacked-layer structure including at least an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, the organic insulating film preferably functions as a planarization film. With this structure, the top surface of the organic insulating film can be flat, and accordingly, coverage with the inorganic insulating film over the organic insulating film is improved, leading to an improvement in barrier properties. Since the top surface of the protective layer 121 is flat, in the case where a component (e.g., a color filter, an electrode of a touch sensor, or a lens array) is provided above the protective layer 121, the component is less affected by an uneven shape caused by the lower structure, which is preferable.

Figure 2B:
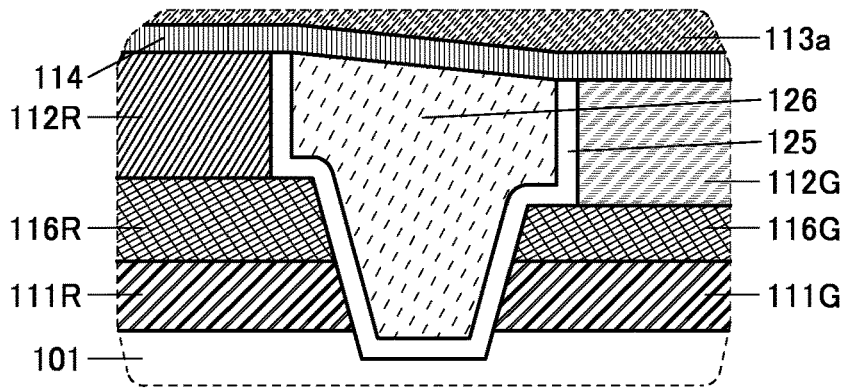

FIG. 2B is an enlarged view of the region 120 and a periphery of the region 120 in FIG. 2A. As illustrated in FIG. 2B, an end portion of the EL layer 112 can be positioned on the inner side relative to an end portion of the electrode 111 and an end portion of the optical adjustment layer 116.

As illustrated in FIG. 2B, the end portions of the electrode 111 and the optical adjustment layer 116 can have a tapered shape. Thus, coverage with the insulating layer 125 provided along the end portions of the electrode 111 and the optical adjustment layer 116 can be improved. Moreover, a foreign substance (also referred to as dust or particles, for example) generated during the manufacturing process of the display apparatus 100 can be favorably removed by treatment such as cleaning. Note that the end portion of the optical adjustment layer 116 does not necessarily have a tapered shape. In some cases, neither the end portion of the optical adjustment layer 116 nor the end portion of the electrode 111 has a tapered shape.

In this specification and the like, a tapered shape refers to a shape such that at least part of a side surface of a component is inclined with respect to the substrate surface. For example, a tapered shape preferably includes a region where the angle between the inclined side surface and the substrate surface (such an angle is also referred to as a taper angle) is less than 90°.

Although FIG. 2B shows an example in which the end portion of the optical adjustment layer 116 is aligned with the end portion of the electrode 111, the end portion of the optical adjustment layer 116 does not have to be aligned with the end portion of the electrode 111. The end portion of the optical adjustment layer 116 may be positioned on the inner side or the outer side relative to the end portion of the electrode 111. In the case where the end portion of the optical adjustment layer 116 is positioned on the outer side relative to the end portion of the electrode 111, the optical adjustment layer 116 can cover the end portion of the electrode 111.

Figure 2C:
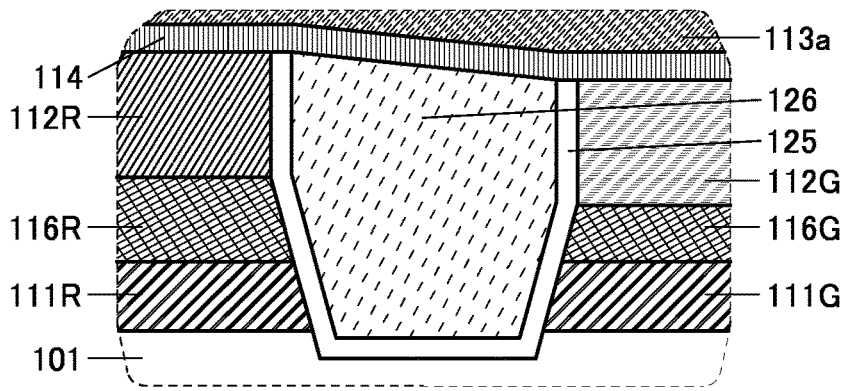
Figure 2D:
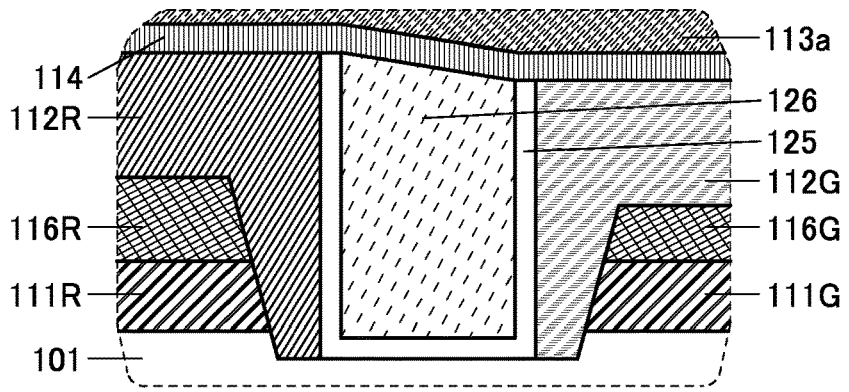

FIGS. 2C and 2D show variation examples of the structure illustrated in FIG. 2B. FIG. 2C illustrates an example in which the end portion of the EL layer 112 is aligned or substantially aligned with an end portion of the top surface of the optical adjustment layer 116. FIG. 2D illustrates an example in which the end portion of the EL layer 112 is positioned on the outer side relative to the end portion of the optical adjustment layer 116 and the end portion of the electrode 111. In FIG. 2D, the EL layer 112 is provided to cover the end portions of the electrode 111 and the optical adjustment layer 116.

In the case where end portions are aligned or substantially aligned with each other and the case where top surface shapes are the same or substantially the same, the outlines of the stacked layers overlap each other at least partly in the top view. For example, the case of patterning or partly patterning an upper layer and a lower layer with the use of the same mask pattern is included. In some cases, the outlines do not exactly coincide with each other and the edge of the upper layer is positioned on the inner side or the outer side of the edge of the lower layer; such a case is also expressed as "end portions are substantially aligned" or "top surface shapes are substantially the same".

Figure 3A:
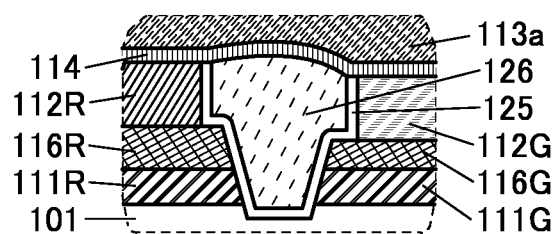
FIGS. 3A to 3E are cross-sectional views each illustrating a structure example of a display apparatus.

FIGS. 3A to 3E show variation examples of the structure illustrated in FIG. 2B. In the structure illustrated in FIG. 3A, the top surface of the insulating layer 126 includes a region that is higher in height than the top surfaces of the EL layers 112 on the opposite sides. As illustrated in FIG. 3A, the top surface of the insulating layer 126 can have a shape such that the middle and its vicinity bulge (i.e., a shape with a convex curved surface) in the cross-sectional view.

Figure 3B:
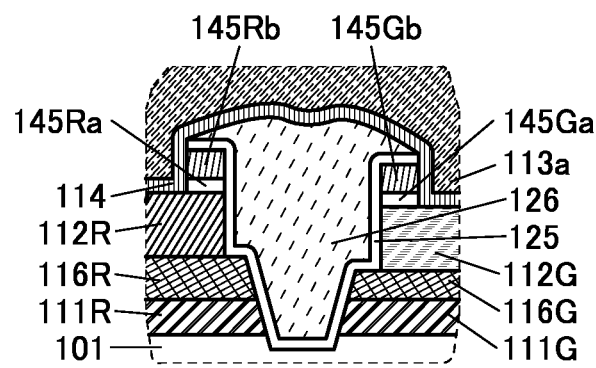

In FIG. 3B, the top surface of the insulating layer 126 bulges slightly toward the middle (i.e., the top surface of the insulating layer 126 has a convex curved surface) and also has a shape such that the middle and its vicinity are recessed (i.e., a concave curved surface) in the cross-sectional view. The display apparatus 100 having the structure illustrated in FIG. 3B includes at least one of a sacrificial layer 145a and a sacrificial layer 145b that will be described later; the insulating layer 126 has a region that is higher in height than the top surface of the EL layer 112; and the region is positioned over at least one of the sacrificial layers 145a and 145b. The insulating layer 125 is provided between the insulating layer 126 and at least one of the sacrificial layers 145a and 145b. Note that the insulating layer 125 does not have to be provided between the insulating layer 126 and at least one of the sacrificial layers 145a and 145b.

In this specification and the like, a sacrificial layer may be referred to as a mask layer, and a sacrificial film may be referred to as a mask film.

Figure 3C:
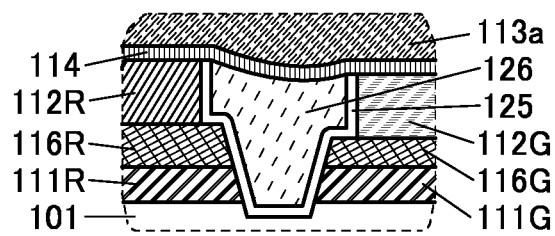

In FIG. 3C, the top surface of the insulating layer 126 includes a region that is lower in height than the top surfaces of the EL layers 112 on the opposite sides. Moreover, the top surface of the insulating layer 126 has a shape such that the middle and its vicinity are recessed (i.e., a shape with a concave curved surface) in the cross-sectional view.

Figure 3D:
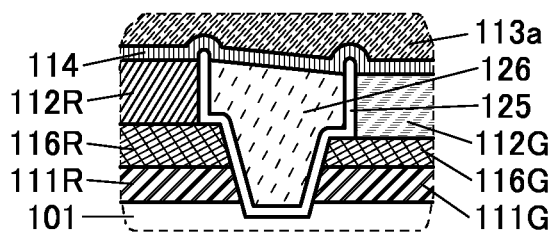

In FIG. 3D, the top surface of the insulating layer 125 includes a region that is higher in height than the top surface of the EL layer 112. That is, the insulating layer 125 protrudes from the formation surface of the organic layer 114 and forms a projection.

For example, when the insulating layer 125 is formed so that its height is equal to or substantially equal to the height of the after-mentioned sacrificial layer, the insulating layer 125 may protrude as illustrated in FIG. 3D.

Figure 3E:
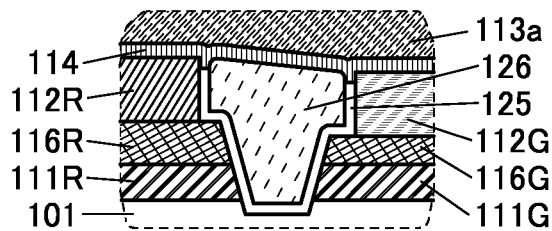

In FIG. 3E, the top surface of the insulating layer 125 includes a region that is lower in height than the top surface of the EL layer 112. That is, on the formation surface of the organic layer 114, a recessed portion is formed at the position overlapping the insulating layer 125.

As described above, the insulating layer 125 and the insulating layer 126 can have a variety of shapes.

Figure 4A:
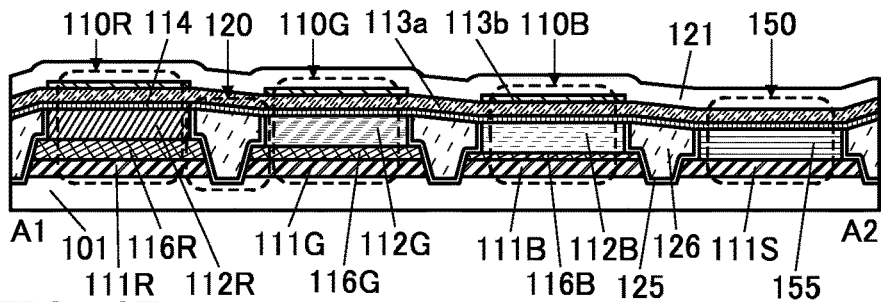
FIGS. 4A to 4E are cross-sectional views each illustrating a structure example of a display apparatus.
Figure 4B:
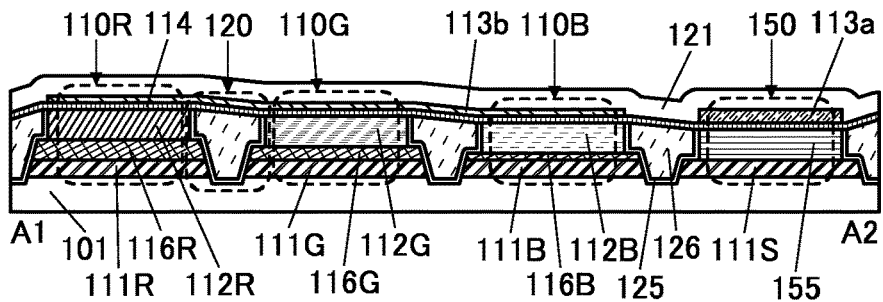

FIGS. 4A and 4B show variation examples of the structure illustrated in FIG. 2A. FIG. 4A illustrates a structure example in which the transflective electrode 113b is provided separately in each light-emitting element 110 instead of being provided to be shared by the light-emitting elements 110. FIG. 4B illustrates a structure example in which the transparent electrode 113a does not serve as the upper electrode of the light-emitting element 110. In the example in FIG. 4B, for instance, the transparent electrode 113a does not overlap the EL layer 112, and the transflective electrode 113b is not in contact with the transparent electrode 113a.

Figure 4C:
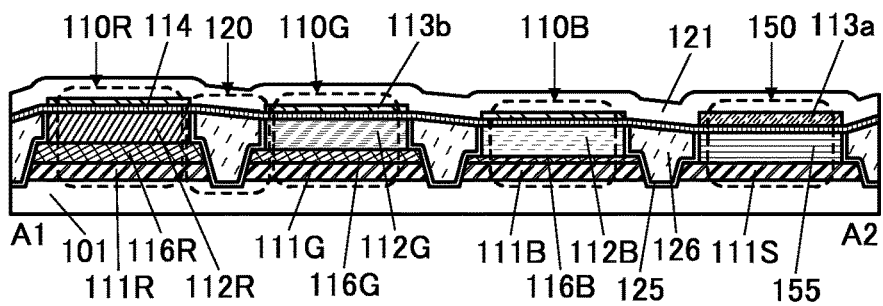
Figure 4D:
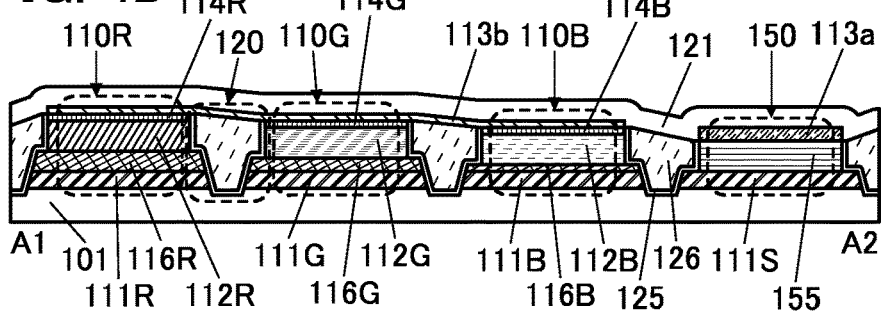

FIGS. 4C and 4D show variation examples of the structure illustrated in FIG. 4B. FIG. 4C illustrates a structure example in which the transflective electrode 113b is provided separately in each light-emitting element 110 instead of being provided to be shared by the light-emitting elements 110. FIG. 4D illustrates a structure example in which the organic layer 114 is provided separately in each light-emitting element 110 instead of being provided to be shared by the light-emitting elements 110 and the light-receiving element 150. That is, FIG. 4D illustrates an example in which the organic layer 114 is not formed as a common layer. In this case, the organic layer 114 that can serve as an electron-injection layer or a hole-injection layer, for example, is not provided in the light-receiving element 150.

In the case where the organic layer 114 is provided separately in each light-emitting element 110, the organic layer 114 provided in the light-emitting element 110R is referred to as an organic layer 114R, the organic layer 114 provided in the light-emitting element 110G as an organic layer 114G, and the organic layer 114 provided in the light-emitting element 110B as an organic layer 114B, for example.

Figure 4E:
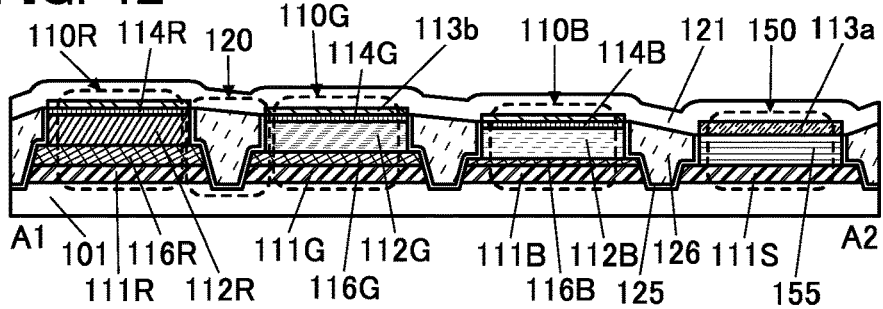

FIG. 4E illustrates a variation example of the structure in FIG. 4D, in which the transflective electrode 113b is provided separately in each light-emitting element 110 instead of being provided to be shared by the light-emitting elements 110.

With the structure where the transparent electrode 113a is not provided over the EL layer 112 as illustrated in FIGS. 4B to 4E, the conductivity of the upper electrode of the light-emitting element 110 can be increased when the electric resistance of the transparent electrode 113a is higher than that of the transflective electrode 113b. On the other hand, in the structure where the transparent electrode 113a is provided over the EL layer 112, the transparent electrode 113a can be used as a common electrode; thus, the process for forming the transparent electrode 113a can be simplified.

Figure 5A:
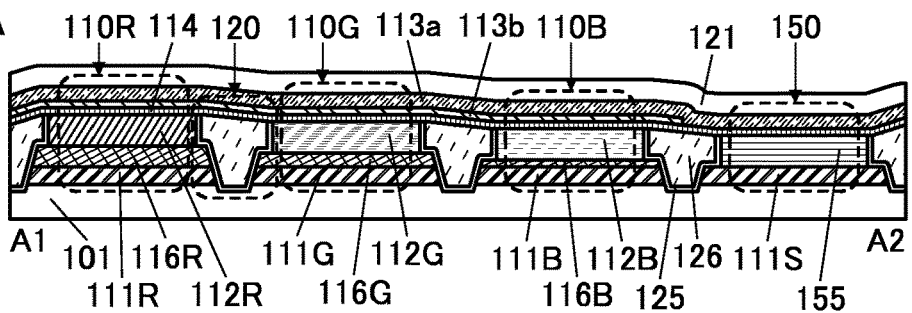
FIGS. 5A to 5E are cross-sectional views each illustrating a structure example of a display apparatus.

FIG. 5A illustrates a variation example of the structure in FIG. 2A, in which the transflective electrode 113b is provided over the organic layer 114 and the transparent electrode 113a is provided over the transflective electrode 113b and the organic layer 114. That is, FIG. 5A illustrates a structure example in which the stacking order of the transparent electrode 113a and the transflective electrode 113b is reversed from that in the example in FIG. 2A.

For example, the optical path length in the light-emitting element 110 differs between the structure where the transflective electrode 113b is provided over the transparent electrode 113a as in FIG. 2A and the like and the structure where the transparent electrode 113a is provided over the transflective electrode 113b as in FIG. 5A and the like. Specifically, in the structure where the transflective electrode 113b is provided over the transparent electrode 113a as in FIG. 2A and the like, the optical path length is longer by the thickness of the transparent electrode 113a than that in the structure where the transparent electrode 113a is provided over the transflective electrode 113b as in FIG. 5A and the like.

Figure 5B:
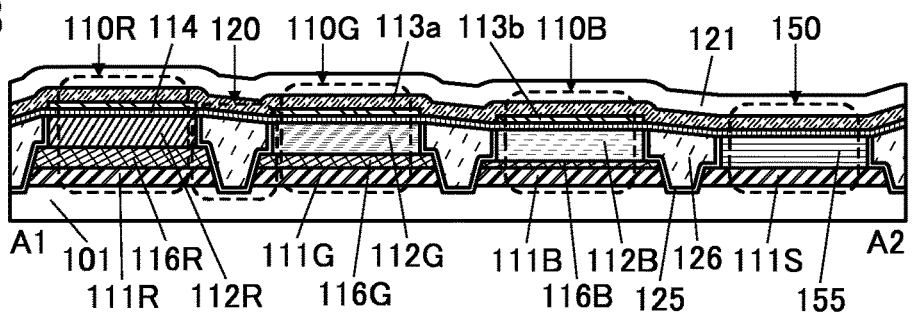
Figure 5C:
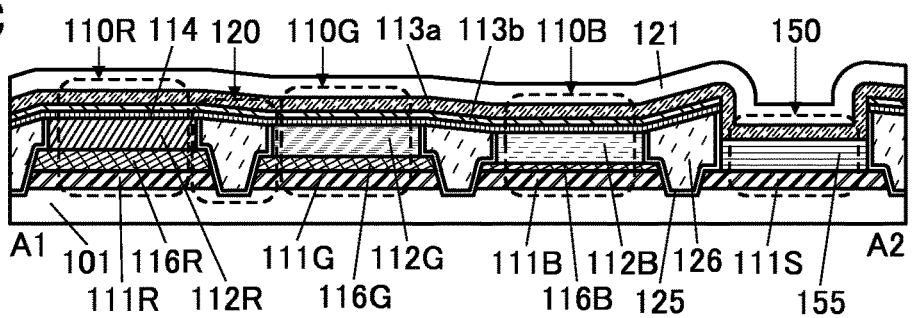

FIGS. 5B and 5C show variation examples of the structure illustrated in FIG. 5A. FIG. 5B illustrates a structure example in which the transflective electrode 113b is provided separately in each light-emitting element 110 instead of being provided to be shared by the light-emitting elements 110. FIG. 5C illustrates a structure example in which the organic layer 114 is not provided in the light-receiving element 150. Although the details will be described later, FIG. 5C illustrates an example in which the shapes of the insulating layers 125 and 126 and the like provided between the light-emitting element 110 and the light-receiving element 150 are different from those illustrated in FIG. 5A because of the manufacturing process of the display apparatus 100.

Figure 5D:
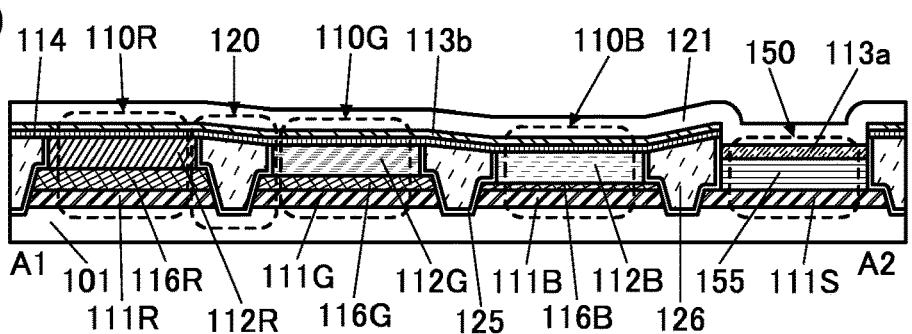

FIG. 5D illustrates a variation example of the structure in FIG. 5C, in which the transflective electrode 113b is not in contact with the transparent electrode 113a. In the example in FIG. 5D, the transparent electrode 113a does not serve as the upper electrode of the light-emitting element 110.

Figure 5E:
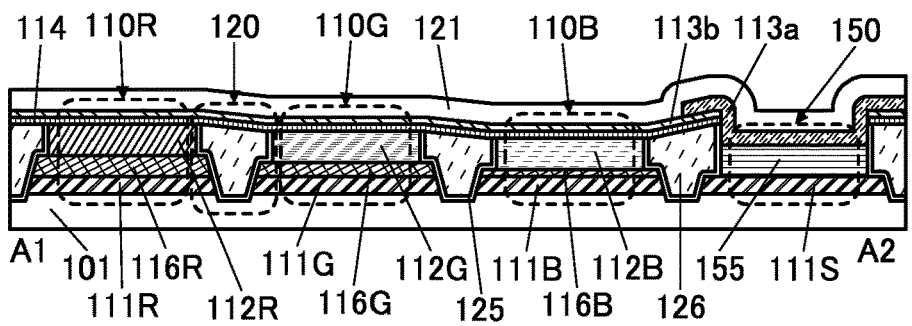

FIG. 5E illustrates a variation example of the structure in FIG. 5D, in which the transflective electrode 113b includes a region in contact with the transparent electrode 113a. In the example in FIG. 5E, the transflective electrode 113b is in contact with the transparent electrode 113a over part of the insulating layer 125 and part of the insulating layer 126. Also in the structure in FIG. 5E, the transparent electrode 113a does not serve as the upper electrode of the light-emitting element 110 when the transparent electrode 113a does not overlap the EL layer 112.

As described above, with the structure where the transparent electrode 113a is not provided over the EL layer 112, the conductivity of the upper electrode of the light-emitting element 110 can be increased when the electric resistance of the transparent electrode 113a is higher than that of the transflective electrode 113b. On the other hand, in the structure where the transparent electrode 113a is provided over the EL layer 112, the transparent electrode 113a can be used as a common electrode; thus, the process for forming the transparent electrode 113a can be simplified.

Figure 6A:
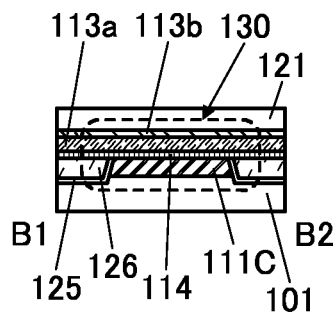
FIGS. 6A to 6L are cross-sectional views each illustrating a structure example of a display apparatus.

FIG. 6A is a schematic cross-sectional view along the dashed-dotted line B1-B2 in FIG. 1, and illustrates a connection portion 130 where the electrode 111C is electrically connected to the transparent electrode 113a and the transflective electrode 113b. In the connection portion 130 in FIG. 6A, the electrode 111C is provided over the layer 101 including transistors. The insulating layer 125 is provided over the layer 101 including transistors so as to be in contact with the side surface of the electrode 111C, and the insulating layer 126 is provided over the insulating layer 125. The organic layer 114, the transparent electrode 113a, the transflective electrode 113b, and the protective layer 121 are stacked in this order over the electrode 111C, the insulating layer 125, and the insulating layer 126.

In the case where the electric resistance of the organic layer 114 in the thickness direction is small enough to be negligible, electrical continuity between the electrode 111C and the transparent electrode 113a can be maintained even when the organic layer 114 is provided between the electrode 111C and the transparent electrode 113a. When the organic layer 114 is provided also in the connection portion 130 to serve as a common layer, the organic layer 114 can be formed, for example, without using a metal mask such as a mask for specifying a film formation area (also referred to as an area mask or a rough metal mask to be distinguished from a fine metal mask). Thus, the manufacturing process of the display apparatus 100 can be simplified.

Figure 6B:
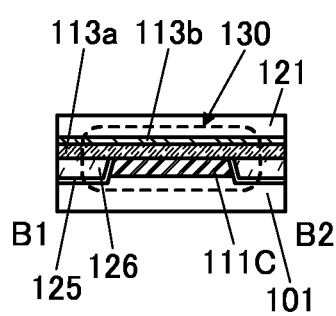
Figure 6C:
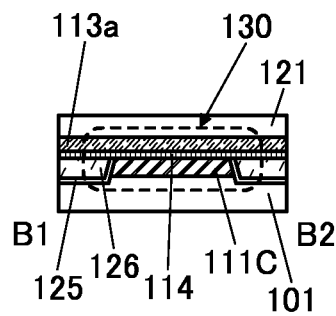
Figure 6D:
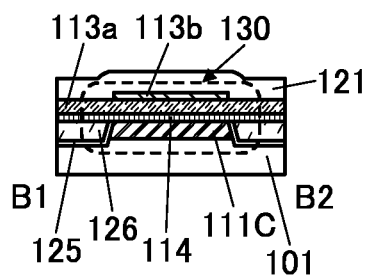

FIGS. 6B to 6D show variation examples of the structure illustrated in FIG. 6A. FIG. 6B illustrates a structure example in which the organic layer 114 is not provided in the connection portion 130. In the example in FIG. 6B, the electrode 111C and the transparent electrode 113a can be in contact with each other. Thus, electric resistance between the electrode 111C and the transparent electrode 113a can be decreased.

FIG. 6C illustrates a structure example in which the transflective electrode 113b is not provided in the connection portion 130. FIG. 6D illustrates a structure example in which the transflective electrode 113b is patterned in the connection portion 130.

Figure 6E:
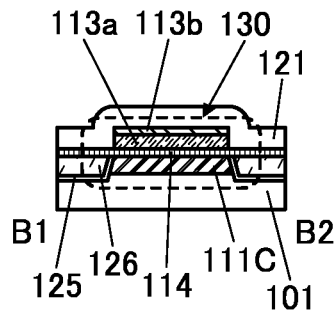
Figure 6F:
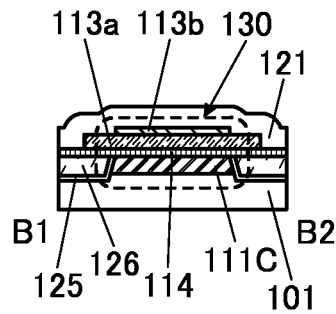

FIG. 6E illustrates a variation example of the structure in FIG. 6D, in which both the transparent electrode 113a and the transflective electrode 113b are patterned in the connection portion 130 and the end portion of the transparent electrode 113a is aligned with the end portion of the transflective electrode 113b. FIG. 6F illustrates a variation example of the structure in FIG. 6E, in which the end portion of the transparent electrode 113a is positioned on the outer side relative to the end portion of the transflective electrode 113b.

Figure 6G:
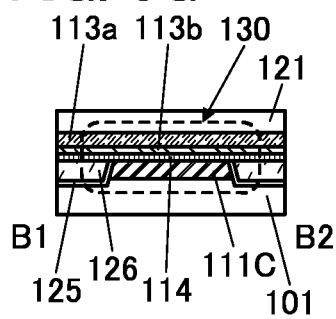
Figure 6H:
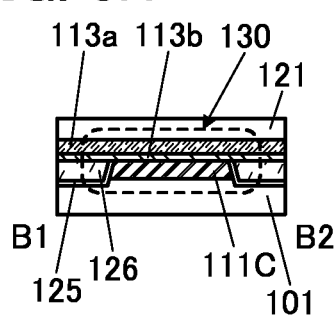
Figure 6I:
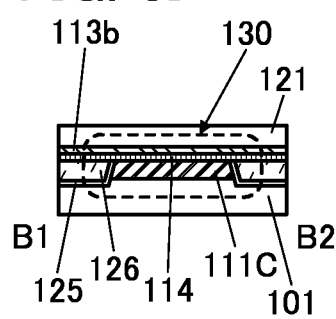
Figure 6J:
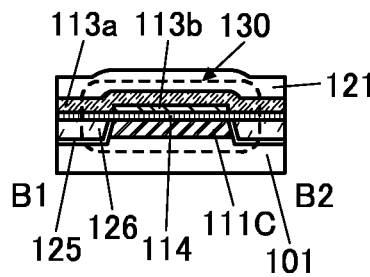
Figure 6K:
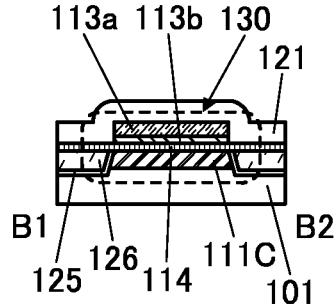
Figure 6L:
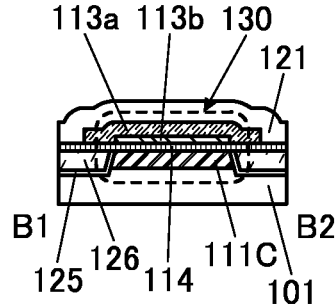

FIGS. 6G and 6H illustrate structures in which the stacking order of the transparent electrode 113a and the transflective electrode 113b in the connection portion 130 in FIGS. 6A and 6B is reversed. FIG. 6I illustrates a variation example of the structure in FIG. 6G, in which the transparent electrode 113a is not provided in the connection portion 130. FIGS. 6J, 6K, and 6L illustrate structures in which the stacking order of the transparent electrode 113a and the transflective electrode 113b in the connection portion 130 in FIGS. 6D, 6E, and 6F is reversed.

Figure 7A:
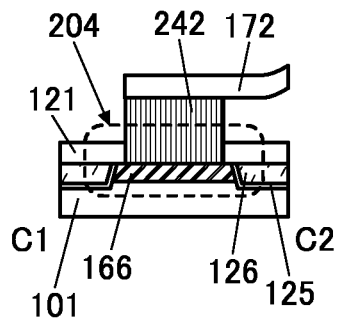
FIGS. 7A to 7H are cross-sectional views each illustrating a structure example of a display apparatus.

FIG. 7A is a schematic cross-sectional view along the dashed-dotted line C1-C2 in FIG. 1, and illustrates a connection portion 204 where the electrode 166 is electrically connected to an FPC 172 through a connection layer 242.

In the connection portion 204 in FIG. 7A, the electrode 166 is provided over the layer 101 including transistors. The insulating layer 125 is provided over the layer 101 including transistors so as to be in contact with the side surface of the electrode 166, and the insulating layer 126 is provided over the insulating layer 125. The protective layer 121 is provided over the electrode 166, the insulating layer 125, and the insulating layer 126. The protective layer 121 has an opening portion, and the connection layer 242 is provided so as to have a region embedded in the opening portion. Note that the protective layer 121 does not necessarily overlap the electrode 166 and does not necessarily overlap the insulating layer 125. The connection layer 242 may include a region overlapping the insulating layer 125 and/or a region overlapping the insulating layer 126.

Note that the connection portion 204 may be included or not be included in the display apparatus 100. In the case where the connection portion 204 is not included in the display apparatus 100, the display apparatus 100 and the connection portion 204 can be collectively referred to as a display module or a display panel.

Figure 7B:
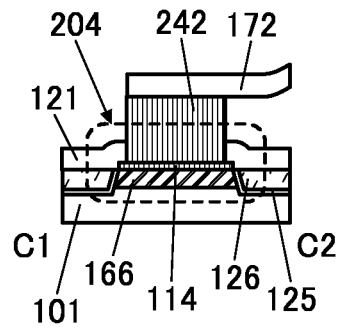
Figure 7C:
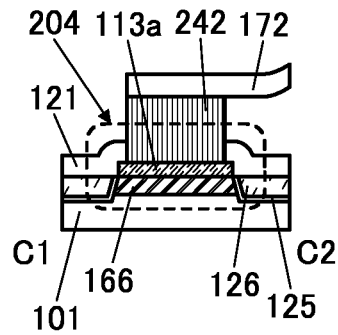
Figure 7D:
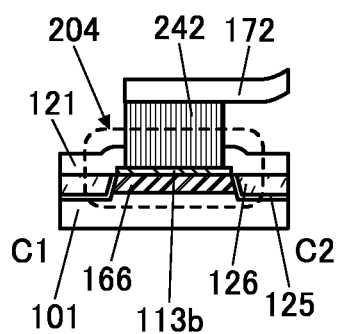
Figure 7E:
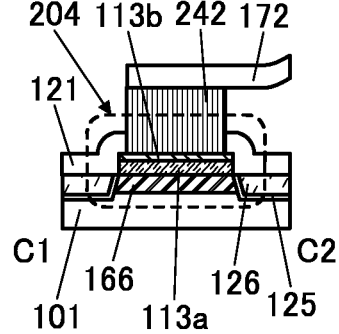
Figure 7F:
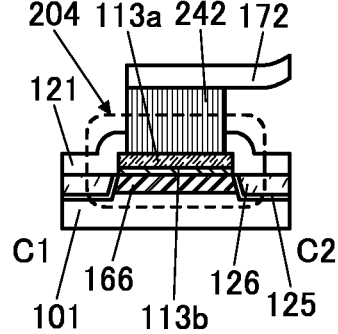
Figure 7G:
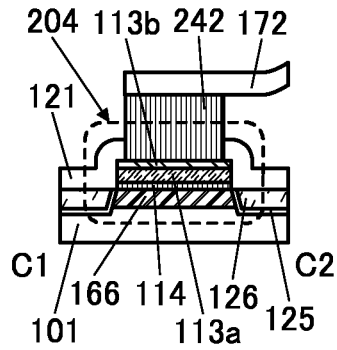
Figure 7H:
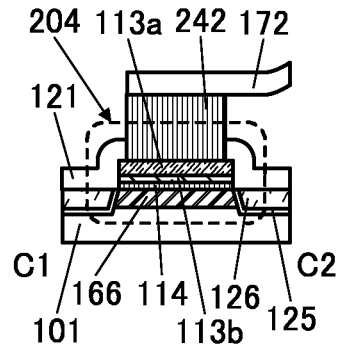

FIGS. 7B to 7H show variation examples of the structure illustrated in FIG. 7A. FIG. 7B illustrates a structure example in which the organic layer 114 is provided between the electrode 166 and the connection layer 242. FIG. 7C illustrates a structure example in which the transparent electrode 113a is provided between the electrode 166 and the connection layer 242. FIG. 7D illustrates a structure example in which the transflective electrode 113b is provided between the electrode 166 and the connection layer 242. FIG. 7E illustrates a structure example in which the transparent electrode 113a and the transflective electrode 113b are stacked in this order between the electrode 166 and the connection layer 242. FIG. 7F illustrates a structure example in which the transparent electrode 113a is provided over the transflective electrode 113b. FIG. 7G illustrates a structure example in which the organic layer 114, the transparent electrode 113a, and the transflective electrode 113b are stacked in this order between the electrodes 166 and the connection layer 242. FIG. 7H illustrates a structure example in which the organic layer 114, the transflective electrode 113b, and the transparent electrode 113a are stacked in this order between the electrode 166 and the connection layer 242.

Manufacturing Method Example 1

An example of a method for manufacturing the display apparatus of one embodiment of the present invention will be described below with reference to drawings. Here, the description is made with use of the display apparatus 100 shown above in Structure example.

Thin films included in the display apparatus (e.g., insulating films, semiconductor films, and conductive films) can be formed by a sputtering method, a CVD method, a vacuum evaporation method, a PLD method, an ALD method, or the like. Examples of a CVD method include a plasma-enhanced chemical vapor deposition (PECVD) method and a thermal CVD method. An example of a thermal CVD method is a metal organic CVD (MOCVD) method. Examples of an ALD method include a PEALD method and a thermal ALD method.

Thin films included in the display apparatus (e.g., insulating films, semiconductor films, and conductive films) can also be formed by a method such as spin coating, dipping, spray coating, ink-jetting, dispensing, screen printing, offset printing, doctor blade coating, slit coating, roll coating, curtain coating, or knife coating.

Thin films included in the display apparatus can be processed by a photolithography method, for example. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching, for example, and then the resist mask is removed. In the other method, a photosensitive thin film is formed and then processed into a desired shape by light exposure and development.

As light used for light exposure in the photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV light, X-rays, or an electron beam because extremely minute processing can be performed. Note that when exposure is performed by scanning of a beam such as an electron beam, a photomask is not needed.

For etching of thin films, a dry etching method, a wet etching method, a sandblast method, or the like can be used.

FIGS. 8A to 8D to FIGS. 13A to 13C are schematic cross-sectional views illustrating an example of a method for manufacturing the display apparatus 100 in which the light-emitting elements 110 and the light-receiving element 150 have the structure in FIG. 2A and the connection portion 130 has the structure in FIG. 6A.

To manufacture the display apparatus 100, first, the layer 101 including transistors is formed over a substrate (not illustrated). As described above, the layer 101 including transistors can have a stacked-layer structure in which an insulating layer is provided to cover the transistors, for example.

As the substrate, a substrate that has heat resistance high enough to withstand at least heat treatment performed later can be used. When an insulating substrate is used, it is possible to use a glass substrate, a quartz substrate, a sapphire substrate, a ceramic substrate, an organic resin substrate, or the like. Alternatively, it is possible to use a semiconductor substrate such as a single crystal semiconductor substrate or a polycrystalline semiconductor substrate of silicon, silicon carbide, or the like; a compound semiconductor substrate of silicon germanium or the like; or an SOI substrate.

Figure 8A:
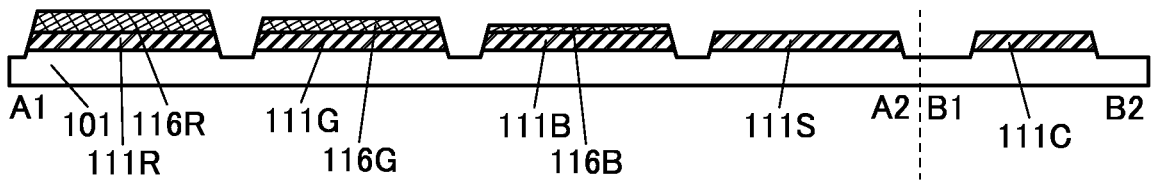
FIGS. 8A to 8D are cross-sectional views illustrating an example of a method for manufacturing a display apparatus.

Next, a conductive film to be the electrode 111 and a conductive film to be the optical adjustment layer 116 are formed over the layer 101 including transistors. Specifically, a conductive film to be the electrode 111 is formed over an insulating surface of the layer 101 including transistors, for example, and a conductive film to be the optical adjustment layer 116 is formed over the conductive film to be the electrode 111. Then, the conductive films are partly removed by etching, whereby the electrode 111R, the electrode 111G, the electrode 111B, the electrode 111S, and the electrode 111C are formed over the layer 101 including transistors. Moreover, the optical adjustment layer 116R is formed over the electrode 111R, the optical adjustment layer 116G is formed over the electrode 111G, and the optical adjustment layer 116B is formed over the electrode 111B (FIG. 8A). Note that the electrode 166 in FIG. 7A can be formed, for example, by removing part of the conductive film to be the electrode 111 by etching.

Subsequently, an EL film 112Rf to be the EL layer 112R is formed over the optical adjustment layers 116R, 116G, and 116B, the electrode 111S, and the layer 101 including transistors. Here, the EL film 112Rf can be provided not to overlap the electrode 111C. For example, the EL film 112Rf can be formed not to overlap the electrode 111C by shielding a region including the electrode 111C with a metal mask. The metal mask used here does not need to shield a pixel region of the display portion; hence, a fine mask is not required, and a rough metal mask can be used, for example.

The EL film 112Rf includes at least a film containing a light-emitting compound (a light-emitting film). The EL film 112Rf may have a structure in which the light-emitting film and one or more films functioning as a hole-injection layer, a hole-transport layer, a hole-blocking layer, an electron-blocking layer, an electron-transport layer, and an electron-injection layer are stacked. For example, the EL film 112Rf can have a structure in which a film functioning as a hole-injection layer, a film functioning as a hole-transport layer, the light-emitting film, and a film functioning as an electron-transport layer are stacked in this order. Alternatively, the EL film 112Rf can have a structure in which a film functioning as an electron-injection layer, a film functioning as an electron-transport layer, the light-emitting film, and a film functioning as a hole-transport layer are stacked in this order.

The EL film 112Rf can be formed by an evaporation method, a sputtering method, or an inkjet method, for example. Without limitation to this, the above-described film formation method can be used as appropriate.

Next, a sacrificial film 144Ra is formed over the EL film 112Rf, the electrode 111C, and the layer 101 including transistors, and a sacrificial film 144Rb is formed over the sacrificial film 144Ra. That is, the two-layer sacrificial film is formed over the EL film 112Rf, the electrode 111C, and the layer 101 including transistors. The sacrificial film may have a single-layer structure or a stacked-layer structure including three or more layers. In the description of a subsequent step of forming another sacrificial film, a sacrificial film having a two-layer structure is formed; however, the sacrificial film may alternatively have a single-layer structure or a stacked-layer structure including three or more layers.

The sacrificial films 144Ra and 144Rb can be formed by a sputtering method, a CVD method, an ALD method, or a vacuum evaporation method, for example. A formation method that cause less damage to the EL film is preferable, and the sacrificial film 144Ra formed directly on the EL film 112Rf is preferably formed by an ALD method or a vacuum evaporation method.

As the sacrificial film 144Ra, an inorganic film such as a metal film, an alloy film, a metal oxide film, a semiconductor film, or an inorganic insulating film or an organic film such as an organic insulating film is preferably used.

As the sacrificial film 144Ra, an oxide film can also be used. Typically, it is possible to use a film of an oxide or an oxynitride such as silicon oxide, silicon oxynitride, aluminum oxide, aluminum oxynitride, hafnium oxide, or hafnium oxynitride. As the sacrificial film 144Ra, a nitride film can also be used, for example. Specifically, it is possible to use a nitride such as silicon nitride, aluminum nitride, hafnium nitride, titanium nitride, tantalum nitride, tungsten nitride, gallium nitride, or germanium nitride. A film containing such an inorganic insulating material can be formed by a film formation method such as a sputtering method, a CVD method, or an ALD method; the sacrificial film 144Ra, which is formed directly on the EL film 112Rf, is particularly preferably formed by an ALD method.

The sacrificial film 144Ra can also be formed using a metal material such as nickel, tungsten, chromium, molybdenum, cobalt, palladium, titanium, aluminum, yttrium, zirconium, or tantalum, for example, or an alloy material containing any of the metal materials. It is particularly preferable to use a low-melting-point material such as aluminum or silver.

The sacrificial film 144Ra can also be formed using a metal oxide such as indium gallium zinc oxide (In—Ga—Zn oxide). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

Any of the above-described materials usable for the sacrificial film 144Ra can be used for the sacrificial film 144Rb. For example, from the above materials usable for the sacrificial film 144Ra, one material can be selected for the sacrificial film 144Ra and another material can be selected for the sacrificial film 144Rb. Alternatively, one or more materials can be selected for the sacrificial film 144Ra from the above materials usable for the sacrificial film 144Ra, and one or more materials can be selected for the sacrificial film 144Rb from the materials excluding the material(s) selected for the sacrificial film 144Ra.

Specifically, an aluminum oxide film formed by an ALD method is preferably used as the sacrificial film 144Ra, and a silicon nitride film formed by a sputtering method is preferably used as the sacrificial film 144Rb. In the case of employing this structure, the deposition temperature at the time of forming the films by an ALD method and a sputtering method is preferably higher than or equal to room temperature and lower than or equal to 120° C., further preferably higher than or equal to room temperature and lower than or equal to 100° C., in which case adverse effects on the EL film 112Rf can be reduced. In the case of employing the stacked-layer structure of the sacrificial films 144Ra and 144Rb, a stress applied to the stacked-layer structure is preferably small. Specifically, a stress applied to the stacked-layer structure is preferably higher than or equal to −500 MPa and less than or equal to +500 MPa, further preferably higher than or equal to −200 MPa and lower than or equal to +200 MPa, in which case troubles in the process, such as film separation and peeling, can be suppressed.

As the sacrificial film 144Ra, it is possible to use a film highly resistant to etching treatment performed on various EL films such as the EL film 112Rf, i.e., a film having high etching selectivity with respect to the EL films. As the sacrificial film 144Ra, it is particularly preferable to use a film that can be removed by a wet etching method, which is less likely to cause damage to the EL films.

For the sacrificial film 144Ra, a material that can be dissolved in a chemically stable solvent may be used. Specifically, a material that will be dissolved in water or alcohol can be suitably used for the sacrificial film 144Ra. In formation of the sacrificial film 144Ra, it is preferable that application of such a material dissolved in a solvent such as water or alcohol be performed by a wet process and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of a wet film formation method that can be used to form the sacrificial film 144Ra include spin coating, dipping, spray coating, ink-jetting, dispensing, screen printing, offset printing, doctor blade coating, slit coating, roll coating, curtain coating, and knife coating.

The sacrificial film 144Ra can be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

As the sacrificial film 144Rb, a film having high etching selectivity with the sacrificial film 144Ra is used.

Preferably, the sacrificial film 144Ra is a film of an inorganic insulating material such as aluminum oxide, hafnium oxide, or silicon oxide formed by an ALD method, and the sacrificial film 144Rb is a film of a metal material such as nickel, tungsten, chromium, molybdenum, cobalt, palladium, titanium, aluminum, yttrium, zirconium, or tantalum or an alloy material containing any of the metal materials formed by a sputtering method. The sacrificial film 144Rb is particularly preferably a tungsten film formed by a sputtering method. Alternatively, the sacrificial film 144Rb may be a film of a metal oxide containing indium, such as indium gallium zinc oxide (In—Ga—Zn oxide), formed by a sputtering method. Furthermore, an inorganic material may be used for the sacrificial film 144Rb. For example, it is possible to use an oxide film or a nitride film such as a silicon oxide film, a silicon oxynitride film, a silicon nitride oxide film, a silicon nitride film, an aluminum oxide film, an aluminum oxynitride film, or a hafnium oxide film.

Alternatively, as the sacrificial film 144Rb, an organic film that can be used as the EL film 112Rf, for example, may be used. For instance, a film that is the same as the organic film used as the EL film 112Rf can be used as the sacrificial film 144Rb. The use of such an organic film is preferable, in which case the film formation apparatus used for forming the EL film 112Rf can be used here. Furthermore, the sacrificial film 144Rb can be removed at the same time as the etching of the EL film 112Rf; thus, the process can be simplified.

Figure 8B:
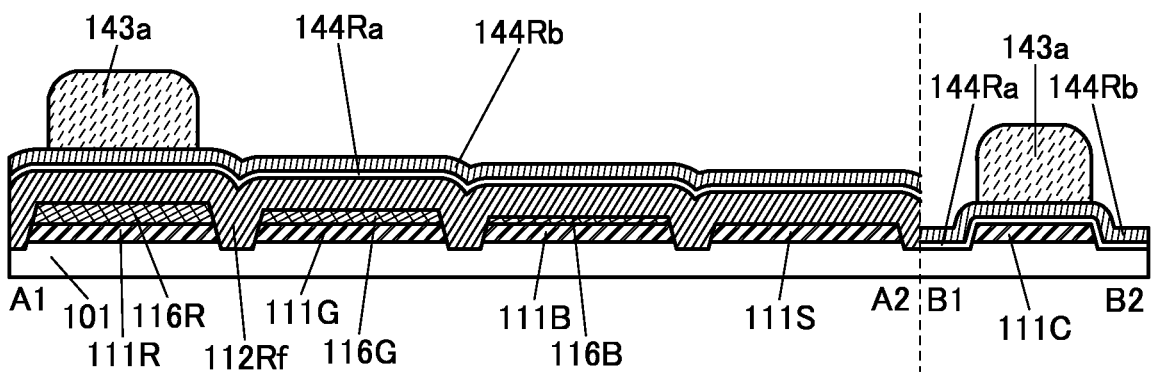

Next, a resist mask 143a is formed over the sacrificial film 144Rb (FIG. 8B). For the resist mask 143a, a resist material containing a photosensitive resin, such as a positive-type resist material or a negative-type resist material, can be used.

Figure 8C:
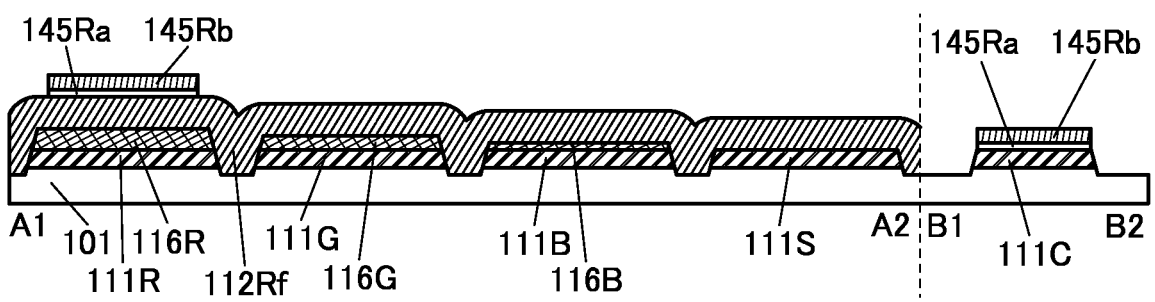

Then, part of the sacrificial films 144Rb and 144Ra that is not covered with the resist mask 143a is removed by etching, whereby island-shaped or band-shaped sacrificial layers 145Rb and 145Ra are formed (FIG. 8C). As illustrated in FIG. 8C, the sacrificial layers 145Rb and 145Ra can be formed over the electrode 111R and the electrode 111C, for example.

Preferably, part of the sacrificial film 144Rb is removed by etching using the resist mask 143a to form the sacrificial layer 145Rb; then, the resist mask 143a is removed; after that, the sacrificial film 144Ra is etched using the sacrificial layer 145Rb as a hard mask. In this case, the etching of the sacrificial film 144Rb preferably employs etching conditions with high selectivity with the sacrificial film 144Ra. Although a wet etching method or a dry etching method can be used for the etching for forming the hard mask, a shrinkage of the pattern can be suppressed by using a dry etching method.

Processing of the sacrificial films 144Ra and 144Rb and removal of the resist mask 143a can be performed by a wet etching method or a dry etching method. For example, the sacrificial films 144Ra and 144Rb can be processed by a dry etching method using a gas containing fluorine. The resist mask 143a can be removed by a dry etching method using a gas containing oxygen (also referred to as an oxygen gas) (such a method is also referred to as a plasma ashing method).

When the sacrificial film 144Ra is etched using the sacrificial layer 145Rb as a hard mask, the resist mask 143*a* can be removed while the EL film 112Rf is covered with the sacrificial film 144Ra. For example, if the EL film 112Rf is exposed to oxygen, the electrical characteristics of the light-emitting element 110R are adversely affected in some cases. Thus, in the case where the resist mask 143*a* is removed by a method using an oxygen gas, such as plasma ashing, the sacrificial film 144Ra is preferably etched using the sacrificial layer 145Rb as a hard mask.

Figure 8D:
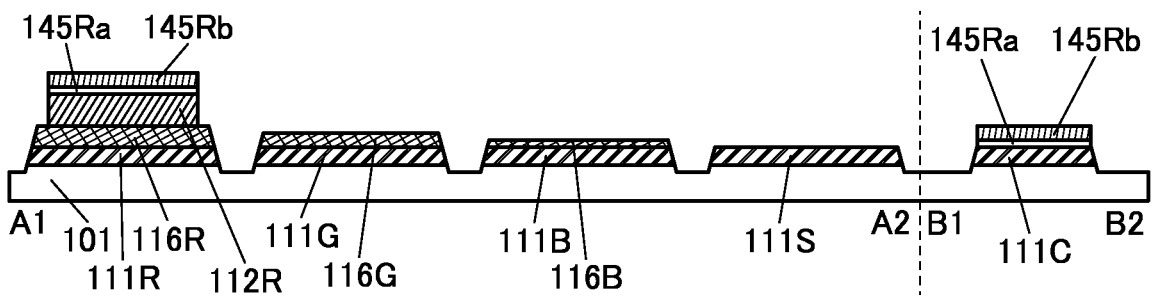

Next, part of the EL film 112Rf that is not covered with the sacrificial layer 145Ra is removed by etching, so that an island-shaped or band-shaped EL layer 112R is formed (FIG. 8D).

When a dry etching method using an oxygen gas is used for the etching of the EL film 112Rf, the etching rate can be increased. Consequently, etching under a low-power condition can be performed while the etching rate is kept adequately high; hence, damage due to the etching can be reduced. Furthermore, defects such as attachment of reaction products generated at the time of the etching to the EL layer 112R, for example, can be suppressed.

When the EL film 112Rf is etched by a dry etching method using an etching gas that does not contain oxygen as its main component, a change in properties of the EL film 112Rf can be inhibited, so that the display apparatus 100 can be highly reliable. Examples of the etching gas that does not contain oxygen as its main component include a gas containing $CF_4$, $C_4F_8$, $SF_6$, $CHF_3$, $Cl_2$, $H_2O$, $BCl_3$, or the like and a gas containing a Group 18 element such as He. Alternatively, a mixed gas of the above gas and a dilute gas that does not contain oxygen can be used the etching gas. Note that etching of the EL film 112Rf is not limited to the above and may be performed by a dry etching method using another gas or a wet etching method.

If impurities are attached to the side surface of the EL layer 112R when the EL layer 112R is formed by etching of the EL film 112Rf, the impurities might enter the EL layer 112R in the subsequent steps. Thus, the reliability of the display apparatus 100 is lowered in some cases. Therefore, it is preferable to remove impurities attached to the surface of the EL layer 112R after the formation of the EL layer 112R, in which case the reliability of the display apparatus 100 can be increased.

Impurities attached to the surface of the EL layer 112R can be removed, for example, by exposing the surface of the EL layer 112R to an inert gas. Here, the surface of the EL layer 112R is exposed right after the EL layer 112R is formed. Specifically, the side surface of the EL layer 112R is exposed. Accordingly, impurities attached to the EL layer 112R can be removed, for example, when the substrate where the EL layer 112R is formed is put in an inert gas atmosphere after the formation of the EL layer 112R. As the inert gas, one or more selected from Group 18 elements (typically, helium, neon, argon, xenon, and krypton) and nitrogen can be used, for example.

Subsequently, an EL film 112Gf to be the EL layer 112G is formed over the sacrificial layer 145Rb, the optical adjustment layers 116G and 116B, the electrode 111S, and the layer 101 including transistors. Forming the EL film 112Gf after the formation of the sacrificial layer 145Ra can prevent the EL film 112Gf from being in contact with the top surface of the EL layer 112R. The description of the formation and the like of the EL film 112Rf can be referred to for the formation and the like of the EL film 112Gf.

Figure 9A:
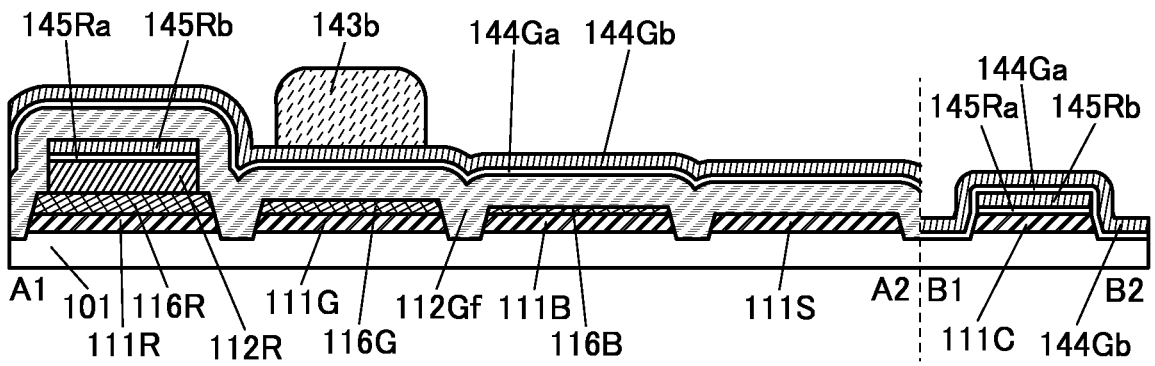
FIGS. 9A to 9C are cross-sectional views illustrating an example of a method for manufacturing a display apparatus.

Next, a sacrificial film 144Ga is formed over the EL film 112Gf, the sacrificial layer 145Rb, and the layer 101 including transistors, and a sacrificial film 144Gb is formed over the sacrificial film 144Ga. After that, a resist mask 143*b* is formed over the sacrificial film 144Gb (FIG. 9A). The description of the formation and the like of the sacrificial films 144Ra and 144Rb and the resist mask 143*a* can be referred to for the formation and the like of the sacrificial films 144Ga and 144Gb and the resist mask 143*b*.

Figure 9B:
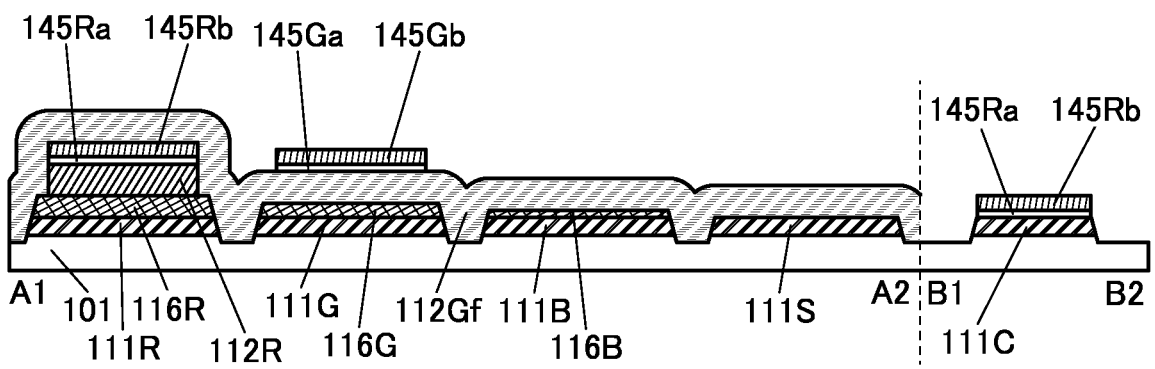

Then, part of the sacrificial films 144Gb and 144Ga that is not covered with the resist mask 143*b* is removed by etching, whereby island-shaped or band-shaped sacrificial layers 145Gb and 145Ga are formed. Moreover, the resist mask 143*b* is removed (FIG. 9B). Here, the sacrificial layers 145Gb and 145Ga can be formed over the electrode 111G. The description of the formation of the sacrificial layers 145Rb and 145Ra, the removal of the resist mask 143*a*, and the like can be referred to for the formation of the sacrificial layers 145Gb and 145Ga, the removal of the resist mask 143*b*, and the like.

Figure 9C:
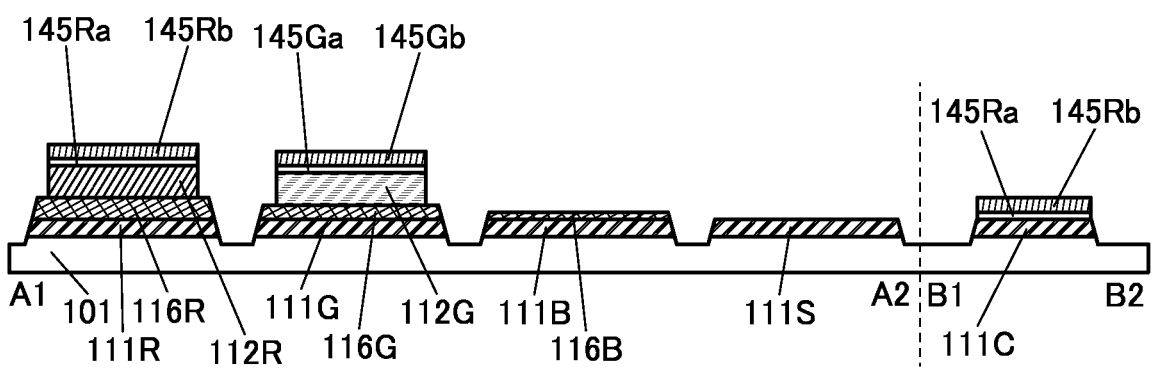

Next, part of the EL film 112Gf that is not covered with the sacrificial layer 145Ga is removed by etching, so that an island-shaped or band-shaped EL layer 112G is formed (FIG. 9C). The description of the formation and the like of the EL layer 112R can be referred to for the formation and the like of the EL layer 112G. As in the case of the EL layer 112R, it is preferable to remove impurities attached to the surface of the EL layer 112G. For example, impurities attached to the EL layer 112G can be removed when the substrate where the EL layer 112G is formed is put in an inert gas atmosphere after the formation of the EL layer 112G.

Subsequently, an EL film 112Bf to be the EL layer 112B is formed over the sacrificial layers 145Rb and 145Gb, the optical adjustment layer 116B, the electrode 111S, and the layer 101 including transistors. Forming the EL film 112Bf after the formation of the sacrificial layer 145Ga can prevent the EL film 112Bf from being in contact with the top surface of the EL layer 112G. The description of the formation and the like of the EL film 112Rf can be referred to for the formation and the like of the EL film 112Bf.

Figure 10A:
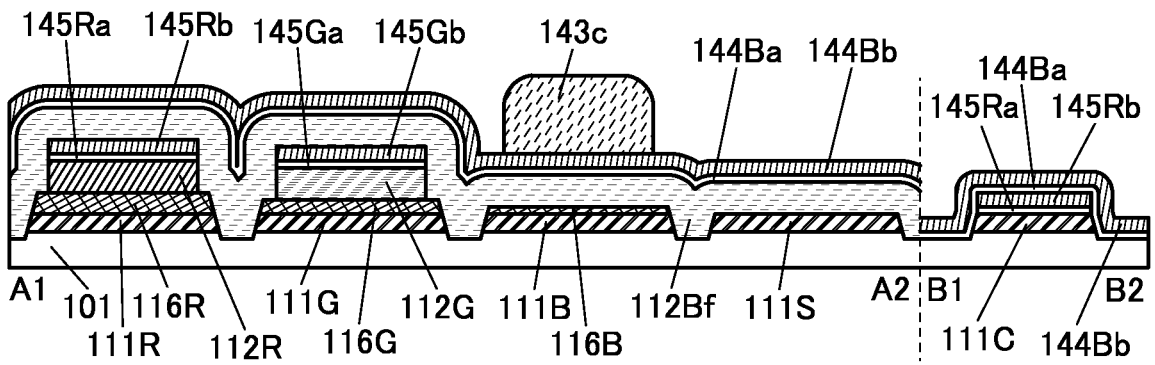
FIGS. 10A to 10C are cross-sectional views illustrating an example of a method for manufacturing a display apparatus.

Next, a sacrificial film 144Ba is formed over the EL film 112Bf, the sacrificial layer 145Rb, and the layer 101 including transistors, and a sacrificial film 144Bb is formed over the sacrificial film 144Ba. After that, a resist mask 143*c* is formed over the sacrificial film 144Bb (FIG. 10A). The description of the formation and the like of the sacrificial films 144Ra and 144Rb and the resist mask 143*a* can be referred to for the formation and the like of the sacrificial films 144Ba and 144Bb and the resist mask 143*c*.

Figure 10B:
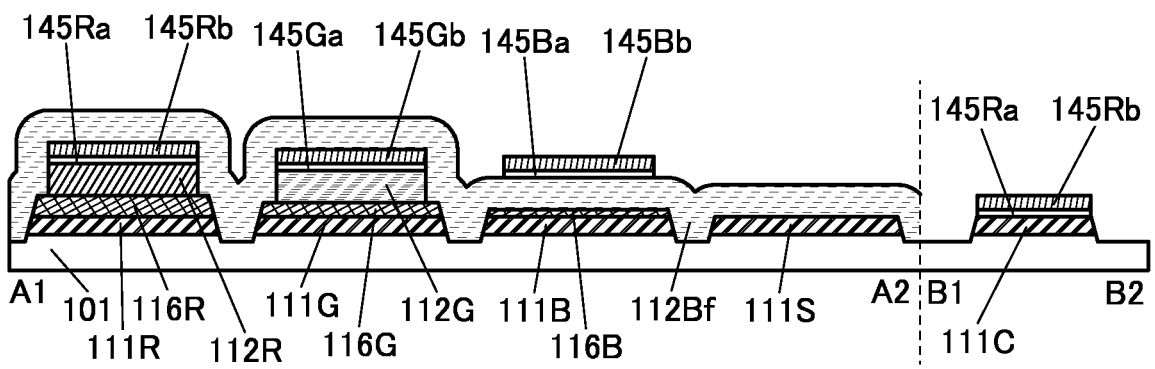

Then, part of the sacrificial films 144Bb and 144Ba that is not covered with the resist mask 143*c* is removed by etching, whereby island-shaped or band-shaped sacrificial layers 145Bb and 145Ba are formed. Moreover, the resist mask 143*c* is removed (FIG. 10B). Here, the sacrificial layers 145Bb and 145Ba can be formed over the electrode 111B. The description of the formation of the sacrificial layers 145Rb and 145Ra, the removal of the resist mask 143*a*, and the like can be referred to for the formation of the sacrificial layers 145Bb and 145Ba, the removal of the resist mask 143*c*, and the like.

Figure 10C:
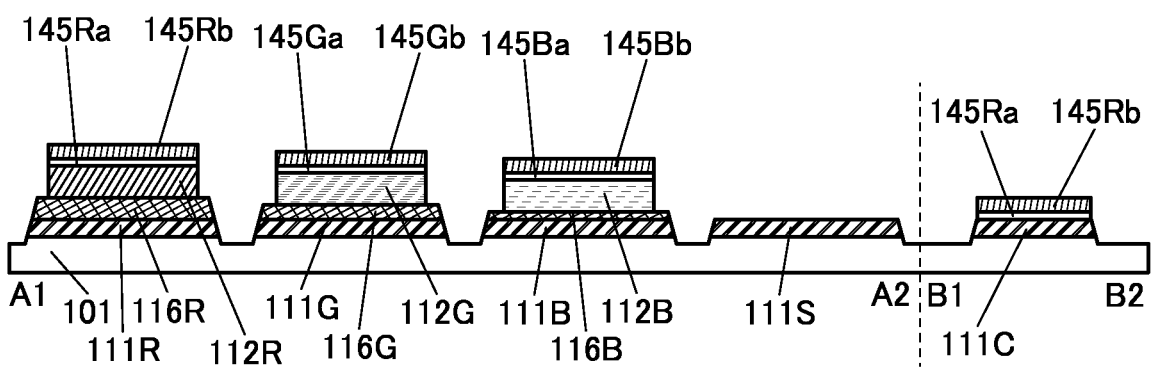

Next, part of the EL film 112Bf that is not covered with the sacrificial layer 145Ba is removed by etching, so that an island-shaped or band-shaped EL layer 112B is formed (FIG. 10C). The description of the formation and the like of the EL layer 112R can be referred to for the formation and the like of the EL layer 112B. As in the case of the EL layers 112R and 112G, it is preferable to remove impurities attached to the surface of the EL layer 112B. For example, impurities attached to the EL layer 112B can be removed when the substrate where the EL layer 112B is formed is put in an inert gas atmosphere after the formation of the EL layer 112B.

Subsequently, a PD film 155f to be the PD layer 155 is formed over the sacrificial layers 145Rb, 145Gb, and 145Bb, the electrode 111S, and the layer 101 including transistors. Forming the PD film 155f after the formation of the sacrificial layer 145Ba can prevent the PD film 155f from being in contact with the top surface of the EL layer 112B. The description of the formation and the like of the EL film 112Rf can be referred to for the formation and the like of the PD film 155f.

The PD film 155f includes a film containing a photoelectric conversion material having sensitivity to visible light or infrared light (a photoelectric conversion film). The PD film 155f may have a structure in which the photoelectric conversion film and one or more films functioning as a hole-transport layer, a hole-blocking layer, an electron-blocking layer, and an electron-transport layer are stacked. For example, the PD film 155f can have a structure in which a film functioning as a hole-transport layer, the photoelectric conversion film, and a film functioning as an electron-transport layer are stacked in this order. Alternatively, the PD film 155f can have a structure in which a film functioning as an electron-transport layer, the photoelectric conversion film, and a film functioning as a hole-transport layer are stacked in this order.

Figure 11A:
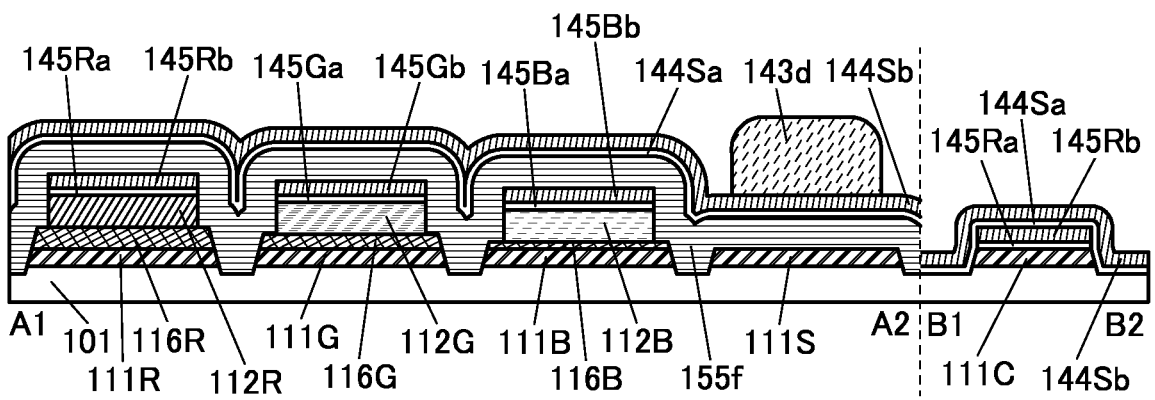
FIGS. 11A to 11C are cross-sectional views illustrating an example of a method for manufacturing a display apparatus.

Next, a sacrificial film 144Sa is formed over the PD film 155f, the sacrificial layer 145Rb, and the layer 101 including transistors, and a sacrificial film 144Sb is formed over the sacrificial film 144Sa. After that, a resist mask 143d is formed over the sacrificial film 144Sb (FIG. 11A). The description of the formation and the like of the sacrificial films 144Ra and 144Rb and the resist mask 143a can be referred to for the formation and the like of the sacrificial films 144Sa and 144Sb and the resist mask 143d.

Then, part of the sacrificial films 144Sb and 144Sa that is not covered with the resist mask 143d is removed by etching, whereby island-shaped or band-shaped sacrificial layers 145Sb and 145Sa are formed. Moreover, the resist mask 143d is removed (FIG. 111B). Here, the sacrificial layers 145Sb and 145Sa can be formed over the electrode 111S. The description of the formation of the sacrificial layers 145Rb and 145Ra, the removal of the resist mask 143a, and the like can be referred to for the formation of the sacrificial layers 145Sb and 145Sa, the removal of the resist mask 143d, and the like.

Figure 11B:
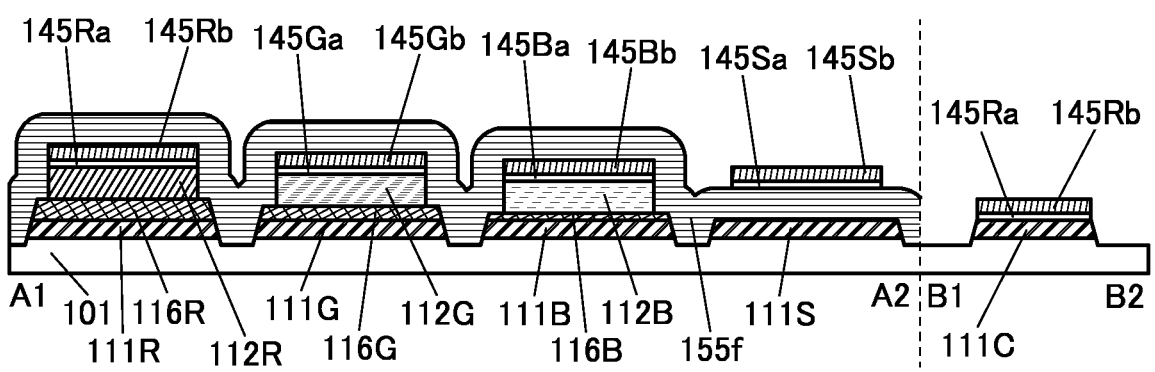
Figure 11C:
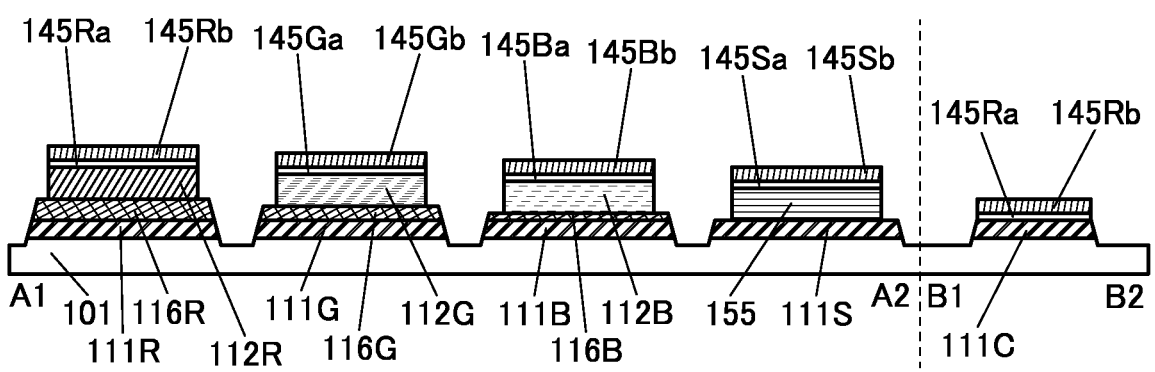

Next, part of the PD film 155f that is not covered with the sacrificial layer 145Sa is removed by etching, so that an island-shaped or band-shaped PD layer 155 is formed (FIG. 11C). The description of the formation and the like of the EL layer 112R can be referred to for the formation and the like of the PD layer 155. As in the case of the EL layers 112R, 112G, and 112B, it is preferable to remove impurities attached to the surface of the PD layer 155. For example, impurities attached to the PD layer 155 can be removed when the substrate where the PD layer 155 is formed is put in an inert gas atmosphere after the formation of the PD layer 155.

Next, an insulating film 125f to be the insulating layer 125 is formed to cover the top surface of the layer 101 including transistors, the side surfaces of the electrode 111, the optical adjustment layer 116, the EL layer 112, the PD layer 155, and the sacrificial layer 145a, and the top and side surfaces of the sacrificial layer 145b.

In this specification and the like, for example, a description common to the sacrificial layers 145Ra, 145Ga, 145Ba, and 145Sa is sometimes made using the term "sacrificial layer 145a". A description common to the sacrificial layers 145Rb, 145Gb, 145Bb, and 145Sb is sometimes made using the term "sacrificial layer 145b". A description common to the sacrificial layers 145a and 145b is sometimes made using the term "sacrificial layer 145". Moreover, other components are sometimes described using reference numerals with the letters of the alphabet omitted, as mentioned above.

The insulating film 125f can be formed by a sputtering method, a CVD method, a PLD method, an ALD method, or the like and is preferably formed by an ALD method achieving favorable coverage. For the insulating film 125f, an inorganic material can be used, for example, and an inorganic insulating film such as an oxide insulating film, a nitride insulating film, an oxynitride insulating film, or a nitride oxide insulating film can be used, for instance. In particular, using an inorganic insulating film such as an aluminum oxide film, a hafnium oxide film, or a silicon oxide film formed by an ALD method enables the insulating film 125f to have few pinholes.

Figure 12A:
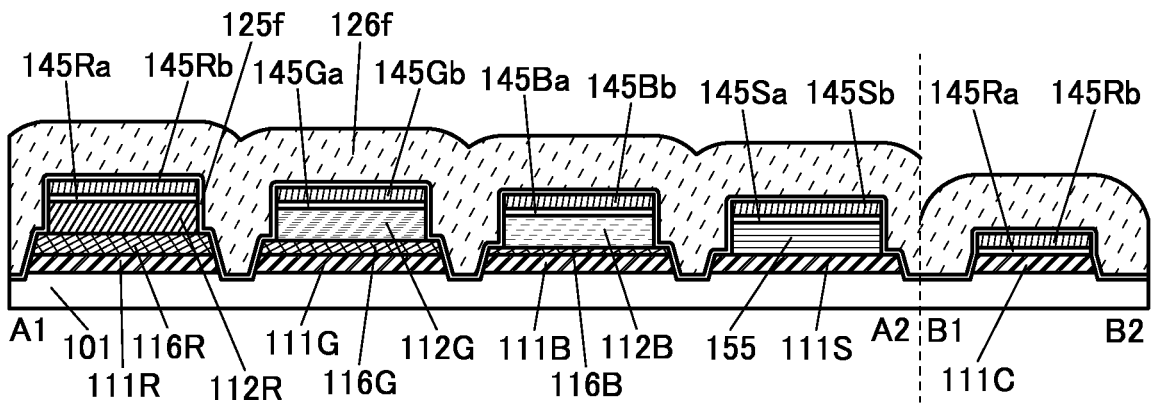
FIGS. 12A to 12D are cross-sectional views illustrating an example of a method for manufacturing a display apparatus.

Then, an insulating film 126f to be the insulating layer 126 is formed over the insulating film 125f (FIG. 12A). As the insulating film 126f, an insulating film containing an organic material is preferably used, and a resin is preferably used as the organic material. A photosensitive resin can be used for the insulating film 126f. The photosensitive resin can be of positive or negative type. In the case of containing a resin, the insulating film 126f can be referred to as a resin film.

When a photosensitive resin is used for the insulating film 126f, the insulating film 126f can be formed by a spin coating method, a spraying method, a screen printing method, a painting method, or the like.

As illustrated in FIG. 12A, the insulating film 126f may have a slight unevenness reflecting unevenness of the formation surface. Alternatively, the insulating film 126f is planarized in some cases.

Next, the insulating layer 126 is formed. Here, when a photosensitive resin is used for the insulating film 126f, the insulating layer 126 can be formed without providing an etching mask such as a resist mask or a hard mask. Since a photosensitive resin can be processed only by the exposure and development process, the insulating layer 126 can be formed without using a dry etching method, for example. Thus, the process can be simplified. In addition, damage to the EL layer 112 and the PD layer 155 due to etching of the insulating film 126f can be reduced.

The insulating layer 126 may alternatively be formed by performing etching substantially uniformly on the top surface of the insulating film 126f. Such uniform etching for planarization is also referred to as etch back.

To form the insulating layer 126, the exposure and development process and the etch back process may be used in combination.

Figure 12B:
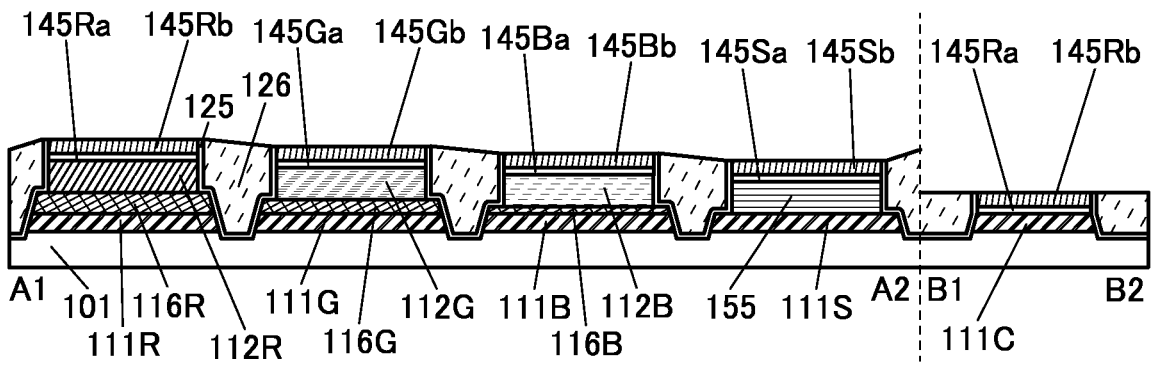

Next, the insulating film 125f is etched, thereby forming the insulating layer 125 (FIG. 12B). The insulating layer 125 can be formed in contact with the side surfaces of the electrode 111, the optical adjustment layer 116, the EL layer 112, the PD layer 155, the sacrificial layer 145a, and the sacrificial layer 145b, for example. Moreover, the insulating layer 125 can be formed in contact with the side and bottom surfaces of the insulating layer 126. That is, the insulating layer 125 can be provided between the insulating layer 126 and the EL layer 112 or the PD layer 155, for example.

The etching of the insulating film 125f is preferably anisotropic etching, in which case the insulating layer 125 can be favorably formed without patterning using a photolithography method, for instance. For example, forming the insulating layer 125 without patterning using a photolithography method enables simplification of the manufacturing process of the display apparatus 100, resulting in lower manufacturing cost of the display apparatus 100. Thus, the display apparatus 100 can be inexpensive. An example of anisotropic etching is a dry etching method. In the case of employing a dry etching method, the insulating film 125f can be etched using an etching gas that can be used in etching of the sacrificial film 144, for example.

Figure 12C:
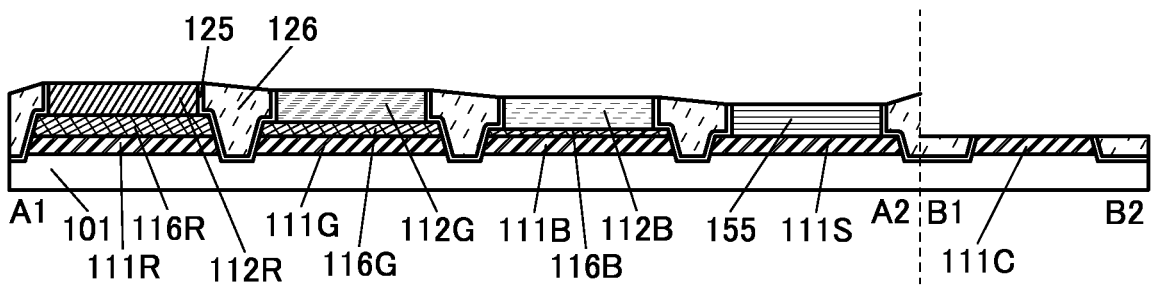

Subsequently, the sacrificial layer 145b and the sacrificial layer 145a are removed by etching or the like (FIG. 12C). The sacrificial layer 145b and the sacrificial layer 145a can be removed by different methods, e.g., under different etching conditions. For example, the sacrificial layer 145b can be removed by a method that allows high selectivity with the sacrificial layer 145a, and the sacrificial layer 145a can be removed by a method that causes damage to the EL layer 112 and the PD layer 155 as little as possible. For instance, the sacrificial layer 145b can be removed by a dry etching method, and the sacrificial layer 145a can be removed by a wet etching method.

In the example in FIG. 12C, the insulating layers 125 and 126 are partly removed by the removal of the sacrificial layers 145b and 145a, and at least part of the top surfaces of the insulating layers 125 and 126 is aligned with at least part of the top surface of the EL layer 112, the top surface of the PD layer 155, or the top surface of the electrode 111C; however, one embodiment of the present invention is not limited thereto. For example, in the A1-A2 cross section in FIG. 12C, at least part of the top surfaces of the insulating layers 125 and 126 may be higher in height than at least part of the top surface of the EL layer 112 or the top surface of the PD layer 155. In the B1-B2 cross section in FIG. 12C, at least part of the top surfaces of the insulating layers 125 and 126 may be higher in height than at least part of the top surface of the electrode 111C.

Next, vacuum baking treatment is performed to remove water and the like adsorbed on the surfaces of the EL layer 112 and the PD layer 155. The vacuum baking is preferably performed in a range of temperatures with which properties of the organic compounds contained in the EL layer 112, the PD layer 155, and the like are not changed, and can be performed at temperatures higher than or equal to 70° C. and lower than or equal to 120° C., for example, preferably higher than or equal to 80° C. and lower than or equal to 100° C. The vacuum backing treatment is not necessarily performed when water and the like adsorbed on the surfaces of the EL layer 112 and the PD layer 155 and the like are small in amount and are less likely to adversely affect the reliability of the display apparatus 100, for example.

Figure 12D:
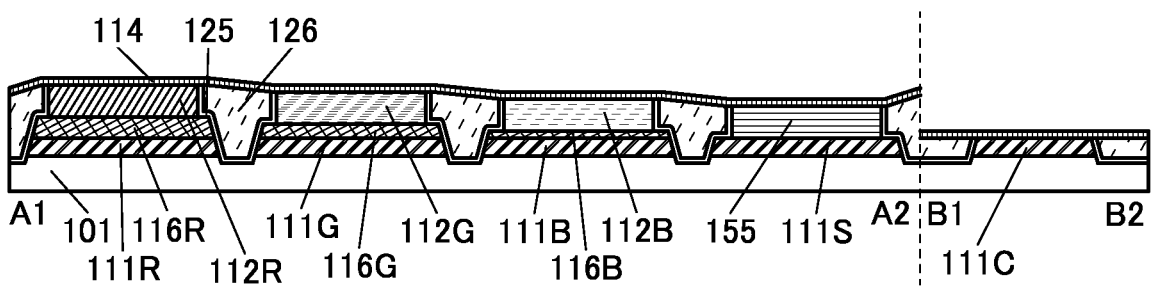

Next, the organic layer 114 is formed over the EL layer 112, the PD layer 155, the insulating layer 125, the insulating layer 126, and the electrode 111C (FIG. 12D). As described above, the organic layer 114 includes at least one of a hole-injection layer, a hole-transport layer, a hole-blocking layer, an electron-blocking layer, an electron-transport layer, and an electron-injection layer, and includes, for example, an electron-injection layer or a hole-injection layer. The organic layer 114 can be formed by an evaporation method, a sputtering method, or an inkjet method, for example. Note that in the case where the organic layer 114 is not provided over the electrode 111C, a metal mask that shields the electrode 111C is used in forming the organic layer 114. The metal mask used here does not need to shield a pixel region of the display portion; hence, a fine mask is not required, and a rough metal mask can be used, for example.

Then, the transparent electrode 113a is formed over the organic layer 114, and a conductive film 113bf to be the transflective electrode 113b is formed over the transparent electrode 113a. For example, the transparent electrode 113a is formed in contact with the top surface of the organic layer 114, and the conductive film 113bf is formed in contact with the top surface of the transparent electrode 113a. The transparent electrode 113a and the conductive film 113bf can be formed by a sputtering method or a vacuum evaporation method, for example. Note that the conductive film 113bf can be referred to as a transflective film.

The visible light transmittance of the transparent electrode 113a is higher than that of the conductive film 113bf. The visible light reflectivity of the transparent electrode 113a is lower than that of the conductive film 113bf. Specifically, the visible light transmittance of the transparent electrode 113a is higher than or equal to 40%, as described above. The visible light reflectivity of the conductive film 113bf is higher than or equal to 10% and less than or equal to 95%, preferably higher than or equal to 30% and lower than or equal to 80%.

For the transparent electrode 113a, a conductive oxide or graphene can be used, and for example, indium tin oxide or indium zinc oxide can be used. For the conductive film 113bf, a layer of a metal material that is thin enough to have a light-transmitting property can be used, for example, and an alloy of silver and magnesium can be used, for instance.

Figure 13A:
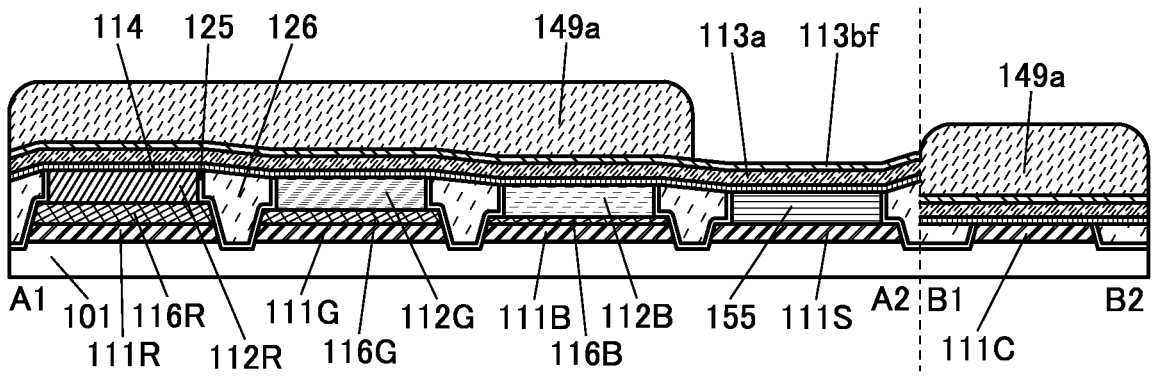
FIGS. 13A to 13C are cross-sectional views illustrating an example of a method for manufacturing a display apparatus.

Next, a resist mask 149a is formed over the conductive film 113bf (FIG. 13A). For the resist mask 149a, a resist material containing a photosensitive resin, such as a positive-type resist material or a negative-type resist material, can be used as in the case of the resist masks 143a to 143d.

Then, part of the conductive film 113bf that is not covered with the resist mask 149a is removed by etching, whereby the island-shaped or band-shaped transflective electrode 113b is formed. Accordingly, the light-emitting elements 110 and the light-receiving element 150 can be manufactured. Here, the transflective electrode 113b is formed to have a region that does not overlap the PD layer 155. It is preferred that the transflective electrode 113b be formed not to have a region overlapping the PD layer 155.

Figure 13B:
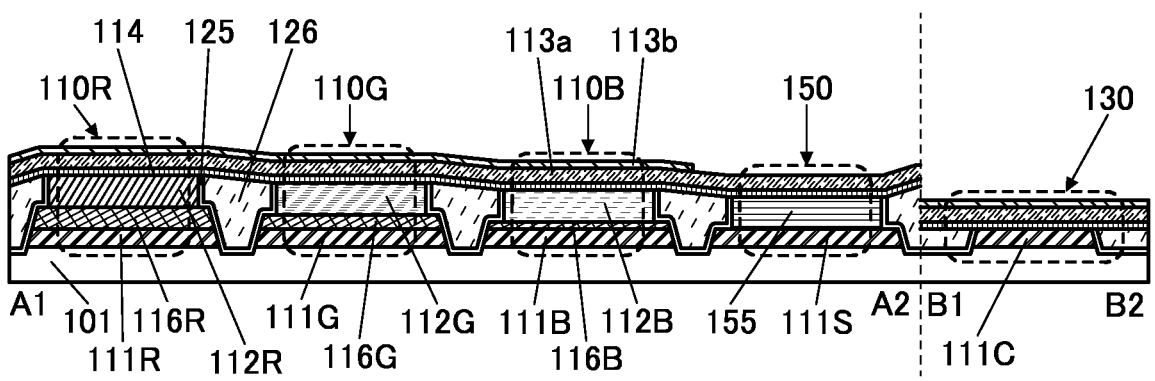

After that, the resist mask 149a is removed (see FIG. 13B). Like the resist masks 143a to 143d, the resist mask 149a can be removed by a plasma ashing method.

Figure 13C:
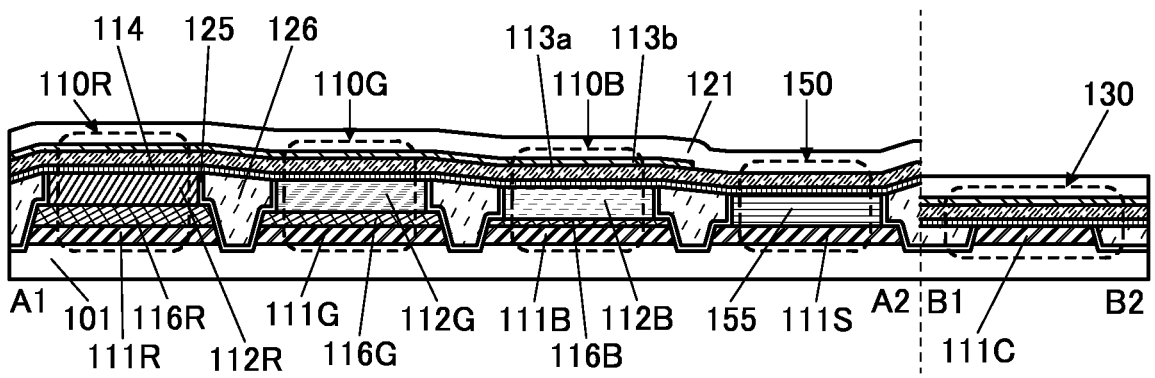

Next, the protective layer 121 is formed over the transparent electrode 113a and the transflective electrode 113b (FIG. 13C). When an inorganic insulating film is used as the protective layer 121, the protective layer 121 is preferably formed by a sputtering method, a CVD method, or an ALD method, for example. When an organic insulating film is used as the protective layer 121, the protective layer 121 is preferably formed by an inkjet method, for example, because a uniform film can be formed in a desired area.

Through the above-described steps, the display apparatus 100 can be manufactured.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In the method for manufacturing the display apparatus having an MML structure illustrated in FIGS. 8A to 8D to FIGS. 13A to 13C, the island-shaped EL layer 112 is formed not by patterning using a metal mask but by processing the EL film 112f formed on the entire surface. Similarly, the island-shaped PD layer 155 is formed not by patterning using a metal mask but by processing the PD film 155f formed on the entire surface.

According to the above, a display apparatus and an imaging apparatus having high definition or a high aperture ratio can be obtained. In addition, a display apparatus that has an image capturing function and high definition or a high aperture ratio can be obtained. Since the EL layers 112 can be formed separately for each color, a display apparatus that is capable of extremely clear display with a high contrast and high display quality can be obtained. Furthermore, providing the sacrificial layers over the EL layer 112 and the PD layer 155 can reduce damage to the EL layer 112 and the PD layer 155 during the manufacturing process of the display apparatus 100, so that the reliability of the light-emitting element 110 and the light-receiving element 150 can be increased.

The display apparatus 100 does not require an insulator for covering the end portion of the pixel electrode. In other words, an insulating layer is not provided between the pixel electrode of the light-emitting element 110 and the EL layer 112, or between the pixel electrode of the light-receiving element 150 and the PD layer 155. With this structure, light emitted from the EL layer 112 can be extracted efficiently, and light delivered to the PD layer 155 can be detected with high sensitivity.

The display apparatus 100 can efficiently extract light emitted from the EL layers 112, so that the viewing angle dependence can be extremely small. For example, in the display apparatus 100, the viewing angle (the maximum angle at which a given constant ratio is maintained when the screen is seen in an oblique direction) can be greater than or equal to 1000 and less than 180°, preferably greater than or equal to 150° and less than or equal to 170°. Note that the above-described viewing angle can apply to both the vertical direction and the horizontal direction. The display apparatus of one embodiment of the present invention can have improved viewing angle dependence and high image visibility.

When the display apparatus 100 employs a fine metal mask (FMM) structure, a configuration of pixel arrangement, for example, may be limited. Here, the FMM structure will be described below.

To fabricate a display apparatus having the FMM structure, a metal mask (FMM) having an opening portion so that an EL material or a PD material is deposited in intended regions is set to face a substrate at the time of EL deposition and PD deposition. Then, the EL material or the PD material is deposited in the intended regions by EL evaporation or PD deposition through the FMM. As the area of a substrate subjected to EL deposition and PD deposition increases, the area and weight of the FMM also increase accordingly. Furthermore, heat, for example, is applied to the FMM in EL deposition and PD deposition, so that the shape of the FMM may be changed. The weight and strength of the FMM are important parameters because there is a method of performing EL deposition or PD deposition while a given tension is applied to the FMM.

Therefore, a configuration of pixel arrangement in a display apparatus having the FMM structure needs to be designed under certain restrictions; for example, the above-described parameters need to be considered. On the other hand, the display apparatus of one embodiment of the present invention, which has the MML structure, has an advantageous effect of a higher degree of freedom in a configuration of pixel arrangement than in the case of employing the FMM structure, for example. Note that the MML structure has higher design flexibility than the FMM structure and thus is highly compatible with flexible devices, for example.

Figure 14A:
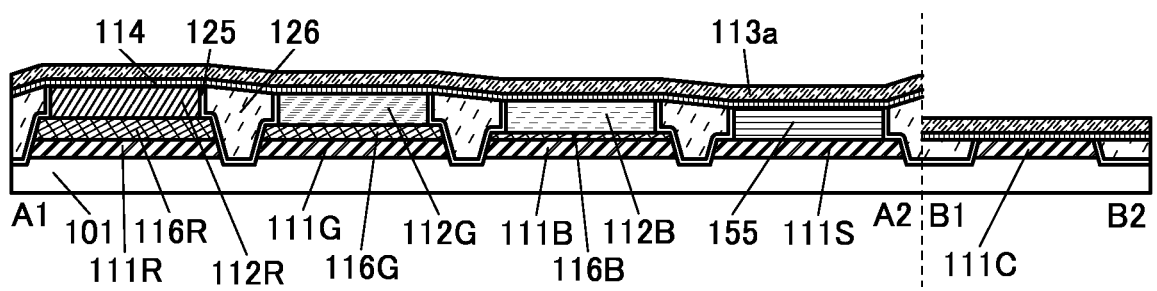
FIGS. 14A and 14B are cross-sectional views illustrating an example of a method for manufacturing a display apparatus.
Figure 14B:
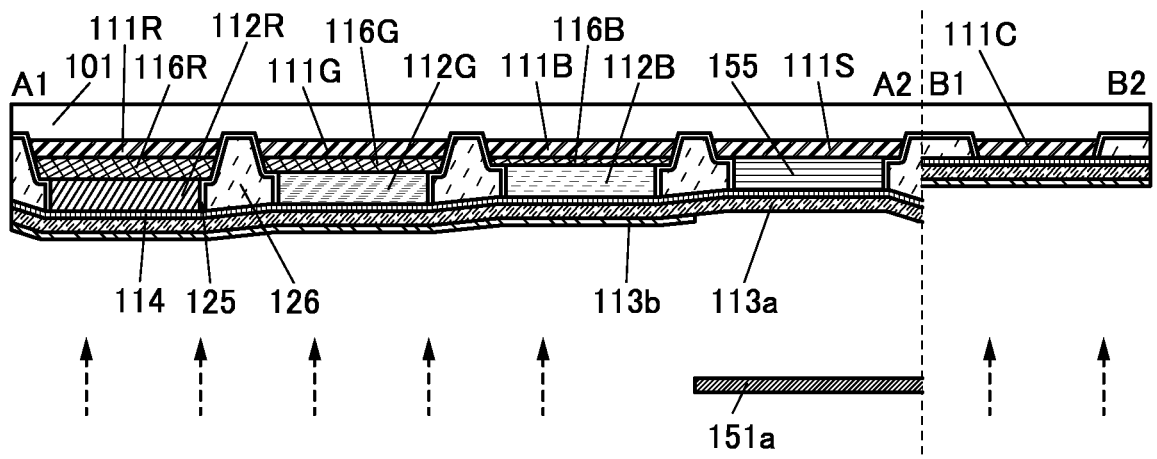

FIGS. 14A and 14B are schematic cross-sectional views illustrating an example of a method for manufacturing the display apparatus 100 in which the light-emitting elements 110 and the light-receiving element 150 have the structure in FIG. 2A and the connection portion 130 has the structure in FIG. 6A.

First, steps similar to those in FIGS. 8A to 8D to FIGS. 12A to 12D are performed. Next, by a method similar to that described with FIG. 13A, the transparent electrode 113a is formed (FIG. 14A).

Then, the transflective electrode 113b is formed using an FMM 151a (FIG. 14B). For example, the transflective electrode 113b is formed by a vacuum evaporation method or a sputtering method using the FMM 151a. Note that the transflective electrode 113b may be formed by an inkjet method. FIG. 14B shows a state of face-down deposition, in which deposition is performed with the substrate turned upside down so that the film formation surface is placed face down.

Next, the protective layer 121 is formed by a method similar to that described with FIG. 13C. Through the above steps, the display apparatus 100 can be manufactured.

FIGS. 15A to 15D are schematic cross-sectional views illustrating a method for manufacturing the display apparatus 100 in which the light-emitting elements 110 and the light-receiving element 150 have the structure in FIG. 4B and the connection portion 130 has the structure in FIG. 6A.

Figure 15A:
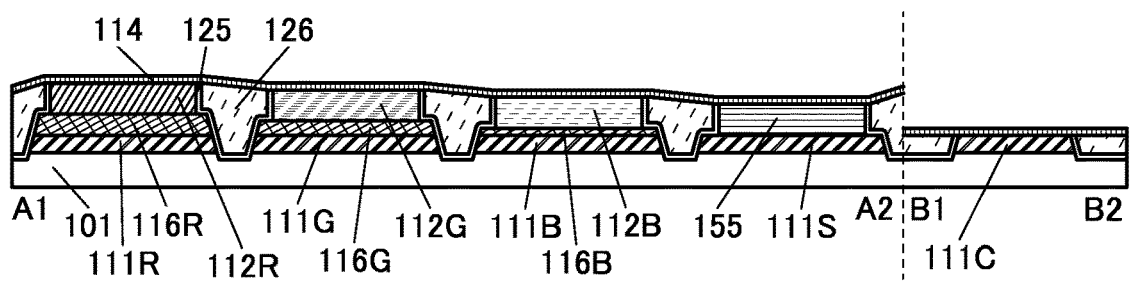
FIGS. 15A to 15D are cross-sectional views illustrating an example of a method for manufacturing a display apparatus.
Figure 15B:
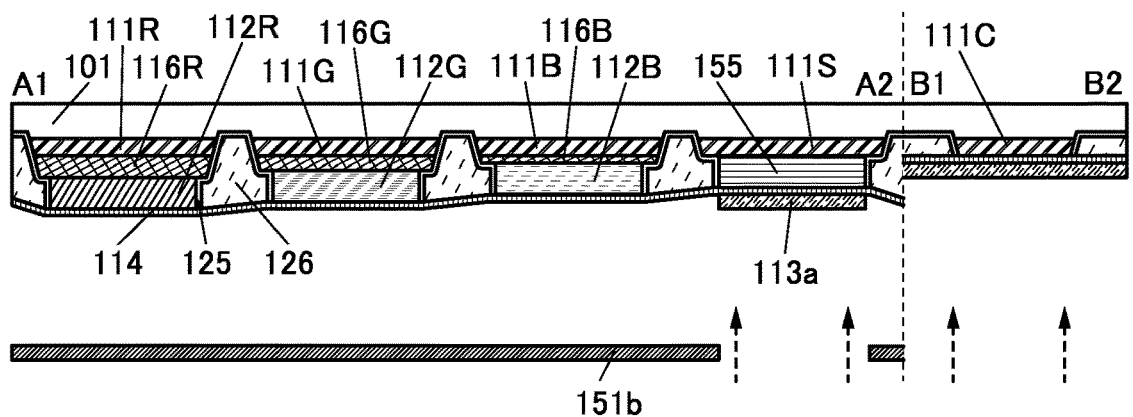
Figure 15C:
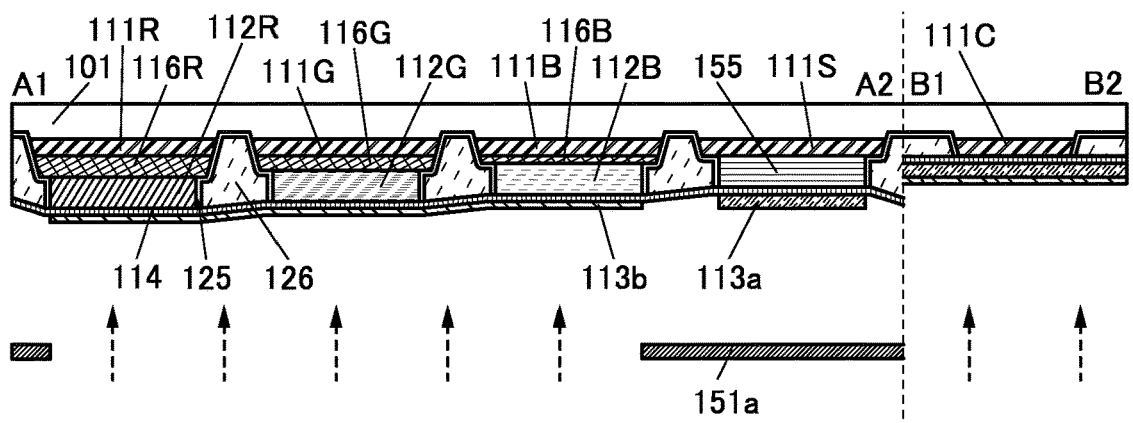

First, steps similar to those in FIGS. 8A to 8D to FIGS. 12A to 12D are performed (FIG. 15A). Next, the transparent electrode 113a is formed using an FMM 151b (FIG. 15B). After that, the transflective electrode 113b is formed using the FMM 151a (FIG. 15C). For example, the transparent electrode 113a is formed by a vacuum evaporation method or a sputtering method using the FMM 151b, and the transflective electrode 113b is formed by a vacuum evaporation method or a sputtering method using the FMM 151a. Note that the transparent electrode 113a and the transflective electrode 113b may be formed by an inkjet method. FIGS. 15B and 15C each show a state of face-down deposition. Alternatively, the transparent electrode 113a and the transflective electrode 113b may be formed by a photolithography method.

Figure 15D:
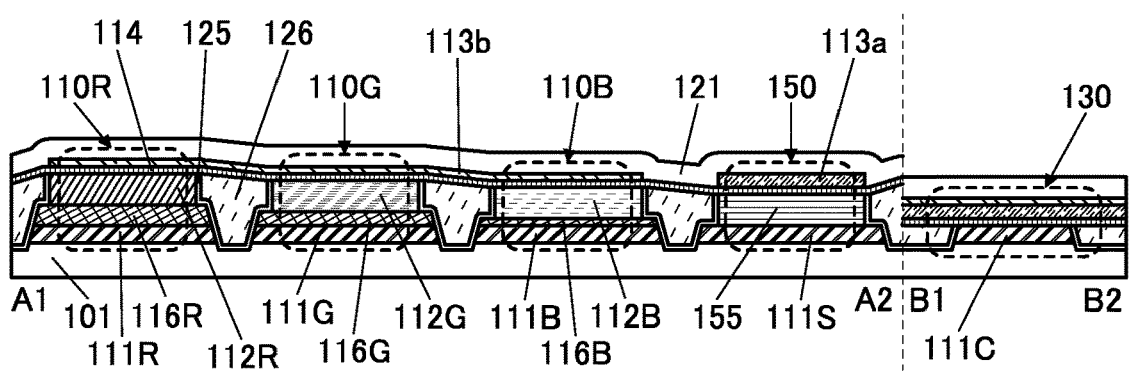

After that, by a method similar to that described with FIG. 13C, the protective layer 121 is formed (FIG. 15D). Through the above steps, the display apparatus 100 can be manufactured.

FIGS. 16A to 16D to FIGS. 19A to 19D are schematic cross-sectional views illustrating a method for manufacturing the display apparatus 100 in which the light-emitting elements 110 and the light-receiving element 150 have the structure in FIG. 4D and the connection portion 130 has the structure in FIG. 6B.

First, the electrodes 111R, 111G, 111B, 111S, and 111C, the optical adjustment layers 116R, 116G, and 116B, and the EL film 112Rf are formed by methods similar to those described with FIGS. 8A and 8B. As described above, the EL film 112Rf can be formed by shielding a region including the electrode 111C with a metal mask.

Next, an organic film 114Rf to be the organic layer 114R is formed over the EL film 112Rf. The organic film 114Rf can be formed by a method similar to that for the EL film 112Rf. The organic film 114Rf can be formed using the apparatus used for forming the EL film 112Rf. For example, the EL film 112Rf has a structure in which a hole-injection layer, a hole-transport layer, a light-emitting layer, and an electron-transport layer are stacked in this order from the electrode 111 side, and the organic film 114Rf includes an electron-injection layer. Alternatively, the EL film 112Rf has a structure in which an electron-injection layer, an electron-transport layer, a light-emitting layer, and a hole-transport layer are stacked in this order from the electrode 111 side, and the organic film 114Rf includes a hole-injection layer.

Figure 16A:
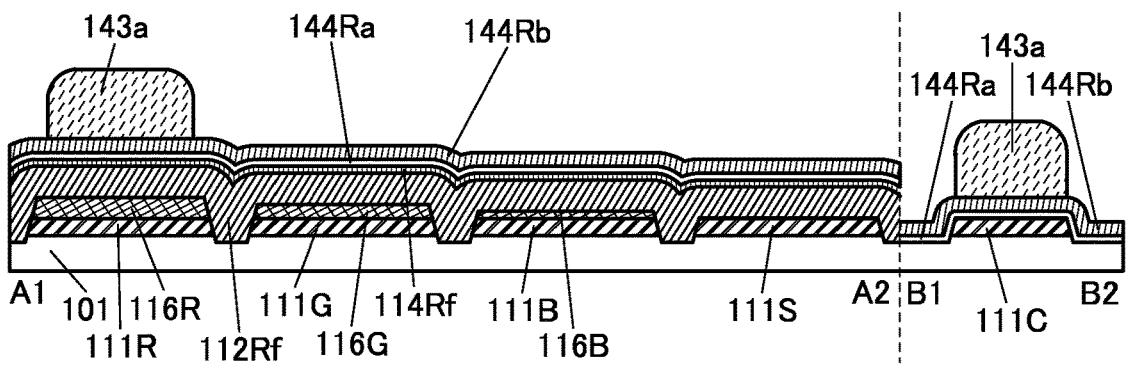
FIGS. 16A to 16D are cross-sectional views illustrating an example of a method for manufacturing a display apparatus.

Subsequently, the sacrificial film 144Ra and the sacrificial film 144Rb are formed over the organic film 114Rf, the electrode 111C, and the layer 101 including transistors by a method similar to that described with FIG. 8B. After that, by a method similar to that described with FIG. 8B, the resist mask 143a is formed (FIG. 16A).

Then, the sacrificial layer 145Rb and the sacrificial layer 145Ra are formed and the resist mask 143a is removed by methods similar to those described with FIGS. 8B and 8C. After that, part of the organic film 114Rf that is not covered with the sacrificial layer 145Ra is removed by etching, whereby the island-shaped or band-shaped organic layer 114R is formed. The organic film 114RF can be etched in a manner similar to that for the EL film 112Rf.

Figure 16B:
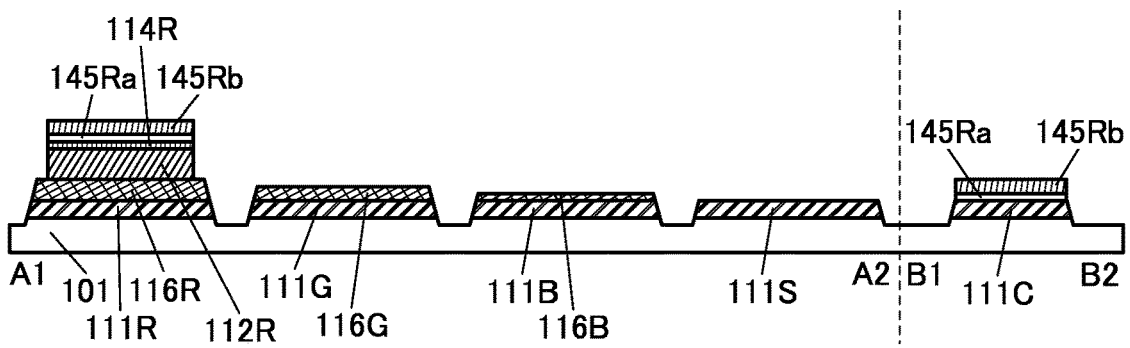

Subsequently, by a method similar to that described with FIGS. 8C and 8D, the EL layer 112R is formed (FIG. 16B). Next, the EL film 112Gf is formed, and an organic film 114Gf is formed over the EL film 112Gf. The description of the formation and the like of the EL film 112Rf and the organic film 114Rf can be referred to for the formation and the like of the EL film 112Gf and the organic film 114Gf.

Figure 16C:
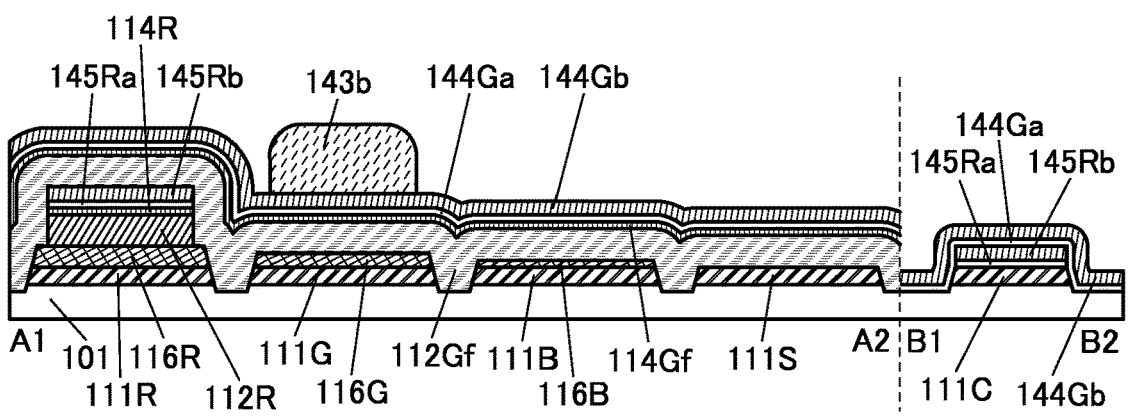

Next, the sacrificial film 144Ga is formed over the organic film 114Gf, and the sacrificial film 144Gb is formed over the sacrificial film 144Ga. After that, the resist mask 143b is formed over the sacrificial film 144Gb (FIG. 16C). The description of the formation and the like of the sacrificial films 144Ra and 144Rb and the resist mask 143a can be referred to for the formation and the like of the sacrificial films 144Ga and 144Gb and the resist mask 143b.

Figure 16D:
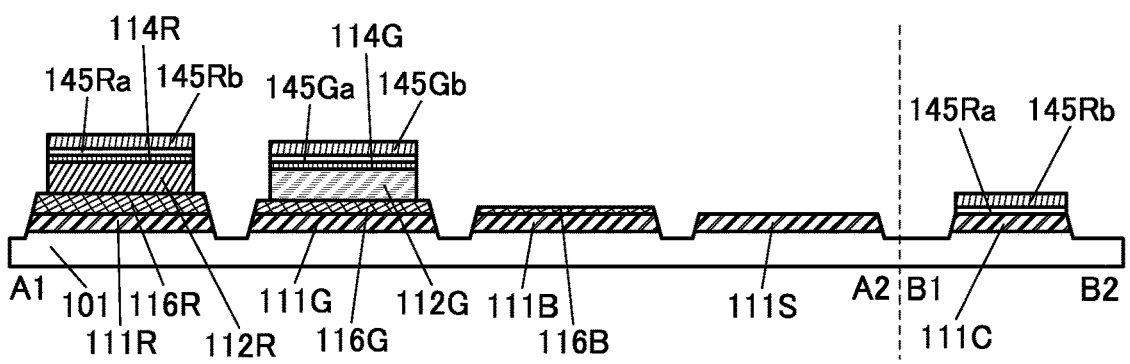

Then, the sacrificial layer 145Gb, the sacrificial layer 145Ga, the organic layer 114G, and the EL layer 112G are formed. Moreover, the resist mask 143b is removed (FIG. 16D). The description of the formation of the sacrificial layers 145Rb and 145Ra, the organic layer 114R, and the EL layer 112R, the removal of the resist mask 143a, and the like can be referred to for the formation of the sacrificial layers 145Gb and 145Ga, the organic layer 114G, and the EL layer 112G, the removal of the resist mask 143b, and the like.

Next, the EL film 112Bf is formed, and an organic film 114Bf is formed over the EL film 112Bf. The description of the formation and the like of the EL film 112Rf and the organic film 114Rf can be referred to for the formation and the like of the EL film 112Bf and the organic film 114Bf.

Figure 17A:
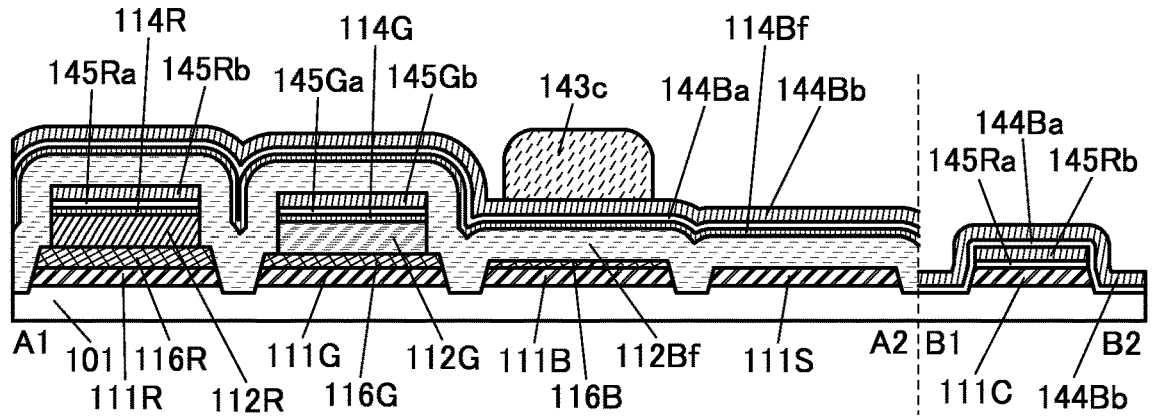
FIGS. 17A to 17D are cross-sectional views illustrating an example of a method for manufacturing a display apparatus.

Then, the sacrificial film 144Ba is formed over the organic film 114Bf, and the sacrificial film 144Bb is formed over the sacrificial film 144Ba. After that, the resist mask 143c is formed over the sacrificial film 144Bb (FIG. 17A). The description of the formation and the like of the sacrificial films 144Ra and 144Rb and the resist mask 143a can be referred to for the formation and the like of the sacrificial films 144Ba and 144Bb and the resist mask 143c.

Figure 17B:
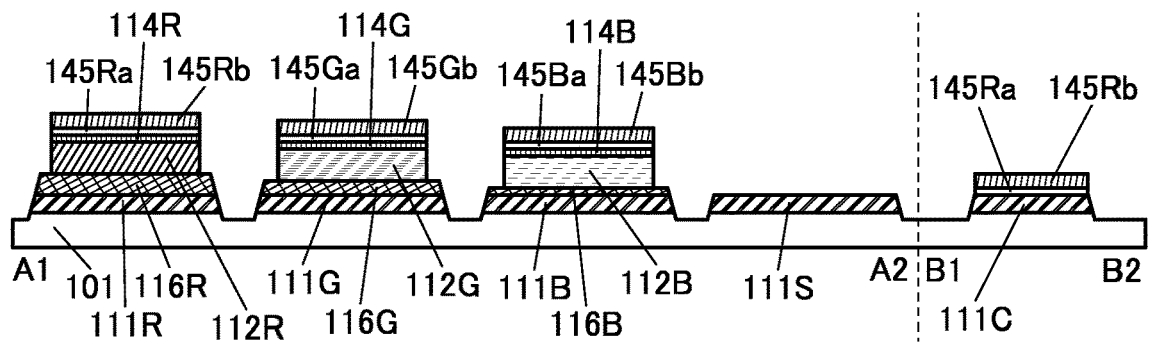

Then, the sacrificial layer 145Bb, the sacrificial layer 145Ba, the organic layer 114B, and the EL layer 112B are formed. Moreover, the resist mask 143c is removed (FIG. 17B). The description of the formation of the sacrificial layers 145Rb and 145Ra, the organic layer 114R, and the EL layer 112R, the removal of the resist mask 143a, and the like can be referred to for the formation of the sacrificial layers 145Bb and 145Ba, the organic layer 114B, and the EL layer 112B, the removal of the resist mask 143c, and the like.

Figure 17C:
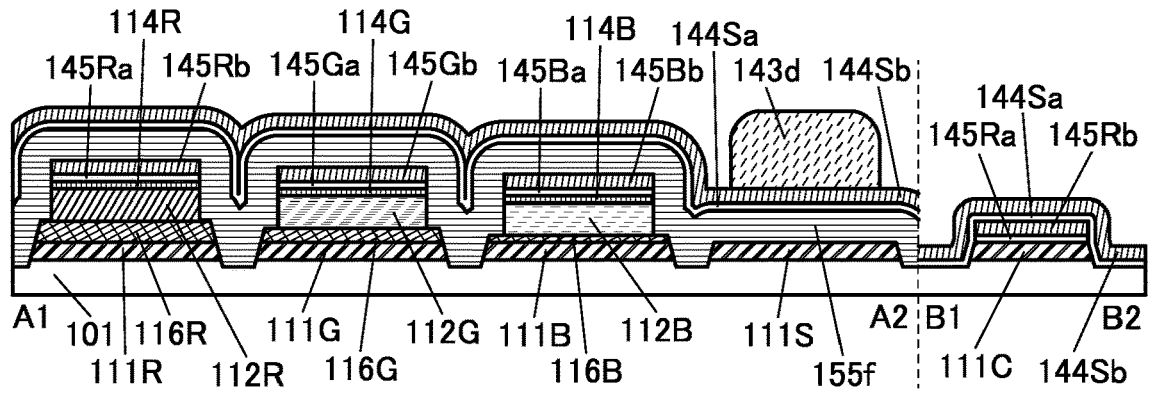

Next, by methods similar to those described with FIG. 11A, the PD film 155f, the sacrificial film 144Sa, the sacrificial film 144Sb, and the resist mask 143d are formed (FIG. 17C). Here, since the light-receiving element does not need to include an electron-injection layer and a hole-injection layer, an organic film including an electron-injection layer or a hole-injection layer does not have to be formed between the PD film 155f and the sacrificial film 144Sa.

Figure 17D:
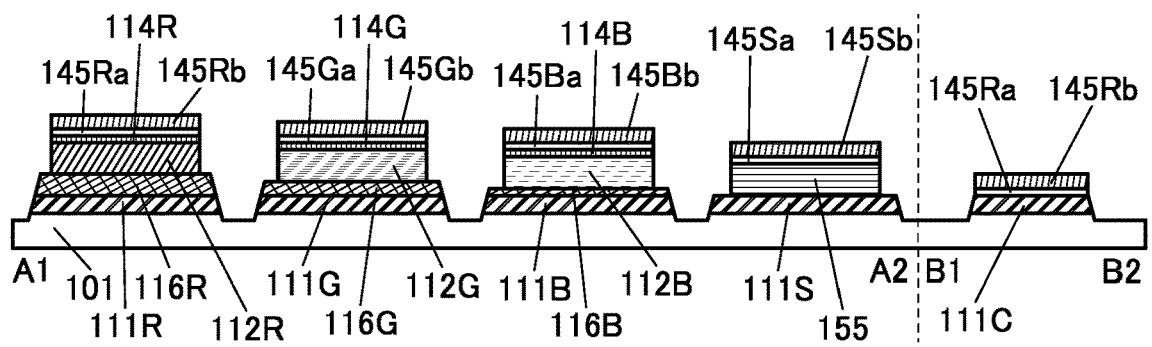
Figure 18A:
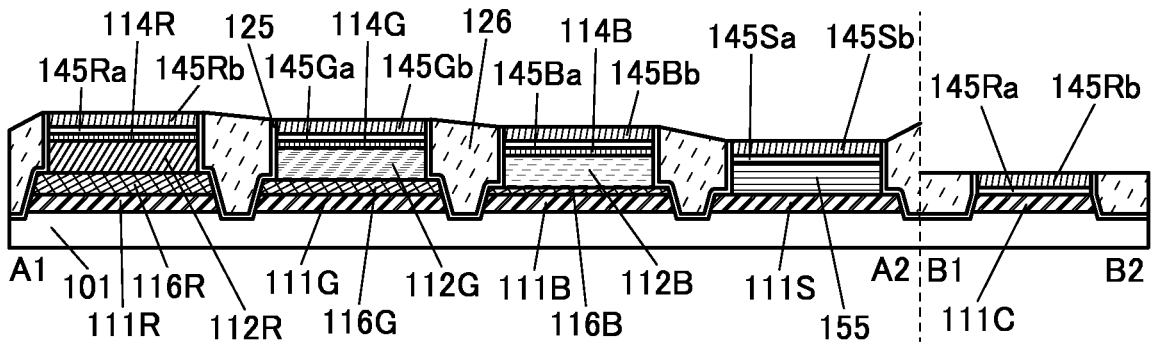
FIGS. 18A to 18C are cross-sectional views illustrating an example of a method for manufacturing a display apparatus.

Then, by methods similar to those described with FIGS. 11A to 11C, the sacrificial layer 145Sb, the sacrificial layer 145Sa, and the PD layer 155 are formed. Moreover, the resist mask 143d is removed (FIG. 17D). After that, by methods similar to those described with FIGS. 12A and 12B, the insulating layer 126 and the insulating layer 125 are formed (FIG. 18A).

Figure 18B:
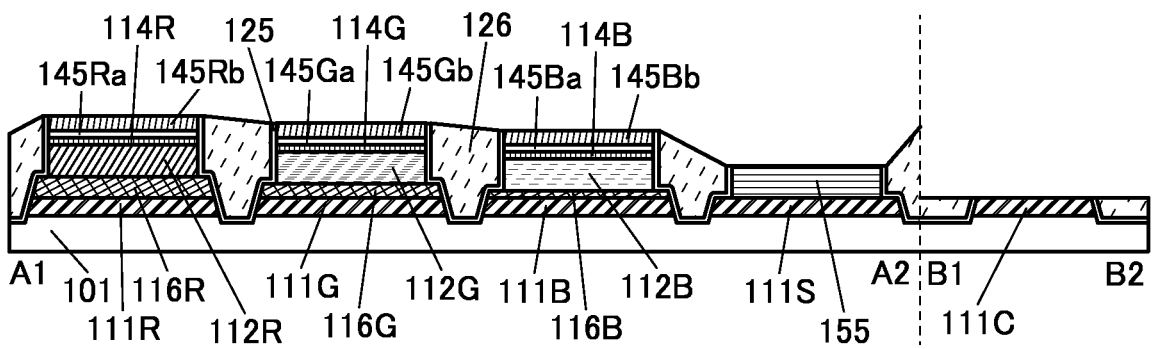

Next, the sacrificial layers 145Rb and 145Ra over the electrode 111C, and the sacrificial layers 145Sb and 145Sa are removed (FIG. 18B). The removal can be performed by a photolithography method, for example. By the removal, the top surface of the PD layer 155 and the top surface of the electrode 111C are exposed.

Then, a conductive film 113af to be the transparent electrode 113a is formed over the PD layer 155, the electrode 111C, the insulating layer 125, the insulating layer 126, the sacrificial layer 145Rb, the sacrificial layer 145Gb, and the sacrificial layer 145Bb. The conductive film 113af can be formed by a method similar to the formation method for the transparent electrode 113a described with FIG. 13A. Note that the conductive film 113af can be referred to as a transparent film.

Figure 18C:
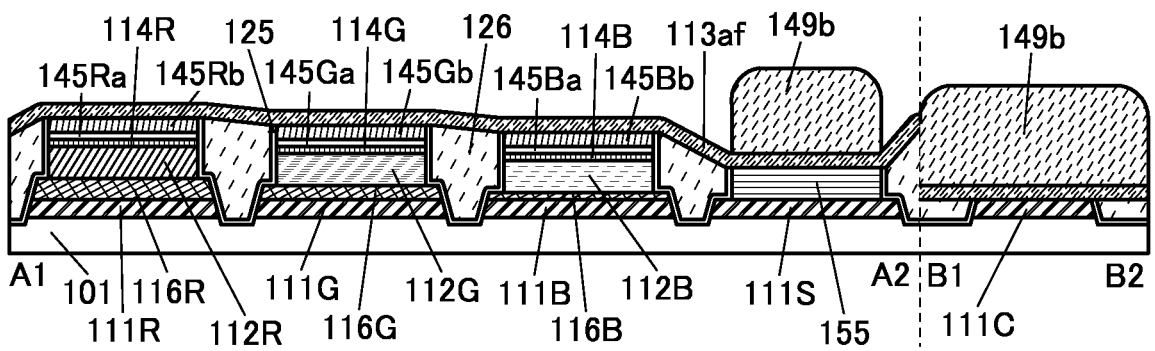

Next, a resist mask 149b is formed over the conductive film 113af (FIG. 18C). For the resist mask 149b, a resist material containing a photosensitive resin, such as a positive-type resist material or a negative-type resist material, can be used as in the case of the resist masks 143a to 143d and the resist mask 149a.

Then, part of the conductive film 113af that is not covered with the resist mask 149b is removed by etching, whereby the island-shaped or band-shaped transparent electrode 113a is formed. Thus, the transparent electrode 113a over the PD layer 155 and the transparent electrode 113a over the electrode 111C are formed.

Figure 19A:
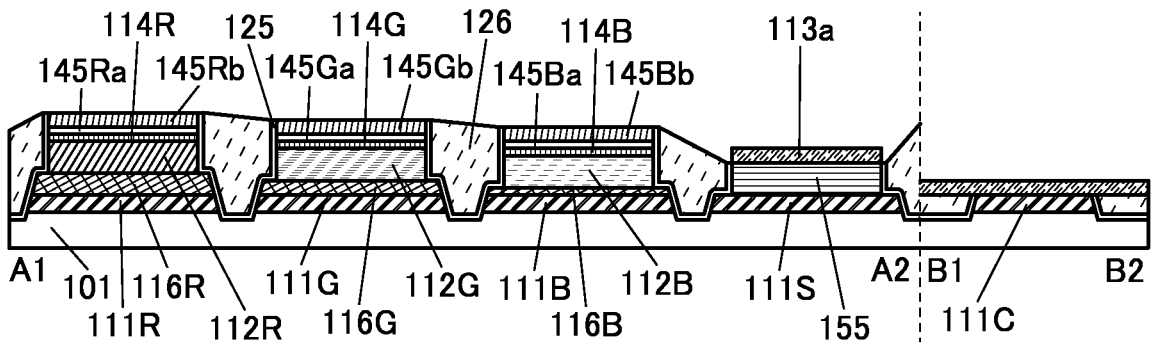
FIGS. 19A to 19D are cross-sectional views illustrating an example of a method for manufacturing a display apparatus.

Subsequently, the resist mask 149b is removed (FIG. 19A). Like the resist masks 143a to 143d and the resist mask 149a, the resist mask 149b can be removed by a plasma ashing method.

Figure 19B:
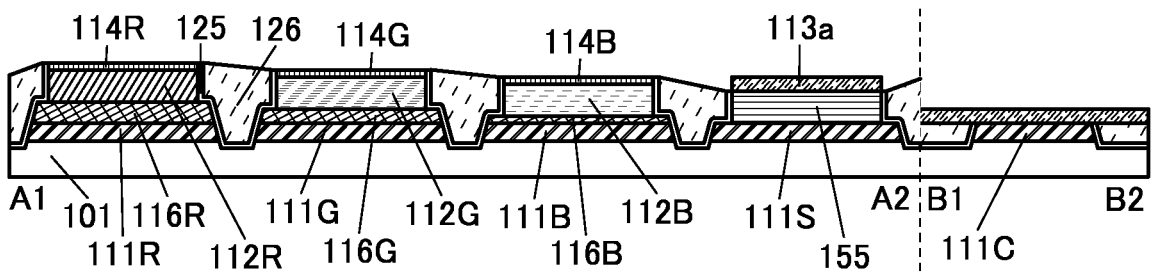

Next, by methods similar to those described with FIGS. 12B and 12C, the sacrificial layers 145Rb, 145Gb, 145Bb, 145Ra, 145Ga, and 145Ba are removed (FIG. 19B). Thus, the top surfaces of the organic layers 114R, 114G, and 114B are exposed.

Figure 19C:
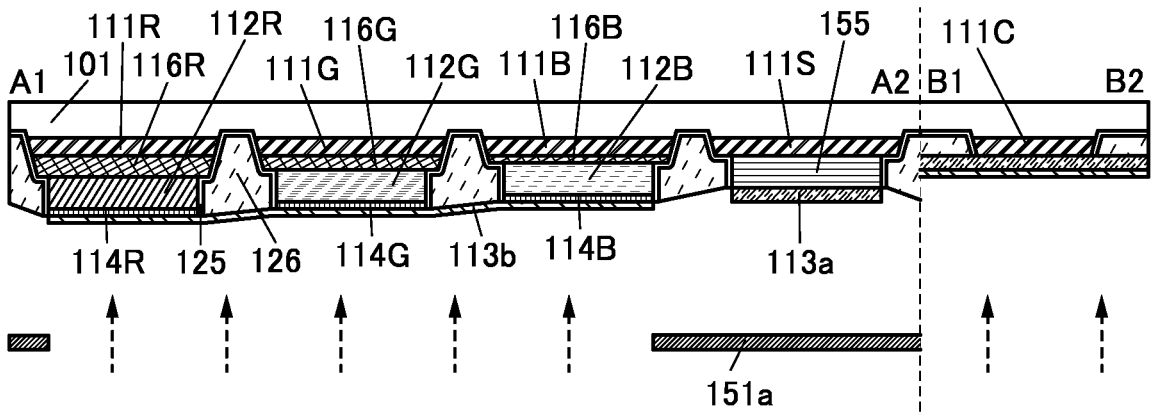
Figure 19D:
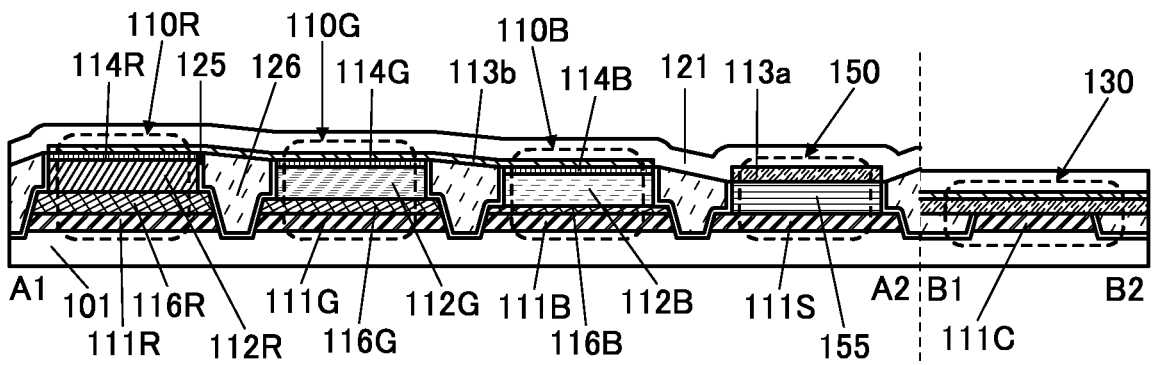

Then, by a method similar to that described with FIG. 15C, the transflective electrode 113b is formed (FIG. 19C). After that, by a method similar to that described with FIG. 13C, the protective layer 121 is formed (FIG. 19D). Through the above steps, the display apparatus 100 can be manufactured.

Figure 20A:
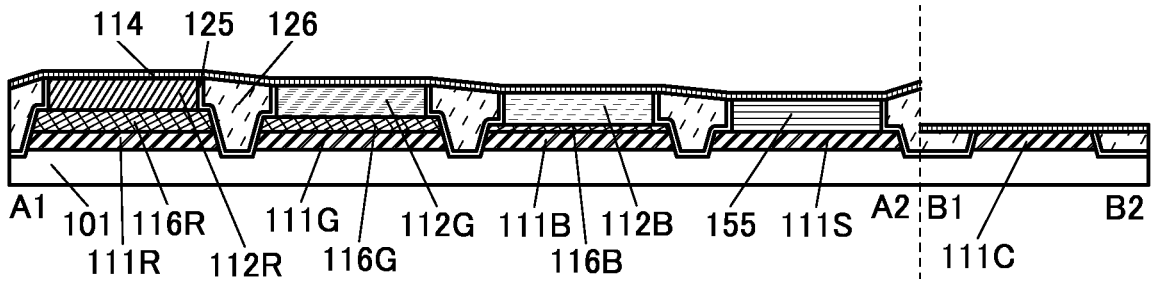
FIGS. 20A to 20C are cross-sectional views illustrating an example of a method for manufacturing a display apparatus.
Figure 20B:
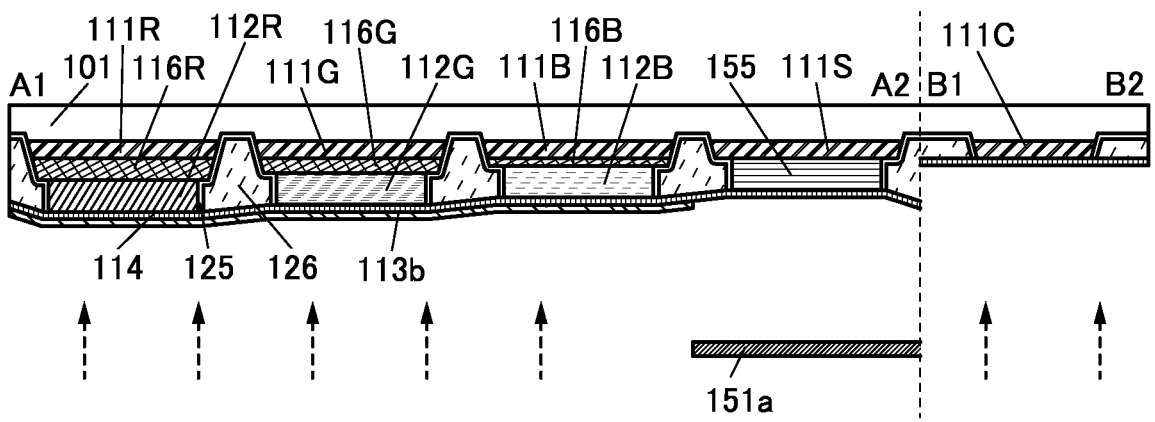
Figure 20C:
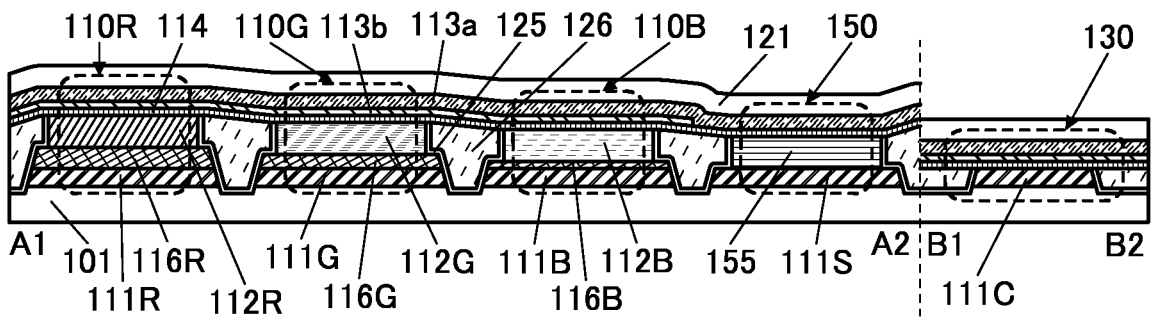

FIGS. 20A to 20C are schematic cross-sectional views illustrating an example of a method for manufacturing the display apparatus 100 in which the light-emitting elements 110 and the light-receiving element 150 have the structure in FIG. 5A and the connection portion 130 has the structure in FIG. 6G.

First, steps similar to those in FIGS. 8A to 8D to FIGS. 12A to 12D are performed (FIG. 20A). Next, the transflective electrode 113b is formed using the FMM 151a (FIG. 20B). For example, the transflective electrode 113b is formed by a vacuum evaporation method or a sputtering method using the FMM 151a. Note that the transflective electrode 113b may be formed by an inkjet method. FIG. 20B shows a state of face-down deposition. Alternatively, the transflective electrode 113b may be formed by a photolithography method.

Next, by a method similar to that described with FIG. 13A, the transparent electrode 113a is formed. After that, by a method similar to that described with FIG. 13C, the protective layer 121 is formed (FIG. 20C). Through the above steps, the display apparatus 100 can be manufactured.

FIGS. 21A to 21D and FIGS. 22A and 22B are schematic cross-sectional views illustrating an example of a method for manufacturing the display apparatus 100 in which the light-emitting elements 110 and the light-receiving element 150 have the structure in FIG. 5C and the connection portion 130 has the structure in FIG. 6G.

Figure 21A:
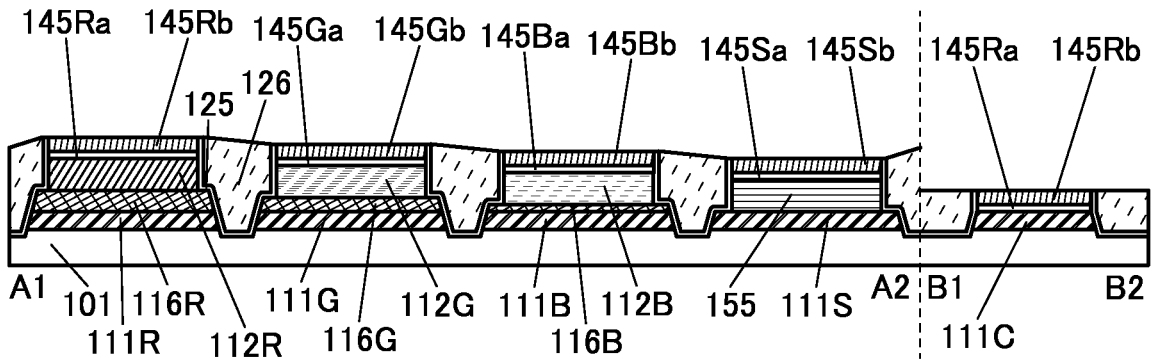
FIGS. 21A to 21D are cross-sectional views illustrating an example of a method for manufacturing a display apparatus.
Figure 21B:
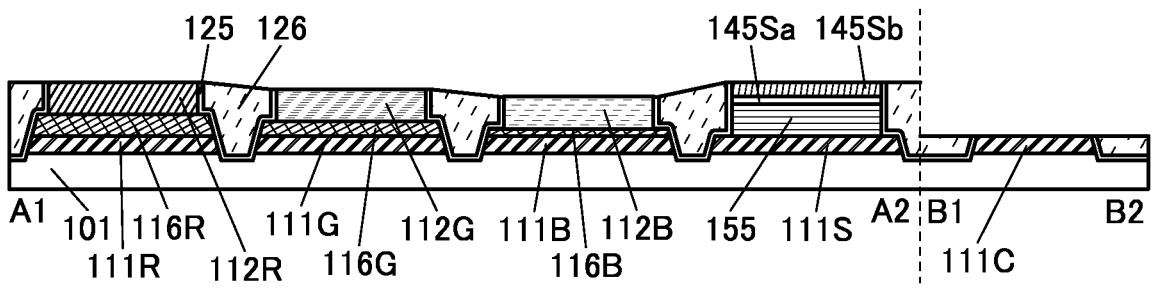

First, steps similar to those in FIGS. 8A to 8D, FIGS. 9A to 9C, FIGS. 10A to 10C, FIGS. 11A to 11C, and FIGS. 12A and 12B are performed (FIG. 21A). Then, the sacrificial layers 145Rb, 145Gb, 145Bb, 145Ra, 145Ga, and 145Ba are removed (FIG. 21B). The removal can be performed by a photolithography method, for example. By the removal, the top surfaces of the EL layers 112R, 112G, and 112B and the top surface of the electrode 111C are exposed. Here, the sacrificial layers 145Sb and 145Sa are not removed.

Figure 21C:
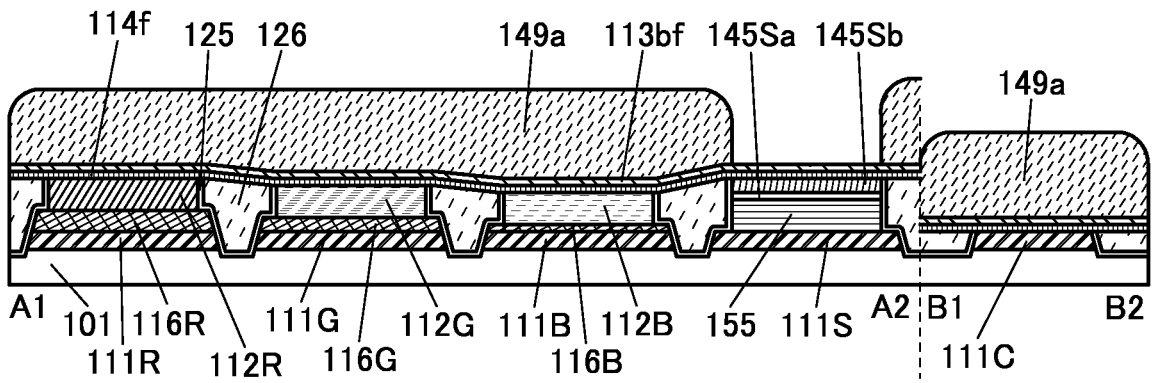
Figure 21D:
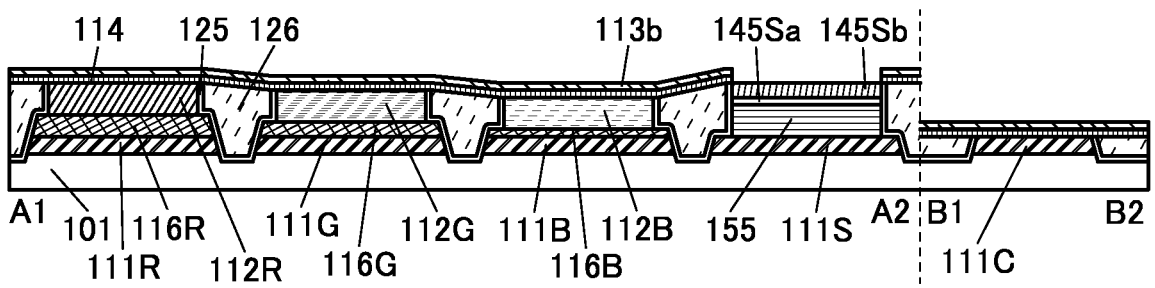

Next, by methods similar to those described with FIG. 13A, the conductive film 113bf and the resist mask 149a are formed (FIG. 21C). After that, by methods similar to those described with FIGS. 13A and 13B, the transflective electrode 113b is formed and the resist mask 149a is removed (FIG. 21D).

Figure 22A:
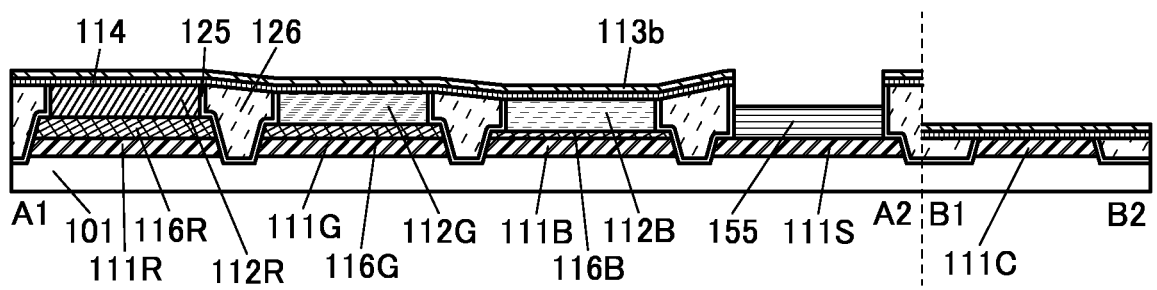
FIGS. 22A and 22B are cross-sectional views illustrating an example of a method for manufacturing of a display apparatus.

Then, by methods similar to those described with FIGS. 12B and 12C, the sacrificial layer 145Sb and the sacrificial layer 145Sa are removed (FIG. 22A). Accordingly, the top surface of the PD layer 155 is exposed.

Figure 22B:
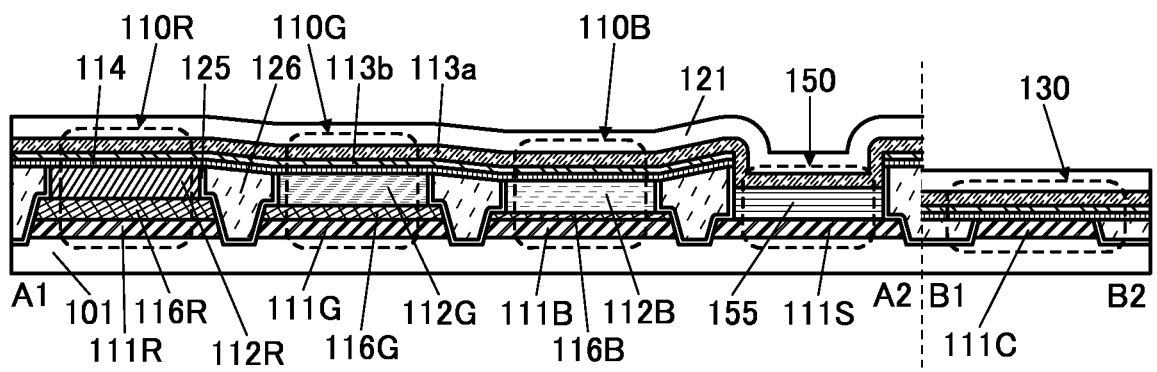

Next, by a method similar to that described with FIG. 13A, the transparent electrode 113a is formed. After that, by a method similar to that described with FIG. 13C, the protective layer 121 is formed (FIG. 22B). Through the above steps, the display apparatus 100 can be manufactured.

Figure 23A:
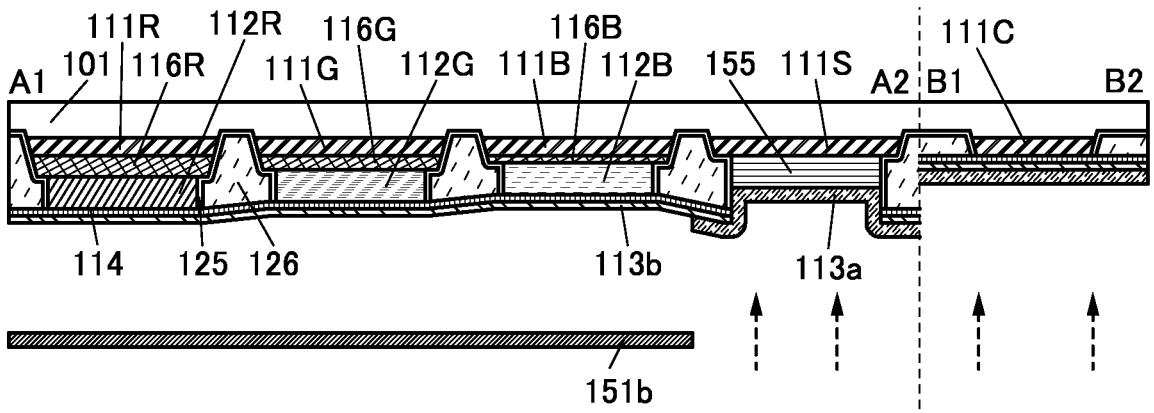
Figure 23A:
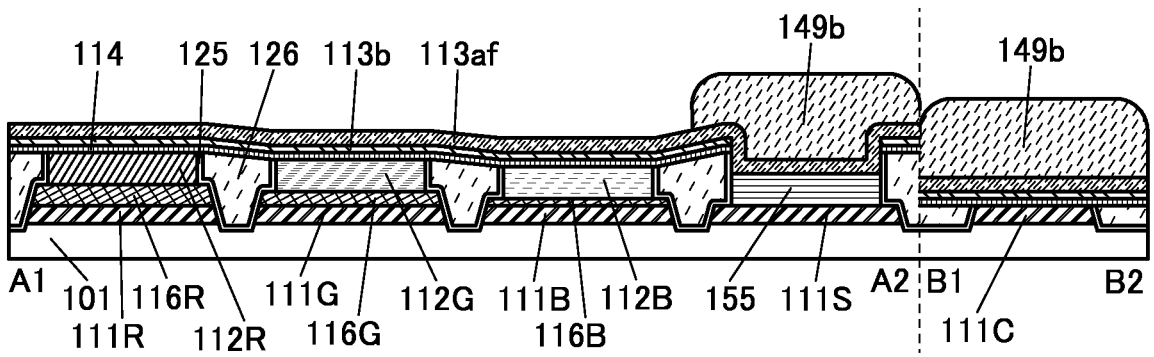
Figure 23A:
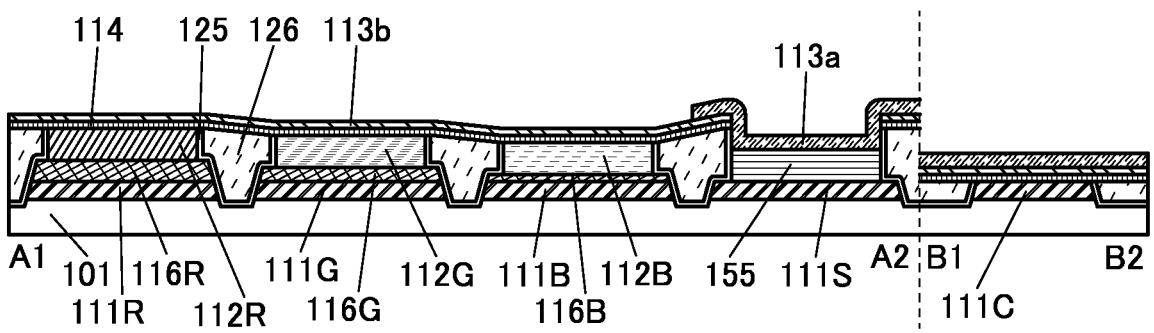

FIG. 23A is a schematic cross-sectional view illustrating an example of a method for manufacturing the display apparatus 100 in which the light-emitting elements 110 and the light-receiving element 150 have the structure in FIG. 5E and the connection portion 130 has the structure in FIG. 6G.

First, the steps up to the step illustrated in FIG. 22A are performed. Next, by a method similar to that described with FIG. 15B, the transparent electrode 113a is formed using the FMM 151b (FIG. 23A). As described above, the transparent electrode 113a can be formed by a vacuum evaporation method, a sputtering method, an inkjet method, or the like.

After that, the protective layer 121 is formed by a method similar to that described with FIG. 13C. Through the above steps, the display apparatus 100 can be manufactured.

FIGS. 23B1 and 23B2 show a variation example of the manufacturing method illustrated in FIG. 23A, and illustrates an example of manufacturing the display apparatus 100 in FIG. 5E by forming the transparent electrode 113a by a photolithography method.

After the steps up to the step illustrated in FIG. 22A are performed, the conductive film 113af is formed over the PD layer 155 and the transflective electrode 113b. The conductive film 113af can be formed by a method similar to the formation method for the transparent electrode 113a described with FIG. 13A.

Next, the resist mask 149b is formed over the conductive film 113af (FIG. 23B1). Then, by methods similar to those described with FIGS. 18C and 19A, the transparent electrode 113a is formed and the resist mask 149b is removed (FIG. 23B2).

After that, the protective layer 121 is formed by a method similar to that described with FIG. 13C. Through the above steps, the display apparatus 100 can be manufactured.

Structure Example 2

Figure 24A:
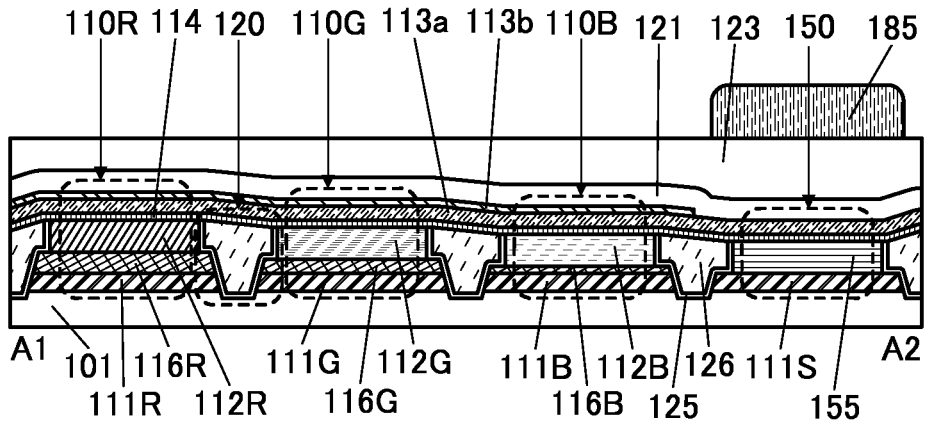
FIGS. 24A to 24C are cross-sectional views each illustrating a structure example of a display apparatus.

FIG. 24A shows a variation example of the structure illustrated in FIG. 2A. FIG. 24A illustrates a structure example in which a protective layer 123 is provided over the protective layer 121 and a coloring layer 185 is provided over the protective layer 123 so as to have a region overlapping the PD layer 155.

In this specification and the like, a coloring layer is sometimes referred to as a color filter.

In the coloring layer 185, the transmittance of light with a specific wavelength is higher than that of light with other wavelengths. Accordingly, providing the coloring layer 185 so as to have a region overlapping the PD layer 155 can prevent the PD layer 155 from being irradiated with light other than light with the specific wavelength. Thus, the display apparatus 100 can perform image capturing with high sensitivity.

The protective layer 123 is preferably planarized. In that case, the coloring layer 185 can be formed on the flat surface, which makes it easier to form the coloring layer 185. Note that the protective layer 123 is not necessarily provided. In the case where the protective layer 123 is not provided, the coloring layer 185 can be provided in contact with the protective layer 121, for example.

The protective layer 123 can include an insulating layer. The insulating layer may be an inorganic insulating layer or an organic insulating layer, like the other insulating layers included in the display apparatus 100. The insulating layer may have a stacked-layer structure of an inorganic insulating layer and an organic insulating layer.

Figure 24B:
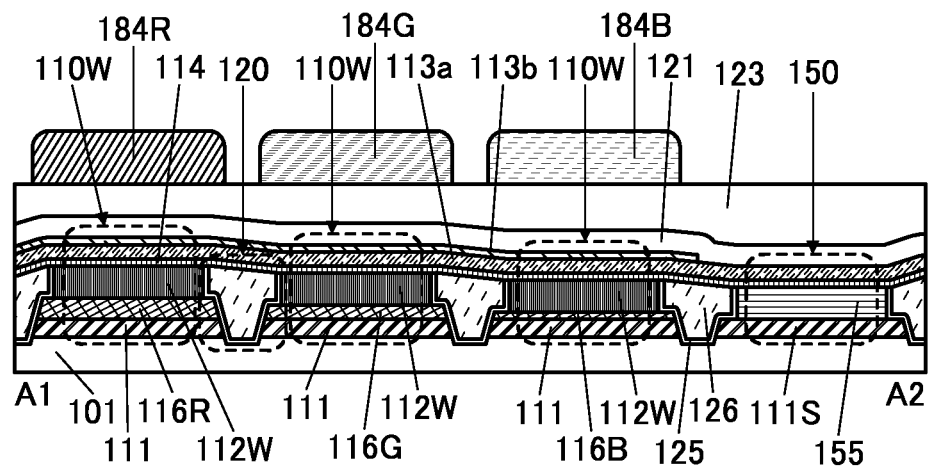

FIG. 24B shows a variation example of the structure illustrated in FIG. 2A. The display apparatus 100 illustrated in FIG. 24B includes light-emitting elements 110W instead of the light-emitting elements 110R, 110G, and 110B. The light-emitting element 110W includes an EL layer 112W that emits white light.

The EL layer 112W can have, for example, a stacked structure of two or more light-emitting layers that are selected so as to emit light of complementary colors (a tandem structure). The EL layer 112W may be a stacked EL layer in which a charge-generation layer is provided between light-emitting layers.

The protective layer 123 is provided over the protective layer 121. A coloring layer 184R, a coloring layer 184G, and a coloring layer 184B are provided over the protective layer 123 so as to have a region overlapping the light-emitting elements 110W. For example, the coloring layer 184R has higher transmittance in the red wavelength range than in the other wavelength ranges; the coloring layer 184G has higher transmittance in the green wavelength range than in the other wavelength ranges; and the coloring layer 184B has higher transmittance in the blue wavelength range than in the other wavelength ranges. Accordingly, the display apparatus 100 can display color images even when light emitted from the light-emitting element 110W is white light.

The light-emitting element 110 preferably includes the optical adjustment layer 116 even when the display apparatus 100 includes the coloring layers 184R, 184G, and 184B. That is, the light-emitting element 110W preferably employs a microcavity structure. Thus, light emitted from the light-emitting element 110W toward the coloring layer 184 can be light with higher intensity in a specific wavelength range. For example, the light-emitting element 110W having a region overlapping the coloring layer 184R can emit light with higher intensity in the red wavelength range. The light-emitting element 110W having a region overlapping the coloring layer 184G can emit light with higher intensity in the green wavelength range. The light-emitting element 110W having a region overlapping the coloring layer 184B can emit light with higher intensity in the blue wavelength range.

For example, in some cases, the coloring layer 184R cannot completely block light other than light in the red wavelength range, the coloring layer 184G cannot completely block light other than light in the green wavelength range, and the coloring layer 184B cannot completely block light other than light in the blue wavelength range. Accordingly, applying a microcavity structure to the light-emitting element 110W can increase the color purity of the light transmitted through the coloring layer 184.

Figure 24C:
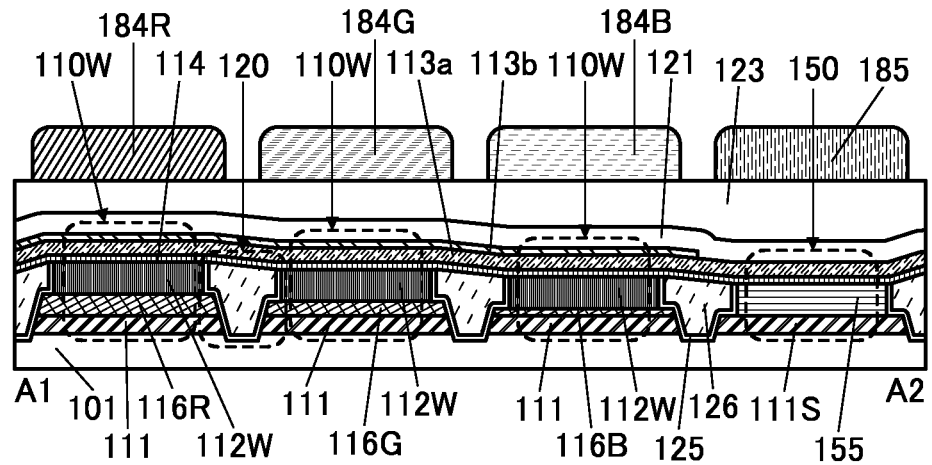

FIG. 24C illustrates an example in which the coloring layer 185 in FIG. 24A is provided in the display apparatus 100 in FIG. 24B. That is, the display apparatus 100 in FIG. 24C includes both the coloring layer 184 and the coloring layer 185.

Figure 25A:
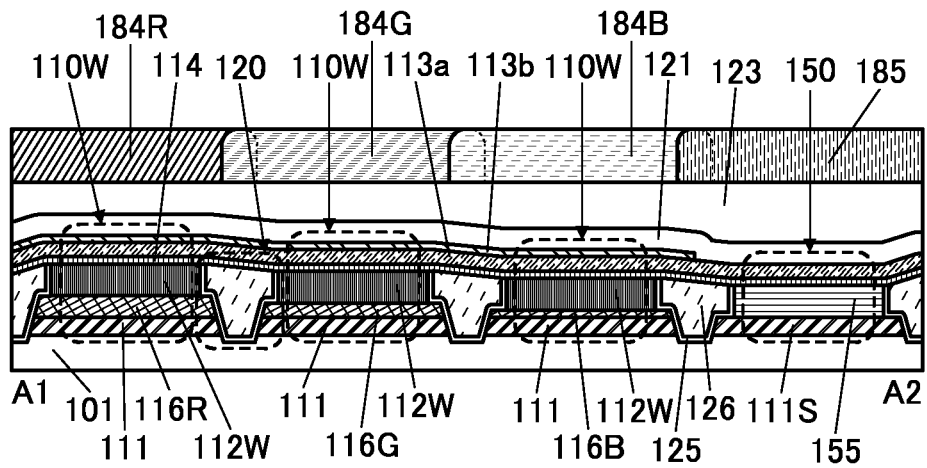
FIGS. 25A to 25C are cross-sectional views each illustrating a structure example of a display apparatus.

FIG. 25A illustrates a variation example of the structure in FIG. 24C, in which the adjacent coloring layers include an overlap region. In FIG. 25A, a region where the coloring layers overlap is shown with a dotted line. The region where the adjacent coloring layers overlap can be provided over the insulating layer 126, for example.

By overlapping the adjacent coloring layers, a region where the coloring layers that transmit light of different colors overlap can be provided. The region in the coloring layers can function as a light-blocking layer. Thus, light emitted from the light-emitting element 110 can be prevented from leaking to an adjacent subpixel. For example, light emitted from the light-emitting element 110W overlapped by the coloring layer 184R can be prevented from entering the coloring layer 184G. Consequently, the contrast of images displayed on the display apparatus 100 can be increased, and the display apparatus achieves high display quality.

Figure 25B:
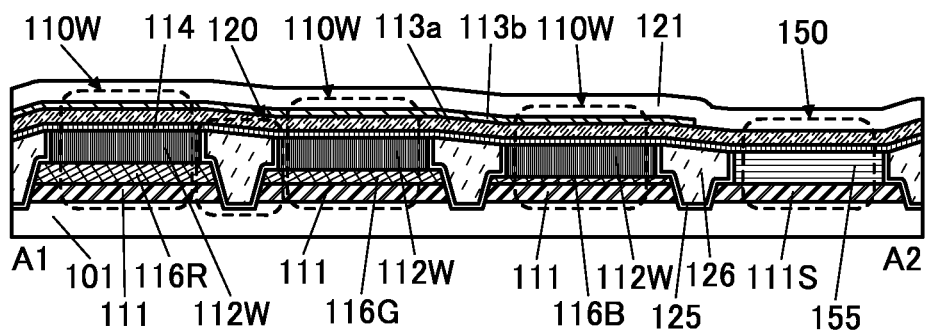

FIG. 25B shows a variation example of the structure in FIG. 24B, in which the coloring layer 184 is not provided.

The EL layer 112W included in the light-emitting element 110W in FIG. 25B has a function of emitting white light. However, since the light-emitting element 110W employs a microcavity structure, light emitted from the light-emitting element 110W can have higher intensity in a specific wavelength range. For example, the light-emitting element 110W including the optical adjustment layer 116R can emit light with higher intensity in the red wavelength range. The light-emitting element 110W including the optical adjustment layer 116G can emit light with higher intensity in the red wavelength range. The light-emitting element 110W including the optical adjustment layer 116B can emit light with higher intensity in the blue wavelength range. Accordingly, the display apparatus including the light-emitting elements 110W instead of the light-emitting elements 110R, 110G, and 110B can display color images without the coloring layers 184R, 184G, and 184B. Meanwhile, when a microcavity structure is applied to the light-emitting elements 110W and the coloring layers 184 are provided over the light-emitting elements 110W, the display apparatus 100 can have a high contrast ratio.

Figure 25C:
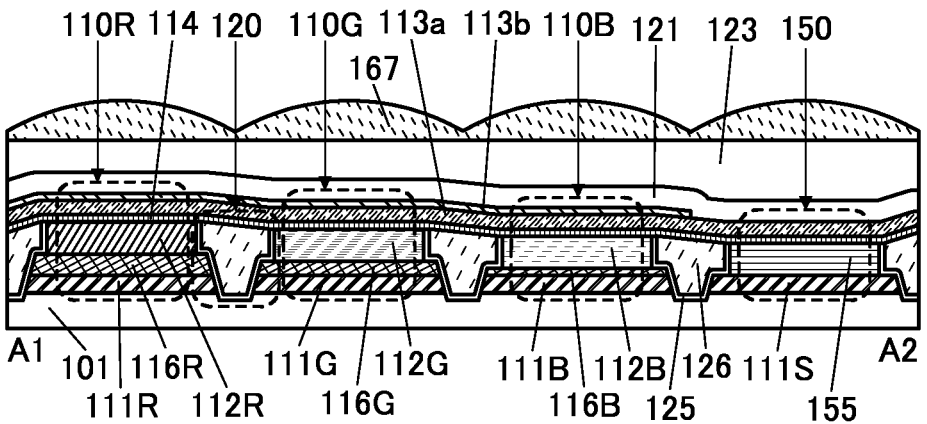

FIG. 25C illustrates a variation example of the structure in FIG. 2A, in which the protective layer 123 is provided over the protective layer 121 and a microlens array 167 is provided over the protective layer 123. Light emitted from the light-emitting elements 110 can be collected by the microlens array 167 in some cases. When light emitted from the light-emitting elements 110 is collected, the user of the display apparatus 100 can see bright images particularly when viewing the display portion of the display apparatus 100 from the front. Moreover, the microlens array 167 can collect light delivered to the light-receiving element 150. Thus, the display apparatus 100 can perform image capturing with high sensitivity.

Figure 26A:
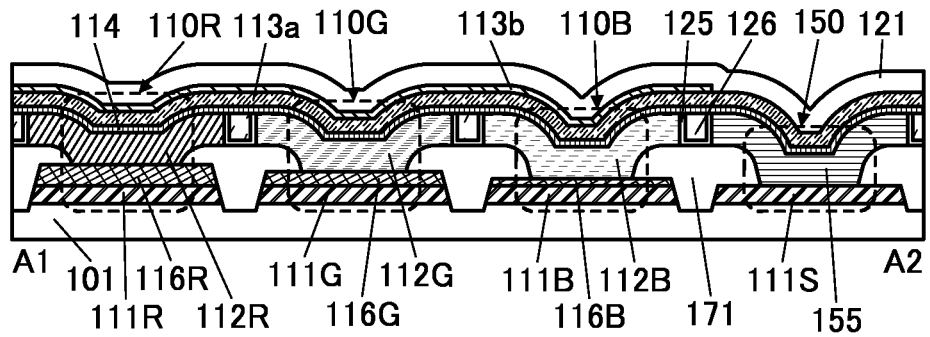
FIGS. 26A to 26C are cross-sectional views each illustrating a structure example of a display apparatus.

FIG. 26A illustrates a variation example of the structure in FIG. 2A, in which an insulating layer 171 is provided between the light-emitting element 110 and the light-receiving element 150 that are adjacent to each other and between the two adjacent light-emitting elements 110. The insulating layer 171 is provided to cover the end portions of the electrode 111 and the optical adjustment layer 116. The insulating layer 125 is provided over the insulating layer 171, and the insulating layer 126 is provided over the insulating layer 125. A region of the EL layer 112 that is not in contact with the optical adjustment layer 116 is positioned over the insulating layer 171, and a region of the PD layer 155 that is not in contact with the electrode 111S is positioned over the insulating layer 171. Thus, in the vicinity of the end portion of the optical adjustment layer 116, there is a region where the insulating layer 171 is provided between the optical adjustment layer 116 and the EL layer 112. Moreover, in the vicinity of the end portion of the electrode 111S, there is a region where the insulating layer 171 is provided between the electrode 111S and the PD layer 155.

Providing the insulating layer 171 to cover the end portions of the electrodes 111 can prevent a short circuit between the adjacent electrodes 111. The end portions of the insulating layer 171 are preferably tapered. When an organic material, for example, an organic resin is used for the insulating layer 171, its edges can be gently curved. Thus, the coverage of the insulating layer 171 with the layer provided thereover can be improved. Furthermore, the top surface of the insulating layer 171 can be planarized.

Examples of an organic material that can be used for the insulating layer 171 include an acrylic resin, an epoxy resin, a polyimide resin, a polyamide resin, a polyimide-amide resin, a polysiloxane resin, a benzocyclobutene-based resin, and a phenol resin.

Figure 26B:
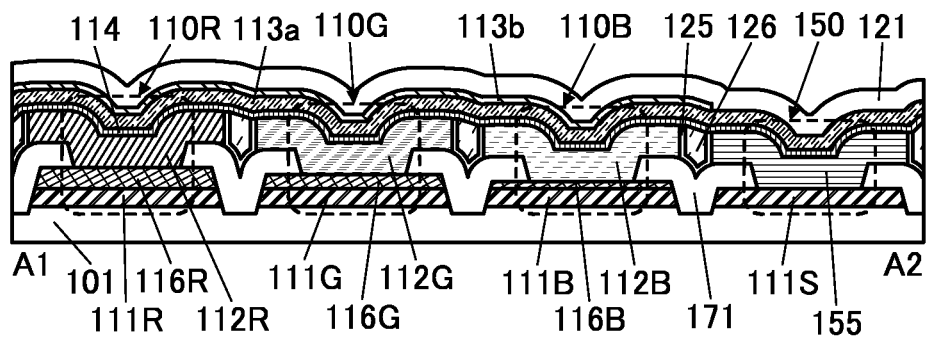

FIG. 26B illustrates a variation example of the structure in FIG. 26A, in which the insulating layer 171 has angular edges and the top surface of the insulating layer 171 is not planarized. For the insulating layer 171 illustrated in FIG. 26B, an inorganic material can be used, for example.

Examples of an inorganic material that can be used for the insulating layer 171 include silicon oxide, aluminum oxide, gallium oxide, germanium oxide, yttrium oxide, zirconium oxide, lanthanum oxide, neodymium oxide, hafnium oxide, tantalum oxide, silicon nitride, aluminum nitride, silicon oxynitride, aluminum oxynitride, silicon nitride oxide, and aluminum nitride oxide.

Figure 26C:
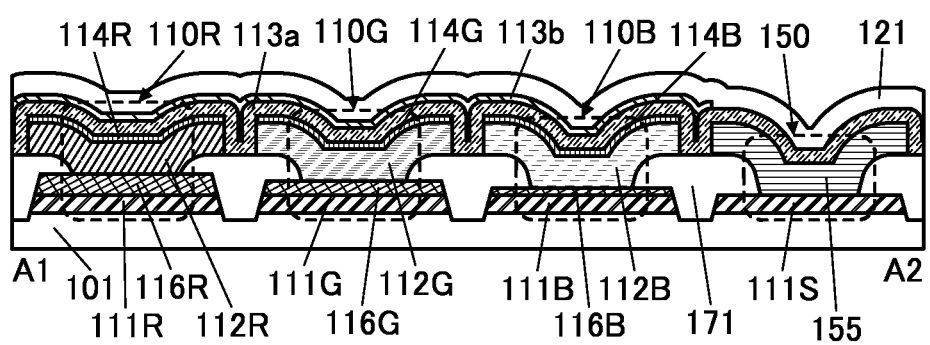

FIG. 26C is a schematic cross-sectional view along the dashed-dotted line A1-A2 in FIG. 1, illustrating a structure example of the light-emitting elements 110R, 110G, and 110B and the light-receiving element 150. As in FIG. 2A and the like, the light-emitting elements 110 and the light-receiving element 150 are provided over the layer 101 including transistors.

The light-emitting element 110R includes the electrode 111R, the optical adjustment layer 116R over the electrode 111R, the EL layer 112R over the optical adjustment layer 116R, the organic layer 114R over the EL layer 112R, the transparent electrode 113a over the organic layer 114R, and the transflective electrode 113b over the transparent electrode 113a. The light-emitting element 110G includes the electrode 111G, the optical adjustment layer 116G over the electrode 111G, the EL layer 112G over the optical adjustment layer 116G, the organic layer 114G over the EL layer 112G, the transparent electrode 113a over the organic layer 114G, and the transflective electrode 113b over the transparent electrode 113a. The light-emitting element 110B includes the electrode 111B, the optical adjustment layer 116B over the electrode 111B, the EL layer 112B over the optical adjustment layer 116B, the organic layer 114B over the EL layer 112B, the transparent electrode 113a over the organic layer 114B, and the transflective electrode 113b over the transparent electrode 113a. The light-receiving element 150 includes the electrode 111S, the PD layer 155 over the electrode 111S, and the transparent electrode 113a over the PD layer 155. The protective layer 121 is provided to cover the light-emitting elements 110R, 110G, and 110B and the light-receiving element 150. Note that the insulating layer 125 and the insulating layer 126 are not provided.

The EL layer 112, the PD layer 155, the transparent electrode 113a, the transflective electrode 113b, and the protective layer 121 are provided over the insulating layer 171. Here, the EL layer 112, the PD layer 155, and the transparent electrode 113a can be provided so as to have a region in contact with the insulating layer 171. Note that a hollow space may be provided between the insulating layer 171 and the transparent electrode 113a. In this case, the transparent electrode 113a is not in contact with the insulating layer 171.

Manufacturing Method Example 2

FIGS. 27A to 27D and FIGS. 28A and 28B are schematic cross-sectional views illustrating an example of a method for manufacturing the display apparatus 100 in which the light-emitting elements 110 and the light-receiving element 150 have the structure in FIG. 26C. FIGS. 27A to 27D and FIGS. 28A and 28B also illustrate an example of a method for manufacturing the connection portion 130, and specifically show schematic cross-sectional views along the dashed-dotted line B1-B2 in FIG. 1.

Figure 27A:
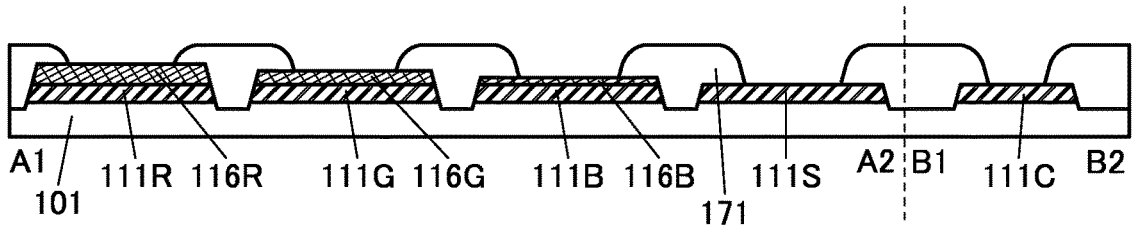
FIGS. 27A to 27D are cross-sectional views illustrating an example of a method for manufacturing a display apparatus.

First, the electrode 111 and the optical adjustment layer 116 are formed by methods similar to those described with FIG. 8A. Next, the insulating layer 171 is formed to cover the end portions of the electrode 111 and the optical adjustment layer 116 (FIG. 27A). For example, a film to be the insulating layer 171 is deposited and then processed, whereby the insulating layer 171 can be formed. The film to be the insulating layer 171 can be formed by a spin coating method, a spray coating method, a screen printing method, a CVD method, a sputtering method, or a vacuum evaporation method, for example. The film to be the insulating layer 171 can be processed by a photolithography method, for example.

Figure 27B:
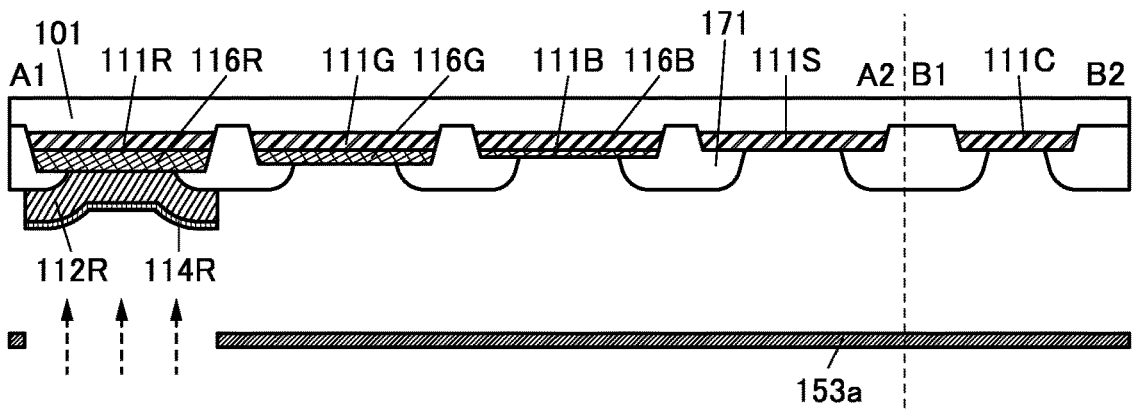

Subsequently, the EL layer 112R and the organic layer 114R are formed using an FMM 153a (FIG. 27B). For example, the EL layer 112R and the organic layer 114R are formed by a vacuum evaporation method or a sputtering method using the FMM 153a. Note that the EL layer 112R and the organic layer 114R may be formed by an inkjet method. FIG. 27B shows a state of face-down deposition, in which deposition is performed with the substrate turned upside down so that the film formation surface lies face down. Here, the EL layer 112R and the organic layer 114R can be formed using the same apparatus.

Figure 27C:
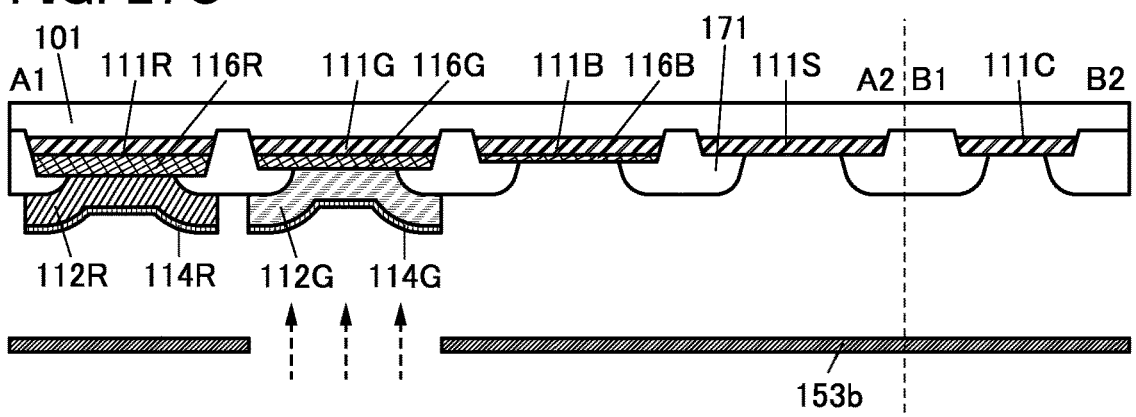
Figure 27D:
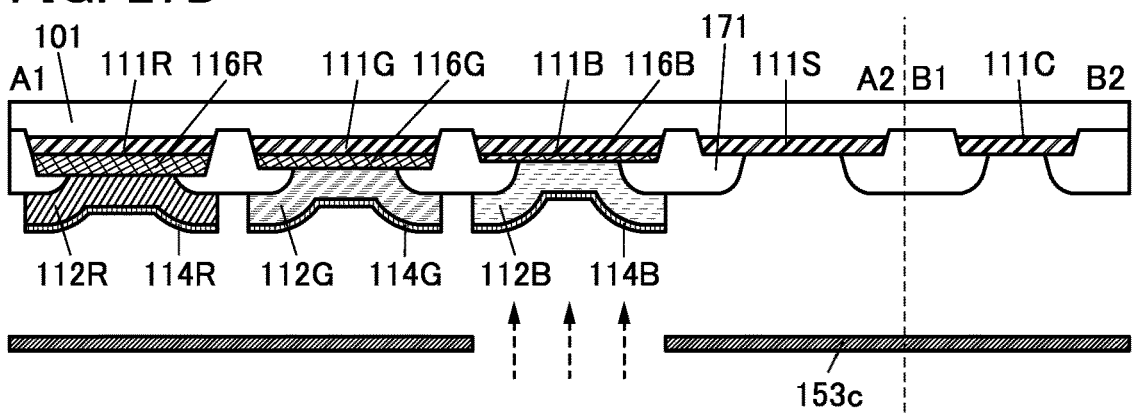

Then, the EL layer 112G and the organic layer 114G are formed using an FMM 153b (FIG. 27C). The EL layer 112G and the organic layer 114G can be formed by methods similar to those for the EL layer 112R and the organic layer 114R. Similarly, the EL layer 112B and the organic layer 114B are formed using an FMM 153c (see FIG. 27D).

Figure 28A:
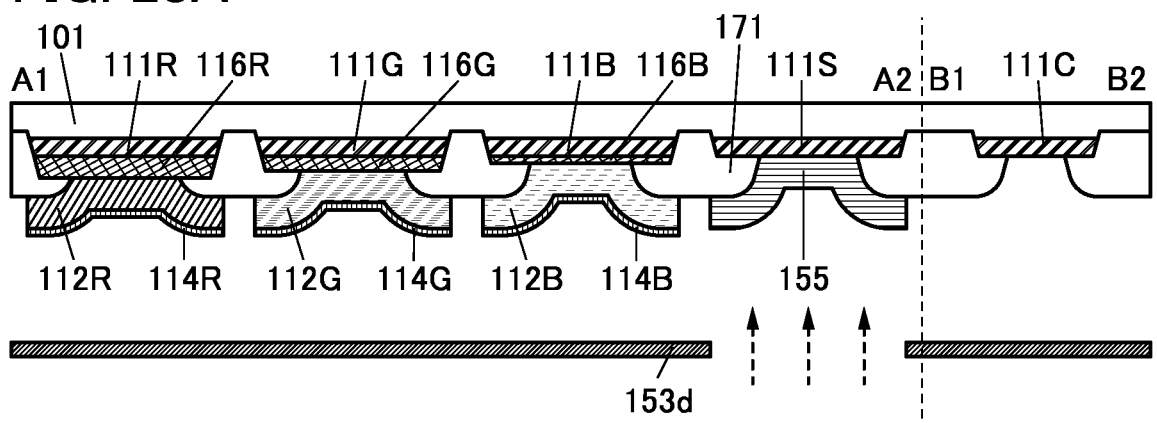
FIGS. 28A and 28B are cross-sectional views illustrating an example of a method for manufacturing a display apparatus.
Figure 28B:
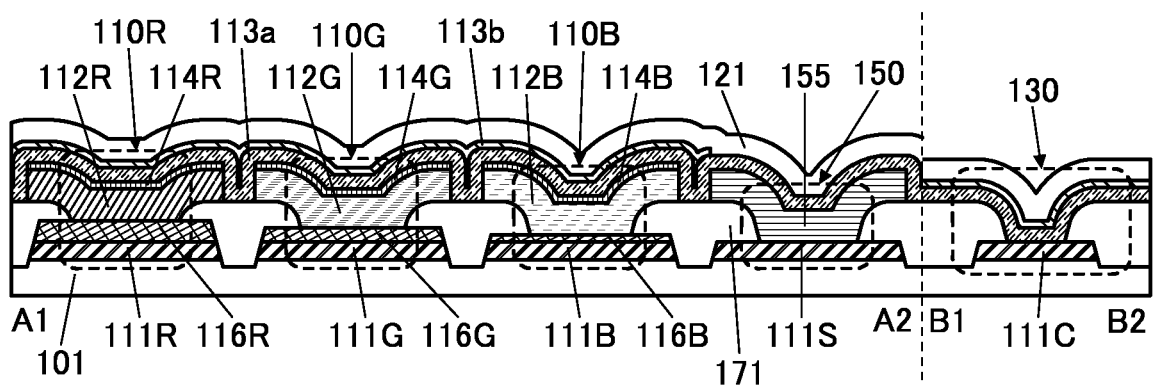

Next, the PD layer 155 is formed by using an FMM 153d (FIG. 28A). For example, the PD layer 155 can be formed by a vacuum evaporation method or a sputtering method using the FMM 153d. Note that the PD layer 155 may be formed by an inkjet method.

Subsequently, the transparent electrode 113a is formed over the organic layers 114R, 114G, and 114B, the PD layer 155, the electrode 111C, and the insulating layer 171 by a method similar to that described with FIG. 13A. After that, the transflective electrode 113b is formed by a method similar to that described with FIGS. 13A and 13B or FIGS. 14A and 14B. Then, the protective layer 121 is formed by a method similar to that described with FIG. 13C. Through the above steps, the display apparatus 100 can be manufactured.

As described above, in the display apparatus 100 illustrated in FIG. 26C, the EL layer 112, the organic layer 114, and the PD layer 155 can be formed using the FMMs. Here, providing the insulating layer 171 in the display apparatus 100 can prevent the FMMs from being in contact with the electrode 111 and the optical adjustment layer 116. Note that the EL layer 112 and the PD layer 155 may alternatively be formed by a photolithography method to fabricate the display apparatus 100 illustrated in FIG. 26C. Furthermore, the EL layer 112 and the PD layer 155 may be formed using FMMs to fabricate the display apparatus 100 other than that in FIG. 26C.

Although the light-emitting element 110 is described as an EL element in this embodiment, one embodiment of the present invention is not limited thereto. For example, the light-emitting element 110 may be an LED such as a micro LED. Alternatively, a liquid crystal element may be provided instead of the light-emitting element 110 so that the display apparatus performs display using liquid crystal elements.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 2

In this embodiment, the display apparatus of one embodiment of the present invention will be described with reference to drawings.

The display apparatus of one embodiment of the present invention can be a high-resolution display apparatus or a large-sized display apparatus. Accordingly, the display apparatus in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, desktop and laptop personal computers, a monitor of a computer and the like, digital signage, and a large game machine such as a pachinko machine.

The display apparatus of one embodiment of the present invention can have high definition. Thus, the display apparatus in this embodiment can be used for display portions of information terminals (wearable devices) such as watch-type and bracelet-type information terminals and display portions of wearable devices capable of being worn on a head, such as a VR device like a head mounted display and a glasses-type AR device.

[Display Module 1]

Figure 29:
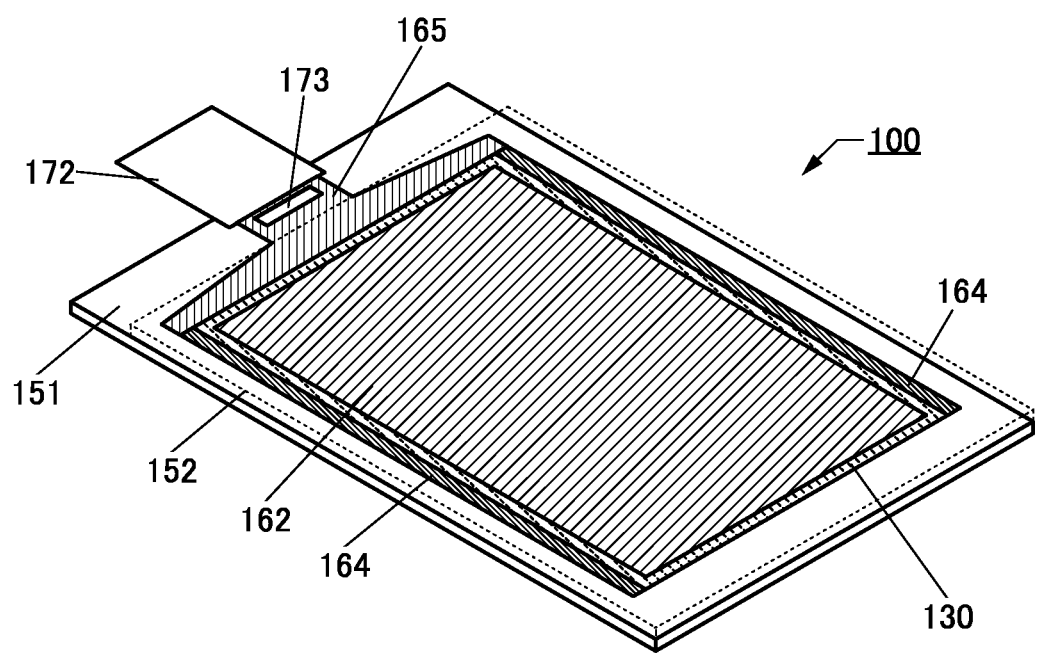
FIG. 29 is a perspective view illustrating a structure example of a display apparatus.
Figure 30A:
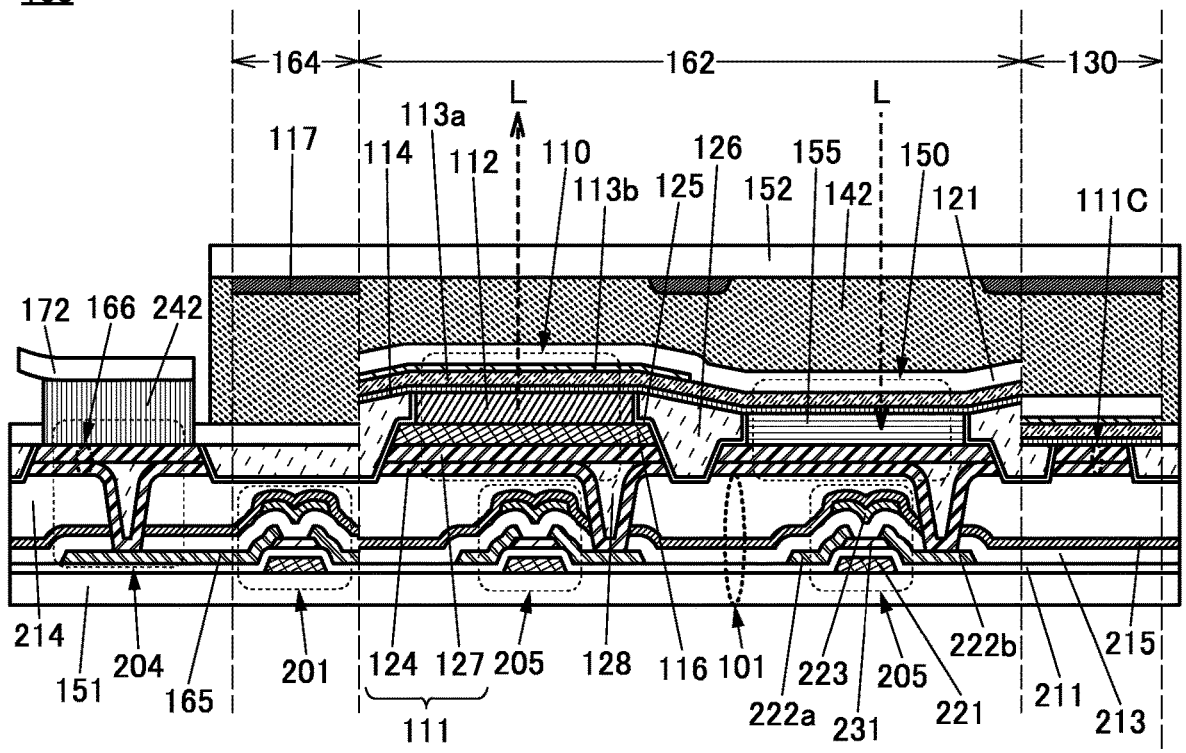
FIG. 30A is a cross-sectional view illustrating a structure example of a display apparatus.

FIG. 29 is a perspective view of the display apparatus 100, and FIG. 30A is a cross-sectional view of the display apparatus 100.

In the display apparatus 100, a substrate 152 and a substrate 151 are attached to each other. In FIG. 29, the substrate 152 is indicated by a dashed line.

The display apparatus 100 includes a display portion 162, the connection portion 130, a circuit portion 164, a wiring 165, and the like. FIG. 29 illustrates an example in which an IC 173 and an FPC 172 are mounted on the display apparatus 100. Thus, the structure illustrated in FIG. 29 can be regarded as a display module including the display apparatus 100, the integrated circuit (IC), and the FPC. Here, a display apparatus in which a substrate is equipped with a connector such as an FPC or mounted with an IC is referred to as a display module.

The connection portion 130 is provided outside the display portion 162. The connection portion 130 can be provided along one side or a plurality of sides of the display portion 162. One or a plurality of connection portions 130 can be provided. FIG. 29 illustrates an example in which the connection portion 130 is provided so as to surround the four sides of the display portion 162. In the connection portion 130, a common electrode of a light-emitting element is electrically connected to a conductive layer so that a potential can be supplied to the common electrode.

As the circuit portion 164, a scan line driver circuit can be used, for example.

The wiring 165 has a function of supplying a signal and power to the display portion 162 and the circuit portion 164. The signal and power are input to the wiring 165 from the outside through the FPC 172 or from the IC 173.

FIG. 29 illustrates an example in which the IC 173 is provided over the substrate 151 by a COG method, a chip on film (COF) method, or the like. An IC including a scan line driver circuit, a signal line driver circuit, or the like can be used as the IC 173, for example. Note that the display apparatus 100 and the display module are not necessarily provided with an IC. Alternatively, the IC may be mounted on the FPC by a COF method, for example.

FIG. 30A illustrates an example of cross sections of part of a region including the FPC 172, part of the circuit portion 164, part of the display portion 162, part of the connection portion 130, and part of a region including an end portion of the display apparatus 100.

The display apparatus 100 in FIG. 30A includes a transistor 201, a transistor 205, the light-emitting element 110, the light-receiving element 150, and the like between the substrates 151 and 152.

The light-emitting element 110 and the light-receiving element 150 can have the structure illustrated in FIG. 2A or the like except for the structure of the pixel electrode. Embodiment 1 can be referred to for the details of the light-emitting element 110 and the light-receiving element 150. The insulating layer 125 and the insulating layer 126 over the insulating layer 125 are provided between the light-emitting element 110 and the light-receiving element 150 that are adjacent to each other. Although not illustrated in FIG. 30A, the insulating layer 125 and the insulating layer 126 over the insulating layer 125 are also provided between the two adjacent light-emitting elements 110.

The light-emitting element 110 includes a conductive layer 124, a conductive layer 127 over the conductive layer 124, the optical adjustment layer 116 over the conductive layer 127, the EL layer 112 over the optical adjustment layer 116, the organic layer 114 over the EL layer 112, the transparent electrode 113a over the organic layer 114, and the transflective electrode 113b over the transparent electrode 113a. The light-receiving element 150 includes the conductive layer 124, the conductive layer 127 over the conductive layer 124, the PD layer 155 over the conductive layer 127, the organic layer 114 over the PD layer 155, and the transparent electrode 113a over the organic layer 114. Here, the conductive layer 124 and the conductive layer 127 form the electrode 111.

The conductive layer 124 is connected to a conductive layer 222b included in the transistor 205 through an opening provided in insulating layers 214, 215, and 213. The conductive layer 124 is recessed along the opening provided in the insulating layers 214, 215, and 213. A layer 128 is embedded in the recessed portion.

The layer 128 has a function of filling the recessed portion of the conductive layer 124. The conductive layer 127 electrically connected to the conductive layer 124 is provided over the conductive layer 124 and the layer 128. Thus, the region overlapping the recessed portion of the conductive layer 124 can also be used as a light-emitting region, so that the aperture ratio of a pixel can be increased.

The layer 128 can be an insulating layer or a conductive layer. For the layer 128, any of a variety of inorganic insulating materials, organic insulating materials, and conductive materials can be used as appropriate. The layer 128 is particularly preferably formed using an insulating material.

As the insulating layer 128, an insulating layer containing an organic material can be favorably used. For example, the insulating layer 128 can be formed using an acrylic resin, a polyimide resin, an epoxy resin, a polyamide resin, a polyimide-amide resin, a siloxane resin, a benzocyclobutene-based resin, a phenol resin, precursors of these resins, or the like. Moreover, the insulating layer 128 can be formed using a photosensitive resin. The photosensitive resin can be of positive or negative type.

Using a photosensitive resin, the layer 128 can be formed only by the exposure and development process; hence, adverse effects of dry etching, wet etching, or the like on the surface of the conductive layer 124 can be reduced. In the case of using a negative photosensitive resin, the layer 128 can sometimes be formed using a photomask (exposure mask) used for forming the opening in the insulating layer 214.

The protective layer 121 is provided over the light-emitting element 110 and the light-receiving element 150. The protective layer 121 and the substrate 152 are bonded to each other with an adhesive layer 142 therebetween. A solid sealing structure, a hollow sealing structure, or the like can be employed to seal the light-emitting element 110 and the light-receiving element 150. In FIG. 30A, a space between the substrate 152 and the protective layer 121 is filled with the adhesive layer 142, i.e., a solid sealing structure is employed. Alternatively, the space may be filled with an inert gas (e.g., nitrogen or argon), i.e., a hollow sealing structure may be employed. At this time, the adhesive layer 142 may be provided not to overlap the light-emitting element 110 and the light-receiving element 150. The space may be filled with a resin other than the frame-shaped adhesive layer 142.

In the connection portion 130, the electrode 111C is provided over the insulating layer 214. FIG. 30A illustrates an example in which the electrode 111C has a stacked-layer structure of a conductive layer obtained by processing the same conductive film as the conductive layer 124 and a conductive layer obtained by processing the same conductive film as the conductive layer 127. The organic layer 114 is provided over the electrode 111C, and the transparent electrode 113a and the transflective electrode 113b are provided over the organic layer 114. The electrode 111C is electrically connected to the transparent electrode 113a through the organic layer 114. Note that the organic layer 114 is not necessarily formed in the connection portion 130. In the case where the organic layer 114 is not formed in the connection portion 130, the electrode 111C and the transparent electrode 113a are electrically connected to each other by direct contact.

The display apparatus 100 illustrated in FIG. 30A has a top-emission structure. Light L emitted from the light-emitting element 110 is directed toward the substrate 152. The light L with which the light-receiving element 150 is irradiated is delivered to the PD layer 155 from the substrate 152 side. For the substrate 152, a material having a high visible-light-transmitting property is preferably used.

A stacked structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same steps.

An insulating layer 211, the insulating layer 213, the insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable for the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. This can inhibit formation of a recessed portion in the insulating layer 214 at the time of processing the conductive layer 124, the conductive layer 127, or the like. Alternatively, a recessed portion may be provided in the insulating layer 214 at the time of processing the conductive layer 124, the conductive layer 127, or the like.

Each of the transistors 201 and 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate transistor or a bottom-gate transistor may be used. Alternatively, gates may be provided above and below a semiconductor layer where a channel is formed.

The transistors 201 and 205 employ a structure in which the semiconductor layer where a channel is formed is provided between two gates. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of transistor characteristics can be suppressed.

The semiconductor layer of the transistor preferably contains a metal oxide (also referred to as an oxide semiconductor). That is, a transistor including a metal oxide in its channel formation region (hereinafter an OS transistor) is preferably used in the display apparatus of this embodiment.

Examples of an oxide semiconductor having crystallinity include a c-axis-aligned crystalline oxide semiconductor (CAAC-OS) and a nanocrystalline oxide semiconductor (nc-OS).

Alternatively, a transistor using silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to drive at a high frequency (e.g., a source driver circuit) can be formed on the same substrate as the display portion. This allows simplification of an external circuit mounted on the display apparatus and a reduction in costs of parts and mounting costs.

The OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display apparatus can be reduced with the OS transistor.

The off-state current per micrometer of channel width of the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of the OS transistor is lower than that of the Si transistor by approximately ten orders of magnitude.

To increase the luminance of the light-emitting element included in a pixel circuit, the amount of current fed through the light-emitting element needs to be increased. To increase the current amount, the source-drain voltage of a driving transistor that is included in the pixel circuit and controls the amount of current fed through the light-emitting element needs to be increased. An OS transistor has a higher withstand voltage between a source and a drain than a Si transistor; hence, high voltage can be applied between the source and the drain of the OS transistor. Therefore, when an OS transistor is used as the driving transistor in the pixel circuit, the amount of current flowing through the light-emitting element can be increased, so that the luminance of the light-emitting element can be increased.

When transistors operate in a saturation region, a change in source-drain current relative to a change in gate-source voltage can be smaller in an OS transistor than in a Si transistor. Accordingly, when an OS transistor is used as the driving transistor in the pixel circuit, a current flowing between the source and the drain can be set minutely by a change in gate-source voltage; hence, the amount of current flowing through the light-emitting element can be controlled. Consequently, the number of gray levels expressed by the pixel circuit can be increased.

Regarding saturation characteristics of current flowing when transistors operates in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting elements even when the current-voltage characteristics of the light-emitting elements vary, for example. In other words, when the OS transistor operates in the saturation region, the source-drain current hardly changes with an increase in the source-drain voltage; hence, the luminance of the light-emitting element can be stable.

By using an OS transistor as the driving transistor included in the pixel circuit, it is possible to prevent black-level degradation, increase the luminance, increase the number of gray levels, and suppress variations in characteristics of light-emitting elements, for example.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

For the semiconductor layer, it is particularly preferable to use an oxide containing indium (In), gallium (Ga), and zinc (Zn). Alternatively, it is preferable to use an oxide containing indium, tin, and zinc. It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of Min the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistor included in the circuit portion 164 and the transistor included in the display portion 162 may have the same structure or different structures. One structure or two or more types of structures may be employed for a plurality of transistors included in the circuit portion 164. Similarly, one structure or two or more types of structures may be employed for a plurality of transistors included in the display portion 162.

All the transistors included in the display portion 162 may be OS transistors or Si transistors. Alternatively, some of the transistors included in the display portion 162 may be OS transistors and the others may be Si transistors.

For example, when both an LTPS transistor and an OS transistor are used in the display portion 162, the display apparatus can have low power consumption and high drive capability. A structure where an LTPS transistor and an OS transistor are used in combination may be referred to as LTPO. As a favorable example, it is preferable that an OS transistor be used as a transistor functioning as a switch for controlling electrical continuity between wirings and an LTPS transistor be used as a transistor for controlling current, for instance.

For example, one transistor included in the display portion 162 functions as a transistor for controlling a current flowing through the light-emitting element and can be referred to as a driving transistor. One of a source and a drain of the driving transistor is electrically connected to the pixel electrode of the light-emitting element. An LTPS transistor is preferably used as the driving transistor. Accordingly, the amount of current flowing through the light-emitting element can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a signal line. An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Figure 30B:
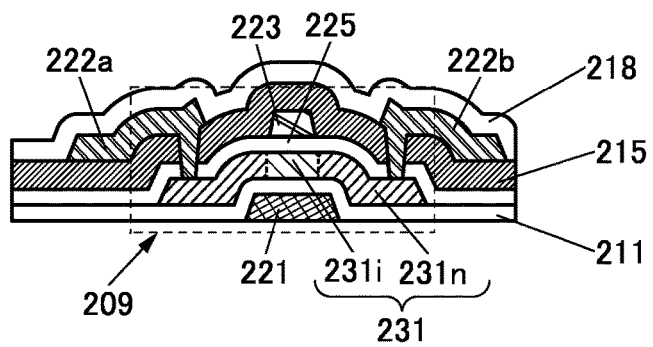
FIGS. 30B and 30C are cross-sectional views each illustrating a structure example of a transistor.
Figure 30C:
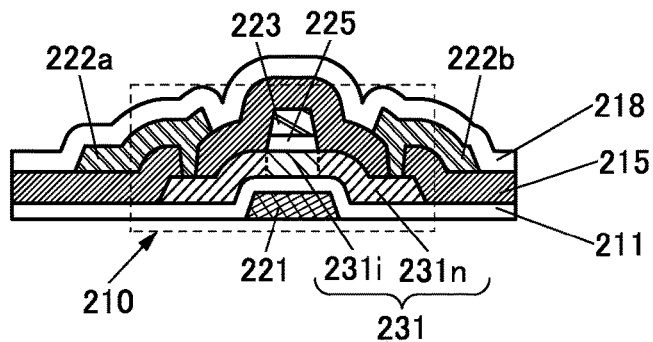

FIGS. 30B and 30C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the low-resistance regions 231n, the conductive layer 222b connected to the other low-resistance region 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 30B illustrates an example of the transistor 209 in which the insulating layer 225 covers the top and side surfaces of the semiconductor layer 231. The conductive layer 222a and the conductive layer 222b are connected to the low-resistance regions 231n through openings provided in the insulating layers 225 and 215. One of the conductive layers 222a and 222b serves as a source, and the other serves as a drain.

In the transistor 210 illustrated in FIG. 30C, the insulating layer 225 overlaps the channel formation region 231i of the semiconductor layer 231 and does not overlap the low-resistance regions 231n. The structure illustrated in FIG. 30C is obtained by processing the insulating layer 225 with the conductive layer 223 as a mask, for example. In FIG. 30C, the insulating layer 215 is provided to cover the insulating layer 225 and the conductive layer 223, and the conductive layer 222a and the conductive layer 222b are connected to the low-resistance regions 231n through openings in the insulating layer 215.

The connection portion 204 is provided in a region of the substrate 151 that is not overlapped by the substrate 152. In the connection portion 204, the wiring 165 is electrically connected to the FPC 172 through the electrode 166 and the connection layer 242. An example is illustrated in which the electrode 166 has a stacked-layer structure of a conductive layer obtained by processing the same conductive film as the conductive layer 124 and a conductive layer obtained by processing the same conductive film as the conductive layer 127. The electrode 166 is exposed on the top side of the connection portion 204. Thus, the connection portion 204 and the FPC 172 can be electrically connected to each other through the connection layer 242.

A light-blocking layer 117 is preferably provided on a surface of the substrate 152 that faces the substrate 151. The light-blocking layer 117 can be provided between the EL layer 112 and the PD layer 155 that are adjacent to each other, between the two adjacent light-emitting elements 110, in the connection portion 130, and in the circuit portion 164, for example. A variety of optical members can be arranged on the outer surface of the substrate 152.

Providing the protective layer 121 that covers the light-emitting element 110 and the light-receiving element 150 prevents impurities such as water from entering the light-emitting element 110 and the light-receiving element 150, thereby increasing the reliability of the light-emitting element 110 and the light-receiving element 150.

For the substrate 152, a material having a high visible-light-transmitting property is preferably used. On the other hand, there is no limitation on the light-transmitting property of a material used for the substrate 151.

For each of the substrates 151 and 152, glass, quartz, ceramic, sapphire, a resin, or the like can be used. When a flexible material is used for the substrates 151 and 152, the flexibility of the display apparatus 100 can be increased.

For the adhesive layer 142, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. As another example, an adhesive sheet may be used.

As the connection layer 242, an anisotropic conductive film (ACF), an anisotropic conductive paste (ACP), or the like can be used.

Figure 31:
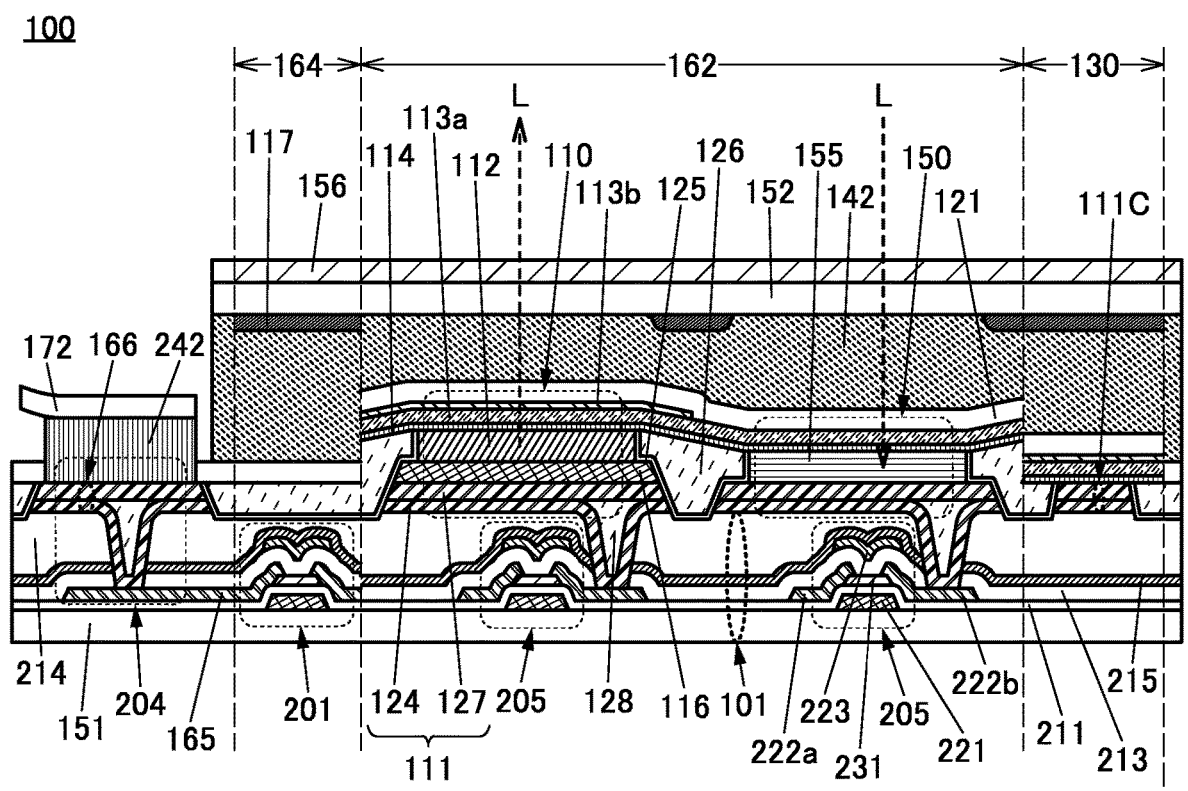
FIG. 31 is a cross-sectional view illustrating a structure example of a display apparatus.

FIG. 31 is a schematic cross-sectional view illustrating a structure example of the display apparatus 100, and illustrates a structure example in which a sensor 156 is provided over the substrate 152 of the display apparatus 100 in FIG. 30A. The sensor 156 can be, for example, a touch sensor having a function of sensing a touch (including a hover touch) of an object on the display portion 162. When the sensor 156 has a function of a touch sensor, the touch (including hover touch) does not have to be sensed using the light-receiving element 150. In this case, for example, when a finger, a palm, or the like touches the display portion 162, the light-receiving element 150 can take an image of a fingerprint or a palm print. As described above, an electronic device including the display apparatus 100 including the sensor 156 is capable of both sensing of a touch (including a hover touch) of an object and personal authentication using an image of a fingerprint or a palm print. Thus, the electronic device including the display apparatus 100 can be a multifunctional electronic device. Note that the sensor 156 may be used to perform personal authentication using an image of a fingerprint or a palm print. Alternatively, a touch (including a hover touch) of an object on the display portion 162 may be sensed using the light-receiving element 150 even when the display apparatus 100 includes the sensor 156.

FIG. 31 illustrates an example where the sensor 156 is provided over the substrate 152, that is, the sensor 156 is mounted on the display apparatus 100 by an on-cell method. Note that the sensor 156 may be mounted on the display apparatus 100 by an out-cell method or an in-cell method.

Figure 32A:
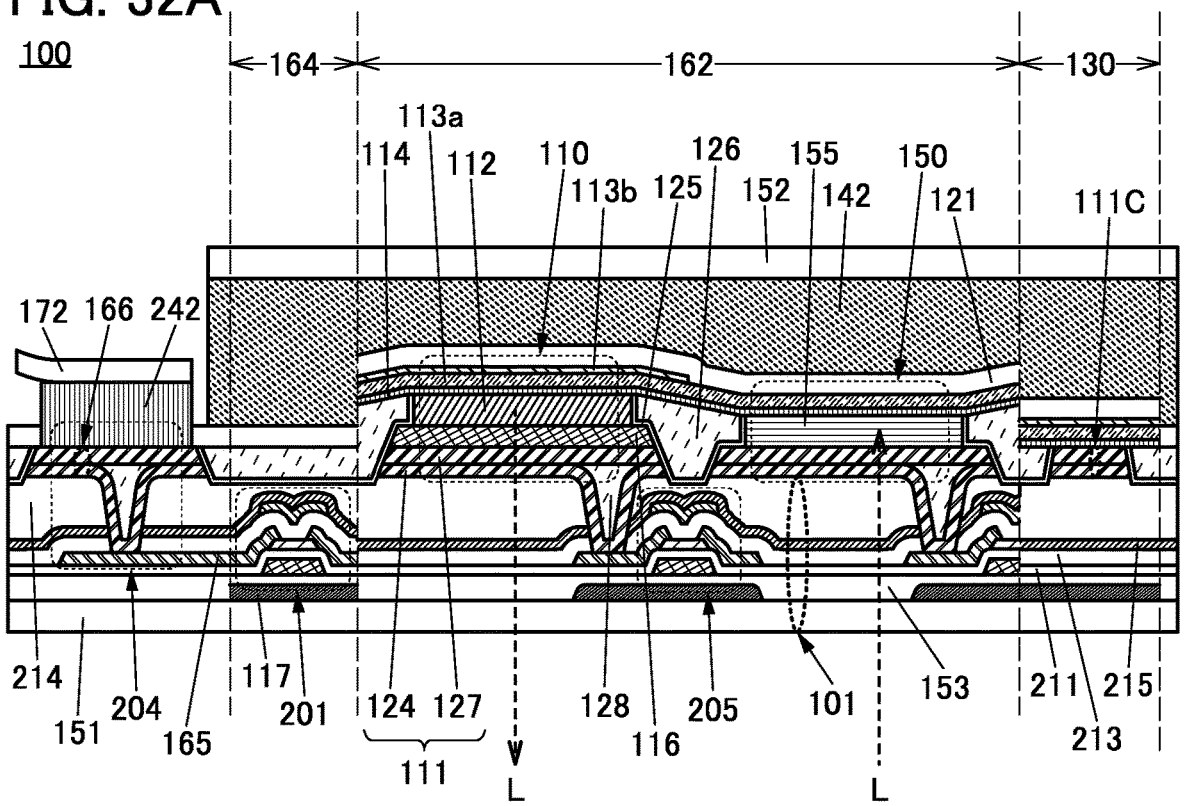
Figure 32A:
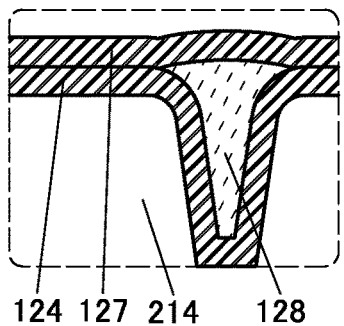
Figure 32A:
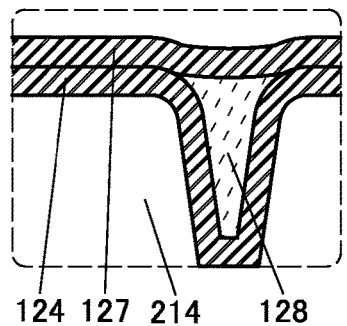
Figure 32A:
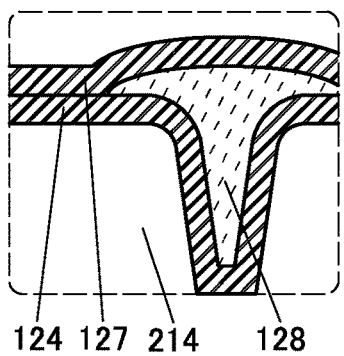
Figure 32A:
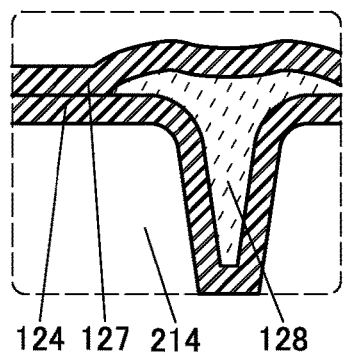

The display apparatus 100 in FIG. 32A differs from the display apparatus 100 in FIG. 30A mainly in having a bottom-emission structure.

The light L emitted from the light-emitting element 110 is directed toward the substrate 151. The light L with which the light-receiving element 150 is irradiated is delivered to the PD layer 155 from the substrate 151 side. For the substrate 151, a material having a high visible-light-transmitting property is preferably used. On the other hand, there is no limitation on the light-transmitting property of a material used for the substrate 152.

The light-blocking layer 117 is preferably provided between the substrate 151 and the transistor 201 and between the substrate 151 and the transistor 205. FIG. 32A illustrates an example in which the light-blocking layer 117 is provided over the substrate 151, an insulating layer 153 is provided to cover the light-blocking layer 117, and the transistors 201 and 205 and the like are provided over the insulating layer 153.

Although the top surface of the layer 128 and the top surface of the conductive layer 124 are substantially aligned with each other in FIG. 30A, FIG. 31, and FIG. 32A, one embodiment of the present invention is not limited thereto. FIGS. 32B1 to 32B4 are enlarged views of a region including the layer 128 and its periphery, and show variation examples of the structures in FIG. 30A, FIG. 31, and FIG. 32A.

FIG. 32B1 illustrates an example in which the top surface of the layer 128 is higher in height than the top surface of the conductive layer 124. In the example in FIG. 32B1, the top surface of the layer 128 bulges gently to be convex toward the middle.

FIG. 32B2 illustrates an example in which the top surface of the layer 128 is lower in height than the top surface of the conductive layer 124. In the example in FIG. 32B2, the top surface of the layer 128 is gently recessed to be concave toward the middle.

FIG. 32B3 illustrates an example in which the top surface of the layer 128 is higher in height than the top surface of the conductive layer 124 and the upper portion of the layer 128 is formed to be wider than the recessed portion of the conductive layer 124. In the example in FIG. 32B3, part of the layer 128 may be formed to cover part of a substantially flat region of the conductive layer 124.

FIG. 32B4 illustrates an example in which a recessed portion is also formed on part of the top surface of the layer 128 in the example in FIG. 32B3. The recessed portion has a shape that is gently recessed toward the middle.

[Display Module 2]

Figure 33A:
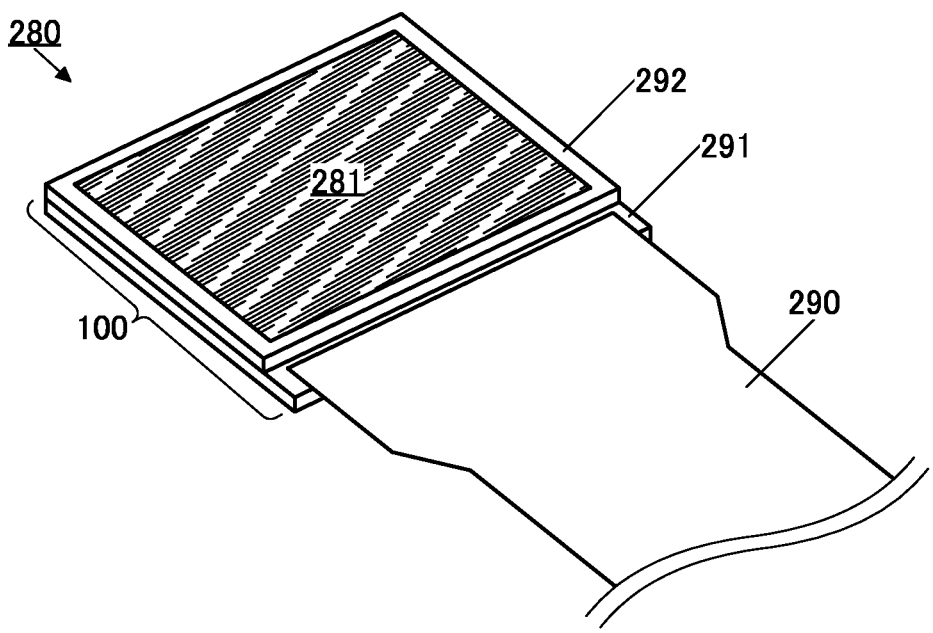
FIGS. 33A and 33B are perspective views illustrating a structure example of a display apparatus.

FIG. 33A is a perspective view of a display module 280. The display module 280 includes the display apparatus 100 and an FPC 290. As described above, a display apparatus in which a substrate is equipped with a connector such as an FPC or mounted with an IC is referred to as a display module.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 33B:
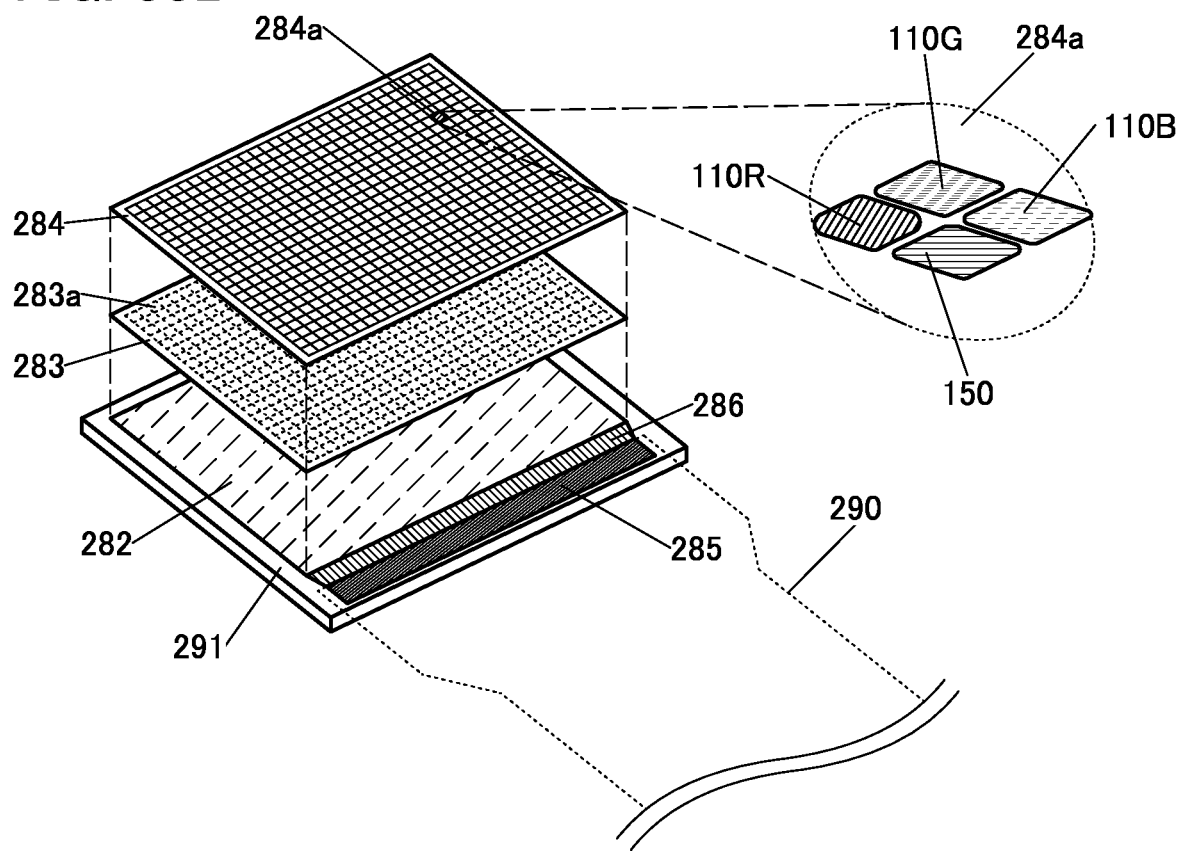

FIG. 33B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that is not overlapped by the pixel portion 284. The terminal portion 285 and the circuit portion 282 are electrically connected to each other through a wiring portion 286 formed of a plurality of wirings.

The pixel portion 284 includes a plurality of pixels 284*a* arranged in a matrix. An enlarged view of one pixel 284*a* is shown on the right side in FIG. 33B. The pixel 284*a* includes the light-emitting element 110R, the light-emitting element 110G, the light-emitting element 110B, and the light-receiving element 150.

The pixel circuit portion 283 includes a plurality of pixel circuits 283*a* arranged in a matrix.

One pixel circuit 283*a* is a circuit that controls driving of a plurality of elements included in one pixel 284*a*. One pixel circuit 283*a* may include four circuits for controlling driving of elements. For example, the pixel circuit 283*a* can include at least one selection transistor, one current control transistor (driving transistor), and a capacitor for one light-emitting element. A gate signal is input to a gate of the selection transistor, and a video signal is input to a source of the selection transistor. Thus, an active-matrix display apparatus is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

Figure 34:
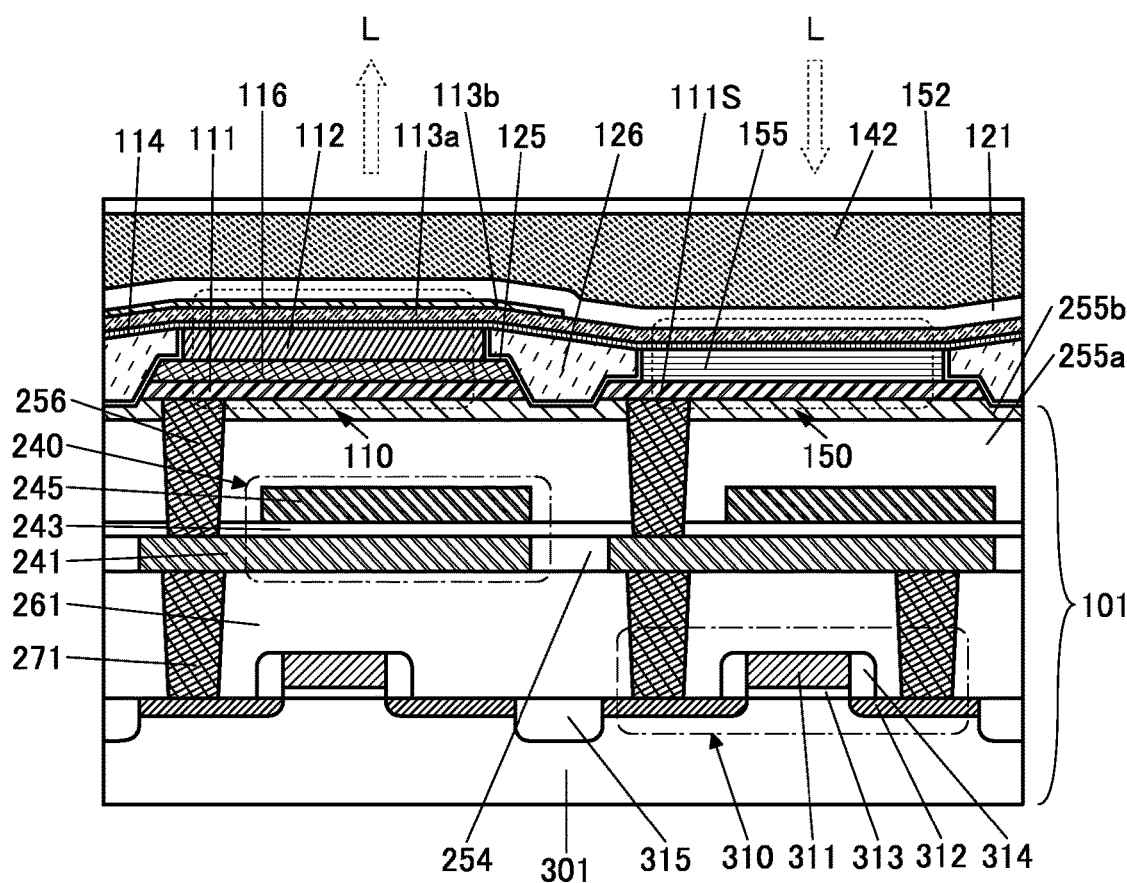
FIG. 34 is a cross-sectional view illustrating a structure example of a display apparatus.

The display apparatus 100 illustrated in FIG. 34 includes a substrate 301, the light-emitting element 110, the light-receiving element 150, a capacitor 240, and a transistor 310.

The substrate 301 corresponds to the substrate 291 illustrated in FIGS. 33A and 33B. A stacked structure including the substrate 301 and the components thereof up to an insulating layer 255b corresponds to the layer 101 including transistors in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween. Note that the conductive layer embedded in the insulating layer 254 is referred to as the conductive layer 241 even when not having a function of the electrode of the capacitor.

An insulating layer 255a is provided to cover the capacitor 240, and the insulating layer 255b is provided over the insulating layer 255a.

As each of the insulating layers 255a and 255b, a variety of inorganic insulating films such as an oxide insulating film, a nitride insulating film, an oxynitride insulating film, and a nitride oxide insulating film can be suitably used. As the insulating layer 255a, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferred that a silicon oxide film be used as the insulating layer 255a and a silicon nitride film be used as the insulating layer 255b. The insulating layer 255b preferably has a function of an etching protective film. Alternatively, a nitride insulating film or a nitride oxide insulating film may be used as the insulating layer 255a, and an oxide insulating film or an oxynitride insulating film may be used as the insulating layer 255b. Although this embodiment shows an example in which a recessed portion is provided in the insulating layer 255b, a recessed portion may not necessarily be provided in the insulating layer 255b.

The light-emitting element 110 and the light-receiving element 150 are provided over the insulating layer 255b. The light-emitting element 110 and the light-receiving element 150 can have the structure illustrated in FIG. 2A and the like. Embodiment 1 can be referred to for the details of the light-emitting element 110 and the light-receiving element 150. The insulating layer 125 and the insulating layer 126 over the insulating layer 125 are provided between the light-emitting element 110 and the light-receiving element 150 that are adjacent to each other. Although not illustrated in FIG. 34, the insulating layer 125 and the insulating layer 126 over the insulating layer 125 are also provided between the two adjacent light-emitting elements 110.

The electrode 111 of the light-emitting element 110 and the electrode 111S of the light-receiving element 150 are each electrically connected to one of the source and the drain of the corresponding transistor 310 through a plug 256 embedded in the insulating layers 243, 255a, and 255b, the conductive layer 241 embedded in the insulating layer 254, and the plug 271 embedded in the insulating layer 261. The electrode 111 includes a region in contact with the plug 256, for example. For instance, the bottom surface of the electrode 111 includes a region in contact with the top surface of the plug 256. The top surface of the insulating layer 255b and the top surface of the plug 256 are level with or substantially level with each other. A variety of conductive materials can be used for the plugs.

The protective layer 121 is provided over the light-emitting element 110 and the light-receiving element 150. The substrate 152 is attached above the protective layer 121 with the adhesive layer 142. Embodiment 1 can be referred to for the details of the light-emitting element 110 and the light-receiving element 150 and the components thereover up to the substrate 152. The substrate 152 corresponds to the substrate 292 in FIG. 33A.

Figure 35:
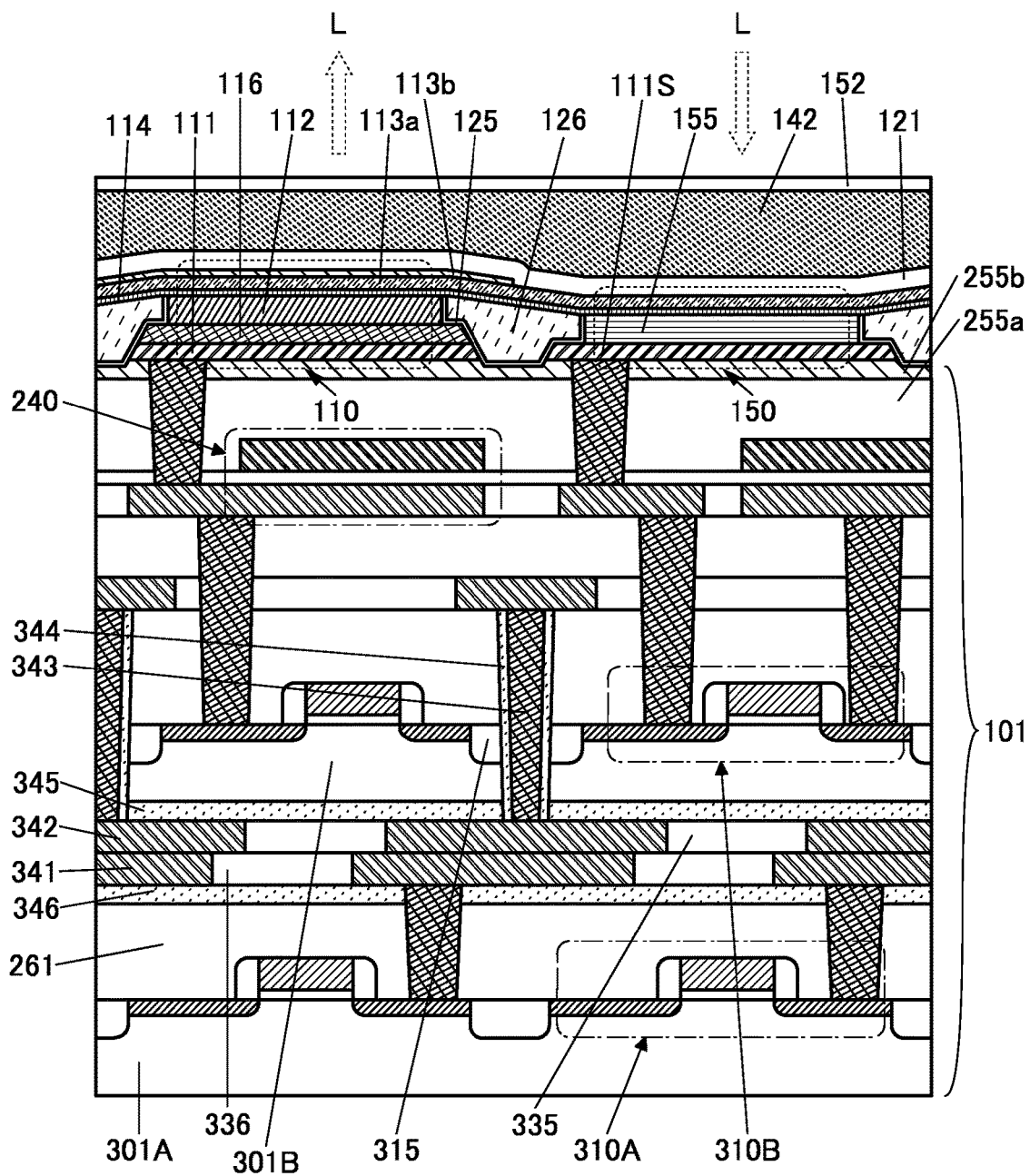
FIG. 35 is a cross-sectional view illustrating a structure example of a display apparatus.

In the display apparatus 100 illustrated in FIG. 35, a transistor 310A and a transistor 310B in each of which a channel is formed in a semiconductor substrate are stacked. Note that in the following description of display apparatuses, the description of portions similar to those of the above-described display apparatuses may be omitted.

In the display apparatus 100, a substrate 301B provided with the transistor 310B, the capacitor 240, the light-emitting element 110, and the light-receiving element 150 is attached to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 121 can be used.

The substrate 301B is provided with a plug 343 that penetrates the substrate 301B and the insulating layer 345. An insulating layer 344 is preferably provided to cover the side surface of the plug 343. The insulating layer 344 functions as a protective layer and can inhibit diffusion of impurities into the substrate 301B. As the insulating layer 344, an inorganic insulating film that can be used as the protective layer 121 can be used.

A conductive layer 342 is provided under the insulating layer 345 on the rear surface of the substrate 301B (the surface opposite to the substrate 152). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 between the substrate 301A and the substrate 301B. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

Figure 36:
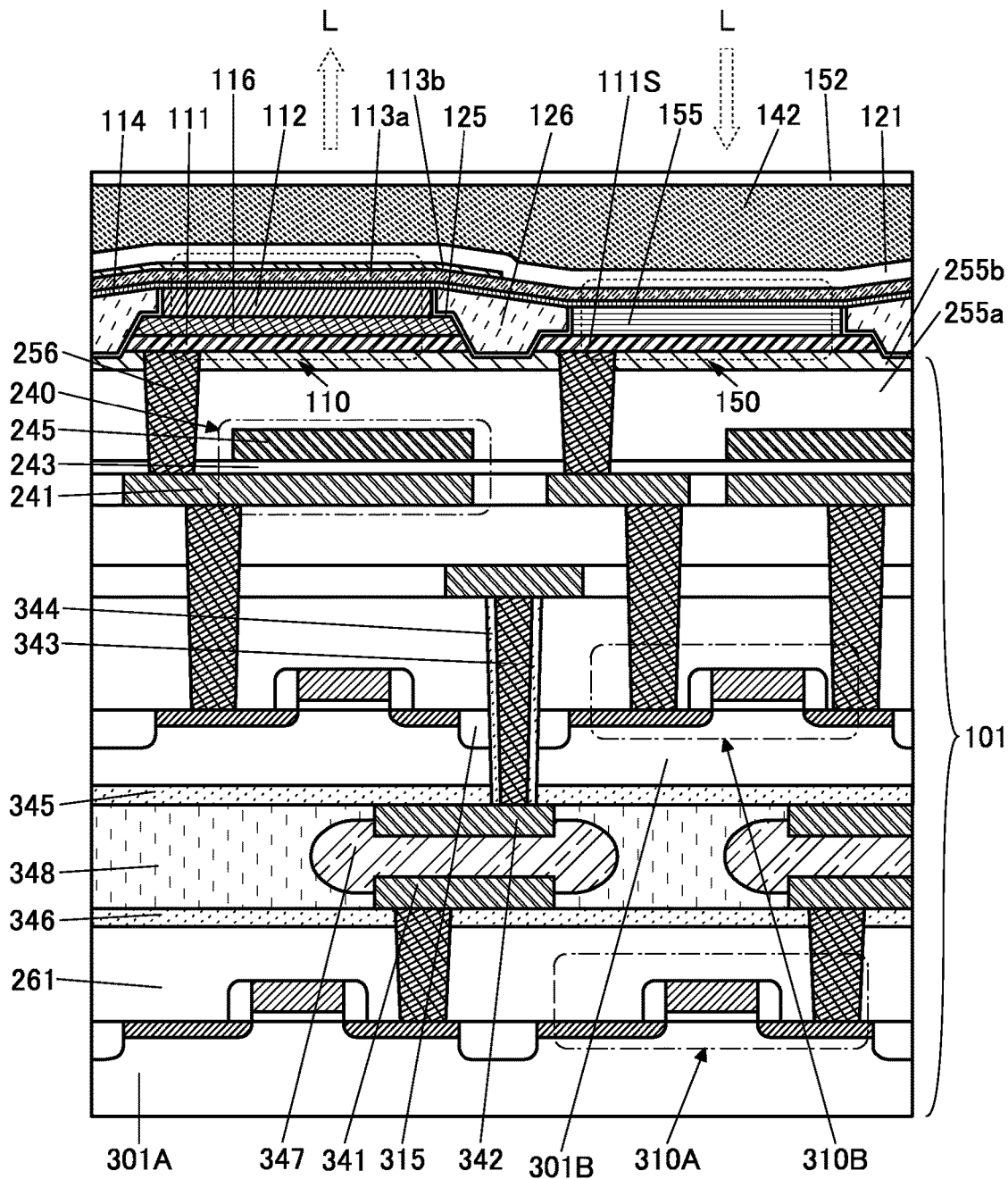
FIG. 36 is a cross-sectional view illustrating a structure example of a display apparatus.

In the display apparatus 100 illustrated in FIG. 36, the conductive layer 341 and the conductive layer 342 are bonded to each other with a bump 347.

As illustrated in FIG. 36, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

Figure 37:
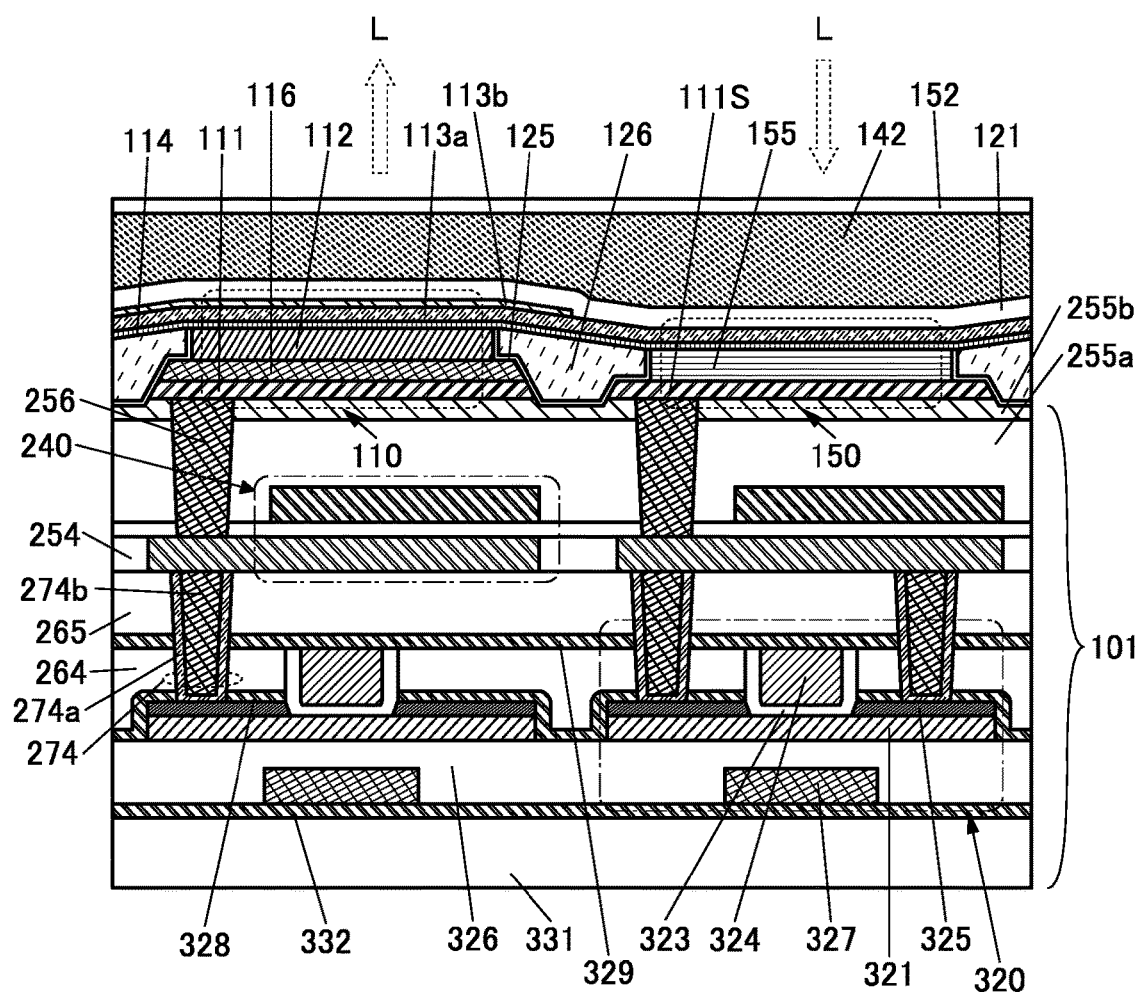
FIG. 37 is a cross-sectional view illustrating a structure example of a display apparatus.

The display apparatus 100 illustrated in FIG. 37 differs from the display apparatus 100 illustrated in FIG. 34 in the structure of a transistor.

A transistor 320 can be an OS transistor. Alternatively, a Si transistor may be used as the transistor 320.

A transistor included in the circuit portion 282 and a transistor included in the pixel circuit portion 283 in FIG. 33B may have the same structure or different structures. One structure or two or more types of structures may be employed for a plurality of transistors included in the circuit portion 282. Similarly, one structure or two or more types of structures may be employed for a plurality of transistors included in the pixel circuit portion 283.

All the transistors included in the pixel circuit portion 283 may be OS transistors or Si transistors. Alternatively, some of the transistors included in the pixel circuit portion 283 may be OS transistors and the others may be Si transistors.

For example, when both an LTPS transistor and an OS transistor are used in the pixel circuit portion 283, the display apparatus can have low power consumption and high drive capability. For example, it is preferable that an OS transistor be used as a transistor functioning as a switch for controlling electrical continuity between wirings and an LTPS transistor be used as a transistor for controlling current.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIGS. 33A and 33B. A stacked structure including the substrate 331 and the components thereover up to the insulating layer 255b corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film can be used. Examples of such a film include an aluminum oxide film, a hafnium oxide film, and a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics is preferably used as the semiconductor layer 321. The pair of conductive layers 325 are provided on and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with the side surfaces of the insulating layers 264 and 328, the side surface of the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and an insulating layer 329 and an insulating layer 265 are provided to cover these layers.

The insulating layers 264 and 265 each function as an interlayer insulating layer. The insulating layer 329 functions as a barrier layer that prevents diffusion of impurities such as water and hydrogen from the insulating layer 265, for example, into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, 264, and 328. Here, the plug 274 preferably includes a conductive layer 274a that covers the side surface of an opening formed in the insulating layers 265, 329, 264, and 328 and part of the top surface of the conductive layer 325, and a conductive layer 274b in contact with the top surface of the conductive layer 274a. For the conductive layer 274a, a conductive material in which hydrogen and oxygen are less likely to diffuse is preferably used.

Note that the display apparatus illustrated in FIG. 37 includes an OS transistor and a light-emitting element having a metal maskless (MML) structure. This structure can significantly reduce a leakage current that would flow through a transistor and a leakage current that would flow between adjacent light-emitting elements (also referred to as a lateral leakage current or a side leakage current, for example). Displaying images on the display apparatus having this structure can bring one or more of image crispness, image sharpness, high color saturation, and a high contrast ratio to the viewer. Note that when the leakage current that would flow through a transistor and the lateral leakage current between light-emitting elements are extremely low, light leakage at the time of black display (which makes black display whitish), for example, can be reduced as much as possible in the display (such display is also referred to as deep black display).

In particular, in the case where a light-emitting element having an MML structure employs the above-described SBS structure, a layer provided between light-emitting elements is disconnected; accordingly, display with no or extremely small side leakage can be achieved.

Figure 38:
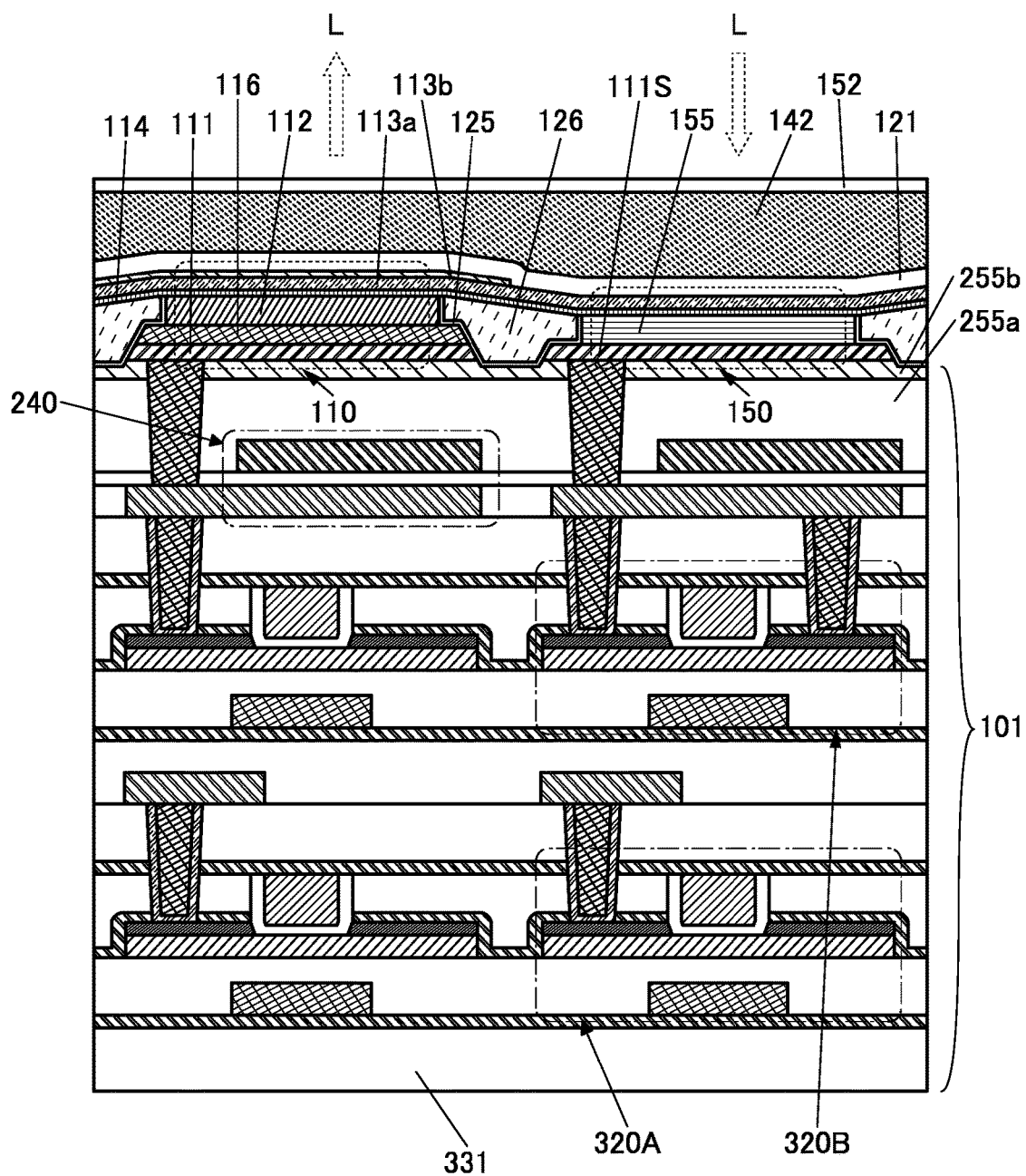
FIG. 38 is a cross-sectional view illustrating a structure example of a display apparatus.

In the display apparatus 100 illustrated in FIG. 38, a transistor 320A and a transistor 320B each including an oxide semiconductor in a semiconductor where a channel is formed are stacked.

The description of the display apparatus 100 illustrated in FIG. 37 can be referred to for the transistor 320A, the transistor 320B, and the components around them.

Although the structure in which two transistors including an oxide semiconductor are stacked is described here, one embodiment of the present invention is not limited thereto. For example, three or more transistors may be stacked.

Figure 39:
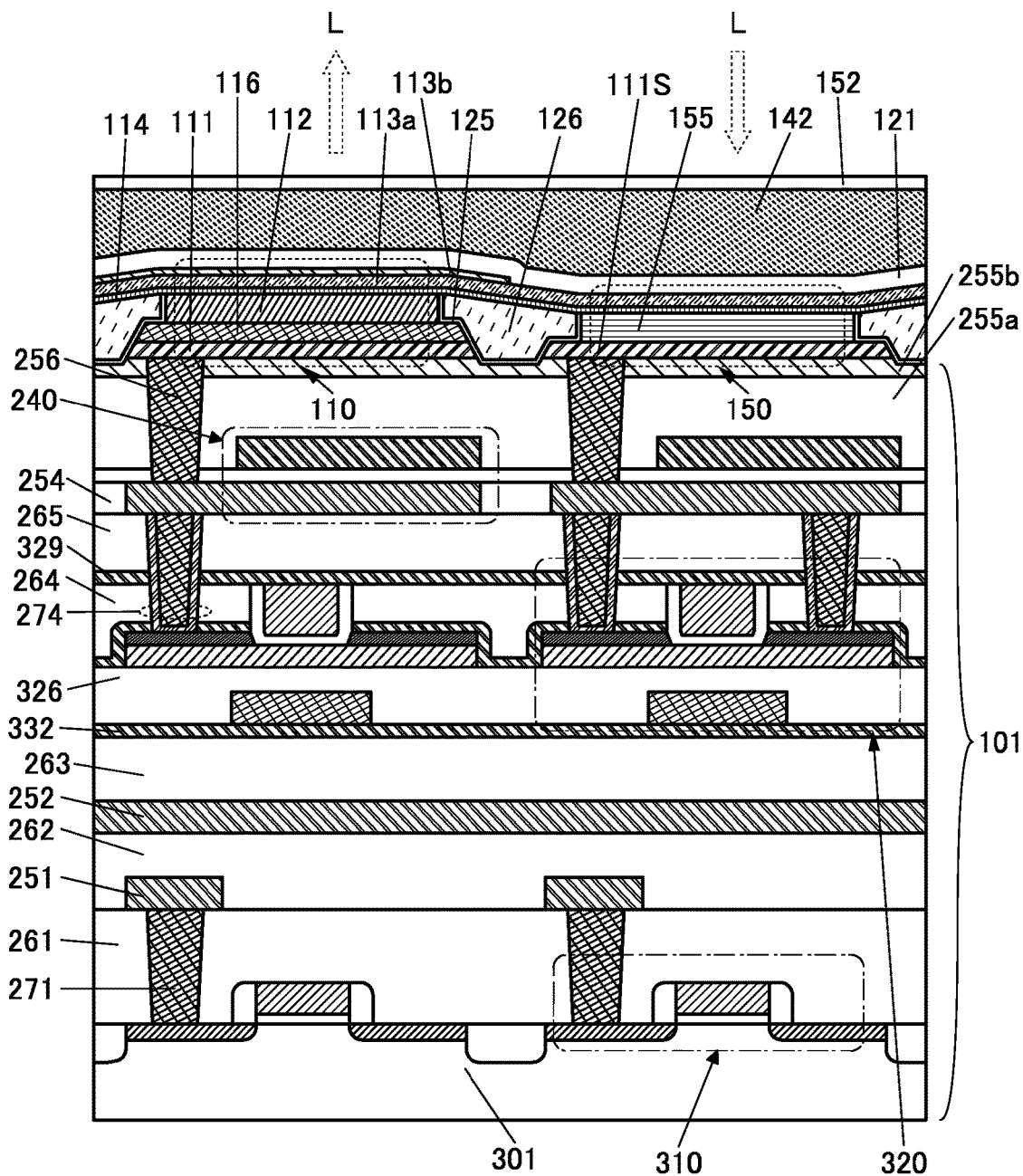
FIG. 39 is a cross-sectional view illustrating a structure example of a display apparatus.

In the display apparatus 100 illustrated in FIG. 39, the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit, for example, can be formed directly under the light-emitting element; thus, the display apparatus can be downsized as compared with the case where the driver circuit is provided around a display portion.

FIGS. 40A and 40B, FIGS. 41A and 41B, and FIG. 42 are schematic top views illustrating structure examples of the display apparatus of one embodiment of the present invention. In FIGS. 40A and 40B, FIGS. 41A and 41B, and FIG. 42, components provided in the same layer are shown with the same hatching pattern.

Figure 40A:
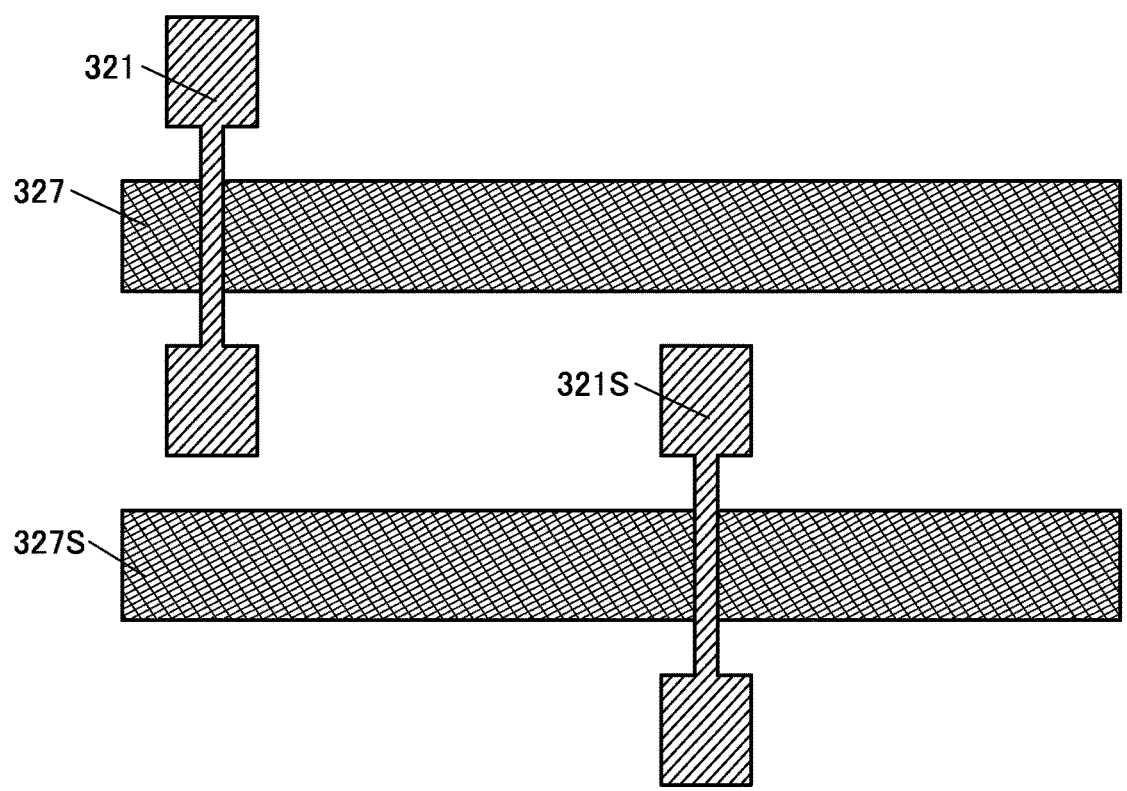
FIGS. 40A and 40B are top views illustrating a structure example of a display apparatus.

FIG. 40A illustrates the conductive layer 327, a conductive layer 327S, the semiconductor layer 321, and a semiconductor layer 321S. The semiconductor layer 321 includes a region overlapping the conductive layer 327, and the semiconductor layer 321S includes a region overlapping the conductive layer 327S.

Figure 40B:
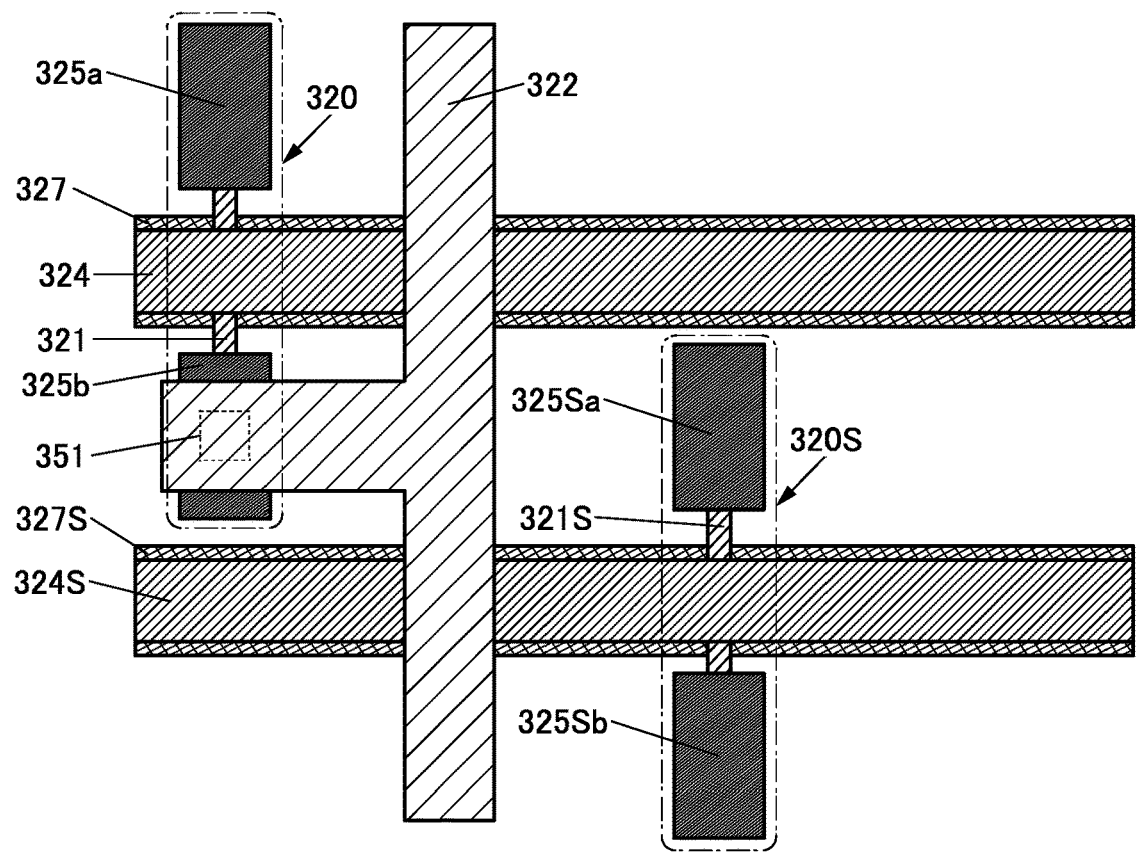

FIG. 40B illustrates a structure example in which a conductive layer 325a, a conductive layer 325b, a conductive layer 325Sa, a conductive layer 325Sb, the conductive layer 324, a conductive layer 324S, and a conductive layer 322 are added to the structure in FIG. 40A. The transistor 320 is composed of the conductive layer 327, the semiconductor layer 321, the conductive layer 325a, the conductive layer 325b, and the conductive layer 324. A transistor 320S is composed of the conductive layer 327S, the semiconductor layer 321S, the conductive layer 325Sa, the conductive layer 325Sb, and the conductive layer 324S. The transistor 320 can be a transistor electrically connected to the electrode 111 of the light-emitting element 110 in FIG. 37, for example. The transistor 320S can be a transistor electrically connected to the electrode 111S of the light-receiving element 150 in FIG. 37, for example.

The conductive layer 327 functions as a first gate electrode of the transistor 320, and the conductive layer 324 functions as a second gate electrode of the transistor 320. The conductive layer 325a functions as one of a source electrode and a drain electrode of the transistor 320, and the conductive layer 325b functions as the other of the source electrode and the drain electrode of the transistor 320. The conductive layer 327S functions as a first gate electrode of the transistor 320S, and the conductive layer 324S functions as a second gate electrode of the transistor 320S. The conductive layer 325Sa functions as one of a source electrode and a drain electrode of the transistor 320S, and the conductive layer 325Sb functions as the other of the source electrode and the drain electrode of the transistor 320S.

The conductive layer 325b is electrically connected to the conductive layer 322 through a contact portion 351. The conductive layer 322 can be supplied with a constant potential, for example. By supplying a constant potential to the conductive layer 322, the constant potential is supplied to the conductive layer 325b.

Figure 41A:
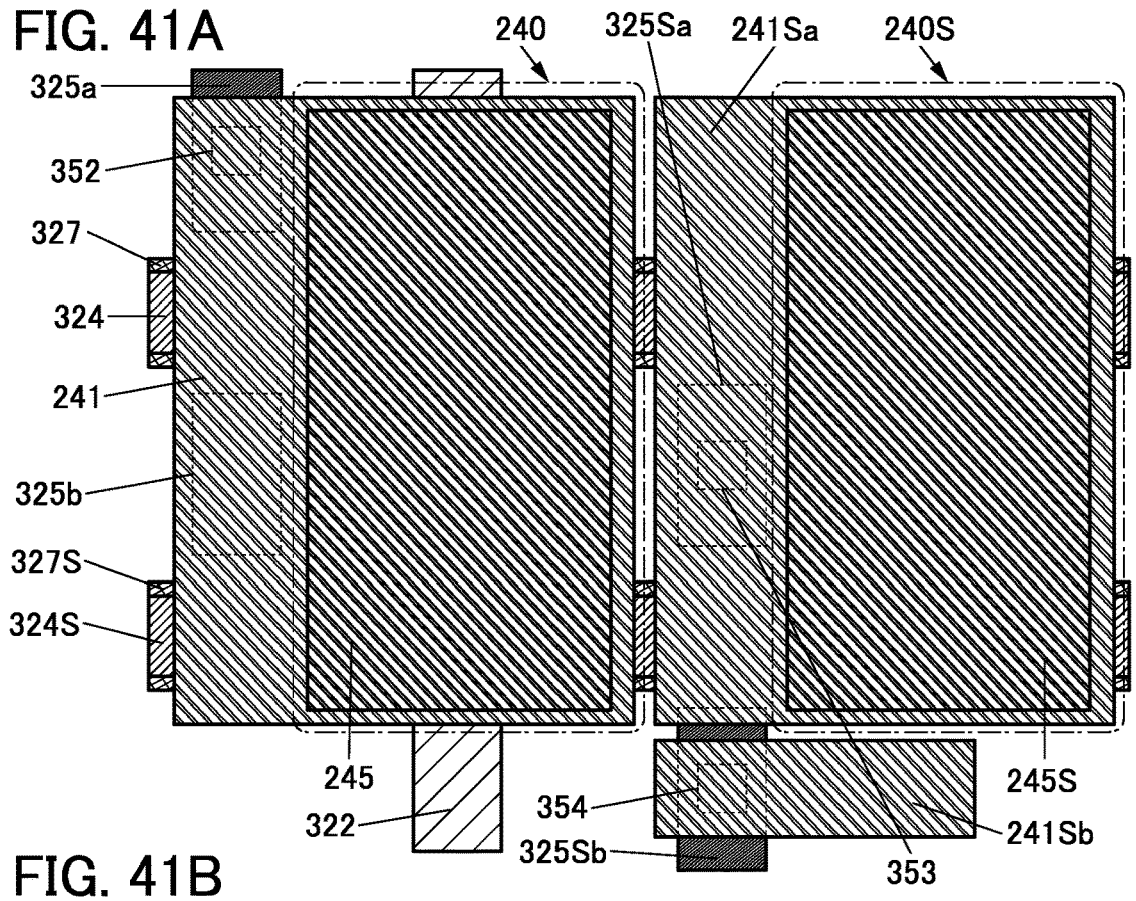
FIGS. 41A and 41B are top views illustrating a structure example of a display apparatus.
Figure 41B:
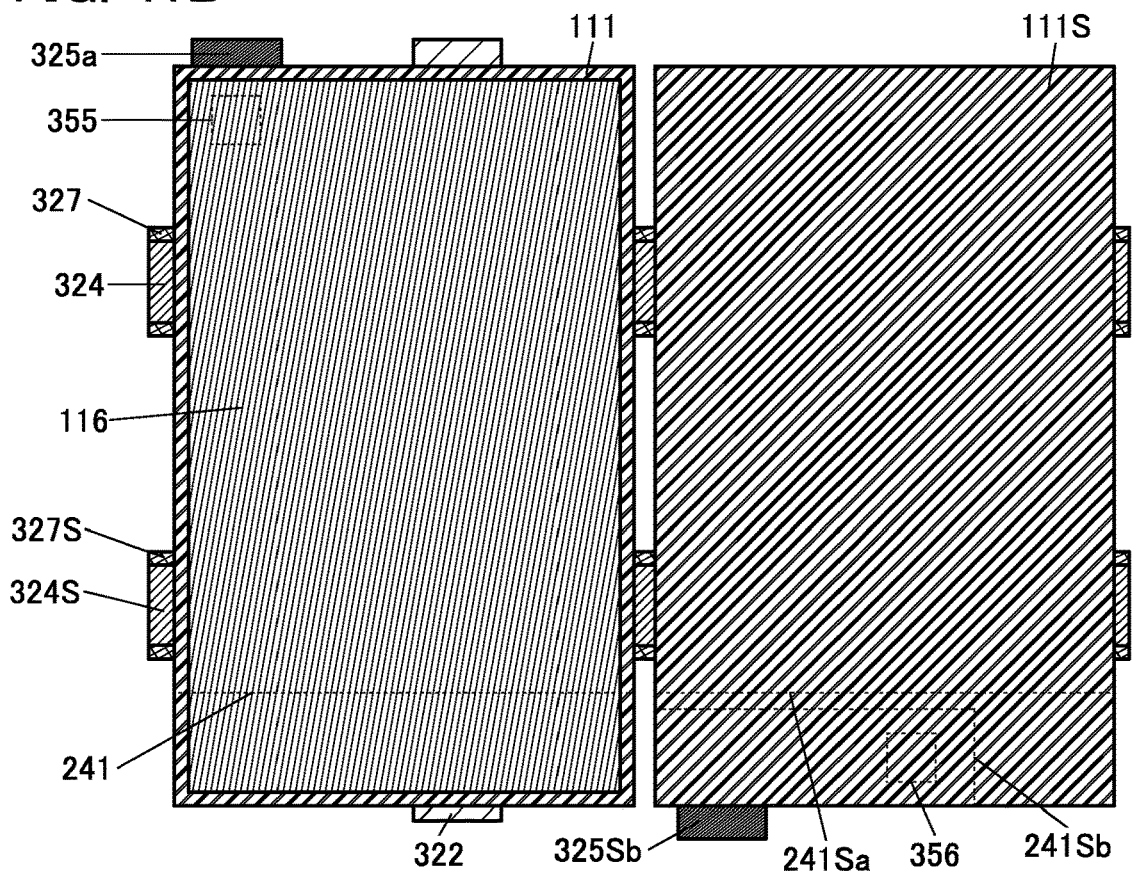

In FIGS. 40B, 41A, and 41B, the contact portion is enclosed by a dotted line. Although the contact portion is shown as a rectangular portion in FIG. 40B, for example, the shape of the contact portion is not limited thereto and may be, for instance, a shape with rounded corners.

FIG. 41A illustrates a structure example in which the conductive layer 241, a conductive layer 241Sa, a conductive layer 241Sb, the conductive layer 245, and a conductive layer 245S are added to the structure in FIG. 40B. The capacitor 240 is composed of the conductive layer 241 and the conductive layer 245, and a capacitor 240S is composed of the conductive layer 241Sa and the conductive layer 245S. In FIG. 41A, portions of the conductive layers 325a, 325b, 325Sa, and 325Sb overlapped by the conductive layer 241, the conductive layer 241Sa, or the conductive layer 241Sb are shown by dotted lines.

The conductive layer 325a is electrically connected to the conductive layer 241 through a contact portion 352. The conductive layer 325Sa is electrically connected to the conductive layer 241Sa through a contact portion 353. The conductive layer 325Sb is electrically connected to the conductive layer 241Sb through a contact portion 354.

FIG. 41B illustrates a structure example in which the electrode 111, the electrode 111S, and the optical adjustment layer 116 are added to the structure in FIG. 41A. In FIG. 41B, portions of the conductive layers 241, 241Sa, and 241Sb overlapped by the electrode 111 or the electrode 111S are shown by dotted lines.

The conductive layer 241 is electrically connected to the electrode 111 through a contact portion 355. The conductive layer 241Sb is electrically connected to the electrode 111S through a contact portion 356.

Figure 42:
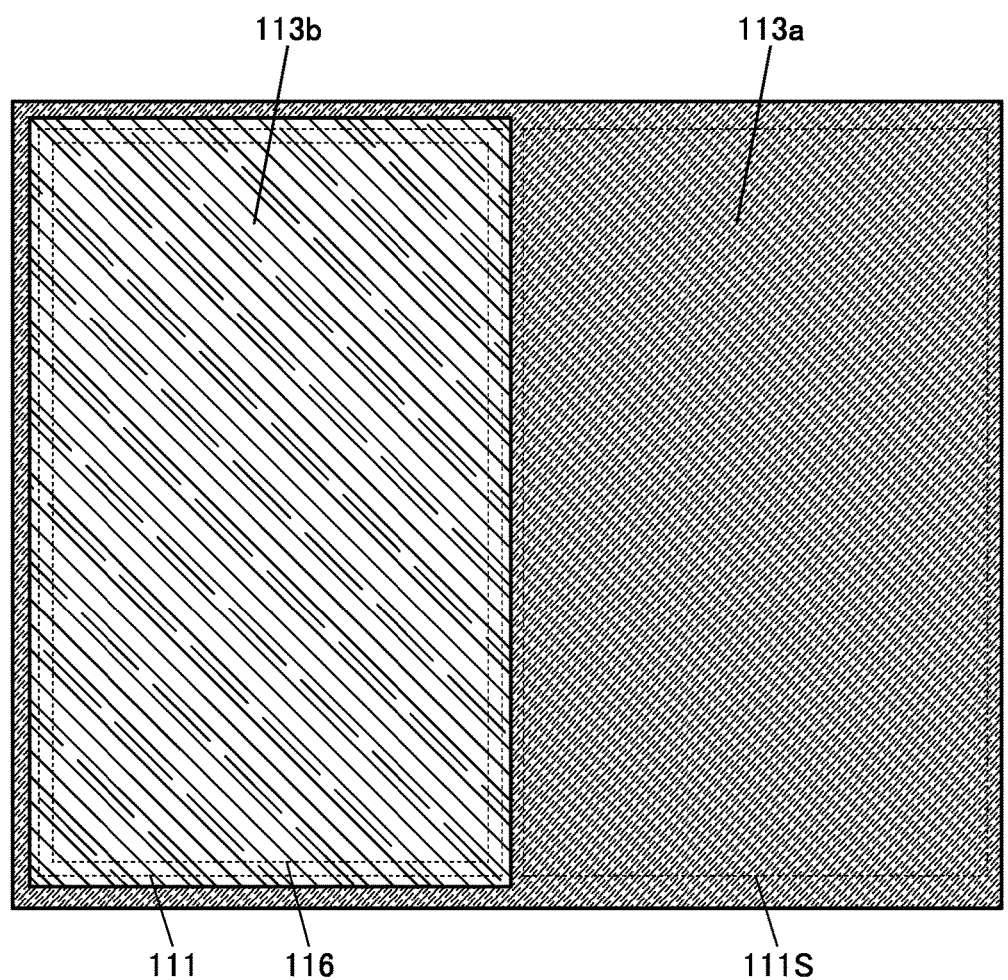
FIG. 42 is a top view illustrating a structure example of a display apparatus.

FIG. 42 illustrates a structure example in which the transparent electrode 113a and the transflective electrode 113b are added to the structure in FIG. 41B. In FIG. 42, portions of the electrodes 111, the electrode 111S, and the optical adjustment layer 116 overlapped by the transparent electrode 113a are shown by dotted lines.

As illustrated in FIG. 42, the transparent electrode 113a can be provided to cover the electrode 111, the electrode 111S, and the optical adjustment layer 116.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 3

In this embodiment, the display apparatus of one embodiment of the present invention will be described.

The display apparatus of one embodiment of the present invention includes light-receiving elements (also referred to as light-receiving devices) and light-emitting elements (also referred to as light-emitting devices). Alternatively, the display apparatus of one embodiment of the present invention may include light-emitting/receiving elements (also referred to as light-emitting/receiving devices) and light-emitting elements.

First, the display apparatus including light-receiving elements and light-emitting elements will be described.

The display apparatus of one embodiment of the present invention includes light-receiving elements and light-emitting elements in a light-emitting/receiving portion. In the display apparatus of one embodiment of the present invention, light-emitting elements are arranged in a matrix in the light-emitting/receiving portion, and an image can be displayed on the light-emitting/receiving portion. The light-receiving elements are also arranged in a matrix in the light-emitting/receiving portion, and the light-emitting/receiving portion has one or both of an image capturing function and a sensing function. The light-emitting/receiving portion can be used as an image sensor, a touch sensor, or the like. That is, by sensing light with the light-emitting/receiving portion, an image can be taken and a touch operation with an object (e.g., a finger or a pen) can be detected. Furthermore, in the display apparatus of one embodiment of the present invention, the light-emitting elements can be used as a light source for the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted by the light-emitting element included in the light-emitting/receiving portion, the light-receiving element can sense the reflected light (or the scattered light); thus, image capturing and touch operation sensing, for example, are possible even in a dark place.

The light-emitting element included in the display apparatus of one embodiment of the present invention functions as a display element (also referred to as a display device).

As the light-emitting element, an EL element (also referred to as an EL device) such as an OLED or a QLED is preferably used. Examples of light-emitting substances included in EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). An LED such as a micro LED can also be used as the light-emitting element.

The display apparatus of one embodiment of the present invention has a function of sensing light using the light-receiving elements.

When the light-receiving elements are used as an image sensor, the display apparatus can capture an image using the light-receiving elements. For example, the display apparatus can be used as a scanner.

An electronic device including the display apparatus of one embodiment of the present invention can acquire data related to biological information such as a fingerprint or a palm print by using a function of an image sensor. That is, a biological authentication sensor can be incorporated in the display apparatus. When the display apparatus incorporates a biological authentication sensor, the number of components of the electronic device can be reduced as compared to the case where a biological authentication sensor is provided separately from the display apparatus; thus, the size and weight of the electronic device can be reduced.

When the light-receiving elements are used as a touch sensor, the display apparatus can sense a touch operation with an object by using the light-receiving elements.

As the light-receiving element, a PN photodiode or a PIN photodiode can be used, for example. The light-receiving element functions as a photoelectric conversion element (also referred to as a photoelectric conversion device) that senses light incident on the light-receiving element and generates charge. The amount of charge generated from the light-receiving element depends on the amount of light incident on the light-receiving element.

As the light-receiving element, it is particularly preferable to use an organic photodiode including a layer containing an organic compound. An organic photodiode, which is easily made thin, lightweight, and large in area and has a high degree of freedom for shape and design, can be used in a variety of apparatuses.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

If all the layers of the organic EL elements and the organic photodiodes are formed separately, the number of film formation steps becomes extremely large. However, a large number of layers can be shared between the organic photodiodes and the organic EL elements; hence, forming the common layers concurrently can prevent the increase in the number of film formation steps.

For example, one of a pair of electrodes (a common electrode) can be a layer shared by the light-receiving element and the light-emitting element. As another example, at least one of a hole-injection layer, a hole-transport layer, an electron-transport layer, and an electron-injection layer may be shared by the light-receiving element and the light-emitting element. When the light-receiving element and the light-emitting element include a common layer in such a manner, the number of film formation steps and the number of masks can be reduced, thereby reducing the number of manufacturing steps and the manufacturing cost of the display apparatus. Furthermore, the display apparatus including the light-receiving elements can be manufactured using an existing manufacturing apparatus and an existing manufacturing method for the display apparatus.

Next, the display apparatus including light-emitting/receiving elements and light-emitting elements will be described. Note that the description of functions, behavior, effects, and the like similar to the above may be omitted.

In the display apparatus of one embodiment of the present invention, a subpixel exhibiting one color includes a light-emitting/receiving element instead of a light-emitting element, and subpixels exhibiting the other colors include light-emitting elements. The light-emitting/receiving element has both a function of emitting light (a light-emitting function) and a function of receiving light (a light-receiving function). For example, in the case where a pixel includes three subpixels of red, green, and blue, at least one of the subpixels includes a light-emitting/receiving element and the other subpixels each include a light-emitting element. Thus, the light-emitting/receiving portion in the display apparatus of one embodiment of the present invention has a function of displaying an image by using both the light-emitting/receiving element and the light-emitting element.

The use of the light-emitting/receiving element serving as both a light-emitting element and a light-receiving element can provide a light-receiving function for the pixel without increasing the number of subpixels included in the pixel. Thus, the light-emitting/receiving portion of the display apparatus can be provided with one or both of an image capturing function and a sensing function while maintaining the aperture ratio of pixels (aperture ratio of subpixels) and the resolution of the display apparatus. Accordingly, in the display apparatus of one embodiment of the present invention, the aperture ratio of the pixels can be more increased and the resolution can be increased more easily than in a display apparatus provided with a subpixel including a light-receiving element separately from subpixels including light-emitting elements.

In the display apparatus of one embodiment of the present invention, light-emitting/receiving elements and light-emitting elements are arranged in a matrix in the light-emitting/receiving portion, and an image can be displayed on the light-emitting/receiving portion. The light-emitting/receiving portion can be used as an image sensor, a touch sensor, or the like. In the display apparatus of one embodiment of the present invention, the light-emitting elements can be used as a light source for the sensor. Hence, image capturing and touch operation sensing, for example, are possible even in a dark place.

The light-emitting/receiving element can be manufactured by combining an organic EL element and an organic photodiode. For example, by adding an active layer of an organic photodiode to a layered structure of an organic EL element, the light-emitting/receiving element can be manufactured. Furthermore, in the light-emitting/receiving element formed of a combination of an organic EL element and an organic photodiode, concurrently forming layers that can be shared with the organic EL element can prevent an increase in the number of film formation steps.

For example, one of a pair of electrodes (a common electrode) can be a layer shared by the light-emitting/receiving element and the light-emitting element. As another example, at least one of a hole-injection layer, a hole-transport layer, an electron-transport layer, and an electron-injection layer may be shared by the light-emitting/receiving element and the light-emitting element.

Note that layers included in the light-emitting/receiving element may have different functions between when the light-emitting/receiving element functions as a light-receiving element and when it functions as a light-emitting element. In this specification, the name of a component is based on its function of the case where the light-emitting/receiving element functions as a light-emitting element.

The display apparatus of this embodiment has a function of displaying images by using the light-emitting elements and the light-emitting/receiving elements. That is, the light-emitting element and the light-emitting/receiving element function as display elements.

The display apparatus of this embodiment has a function of sensing light by using the light-emitting/receiving elements. The light-emitting/receiving element can sense light having a shorter wavelength than light emitted by the light-emitting/receiving element itself.

When the light-emitting/receiving elements are used as an image sensor, the display apparatus of this embodiment can capture an image by using the light-emitting/receiving elements. When the light-emitting/receiving elements are used as a touch sensor, the display apparatus of this embodiment can sense a touch operation with an object by using the light-emitting/receiving elements.

The light-emitting/receiving element functions as a photoelectric conversion element. The light-emitting/receiving element can be manufactured by adding an active layer of a light-receiving element to the above-described structure of the light-emitting element. In the light-emitting/receiving element, an active layer of a PN photodiode or a PIN photodiode can be used, for example.

In the light-emitting/receiving element, it is particularly preferable to use an active layer of an organic photodiode including a layer containing an organic compound. An organic photodiode, which is easily made thin, lightweight, and large in area and has a high degree of freedom for shape and design, can be used in a variety of apparatuses.

A display apparatus that is an example of the display apparatus of one embodiment of the present invention will be more specifically described below with reference to drawings.

Structure Example 1 of Display Apparatus

Structure Example 1-1

Figure 43A:
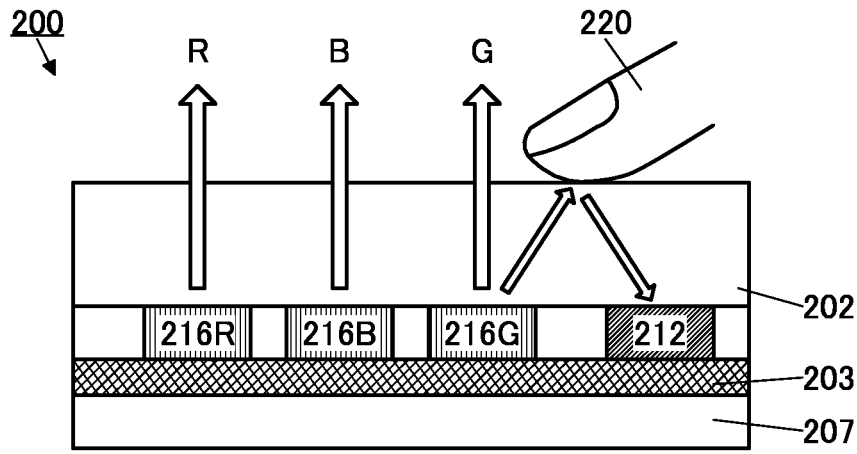
FIGS. 43A, 43B, and 43D are cross-sectional views illustrating an example of a display apparatus.

FIG. 43A is a schematic diagram of a display panel 200. The display panel 200 includes a substrate 207, a substrate 202, a light-receiving element 212, a light-emitting element 216R, a light-emitting element 216G, a light-emitting element 216B, a functional layer 203, and the like.

The light-emitting elements 216R, 216B, and 216G and the light-receiving element 212 are provided between the substrate 207 and the substrate 202. The light-emitting element 216R, the light-emitting element 216G, and the light-emitting element 216B emit red (R) light, green (G) light, and blue (B) light, respectively. Note that in the following description, the term "light-emitting element 216" may be used when the light-emitting elements 216R, 216G, and 216B are not distinguished from each other.

The display panel 200 includes a plurality of pixels arranged in a matrix. One pixel includes at least one subpixel. One subpixel includes one light-emitting element. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel also includes the light-receiving element 212. The light-receiving element 212 may be provided in all the pixels or in some of the pixels. Alternatively, one pixel may include a plurality of light-receiving elements 212.

FIG. 43A shows a state where a finger 220 touches a surface of the substrate 202. Part of light emitted from the light-emitting element 216G is reflected in a contact portion of the substrate 202 and the finger 220. Then, when part of the reflected light is incident on the light-receiving element 212, the contact of the finger 220 with the substrate 202 can be sensed. That is, the display panel 200 can function as a touch panel.

The functional layer 203 includes a circuit for driving the light-emitting elements 216R, 216G, and 216B and a circuit for driving the light-receiving element 212. The functional layer 203 includes a switch, a transistor, a capacitor, a wiring, and the like. Note that in the case where the light-emitting elements 216R, 216G, and 216B and the light-receiving element 212 are driven by a passive-matrix method, the functional layer 203 does not necessarily include a switch, a transistor, and the like.

Figure 43B:
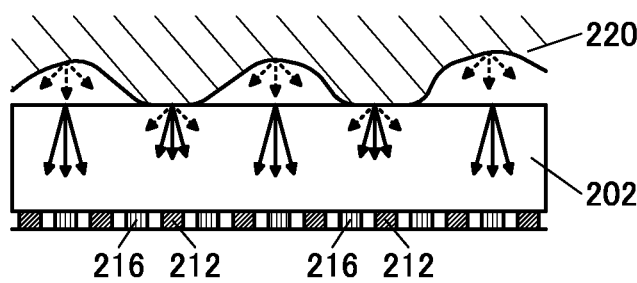

The display panel 200 preferably has a function of sensing the fingerprint of the finger 220. FIG. 43B schematically shows an enlarged view of the contact portion in a state where the finger 220 touches the substrate 202. FIG. 43B also illustrates the light-emitting elements 216 and the light-receiving elements 212 that are alternately arranged.

The fingerprint of the finger 220 is formed of depressions and projections. Accordingly, as illustrated in FIG. 43B, the projections of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and enters the light-receiving elements 212 which are positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving element 212 positioned directly below the depression is higher than the intensity of light received by the light-receiving element 212 positioned directly below the projection. Accordingly, an image of the fingerprint of the finger 220 can be captured.

When the interval between the light-receiving elements 212 is smaller than the distance between two projections of the fingerprint, preferably the distance between a depression and a projection adjacent to each other, a clear fingerprint image can be obtained. The distance between a depression and a projection of a human's fingerprint is approximately 200 µm; thus, the interval between the light-receiving elements 212 is, for example, less than or equal to 400 µm, preferably less than or equal to 200 µm, further preferably less than or equal to 150 µm, still further preferably less than or equal to 100 µm, even still further preferably less than or equal to 50 µm and greater than or equal to 1 µm, preferably greater than or equal to 10 µm, further preferably greater than or equal to 20 µm.

Figure 43C:
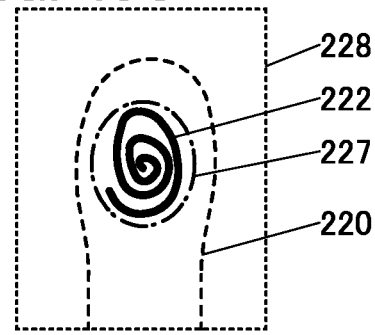
FIGS. 43C and 43E illustrate examples of images.

FIG. 43C illustrates an example of a fingerprint image captured with the display panel 200. In FIG. 43C, in an imaging range 228, the outline of the finger 220 is indicated by a dashed line and the outline of a contact portion 227 is indicated by a dashed-dotted line. In the contact portion 227, a high-contrast image of a fingerprint 222 can be captured by a difference in the amount of light incident on the light-receiving elements 212.

Figure 43D:
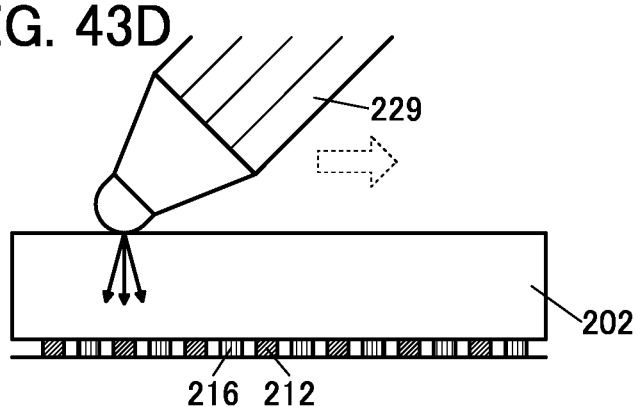

The display panel 200 can also function as a touch panel or a pen tablet. FIG. 43D shows a state in which a stylus 229 slides in a direction indicated by a dashed arrow while the tip of the stylus 229 touches the substrate 202.

As illustrated in FIG. 43D, when diffusely reflected light diffused by the contact surface of the tip of the stylus 229 and the substrate 202 is incident on the light-receiving element 212 overlapped by the contact surface, the position of the tip of the stylus 229 can be sensed with high accuracy.

Figure 43E:
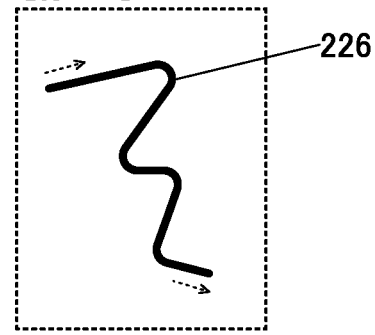

FIG. 43E illustrates an example of a path 226 of the stylus 229 that is detected by the display panel 200. The display panel 200 can sense the position of an object such as the stylus 229 with high accuracy, so that high-definition drawing can be performed using a drawing application, for example. Unlike in the case of using a capacitive touch sensor, an electromagnetic induction touch pen, or the like, the display panel 200 can sense even the position of a highly insulating object; hence, the material of a tip portion of the stylus 229 is not limited, and a variety of writing materials (e.g., a brush, a glass pen, or a quill pen) can be used.

Figure 43F:
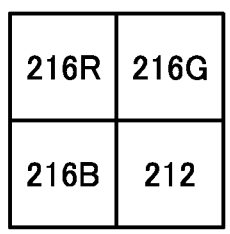
FIGS. 43F to 43H are top views illustrating examples of pixels.
Figure 43G:
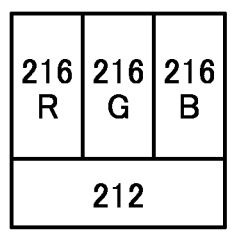
Figure 43H:
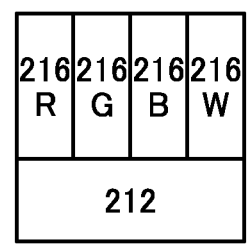

Here, FIGS. 43F to 43H illustrate examples of pixels that can be used in the display panel 200.

The pixels illustrated in FIGS. 43F and 43G each include the red (R) light-emitting element 216R, the green (G) light-emitting element 216G, the blue (B) light-emitting element 216B, and the light-receiving element 212. The pixels each include a pixel circuit for driving the light-emitting elements 216R, 216G, and 216B and the light-receiving element 212.

FIG. 43F illustrates an example in which three light-emitting elements and one light-receiving element are arranged in a matrix of 2×2. FIG. 43G illustrates an example in which three light-emitting elements are arranged in one column and one laterally long light-receiving element 212 is provided below the three light-emitting elements.

FIG. 43H illustrates an example in which the pixel includes a white (W) light-emitting element 216W. Here, four light-emitting elements are arranged in one column, and the light-receiving element 212 is provided below the four light-emitting elements.

Note that the pixel structure is not limited to the above, and a variety of arrangements can be employed.

Structure Example 1-2

An example of a structure including a light-emitting element that emits visible light, a light-emitting element that emits infrared light, and a light-receiving element will be described below.

Figure 44A:
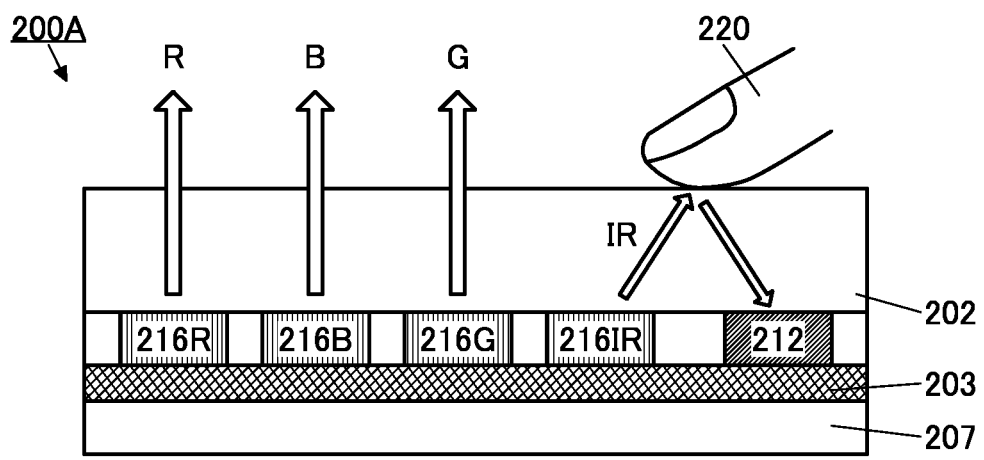
FIG. 44A is a cross-sectional view illustrating a structure example of a display apparatus.

A display panel 200A illustrated in FIG. 44A includes a light-emitting element 216IR in addition to the components illustrated in FIG. 43A. The light-emitting element 216IR is a light-emitting element that emits infrared light IR. Here, the light-receiving element 212 is preferably an element capable of receiving at least the infrared light IR emitted from the light-emitting element 216IR. The light-receiving element 212 is further preferably an element capable of receiving both visible light and infrared light.

As illustrated in FIG. 44A, when the finger 220 touches the substrate 202, the infrared light IR emitted from the light-emitting element 216IR is reflected by the finger 220 and part of the reflected light is incident on the light-receiving element 212; hence, the positional information of the finger 220 can be obtained.

Figure 44B:
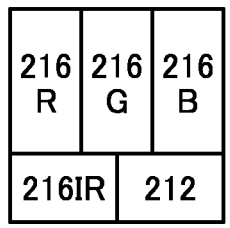
FIGS. 44B to 44D are top views illustrating examples of pixels.
Figure 44C:
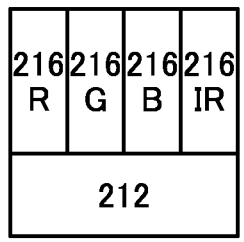
Figure 44D:
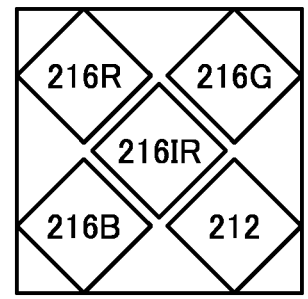

FIGS. 44B to 44D illustrate examples of pixels that can be used in the display panel 200A.

FIG. 44B illustrates an example in which three light-emitting elements are arranged in one column and the light-emitting element 216IR and the light-receiving element 212 are arranged laterally below the three light-emitting elements. FIG. 44C illustrates an example in which four light-emitting elements including the light-emitting element 216IR are arranged in one column and the light-receiving element 212 is provided below the four light-emitting elements.

FIG. 44D illustrates an example in which three light-emitting elements and the light-receiving element 212 are arranged in four directions around the light-emitting element 216IR.

Note that in the pixels illustrated in FIGS. 44B to 44D, the positions of the light-emitting elements are interchangeable, and the positions of the light-emitting element and the light-receiving element are interchangeable.

Structure Example 1-3

An example of a structure including a light-emitting element that emits visible light and a light-emitting/receiving element that emits and receives visible light will be described below.

A display panel 200B illustrated in FIG. 45A includes the light-emitting element 216B, the light-emitting element 216G, and a light-emitting/receiving element 213R. The light-emitting/receiving element 213R has a function of a light-emitting element that emits red (R) light, and a function of a photoelectric conversion element that receives visible light. FIG. 45A illustrates an example in which the light-emitting/receiving element 213R receives green (G) light emitted from the light-emitting element 216G. Note that the light-emitting/receiving element 213R may receive blue (B) light emitted from the light-emitting element 216B. Alternatively, the light-emitting/receiving element 213R may receive both green light and blue light.

For example, the light-emitting/receiving element 213R preferably receives light having a shorter wavelength than light emitted from itself. Alternatively, the light-emitting/receiving element 213R may receive light (e.g., infrared light) having a longer wavelength than light emitted from itself. The light-emitting/receiving element 213R may receive light having approximately the same wavelength as light emitted from itself; however, in that case, the light-emitting/receiving element 213R also receives light emitted from itself, whereby its emission efficiency might be decreased. Therefore, the peak of the emission spectrum and the peak of the absorption spectrum of the light-emitting/receiving element 213R preferably overlap as little as possible.

Here, light emitted from the light-emitting/receiving element is not limited to red light. Light emitted from the light-emitting elements is not limited to a combination of green light and blue light. For example, the light-emitting/receiving element can be an element that emits green light or blue light and receives light having a different wavelength from light emitted from itself.

The light-emitting/receiving element 213R serves as both a light-emitting element and a light-receiving element as described above, whereby the number of elements provided in one pixel can be reduced. Thus, higher definition, a higher aperture ratio, higher resolution, and the like can be easily achieved.

FIGS. 45B to 45I illustrate examples of pixels that can be used in the display panel 200B.

FIG. 45B illustrates an example in which the light-emitting/receiving element 213R, the light-emitting element 216G, and the light-emitting element 216B are arranged in one column. FIG. 45C illustrates an example in which the light-emitting element 216G and the light-emitting element 216B are alternately arranged in the vertical direction and the light-emitting/receiving element 213R is provided alongside the light-emitting elements.

FIG. 45D illustrates an example in which three light-emitting elements (light-emitting elements 216G, 216B, and 216X) and one light-emitting/receiving element are arranged in matrix of 2×2. The light-emitting element 216X emits light of a color other than R, G, and B. Examples of light of a color other than R, G, and B include white (W) light, yellow (Y) light, cyan (C) light, magenta (M) light, infrared light (IR), and ultraviolet light (UV). In the case where the light-emitting element 216X emits infrared light, the light-emitting/receiving element preferably has a function of sensing infrared light or a function of sensing both visible light and infrared light. The wavelength of light that the light-emitting/receiving element senses can be determined depending on the application of the sensor.

FIG. 45E illustrates two pixels. A region that includes three elements and is enclosed by a dotted line corresponds to one pixel. Each of the pixels includes the light-emitting element 216G, the light-emitting element 216B, and the light-emitting/receiving element 213R. In the left pixel in FIG. 45E, the light-emitting element 216G is provided in the same row as the light-emitting/receiving element 213R, and the light-emitting element 216B is provided in the same column as the light-emitting/receiving element 213R. In the right pixel in FIG. 45E, the light-emitting element 216G is provided in the same row as the light-emitting/receiving element 213R, and the light-emitting element 216B is provided in the same column as the light-emitting element 216G. In the pixel layout in FIG. 45E, the light-emitting/receiving element 213R, the light-emitting element 216G, and the light-emitting element 216B are repeatedly arranged in both the odd-numbered row and the even-numbered row, and in each column, the light-emitting elements or the light-emitting element and the light-emitting/receiving element arranged in the odd-numbered row and the even-numbered row emit light of different colors.

FIG. 45F illustrates four pixels that employ pentile arrangement; two adjacent pixels have different combinations of light-emitting elements or a light-emitting element and a light-emitting/receiving element that emit light of two different colors. Note that FIG. 45F illustrates the top surface shapes of the light-emitting elements and the light-emitting/receiving elements.

The upper left pixel and the lower right pixel in FIG. 45F each include the light-emitting/receiving element 213R and the light-emitting element 216G. The upper right pixel and the lower left pixel each include the light-emitting element 216G and the light-emitting element 216B. That is, in the example illustrated in FIG. 45F, the light-emitting element 216G is provided in each pixel.

The top surface shapes of the light-emitting elements and the light-emitting/receiving elements are not particularly limited and can be a circular shape, an elliptical shape, a polygonal shape, a polygonal shape with rounded corners, or the like. FIG. 45F and the like illustrate examples in which the top surface shapes of the light-emitting elements and the light-emitting/receiving elements are each a square tilted at approximately 45° (a diamond shape). Note that the top surface shapes of the light-emitting elements and the light-emitting/receiving elements of different colors may vary, or the elements of at least one color or all colors may have the same top surface shape.

The sizes of the light-emitting regions (or light-emitting/receiving regions) of the light-emitting elements and the light-emitting/receiving elements of different colors may vary, or the regions of at least one color or all colors may be the same in size. For example, in FIG. 45F, the light-emitting region of the light-emitting element 216G provided in each pixel may have a smaller area than the light-emitting region (or the light-emitting/receiving region) of the other elements.

FIG. 45G shows a variation example of the pixel arrangement in FIG. 45F. Specifically, the structure of FIG. 45G is obtained by rotating the structure of FIG. 45F by 45°. Although one pixel is shown as including two elements in FIG. 45F, one pixel can also be regarded as including four elements as illustrated in FIG. 45G.

FIG. 45H shows a variation example of the pixel arrangement in FIG. 45F. The upper left pixel and the lower right pixel in FIG. 45H each include the light-emitting/receiving element 213R and the light-emitting element 216G. The upper right pixel and the lower left pixel each include the light-emitting/receiving element 213R and the light-emitting element 216B. That is, in the example illustrated in FIG. 45H, the light-emitting/receiving element 213R is provided in each pixel. The structure in FIG. 45H enables higher-resolution image capturing than the structure in FIG. 45F because of having the light-emitting/receiving element 213R in each pixel. Thus, the accuracy of biometric authentication can be increased, for example.

FIG. 45I shows a variation example of the pixel arrangement in FIG. 45H, obtained by rotating the pixel arrangement in FIG. 45H by 45°.

In FIG. 45I, one pixel is described as being composed of four elements (two light-emitting elements and two light-emitting/receiving elements). The pixel including a plurality of light-emitting/receiving elements having a light-receiving function allows high-resolution image capturing. Thus, the accuracy of biometric authentication can be increased. For example, the resolution of image capturing can be the square root of 2 times the resolution of display.

A display apparatus that employs the structure illustrated in FIG. 45H or FIG. 45I includes p first light-emitting elements (p is an integer greater than or equal to 2), q second light-emitting elements (q is an integer greater than or equal to 2), and r light-emitting/receiving elements (r is an integer greater than p and greater than q). The following are satisfied: r=2p, r=p+q. Either the first light-emitting elements or the second light-emitting elements emit green light, and the other light-emitting elements emit blue light. The light-emitting/receiving elements emit red light and have a light-receiving function.

When a touch operation is detected using the light-emitting/receiving elements, for example, it is preferable that light emitted from a light source be less likely to be perceived by the user. Since blue light has lower visibility than green light, light-emitting elements that emit blue light are preferably used as a light source. Accordingly, the light-emitting/receiving elements preferably have a function of receiving blue light. Note that without limitation to the above, light-emitting elements used as a light source can be selected as appropriate depending on the sensitivity of the light-emitting/receiving elements.

As described above, the display apparatus of this embodiment can include pixels with a variety of arrangements.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 4

In this embodiment, a light-emitting element (also referred to as light-emitting device) and a light-receiving element (also referred to as a light-receiving device) that can be used in a light-emitting/receiving apparatus of one embodiment of the present invention will be described.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that a combination of white light-emitting devices with coloring layers (e.g., color filters) enables a full-color display apparatus.

Structures of light-emitting devices can be classified roughly into a single structure and a tandem structure. A light-emitting device having a single structure includes one light-emitting unit between a pair of electrodes, and the light-emitting unit preferably includes one or more light-emitting layers. To obtain white light emission by using two light-emitting layers, the two light-emitting layers are selected such that emission colors of the light-emitting layers are complementary colors. For example, when emission colors of a first light-emitting layer and a second light-emitting layer are complementary colors, the light-emitting device can be configured to emit white light as a whole. To obtain white light emission by using three or more light-emitting layers, the light-emitting device is configured to emit white light as a whole by combining emission colors of the three or more light-emitting layers.

A light-emitting device having a tandem structure includes two or more light-emitting units between a pair of electrode, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, the light-emitting device is configured to obtain white light emission by combining light from light-emitting layers of a plurality of light-emitting units. Note that a combination of emission colors for obtaining white light emission is similar to that for a single structure. In a light-emitting device having a tandem structure, an intermediate layer such as a charge-generation layer is preferably provided between a plurality of light-emitting units.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

[Device Structure]

Next, detailed structures of a light-emitting element, a light-receiving element, and a light-emitting/receiving element that can be used in the display apparatus of one embodiment of the present invention will be described.

The display apparatus of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), letters of the alphabet are omitted from the reference numerals when a common part of the components is described. For example, the collective term "light-emitting layer 383" is sometimes used to describe a common part of a light-emitting layer 383R, a light-emitting layer 383G, and the like.

Figure 46A:
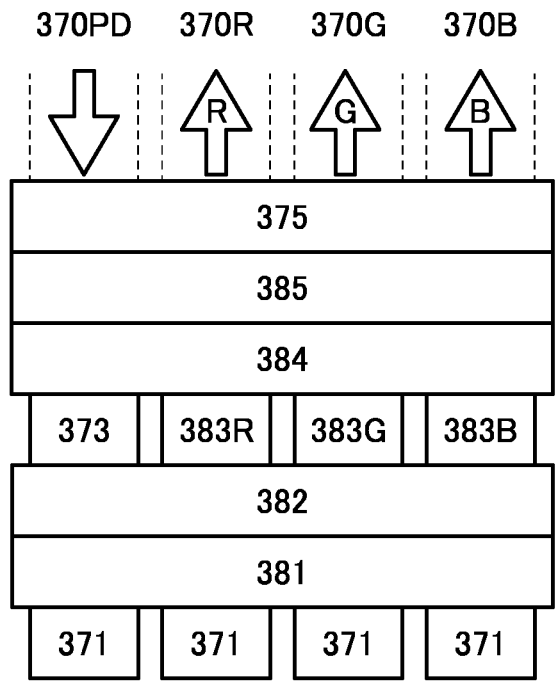
FIGS. 46A and 46B each illustrate a structure example of a display apparatus.

A display apparatus 380A illustrated in FIG. 46A includes a light-receiving element 370PD, a light-emitting element 370R that emits red (R) light, a light-emitting element 370G that emits green (G) light, and a light-emitting element 370B that emits blue (B) light.

Each of the light-emitting elements includes a pixel electrode 371, a hole-injection layer 381, a hole-transport layer 382, a light-emitting layer, an electron-transport layer 384, an electron-injection layer 385, and a common electrode 375 that are stacked in this order. The light-emitting element 370R includes the light-emitting layer 383R, the light-emitting element 370G includes the light-emitting layer 383G, and the light-emitting element 370B includes a light-emitting layer 383B. The light-emitting layer 383R includes a light-emitting substance that emits red light, the light-emitting layer 383G includes a light-emitting substance that emits green light, and the light-emitting layer 383B includes a light-emitting substance that emits blue light.

The light-emitting elements are electroluminescent elements that emit light toward the common electrode 375 by voltage application between the pixel electrode 371 and the common electrode 375.

The light-receiving element 370PD includes the pixel electrode 371, the hole-injection layer 381, the hole-transport layer 382, an active layer 373, the electron-transport layer 384, the electron-injection layer 385, and the common electrode 375 that are stacked in this order.

The light-receiving element 370PD is a photoelectric conversion element that receives light incident from the outside of the display apparatus 380A and converts the light into an electric signal.

This embodiment is described assuming that the pixel electrode 371 functions as an anode and the common electrode 375 functions as a cathode in the light-emitting elements and the light-receiving element. In other words, the light-receiving element is driven by application of reverse bias between the pixel electrode 371 and the common electrode 375, whereby light incident on the light-receiving element can be sensed and electric charge can be generated and extracted as a current.

In the display apparatus of this embodiment, an organic compound is used for the active layer 373 of the light-receiving element 370PD. The light-receiving element 370PD can share the layers other than the active layer 373 with the light-emitting elements. Therefore, the light-receiving element 370PD can be formed concurrently with the formation of the light-emitting elements only by adding a step of forming the active layer 373 in the manufacturing process of the light-emitting elements. The light-emitting elements and the light-receiving element 370PD can be formed over one substrate. Accordingly, the light-receiving element 370PD can be incorporated into the display apparatus without a significant increase in the number of manufacturing steps.

In the display apparatus 380A, for example, the light-receiving element 370PD and the light-emitting elements have a common structure except that the active layer 373 of the light-receiving element 370PD and the light-emitting layers 383 of the light-emitting elements are separately formed. The structures of the light-receiving element 370PD and the light-emitting elements are not limited thereto. The light-receiving element 370PD and the light-emitting elements may include separately formed layers in addition to the active layer 373 and the light-emitting layer 383. The light-receiving element 370PD and the light-emitting elements preferably include at least one layer used in common (common layer). Thus, the light-receiving element 370PD can be incorporated into the display apparatus without a significant increase in the number of manufacturing steps.

A conductive film that transmits visible light is used for the electrode through which light is extracted, which is either the pixel electrode 371 or the common electrode 375. A conductive film that reflects visible light is preferably used for the electrode through which light is not extracted.

The light-emitting element includes at least the light-emitting layer 383. In addition to the light-emitting layer 383, the light-emitting element may further include a layer containing any of a substance with a high hole-injection property, a substance with a high hole-transport property, a hole-blocking material, a substance with a high electron-transport property, a substance with a high electron-injection property, a substance with a bipolar property (a substance with high electron- and hole-transport properties), and the like.

For example, the light-emitting elements and the light-receiving element can share at least one of the hole-injection layer, the hole-transport layer, the electron-transport layer, and the electron-injection layer. At least one of the hole-injection layer, the hole-transport layer, the electron-transport layer, and the electron-injection layer can be separately formed for the light-emitting elements and the light-receiving element.

The hole-injection layer injects holes from the anode to the hole-transport layer and contains a material with a high hole-injection property. As the material with a high hole-injection property, an aromatic amine compound or a composite material containing a hole-transport material and an acceptor material (electron-accepting material) can be used.

In the light-emitting elements, the hole-transport layer transports holes injected from the anode by the hole-injection layer, to the light-emitting layer. In the light-receiving element, the hole-transport layer transports holes generated in the active layer on the basis of incident light, to the anode. The hole-transport layer contains a hole-transport material. The hole-transport material preferably has a hole mobility of $1\times10^{-6}$ cm$^2$/Vs or higher. Note that other substances can also be used as long as the substances have a hole-transport property higher than an electron-transport property. As the hole-transport material, a material having a high hole-transport property, such as a π-electron rich heteroaromatic compound (e.g., a carbazole derivative, a thiophene derivative, or a furan derivative) or an aromatic amine (a compound having an aromatic amine skeleton), is preferred.

In the light-emitting elements, the electron-transport layer transports electrons injected from the cathode by the electron-injection layer, to the light-emitting layer. In the light-receiving element, the electron-transport layer transports electrons generated in the active layer on the basis of incident light, to the cathode. The electron-transport layer contains an electron-transport material. The electron-transport material preferably has an electron mobility of $1\times10^{-6}$ cm$^2$/Vs or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 383 contains a light-emitting substance. The light-emitting layer 383 can contain one kind or two or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton, an organometallic complex (particularly an iridium complex) having a phenylpyridine derivative including an electron-withdrawing group as a ligand, a platinum complex, and a rare earth metal complex.

The light-emitting layer 383 may contain one or more kinds of organic compounds (e.g., a host material or an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer 383 preferably includes a phosphorescent material and a combination of a hole-transport material and an electron-transport material that easily forms an exciplex. With such a structure, light emission can be efficiently obtained by exciplex-triplet energy transfer (Ex-TET), which is energy transfer from the exciplex to the light-emitting substance (phosphorescent material). When a combination of materials is selected so as to form an exciplex that emits light whose wavelength overlaps the wavelength of a lowest-energy-side absorption band of the light-emitting substance, energy can be transferred smoothly and light emission can be obtained efficiently. With the above structure, high efficiency, low-voltage driving, and a long lifetime of a light-emitting element can be achieved at the same time.

In a combination of materials for forming an exciplex, the highest occupied molecular orbital level (HOMO level) of the hole-transport material is preferably higher than or equal to that of the electron-transport material. The lowest unoccupied molecular orbital level (LUMO level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film where the hole-transport material and the electron-transport material are mixed is shifted to the longer wavelength side than the emission spectra of each of the hole-transport material and the electron-transport material (or has another peak on the longer wavelength side) observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the hole-transport material and the electron-transport material, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of transient EL of the hole-transport material, the electron-transport material, and the mixed film of these materials.

The active layer 373 includes a semiconductor. Examples of the semiconductor include an inorganic semiconductor such as silicon and an organic semiconductor including an organic compound. This embodiment shows an example in which an organic semiconductor is used as the semiconductor included in the active layer 373. The use of an organic semiconductor is preferable because the light-emitting layer 383 and the active layer 373 can be formed by the same method (e.g., a vacuum evaporation method) and thus the same manufacturing apparatus can be used.

Examples of an n-type semiconductor material contained in the active layer 373 are electron-accepting organic semiconductor materials such as fullerene (e.g., $C_{60}$ fullerene and $C_{70}$ fullerene) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electron conjugation widely spread in fullerene having a spherical shape, its electron-accepting property is high. The high electron-accepting property efficiently causes rapid charge separation and is useful for the light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1'', 4',4''-tetrahydro-di[1,4]methanonaphthaleno[1,2:2',3',56,60: 2'',3'][5,6]fullerene-$C_{60}$ (abbreviation: ICBA).

Another example of an n-type semiconductor material includes a perylenetetracarboxylic derivative such as N,N'-dimethyl-3,4,9,10-perylenetetracarboxylic diimide (abbreviation: Me-PTCDI).

Another example of an n-type semiconductor material is 2,2'-(5,5'-(thieno[3,2-b]thiophene-2,5-diyl)bis(thiophene-5, 2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 373 include electron-donating organic semiconductor materials such as copper(II) phthalocyanine (CuPc), tetraphenyldibenzoperiflanthene (DBP), zinc phthalocyanine (ZnPc), tin(II) phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Spherical fullerene is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 373 is preferably formed by co-evaporation of an n-type semiconductor and a p-type semiconductor. Alternatively, the active layer 373 may be formed by stacking an n-type semiconductor and a p-type semiconductor.

Either a low molecular compound or a high molecular compound can be used for the light-emitting elements and the light-receiving element, and an inorganic compound may also be included. Each of the layers included in the light-emitting elements and the light-receiving element can be formed by any of the following methods, for example: an evaporation method (including a vacuum evaporation method), a transfer method, a printing method, an inkjet method, and a coating method.

As the hole-transport material or an electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or a hole-blocking material, an inorganic compound such as zinc oxide (ZnO), or an organic compound such as polyethylenimine ethoxylated (PEIE) can be used. The light-receiving device may include a mixed film of PEIE and ZnO, for example.

For the active layer 373, it is possible to use a high molecular compound that functions as a donor, such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative. For example, a method of dispersing an acceptor material in PBDB-T or a PBDB-T derivative can be employed.

Figure 46B:
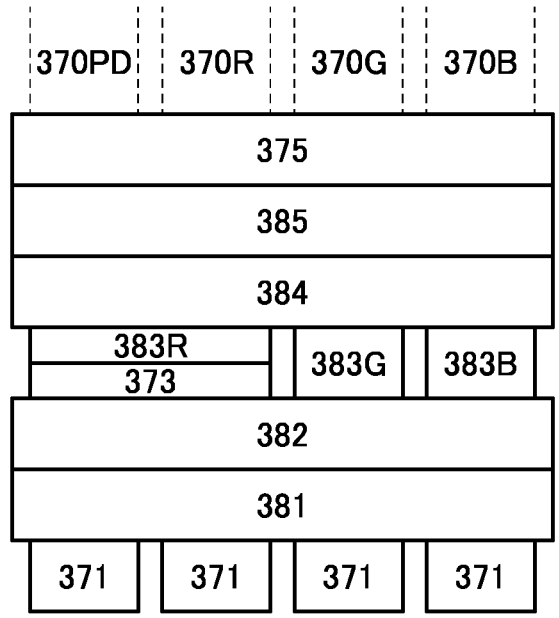

A display apparatus 380B illustrated in FIG. 46B is different from the display apparatus 380A in that the light-receiving element 370PD and the light-emitting element 370R have the same structure.

The light-receiving element 370PD and the light-emitting element 370R share the active layer 373 and the light-emitting layer 383R.

Here, the light-receiving element 370PD preferably has the same structure as the light-emitting element which emits light with a wavelength that is longer than the sensing-target light wavelength. For example, the light-receiving element 370PD with a structure for sensing blue light can have the same structure as one or both of the light-emitting element 370R and the light-emitting element 370G. As another example, the light-receiving element 370PD with a structure for sensing green light can have the same structure as the light-emitting element 370R.

When the light-receiving element 370PD and the light-emitting element 370R have a common structure, the number of film formation steps and the number of masks can be reduced from those used in the structure where the light-receiving element 370PD and the light-emitting element 370R include separately formed layers. Consequently, the number of manufacturing steps and the manufacturing costs of the display apparatus can be reduced.

When the light-receiving element 370PD and the light-emitting element 370R have a common structure, a space provided to allow for misalignment can be reduced compared with the structure in which the light-receiving element 370PD and the light-emitting element 370R include separately formed layers. Accordingly, the aperture ratio of pixels can be increased, and the light extraction efficiency of the display apparatus can be increased. This can extend the life of the light-emitting element. Furthermore, the display apparatus can exhibit a high luminance. Moreover, the definition of the display apparatus can be increased.

The light-emitting layer 383R includes a light-emitting substance that emits red light. The active layer 373 contains an organic compound that absorbs light with a wavelength shorter than that of red light (e.g., one or both of green light and blue light). The active layer 373 preferably contains an organic compound that does not easily absorb red light and absorbs light with a wavelength shorter than that of red light. In that case, red light can be efficiently extracted from the light-emitting element 370R, and the light-receiving element 370PD can sense light with a wavelength shorter than that of red light with high accuracy.

Although the display apparatus 380B is an example where the light-emitting element 370R and the light-receiving element 370PD have the same structure, the light-emitting element 370R and the light-receiving element 370PD may include optical adjustment layers with different thicknesses.

A display apparatus 380C illustrated in FIGS. 47A and 47B includes a light-emitting/receiving element 370SR that emits red (R) light and has a light-receiving function, the light-emitting element 370G, and the light-emitting element 370B. The above description of the display apparatus 380A, for example, can be referred to for the structures of the light-emitting elements 370G and 370B.

The light-emitting/receiving element 370SR includes the pixel electrode 371, the hole-injection layer 381, the hole-transport layer 382, the active layer 373, the light-emitting layer 383R, the electron-transport layer 384, the electron-injection layer 385, and the common electrode 375 that are stacked in this order. The light-emitting/receiving element 370SR has the same structure as the light-emitting element 370R and the light-receiving element 370PD in the display apparatus 380B.

FIG. 47A shows the case where the light-emitting/receiving element 370SR functions as a light-emitting element. FIG. 47A illustrates an example in which the light-emitting element 370B emits blue light, the light-emitting element 370G emits green light, and the light-emitting/receiving element 370SR emits red light.

FIG. 47B shows the case where the light-emitting/receiving element 370SR functions as a light-receiving element. FIG. 47B illustrates an example in which the light-emitting/receiving element 370SR receives blue light emitted by the light-emitting element 370B and green light emitted by the light-emitting element 370G.

The light-emitting element 370B, the light-emitting element 370G, and the light-emitting/receiving element 370SR each include the pixel electrode 371 and the common electrode 375. In this embodiment, the case where the pixel electrode 371 functions as an anode and the common electrode 375 functions as a cathode is described as an example. The light-emitting/receiving element 370SR is driven by application of reverse bias between the pixel electrode 371 and the common electrode 375, whereby light incident on the light-emitting/receiving element 370SR can be sensed and electric charge can be generated and extracted as a current.

It can be said that the light-emitting/receiving element 370SR has a structure in which the active layer 373 is added to the light-emitting element. That is, the light-emitting/receiving element 370SR can be formed concurrently with the light-emitting elements only by adding a step of forming the active layer 373 in the manufacturing process of the light-emitting element. The light-emitting elements and the light-emitting/receiving element can be formed over one substrate. Thus, one or both of an image capturing function and a sensing function can be provided to the display portion without a significant increase in the number of manufacturing steps.

The stacking order of the light-emitting layer 383R and the active layer 373 is not limited. In FIGS. 47A and 47B, the active layer 373 is provided over the hole-transport layer 382, and the light-emitting layer 383R is provided over the active layer 373. The stacking order of the light-emitting layer 383R and the active layer 373 may be reversed.

In the light-emitting/receiving element, a conductive film that transmits visible light is used for the electrode through which light is extracted. A conductive film that reflects visible light is preferably used for the electrode through which light is not extracted.

The functions and materials of the layers constituting the light-emitting/receiving element are similar to those of the layers constituting the light-emitting elements and the light-receiving element and are not described in detail here.

FIGS. 47C to 47G illustrate examples of stacked-layer structures of light-emitting/receiving elements.

The light-emitting/receiving element illustrated in FIG. 47C includes a first electrode 377, the hole-injection layer 381, the hole-transport layer 382, the light-emitting layer 383R, the active layer 373, the electron-transport layer 384, the electron-injection layer 385, and a second electrode 378.

FIG. 47C illustrates an example in which the light-emitting layer 383R is provided over the hole-transport layer 382, and the active layer 373 is stacked over the light-emitting layer 383R.

As illustrated in FIGS. 47A to 47C, the active layer 373 and the light-emitting layer 383R may be in contact with each other.

A buffer layer is preferably provided between the active layer 373 and the light-emitting layer 383R. In that case, the buffer layer preferably has a hole-transport property and an electron-transport property. For example, a bipolar substance is preferably used for the buffer layer. Alternatively, as the buffer layer, at least one of a hole-injection layer, a hole-transport layer, an electron-transport layer, an electron-injection layer, a hole-blocking layer, an electron-blocking layer, and the like can be used. FIG. 47D illustrates an example where the hole-transport layer 382 is used as the buffer layer.

The buffer layer provided between the active layer 373 and the light-emitting layer 383R can suppress transfer of excitation energy from the light-emitting layer 383R to the active layer 373. Furthermore, the optical path length (cavity length) of the microcavity structure can be adjusted with the buffer layer. Thus, high emission efficiency can be obtained from the light-emitting/receiving element including the buffer layer between the active layer 373 and the light-emitting layer 383R.

FIG. 47E illustrates an example in which a hole-transport layer 382-1, the active layer 373, a hole-transport layer 382-2, and the light-emitting layer 383R are stacked in this order over the hole-injection layer 381. The hole-transport layer 382-2 functions as a buffer layer. The hole-transport layers 382-1 and 382-2 may contain the same material or different materials. Instead of the hole-transport layer 382-2, any of the above layers that can be used as the buffer layer may be used. The positions of the active layer 373 and the light-emitting layer 383R may be interchanged.

The light-emitting/receiving element illustrated in FIG. 47F is different from the light-emitting/receiving element illustrated in FIG. 47A in that the hole-transport layer 382 is not included. In this manner, the light-emitting/receiving element may exclude at least one of the hole-injection layer 381, the hole-transport layer 382, the electron-transport layer 384, and the electron-injection layer 385. The light-emitting/receiving element may include another functional layer such as a hole-blocking layer or an electron-blocking layer.

The light-emitting/receiving element illustrated in FIG. 47G is different from the light-emitting/receiving element illustrated in FIG. 47A in including a layer 389 serving as both a light-emitting layer and an active layer instead of including the active layer 373 and the light-emitting layer 383R.

As the layer serving as both a light-emitting layer and an active layer, a layer containing three materials which are an n-type semiconductor that can be used for the active layer 373, a p-type semiconductor that can be used for the active layer 373, and a light-emitting substance that can be used for the light-emitting layer 383R can be used, for example.

An absorption band on the lowest energy side of the absorption spectrum of a mixed material of the n-type semiconductor and the p-type semiconductor and the maximum peak of an emission spectrum (PL spectrum) of the light-emitting substance preferably do not overlap each other and are further preferably positioned fully apart from each other.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 5

In this embodiment, an example of a display apparatus including a light-receiving device of one embodiment of the present invention will be described.

In the display apparatus of this embodiment, a pixel can include a plurality of types of subpixels including light-emitting devices that emit light of different colors. For example, the pixel can include three types of subpixels. The three subpixels can be of three colors of red (R), green (G), and blue (B) or of three colors of yellow (Y), cyan (C), and magenta (M), for example. Alternatively, the pixel can include four types of subpixels. The four subpixels can be of four colors of R, G, B, and white (W) or of four colors of R, G, B, and Y, for example.

There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

In the display apparatus including light-emitting devices and a light-receiving device in each pixel, the pixel has a light-receiving function; thus, the display apparatus can sense a contact or approach of an object while displaying an image. For example, an image can be displayed by using all the subpixels included in the display apparatus; or light can be emitted by some of the subpixels as a light source and an image can be displayed by using the other subpixels.

Figure 48A:
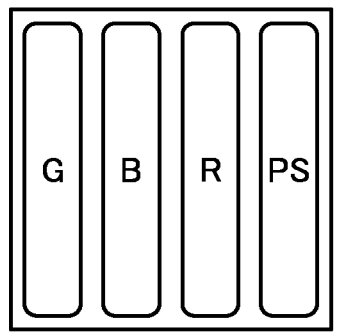
FIGS. 48A to 48F each illustrate a structure example of a pixel, and FIGS. 48G and 48H each illustrate an example of a circuit diagram of a pixel.
Figure 48B:
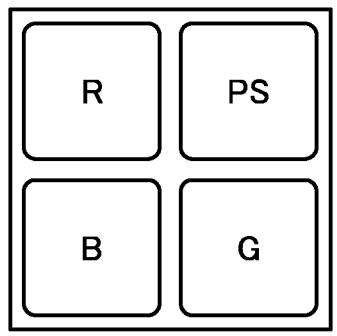
Figure 48C:
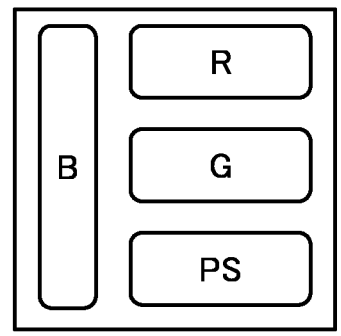

Pixels illustrated in FIGS. 48A to 48C each include a subpixel G, a subpixel B, a subpixel R, and a subpixel PS.

The pixel illustrated in FIG. 48A employs S-stripe arrangement. The pixel illustrated in FIG. 48B employs matrix arrangement.

In the pixel illustrated in FIG. 48C, three subpixels (the subpixels R, G, and PS) are vertically arranged next to one subpixel (the subpixel B).

Figure 48D:
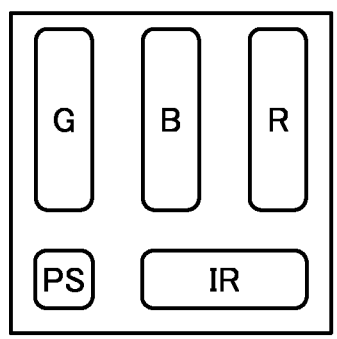
Figure 48E:
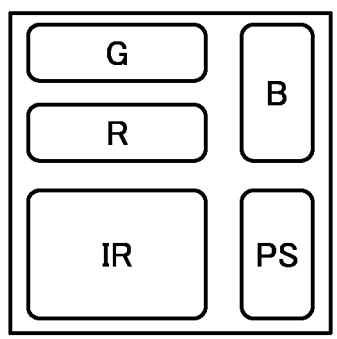
Figure 48F:
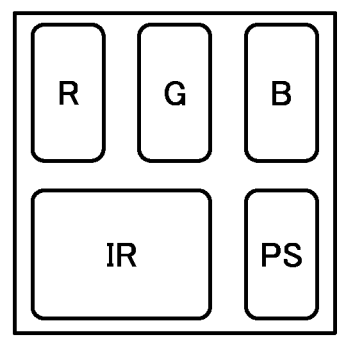

Pixels illustrated in FIGS. 48D to 48F each include the subpixel G, the subpixel B, the subpixel R, a subpixel IR, and the subpixel PS.

FIGS. 48D to 48F illustrate examples in which one pixel is provided in two rows. Three subpixels (the subpixels G, B, and R) are provided in the upper row (first row), and two subpixel (one subpixel PS and one subpixel IR) are provided in the lower row (second row).

In FIG. 48D, the three vertically oriented subpixels G, B, and R are arranged laterally, and the subpixel PS and the horizontally oriented subpixel IR are arranged laterally below the three subpixels. In FIG. 48E, the two horizontally oriented subpixels G and R are arranged in the vertical direction; the vertically oriented subpixel B is arranged laterally next to the subpixels G and R; and the horizontally oriented subpixel IR and the vertically oriented subpixel PS are arranged laterally below the subpixels R, G, and B. In FIG. 48F, the three vertically oriented subpixels R, G, and B are arranged laterally, and the horizontally oriented subpixel IR and the vertically oriented subpixel PS are arranged laterally below the subpixels R, G, and B. In FIGS. 48E and 48F, the area of the subpixel IR is the largest, and the area of the subpixel PS is substantially the same as that of the subpixel B and the like.

Note that the layout of the subpixels is not limited to those illustrated in FIGS. 48A to 48F.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. Although there is no particular limitation on the wavelength of light that the subpixel PS senses, the light-receiving device included in the subpixel PS preferably has sensitivity to light emitted from the light-emitting device included in the subpixel R, the subpixel G, the subpixel B, or the subpixel IR. The light-receiving device preferably senses one or more of light in blue, violet, bluish violet, green, yellow green, yellow, orange, red, and infrared wavelength ranges, for example.

The light-receiving area of the subpixel PS is smaller than the light-emitting area of each of the other subpixels. A smaller light-receiving area leads to a narrower image-capturing range, prevents a blur in a captured image, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably senses infrared light. Thus, touch sensing is possible even in a dark place.

Here, the touch sensor or the near touch sensor can detect an approach or contact of an object (e.g., a finger, a hand, or a pen). The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is more than or equal to 0.1 mm and less than or equal to 300 nm, preferably more than or equal to 3 mm and less than or equal to 50 mm. With this structure, the display apparatus can be controlled without an object directly contacting with the display apparatus. In other words, the display apparatus can be controlled in a contactless (touchless) manner. With the above structure, the display apparatus can be controlled with a reduced risk of making the display apparatus dirty or damaging the display apparatus or without the object directly touching a dirt (e.g., dust, bacteria, or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some of the pixels in the display apparatus. When the number of subpixels PS included in the display apparatus is smaller than the number of subpixels R, for example, higher detection speed can be achieved.

Figure 48G:
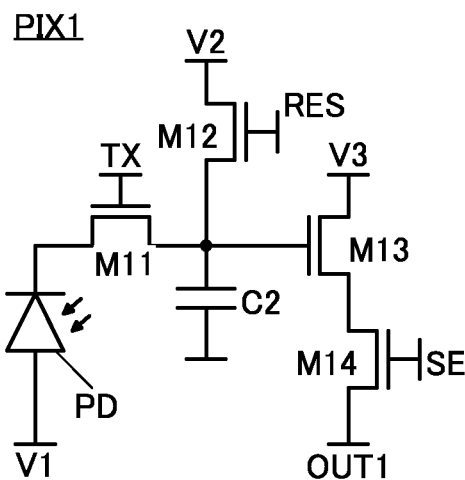
Figure 48H:
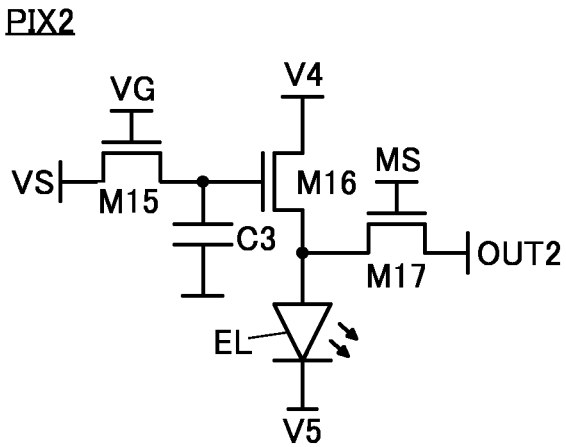

FIG. 48G illustrates an example of a pixel circuit for a subpixel including a light-receiving device. FIG. 48H illustrates an example of a pixel circuit for a subpixel including a light-emitting device.

A pixel circuit PIX1 illustrated in FIG. 48G includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving device PD is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the light-receiving device PD. The transistor M13 functions as an amplifier transistor for outputting a signal corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 48H includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to the wiring V4 and the wiring V5. The anode of the light-emitting device EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls a current flowing through the light-emitting device EL in accordance with a potential supplied to the gate of the transistor M16. When the transistor M15 is on, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, transistors in which a metal oxide (an oxide semiconductor) is used in a semiconductor layer where a channel is formed are preferably used as the transistors M11, M12, M13, and M14 included in the pixel circuit PIX1 and the transistors M15, M16, and M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a long time. Hence, it is particularly preferable to use transistors containing an oxide semiconductor as the transistors M11, M12, and M15 each of which is connected in series with the capacitor C2 or the capacitor C3. When the other transistors also include an oxide semiconductor, the manufacturing cost can be reduced.

For example, the off-state current per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

Alternatively, transistors using silicon as a semiconductor in which a channel is formed can be used as the transistors M11 to M17. It is particularly preferable to use silicon with high crystallinity, such as single crystal silicon or polycrystalline silicon, because high field-effect mobility can be achieved and higher-speed operation can be performed.

Alternatively, a transistor containing an oxide semiconductor may be used as at least one of the transistors M11 to M17, and transistors containing silicon may be used as the other transistors.

Although n-channel transistors are shown in FIGS. 48G and 48H, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap the light-receiving device PD or the light-emitting device EL. Thus, the effective area of each pixel circuit can be reduced, and a high-definition light-receiving portion or display portion can be achieved.

To increase the luminance of the light-emitting device EL included in the pixel circuit, the amount of current fed through the light-emitting device EL needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Accordingly, when an OS transistor is used as the driving transistor in the pixel circuit, the amount of current flowing through the light-emitting device can be increased, so that the luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor in the pixel circuit, a current flowing between the source and the drain can be set minutely by a change in gate-source voltage; hence, the amount of current flowing through the light-emitting device can be controlled. Consequently, the number of gray levels expressed by the pixel circuit can be increased.

Regarding saturation characteristics of current flowing when transistors operates in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices that contain an EL material even when the current-voltage characteristics of the light-emitting devices vary, for example. In other words, when the OS transistor operates in the saturation region, the source-drain current hardly changes with an increase in the source-drain voltage; hence, the luminance of the light-emitting device can be stable.

As described above, by using an OS transistor as the driving transistor included in the pixel circuit, it is possible to prevent black-level degradation, increase the luminance, increase the number of gray levels, and suppress variations in characteristics of light-emitting devices, for example.

The refresh rate can be variable in the display apparatus of one embodiment of the present invention. For example, the refresh rate can be adjusted in accordance with the contents displayed on the display apparatus (e.g., adjusted in the range from 0.01 Hz to 240 Hz), whereby power consumption can be reduced. The driving with a lowered refresh rate for reducing power consumption of a display apparatus may be referred to as idling stop (IDS) driving.

The driving frequency of the touch sensor or the near touch sensor may be changed in accordance with the refresh rate. For example, when the refresh rate of the display apparatus is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 6

In this embodiment, a high-definition display apparatus will be described.

Structure Example of Display Panel

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display apparatus may be a horizontally oriented rectangle, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, a load on source lines, gate lines, and the like is reduced, so that display with a high frame rate is possible. Consequently, smooth moving images can be displayed, which improves realistic sensation.

Figure 49A:
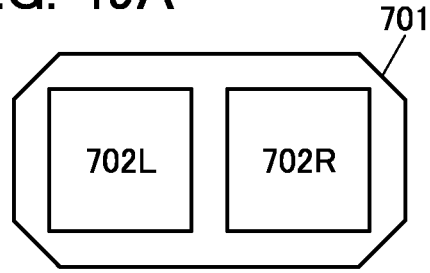
FIGS. 49A to 49J each illustrate a structure example of a display apparatus.
Figure 49B:
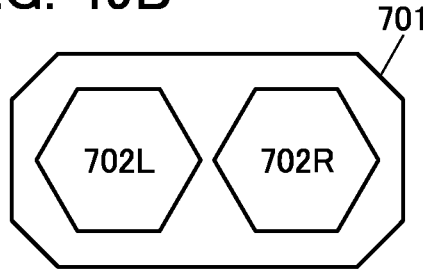

FIG. 49A illustrates a structure example of a display panel. In FIG. 49A, a display portion 702L for the left eye and a display portion 702R for the right eye are provided within the substrate 701. Note that in addition to the display portions 702L and 702R, a driver circuit, a wiring, an IC, an FPC, or the like may be provided over the substrate 701.

The display portions 702L and 702R illustrated in FIG. 49A have a square top surface.

The top surface shapes of the display portions 702L and 702R may be other regular polygons. FIGS. 49B, 49C, 49D, and 49E illustrate examples in which the top surface shapes are a regular hexagon, a regular octagon, a regular decagon, and a regular dodecagon, respectively. When the top surface shapes are a polygon with even-numbered corners as above, the shape of the display portion can be bilaterally symmetrical. Note that the top surface shapes may be a polygon other than a regular polygon, or a regular polygon or a polygon with rounded corners.

Since the display portion consists of pixels arranged in a matrix, a straight line portion of the outline of the display portion is not strictly a straight line and can be partly a stair-like portion. Specifically, a straight line portion that is not parallel to the direction of pixel arrangement has a stair-like top surface. Since the user see images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

Figure 49C:
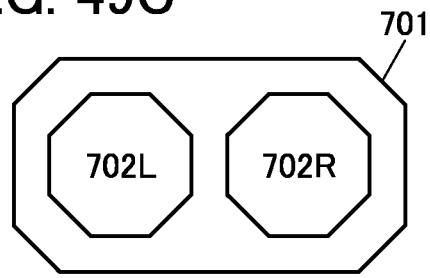
Figure 49D:
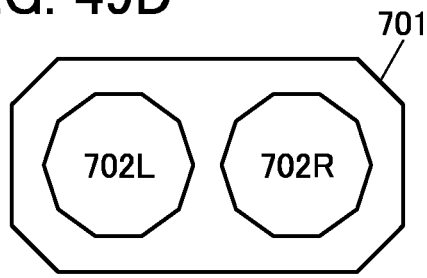
Figure 49E:
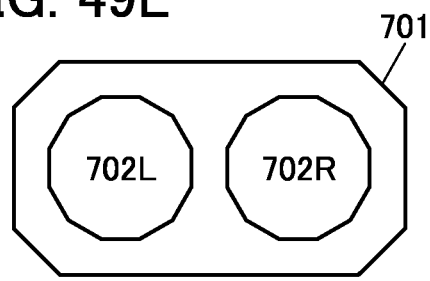
Figure 49F:
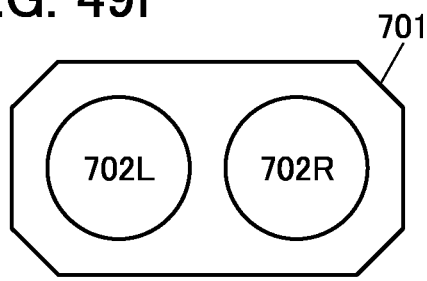

FIG. 49F illustrates an example in which the top surfaces of the display portions 702L and 702R are circular.

The top surfaces of the display portions 702L and 702R may be bilaterally asymmetrical or have a shape other than a regular polygon.

Figure 49G:
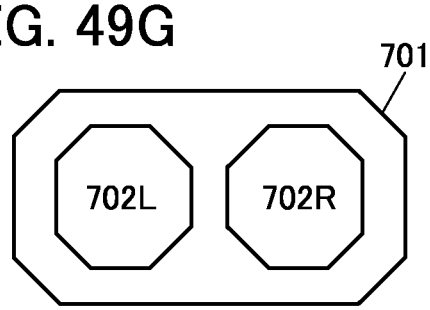
Figure 49H:
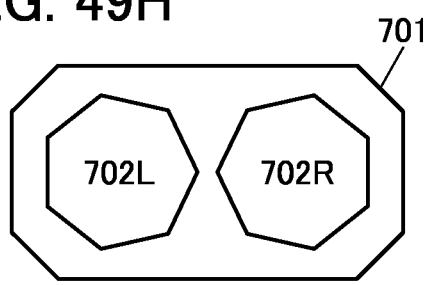

FIG. 49G illustrates an example in which the top surfaces of the display portions 702L and 702R are asymmetric octagonal. FIG. 49H illustrates an example in which the top surfaces are regular heptagonal. Even when the display portions 702L and 702R have bilaterally asymmetrical top surfaces in this manner, the display portions 702L and 702R are preferably arranged bilaterally symmetrically. Thus, the display portions can provide images without a sense of strangeness.

Although the structures where the display portion is divided into two are described above, the display portions may have a continuous shape.

Figure 49I:
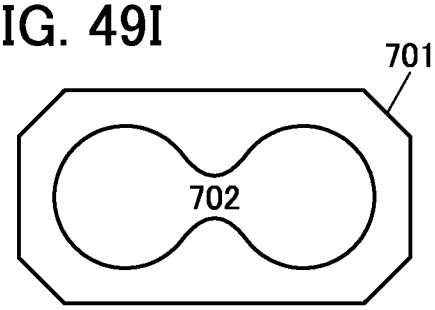
Figure 49J:
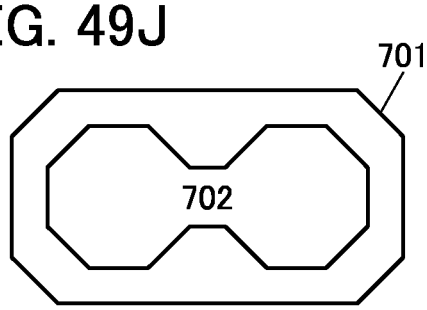

FIG. 49I shows an example in which the two circular display portions 702 in FIG. 49F are connected to each other. FIG. 49J shows an example in which the two regular octagonal display portions 702 in FIG. 49C are connected to each other.

The above is the description of the structure examples of the display panel.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 7

Described in this embodiment is a metal oxide applicable to an OS transistor described in the above embodiment.

A metal oxide used in an OS transistor preferably contains at least indium or zinc, and further preferably contains indium and zinc. The metal oxide preferably contains indium, M (M is one or more of gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more of gallium, aluminum, yttrium, and tin and is further preferably gallium.

The metal oxide can be formed by a sputtering method, a CVD method such as an MOCVD method, an ALD method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Examples of a crystal structure of an oxide semiconductor include amorphous (including completely amorphous), c-axis-aligned crystalline (CAAC), nanocrystalline (nc), cloud-aligned composite (CAC), single crystal, and polycrystalline structures.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the peak of the XRD spectrum of a quartz glass substrate has a substantially bilaterally symmetrical shape. On the other hand, the peak of the XRD spectrum of an In—Ga—Zn oxide film having a crystal structure has a bilaterally asymmetrical shape. The bilaterally asymmetrical peak of the XRD spectrum shows the existence of crystal in the film or the substrate. In other words, the crystal structure of the film or the substrate cannot be regarded as "amorphous" unless it has a bilaterally symmetrical peak in the XRD spectrum.

The crystal structure of a film or a substrate can be analyzed with a diffraction pattern obtained by nanobeam electron diffraction (NBED) (also referred to as a nanobeam electron diffraction pattern). For example, a halo pattern is observed in the diffraction pattern of a quartz glass substrate, which indicates that the quartz glass substrate is in an amorphous state. Furthermore, not a halo pattern but a spot-like pattern is observed in the diffraction pattern of an In—Ga—Zn oxide film formed at room temperature. Thus, it is presumed that the In—Ga—Zn oxide film formed at room temperature is in an intermediate state, which is neither a single crystal or polycrystalline state nor an amorphous state, and that it cannot be concluded that the In—Ga—Zn oxide film is in an amorphous state.

<<Structure of Oxide Semiconductor>>

Oxide semiconductors may be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In—Ga—Zn oxide, the CAAC-OS tends to have a layered crystal structure (also referred to as a stacked-layer structure) in which a layer containing indium (In) and oxygen (hereinafter, an In layer) and a layer containing gallium (Ga), zinc (Zn), and oxygen (hereinafter, an (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using $\theta/2\theta$ scanning, for example, a peak indicating c-axis alignment is detected at or around $2\theta=31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example.

Hence, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to a composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

The CAC-OS also refers to a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas can be used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor including the CAC-OS is highly reliable. Thus, the CAC-OS is suitably used in a variety of semiconductor devices typified by a display apparatus.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, reducing the concentration of impurities in the oxide semiconductor is effective. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon. Note that an impurity in an oxide semiconductor refers to, for example, elements other than the main components of the oxide semiconductor. For example, an element with a concentration lower than 0.1 atomic % is regarded as an impurity.

<Impurities>

The influence of impurities in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. As a result, a transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the concentration of hydrogen in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

Embodiment 8

In this embodiment, electronic devices of one embodiment of the present invention will be described with reference to FIGS. 50A and 50B, FIGS. 51A to 51D, FIGS. 52A to 52F, and FIGS. 53A to 53F.

An electronic device in this embodiment includes the display apparatus of one embodiment of the present invention. In the display apparatus of one embodiment of the present invention, increases in resolution, definition, and size are easily achieved. Thus, the display apparatus of one embodiment of the present invention can be used for display portions of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have a high definition, and thus can be favorably used for an electronic device having a relatively small display portion. Examples of such an electronic device include watch-type and bracelet-type information terminals (wearable devices); and wearable devices worn on a head, such as a device for VR (e.g., a head mounted display) and a glasses-type device for AR. Other examples of wearable devices include a device for substitution reality (SR) and a device for mixed reality (MR).

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680× 4320). In particular, a resolution of 4K2K, 8K4K, or higher is preferable. Furthermore, the pixel density (definition) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display apparatus with high resolution or high definition, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 50A:
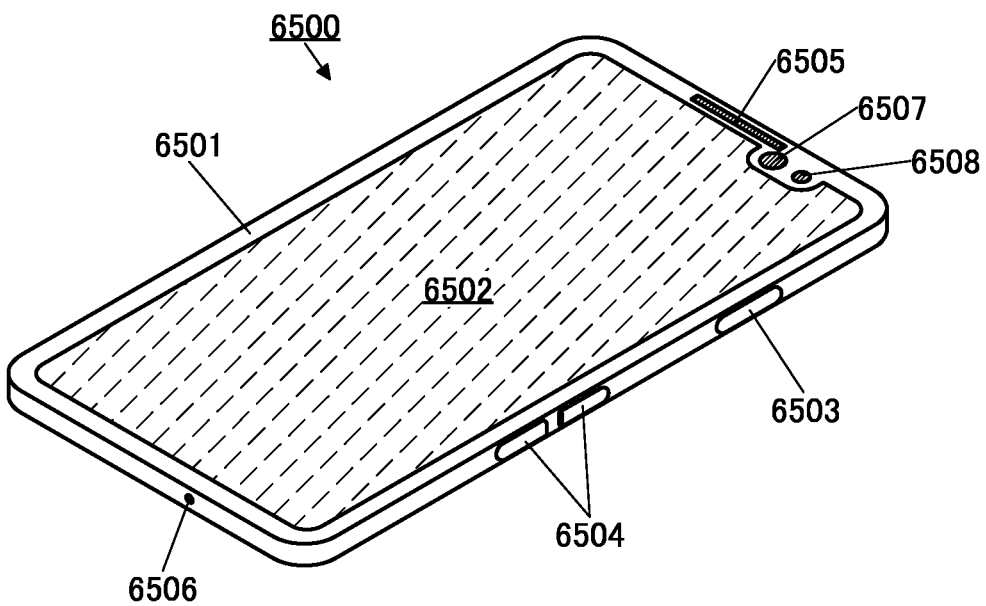
FIGS. 50A and 50B illustrate an example of an electronic device.

An electronic device 6500 in FIG. 50A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 50B:
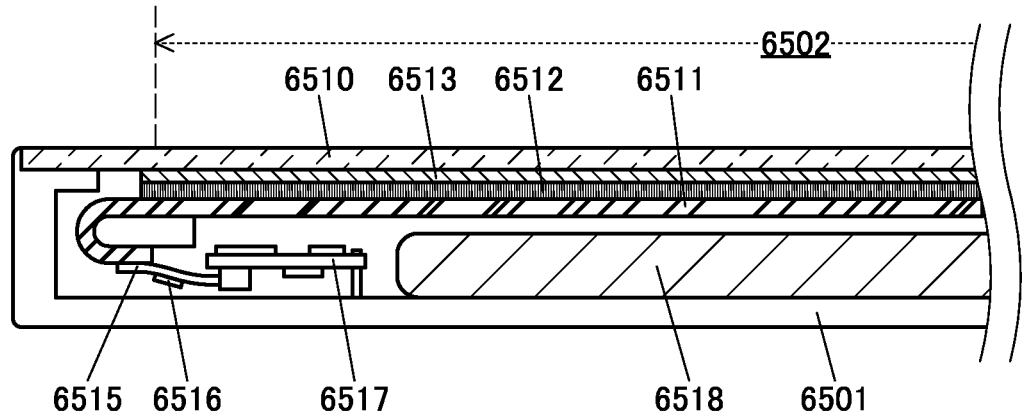

FIG. 50B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display apparatus having flexibility) of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, a part of the display panel 6511 is folded back so that a connection portion with the FPC 6515 is provided on the back side of the pixel portion, whereby an electronic device with a narrow bezel can be achieved.

Figure 51A:
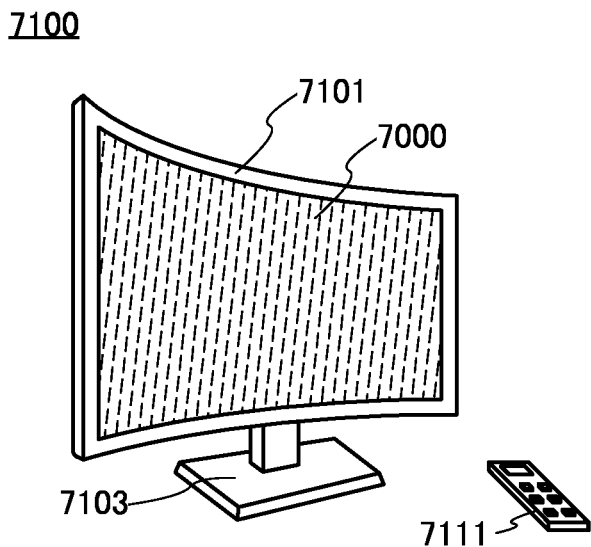
FIGS. 51A to 51D illustrate examples of electronic devices.

FIG. 51A illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000.

Operation of the television device 7100 illustrated in FIG. 51A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers) information communication can be performed.

Figure 51B:
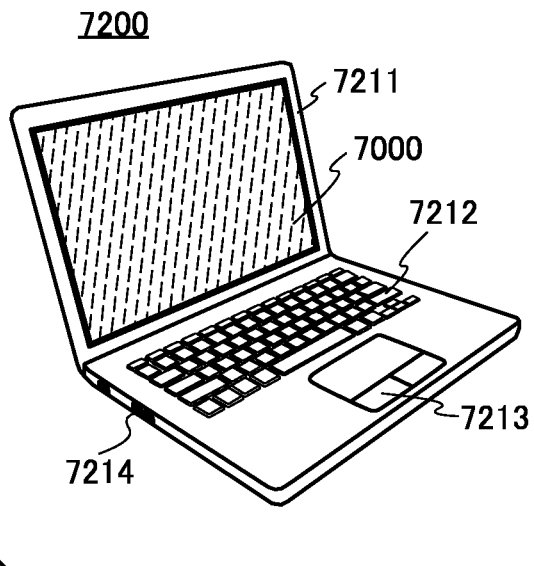

FIG. 51B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

Figure 51C:
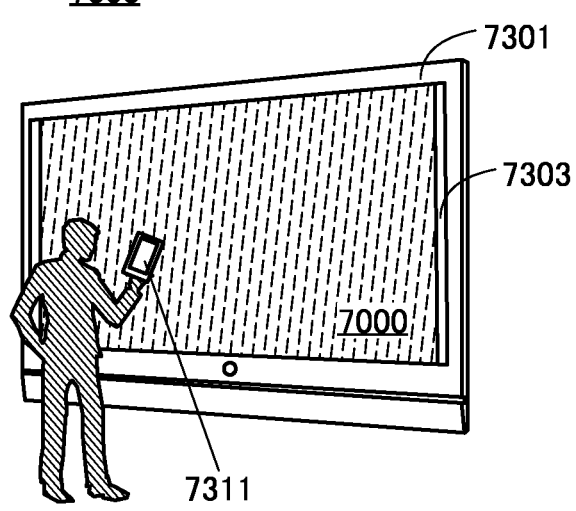
Figure 51D:
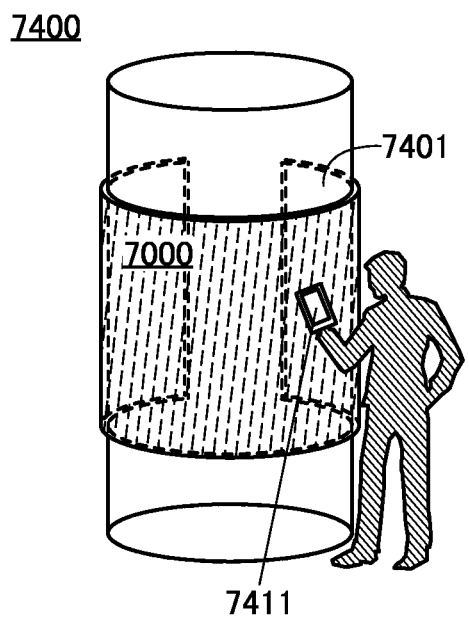

FIGS. 51C and 51D illustrate examples of digital signage.

Digital signage 7300 illustrated in FIG. 51C includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 51D shows digital signage 7400 attached to a cylindrical pillar 7401. The digital signage 7400 includes the display portion 7000 provided along a curved surface of the pillar 7401.

The display apparatus of one embodiment of the present invention can be used in the display portion 7000 illustrated in each of FIGS. 51C and 51D.

A larger area of the display portion 7000 can increase the amount of data that can be provided at a time. The larger display portion 7000 attracts more attention, so that the effectiveness of the advertisement can be increased, for example.

The use of the touch panel in the display portion 7000 is preferable because in addition to display of a still or moving image on the display portion 7000, intuitive operation by a user is possible. Moreover, for an application for providing information such as route information or traffic information, usability can be enhanced by intuitive operation.

As illustrated in FIGS. 51C and 51D, it is preferable that the digital signage 7300 or the digital signage 7400 work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 52A:
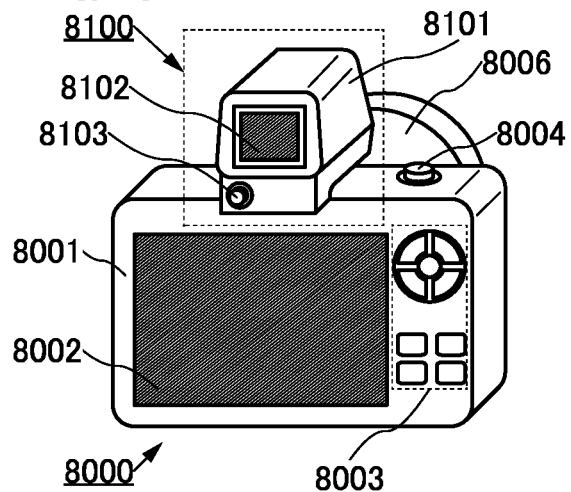
FIGS. 52A to 52F illustrate examples of electronic devices.

FIG. 52A is an external view of a camera 8000 to which a finder 8100 is attached.

The camera 8000 includes a housing 8001, a display portion 8002, operation buttons 8003, a shutter button 8004, and the like. A detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode; hence, a stroboscope, for example, as well as the finder 8100 can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display an image received from the camera 8000, for example, on the display portion 8102.

The button 8103 functions as a power supply button, for example.

The display apparatus of one embodiment of the present invention can be used in the display portion 8002 of the camera 8000 and the display portion 8102 of the finder 8100. Note that a finder may be incorporated in the camera 8000.

Figure 52B:
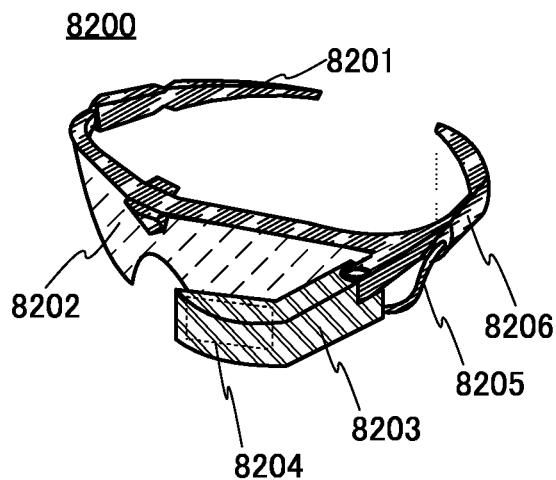

FIG. 52B is an external view of a head mounted display 8200.

The head mounted display 8200 includes a mounting portion 8201, a lens 8202, a main body 8203, a display portion 8204, a cable 8205, and the like. The mounting portion 8201 incorporates a battery 8206.

Power is supplied from the battery 8206 to the main body 8203 through the cable 8205. The main body 8203 includes a wireless receiver, for example, and received image data can be displayed on the display portion 8204. The main body 8203 includes a camera, and data on the movement of the eyeballs or the eyelids of the user can be used as an input means.

The mounting portion 8201 can be provided with a plurality of electrodes capable of sensing a current flowing in response to the movement of the user's eyeball at a position in contact with the user. Thus, the head mounted display 8200 can have a function of recognizing the user's sight line. The head mounted display 8200 may have a function of monitoring the user's pulse using a current flowing through the electrodes. The mounting portion 8201 may be provided with a variety of sensors such as a temperature sensor, a pressure sensor, or an acceleration sensor. The head mounted display 8200 may have a function of displaying the user's biological information on the display portion 8204, a function of changing a moving image displayed on the display portion 8204 in accordance with the movement of the user's head, or the like.

The display apparatus of one embodiment of the present invention can be used in the display portion 8204.

Figure 52C:
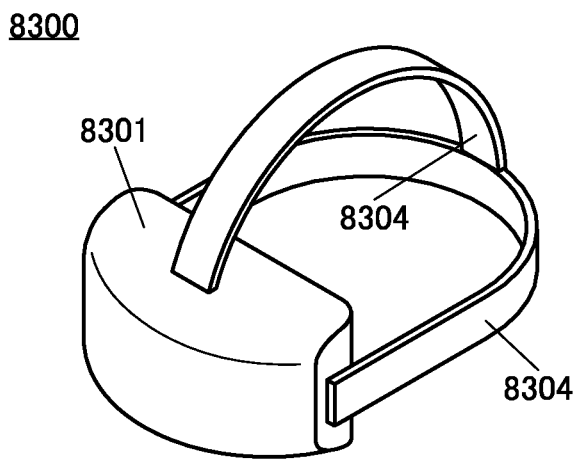
Figure 52D:
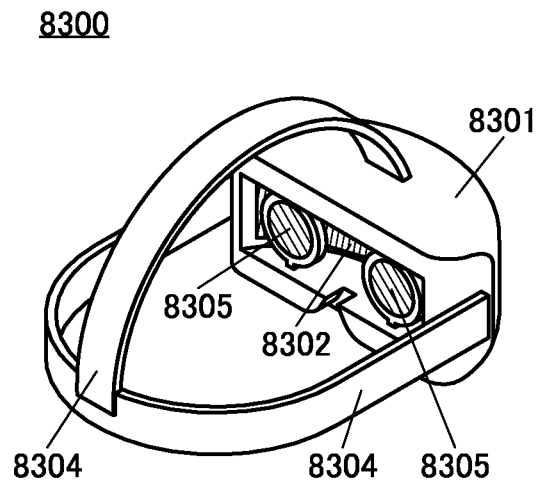
Figure 52E:
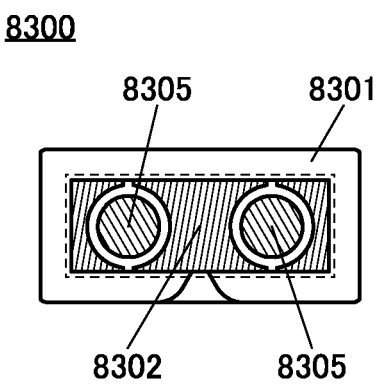

FIGS. 52C to 52E are external views of a head mounted display 8300. The head mounted display 8300 includes a housing 8301, a display portion 8302, a band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax can be performed, for example. Note that the number of display portions 8302 is not limited to one; two display portions 8302 may be provided for the user's respective eyes.

The display apparatus of one embodiment of the present invention can be used in the display portion 8302. The display apparatus of one embodiment of the present invention achieves extremely high resolution. For example, a pixel is not easily seen by the user even when the user sees display that is magnified by the use of the lenses 8305 as illustrated in FIG. 52E. In other words, a video with a strong sense of reality can be seen by the user with use of the display portion 8302.

Figure 52F:
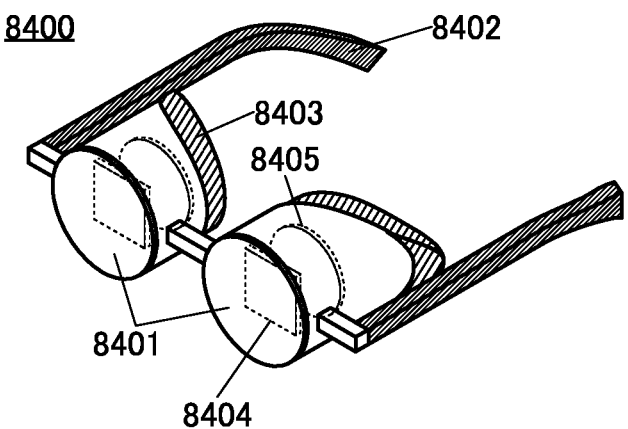

FIG. 52F is an external view of a goggles-type head mounted display 8400. The head mounted display 8400 includes a pair of housings 8401, a mounting portion 8402, and a cushion 8403. A display portion 8404 and a lens 8405 are provided in each of the pair of housings 8401. When the pair of display portions 8404 display different images, three-dimensional display using parallax can be performed.

A user can see display on the display portion 8404 through the lenses 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, without additionally requiring an audio device such as earphones, or a speaker, the user can enjoy video and sound only by wearing the head mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head mounted display 8400 is in close contact with the user's face when being worn by the user. For example, a material such as rubber, silicone rubber, urethane, or a sponge can be used. When a sponge or the like whose surface is covered with cloth, leather (natural leather or synthetic leather), or the like is used, a gap is less likely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIGS. 53A to 53F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 53A to 53F have a variety of functions. For example, the electronic devices can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The display apparatus of one embodiment of the present invention can be used in the display portion 9001.

The electronic devices in FIGS. 53A to 53F are described in detail below.

Figure 53A:
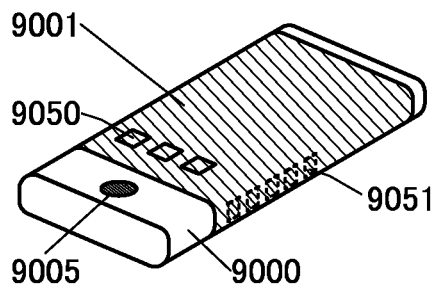
FIGS. 53A to 53F illustrate examples of electronic devices.

FIG. 53A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 53A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 53B:
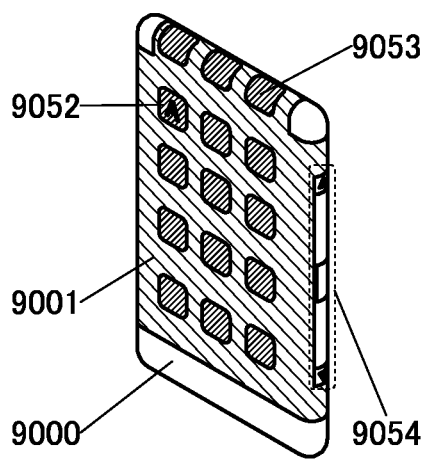

FIG. 53B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 53C:
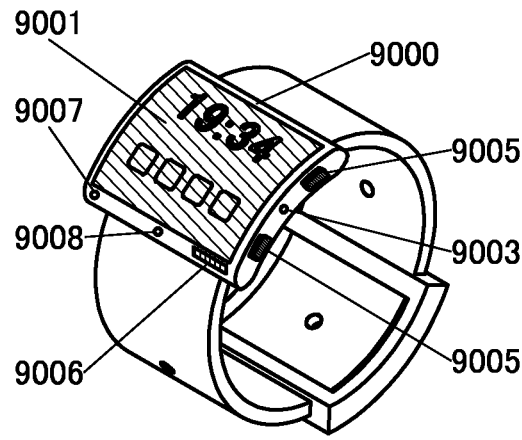

FIG. 53C is a perspective view illustrating a watch-type portable information terminal 9200. The portable information terminal 9200 can be used as a Smartwatch (registered trademark), for example. The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 53D:
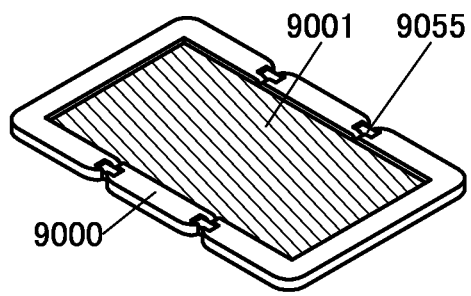
Figure 53E:
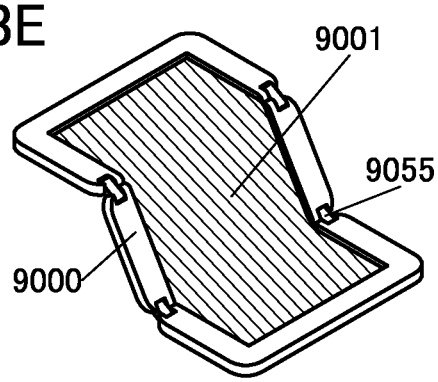
Figure 53F:
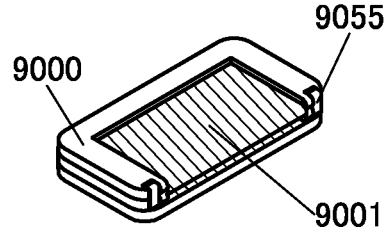

FIGS. 53D to 53F are perspective views illustrating a foldable portable information terminal 9201. FIG. 53D is a perspective view of an opened state of the portable information terminal 9201, FIG. 53F is a perspective view of a folded state thereof, and FIG. 53E is a perspective view of a state in the middle of change from one of FIG. 53D and FIG. 53F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in appropriate combination with any of the other embodiments described in this specification.

This application is based on Japanese Patent Application Serial No. 2021-089159 filed with Japan Patent Office on May 27, 2021, the entire contents of which are hereby incorporated by reference.

What is claimed is:

1. A display apparatus comprising:
a first light-emitting layer;
a photoelectric conversion layer;
a first electrode over the first light-emitting layer; and
a second electrode over the photoelectric conversion layer,
wherein visible light transmittance of the second electrode is higher than visible light transmittance of the first electrode, and
wherein the photoelectric conversion layer comprises a region not overlapped by the first electrode.

2. The display apparatus according to claim 1,
wherein the first electrode is a transflective electrode, and
wherein the second electrode is a transparent electrode.

3. The display apparatus according to claim 1, further comprising an optical adjustment layer under the first light-emitting layer.

4. The display apparatus according to claim 1,
wherein the photoelectric conversion layer comprises no region overlapped by the first electrode.

5. The display apparatus according to claim 1,
wherein the second electrode comprises a region overlapping the first light-emitting layer, and
wherein the second electrode comprises a region in contact with the first electrode.

6. The display apparatus according to claim 1, further comprising a resin layer between the first light-emitting layer and the photoelectric conversion layer.

7. The display apparatus according to claim 6, further comprising an insulating layer between the first light-emitting layer and the resin layer and between the photoelectric conversion layer and the resin layer.

8. The display apparatus according to claim 1, further comprising a second light-emitting layer,
wherein the first electrode is positioned over the second light-emitting layer.

9. The display apparatus according to claim 8, further comprising an organic layer between the first light-emitting layer and the first electrode and between the second light-emitting layer and the first electrode,
wherein the organic layer comprises at least one of a hole-injection layer, a hole-transport layer, a hole-blocking layer, an electron-blocking layer, an electron-transport layer, and an electron-injection layer.

10. The display apparatus according to claim 9,
wherein the organic layer is positioned between the photoelectric conversion layer and the second electrode.

11. The display apparatus according to claim 1, further comprising a protective layer over the first electrode and the second electrode.

12. A display module comprising:
the display apparatus according to claim 1; and
at least one of a connector and an integrated circuit.

13. An electronic device comprising:
the display module according to claim 12; and
at least one of a battery, a camera, a speaker, and a microphone.

* * * * *